(12) United States Patent
Biard et al.

(10) Patent No.: US 7,031,363 B2
(45) Date of Patent: Apr. 18, 2006

(54) LONG WAVELENGTH VCSEL DEVICE PROCESSING

(75) Inventors: James R. Biard, Richardson, TX (US);
Klein L. Johnson, Orono, MN (US);
Ralph H. Johnson, Murphy, TX (US);
Gyoungwon Park, Medina, MN (US);
Tzu-Yu Wang, Maple Grove, MN (US)

(73) Assignee: Finisar Corporation, Sunnyvale, CA (US)

( * ) Notice: Subject to any disclaimer, the term of this patent is extended or adjusted under 35 U.S.C. 154(b) by 261 days.

(21) Appl. No.: 10/697,660

(22) Filed: Oct. 29, 2003

(65) Prior Publication Data

US 2005/0092710 A1 May 5, 2005

(51) Int. Cl.
*H01S 5/00* (2006.01)

(52) U.S. Cl. .............................. 372/45; 372/46; 372/96; 438/718

(58) Field of Classification Search ............. 372/45–49, 372/96; 438/718–724; 257/14–21
See application file for complete search history.

(56) References Cited

U.S. PATENT DOCUMENTS

| | | | |
|---|---|---|---|
| 4,317,085 A | 2/1982 | Burnham et al. | |
| 4,466,694 A | 8/1984 | MacDonald | |
| 4,660,207 A | 4/1987 | Svilans | |

(Continued)

FOREIGN PATENT DOCUMENTS

| | | |
|---|---|---|
| DE | 4240706 A1 | 6/1994 |
| EP | 0288184 A2 | 10/1988 |
| EP | 0776076 A1 | 5/1997 |

(Continued)

OTHER PUBLICATIONS

Banwell et al., "VCSE Laser Transmitters for Parallel Data Links", *IEEE Journal of Quantum Electronics*, vol. 29, No. 2, Feb. 1993, pp. 635–644.

Bowers et al., "Fused Vertical Cavity Lasers With Oxide Aperture", Final report for MICRO project 96–042, Industrial Sponsor: Hewlett Packard, 4 pages, 1996–97.

Catchmark et al., "High Temperature CW Operation of Vertical Cavity Top Surface–Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83–120.

Choe, et al., "Lateral oxidation of AIAs layers at elevated water vapour pressure using a closed–chamber system," Letter to the Editor, Semiconductor Science Technology, 15, pp. L35–L38, Aug. 2000.

Choa et al., "High–Speed Modulation of Vertical–Cavity Surface–Emitting Lasers", *IEEE Photonics Technology Letter*, vol. 3, No. 8, Aug. 1991, pp. 697–699.

Choquette et al., "High Single Mode Operation from Hybrid Ion Implanted/Selectively Oxidized VCSELs", 200 IEEE 17th International Semiconductor Laser Conference, Monterrey, CA pp. 59–60.

Choquette et al., "Lithographically–Defined Gain Apertures Within Selectively Oxidized VCSELs", paper CtuL6, Conference on Lasers and Electro–Optics, San Francisco, California (2000).

(Continued)

*Primary Examiner*—Duy-Vu N. Deo
(74) *Attorney, Agent, or Firm*—Workman Nydegger

(57) ABSTRACT

A process for making a laser structure. The process is for the fabrication of a laser device such a vertical cavity surface emitting laser (VCSEL). The structures made involve dielectric and spin-on material planarization over wide and narrow trenches, coplanar contacts, non-coplanar contacts, thick and thin pad dielectric, air bridges and wafer thinning.

24 Claims, 191 Drawing Sheets

U.S. PATENT DOCUMENTS

| | | |
|---|---|---|
| 4,675,058 A | 6/1987 | Plaster |
| 4,784,722 A | 11/1988 | Liau et al. |
| 4,790,733 A | 12/1988 | Vaccaro |
| 4,885,592 A | 12/1989 | Kofol et al. |
| 4,901,327 A | 2/1990 | Bradley |
| 4,943,970 A | 7/1990 | Bradley |
| 4,956,844 A | 9/1990 | Goodhue et al. |
| 5,031,187 A | 7/1991 | Orenstein et al. |
| 5,052,016 A | 9/1991 | Mahbobzadeh et al. |
| 5,056,098 A | 10/1991 | Anthony et al. |
| 5,062,115 A | 10/1991 | Thornton |
| 5,068,869 A | 11/1991 | Wang et al. |
| 5,079,774 A | 1/1992 | Mendez et al. |
| 5,115,442 A | 5/1992 | Lee et al. |
| 5,117,469 A | 5/1992 | Cheung et al. |
| 5,140,605 A | 8/1992 | Paoli et al. |
| 5,157,537 A | 10/1992 | Rosenblatt |
| 5,158,908 A | 10/1992 | Blonder et al. |
| 5,212,706 A | 5/1993 | Jain |
| 5,216,263 A | 6/1993 | Paoli |
| 5,216,680 A | 6/1993 | Magnusson et al. |
| 5,237,581 A | 8/1993 | Asada et al. |
| 5,245,622 A | 9/1993 | Jewell et al. |
| 5,258,990 A | 11/1993 | Olbright et al. |
| 5,262,360 A | 11/1993 | Holonyak, Jr. et al. |
| 5,285,466 A | 2/1994 | Tabatabaie |
| 5,293,392 A | 3/1994 | Shieh et al. |
| 5,317,170 A | 5/1994 | Paoli |
| 5,317,587 A | 5/1994 | Ackley et al. |
| 5,325,386 A | 6/1994 | Jewell et al. |
| 5,331,654 A | 7/1994 | Jewell et al. |
| 5,337,074 A | 8/1994 | Thornton |
| 5,337,183 A | 8/1994 | Rosenblatt |
| 5,349,599 A | 9/1994 | Larkins |
| 5,351,256 A | 9/1994 | Schneider et al. |
| 5,359,447 A | 10/1994 | Hahn et al. |
| 5,359,618 A | 10/1994 | Lebby et al. |
| 5,363,397 A | 11/1994 | Collins et al. |
| 5,373,520 A | 12/1994 | Shoji et al. |
| 5,373,522 A | 12/1994 | Holonyak, Jr. et al. |
| 5,376,580 A | 12/1994 | Kish et al. |
| 5,386,426 A | 1/1995 | Stephens |
| 5,390,209 A | 2/1995 | Vakhshoori |
| 5,396,508 A | 3/1995 | Bour et al. |
| 5,404,373 A | 4/1995 | Cheng |
| 5,412,678 A | 5/1995 | Treat et al. |
| 5,412,680 A | 5/1995 | Swirhun et al. |
| 5,416,044 A | 5/1995 | Chino et al. |
| 5,428,634 A | 6/1995 | Bryan et al. |
| 5,438,584 A | 8/1995 | Paoli et al. |
| 5,446,754 A | 8/1995 | Jewell et al. |
| 5,465,263 A | 11/1995 | Bour et al. |
| 5,475,701 A | 12/1995 | Hibbs-Brenner |
| 5,493,577 A | 2/1996 | Choquette et al. |
| 5,497,390 A | 3/1996 | Tanaka et al. |
| 5,513,202 A | 4/1996 | Kobayashi et al. |
| 5,530,715 A | 6/1996 | Shieh et al. |
| 5,555,255 A | 9/1996 | Kock et al. |
| 5,557,626 A | 9/1996 | Grodzinski et al. |
| 5,561,683 A | 10/1996 | Kwon |
| 5,567,980 A | 10/1996 | Holonyak, Jr. et al. |
| 5,568,498 A | 10/1996 | Nilsson |
| 5,568,499 A | 10/1996 | Lear |
| 5,574,738 A | 11/1996 | Morgan |
| 5,581,571 A | 12/1996 | Holonyak, Jr. et al. |
| 5,586,131 A | 12/1996 | Ono et al. |
| 5,586,571 A | 12/1996 | Guillermo |
| 5,590,145 A | 12/1996 | Nitta |
| 5,598,300 A | 1/1997 | Magnusson et al. |
| 5,606,572 A | 2/1997 | Swirhun et al. |
| 5,625,729 A | 4/1997 | Brown |
| 5,642,376 A | 6/1997 | Olbright et al. |
| 5,645,462 A | 7/1997 | Banno et al. |
| 5,646,978 A | 7/1997 | Kem et al. |
| 5,648,978 A | 7/1997 | Sakata |
| 5,679,963 A | 10/1997 | Klem et al. |
| 5,692,083 A | 11/1997 | Bennett |
| 5,696,023 A | 12/1997 | Holonyak, Jr. et al. |
| 5,699,373 A | 12/1997 | Uchida et al. |
| 5,712,188 A | 1/1998 | Chu et al. |
| 5,726,805 A | 3/1998 | Kaushik et al. |
| 5,727,013 A | 3/1998 | Botez et al. |
| 5,727,014 A | 3/1998 | Wang et al. |
| 5,774,487 A | 6/1998 | Morgan |
| 5,778,018 A | 7/1998 | Yoshikawa et al. |
| 5,781,575 A | 7/1998 | Nilsson |
| 5,784,399 A | 7/1998 | Sun |
| 5,805,624 A | 9/1998 | Yang et al. |
| 5,818,066 A | 10/1998 | Duboz |
| 5,828,684 A | 10/1998 | Van de Walle |
| 5,838,705 A | 11/1998 | Shieh et al. |
| 5,838,715 A | 11/1998 | Corzine et al. |
| 5,841,152 A * | 11/1998 | Ishikawa ..................... 257/14 |
| 5,892,784 A | 4/1999 | Tan et al. |
| 5,892,787 A | 4/1999 | Tan et al. |
| 5,896,408 A | 4/1999 | Corzine et al. |
| 5,901,166 A | 5/1999 | Nitta et al. |
| 5,903,588 A | 5/1999 | Guenter et al. |
| 5,903,589 A | 5/1999 | Jewell |
| 5,903,590 A | 5/1999 | Hadley et al. |
| 5,908,408 A | 6/1999 | McGary et al. |
| 5,936,266 A | 8/1999 | Holonyak, Jr. et al. |
| 5,940,422 A | 8/1999 | Johnson |
| 5,953,362 A | 9/1999 | Pamulapati et al. |
| 5,978,401 A | 11/1999 | Morgan |
| 5,978,408 A | 11/1999 | Thornton |
| 5,995,531 A | 11/1999 | Gaw et al. |
| 6,002,705 A | 12/1999 | Thornton |
| 6,008,675 A | 12/1999 | Handa |
| 6,014,395 A | 1/2000 | Jewell |
| 6,043,104 A | 3/2000 | Uchida et al. |
| 6,046,065 A | 4/2000 | Goldstein et al. |
| 6,052,398 A | 4/2000 | Brillouet et al. |
| 6,055,262 A | 4/2000 | Cox et al. |
| 6,060,743 A | 5/2000 | Sugiyama et al. |
| 6,078,601 A | 6/2000 | Smith |
| 6,086,263 A | 6/2000 | Smith |
| 6,133,590 A | 10/2000 | Ashley et al. |
| 6,144,682 A | 11/2000 | Sun |
| 6,154,480 A | 11/2000 | Magnusson et al. |
| 6,185,241 B1 | 2/2001 | Sun |
| 6,191,890 B1 | 2/2001 | Baets et al. |
| 6,208,681 B1 | 3/2001 | Thornton |
| 6,212,312 B1 | 4/2001 | Grann et al. |
| 6,238,944 B1 | 5/2001 | Floyd |
| 6,269,109 B1 | 7/2001 | Jewell |
| 6,297,068 B1 | 10/2001 | Thornton |
| 6,302,596 B1 | 10/2001 | Cohen et al. |
| 6,339,496 B1 | 1/2002 | Koley et al. |
| 6,359,920 B1 * | 3/2002 | Jewell et al. ................. 372/46 |
| 6,369,403 B1 | 4/2002 | Holonyak, Jr. |
| 6,372,533 B1 | 4/2002 | Jayaraman et al. |
| 6,392,257 B1 | 5/2002 | Ramdani et al. |
| 6,410,941 B1 | 6/2002 | Taylor et al. |
| 6,411,638 B1 | 6/2002 | Johnson et al. |
| 6,427,066 B1 | 7/2002 | Grube |
| 6,455,879 B1 | 9/2002 | Ashley et al. |
| 6,459,709 B1 | 10/2002 | Lo et al. |
| 6,459,713 B1 | 10/2002 | Jewell |
| 6,462,360 B1 | 10/2002 | Higgins, Jr. et al. |
| 6,472,694 B1 | 10/2002 | Wilson et al. |

| | | | |
|---|---|---|---|
| 6,477,285 B1 | 11/2002 | Shanley | |
| 6,487,230 B1 | 11/2002 | Boucart et al. | |
| 6,487,231 B1 | 11/2002 | Boucart et al. | |
| 6,490,311 B1 | 12/2002 | Boucart et al. | |
| 6,493,371 B1 | 12/2002 | Boucart et al. | |
| 6,493,372 B1 | 12/2002 | Boucart et al. | |
| 6,493,373 B1 | 12/2002 | Boucart et al. | |
| 6,496,621 B1 | 12/2002 | Koehler et al. | |
| 6,498,358 B1 | 12/2002 | Lach et al. | |
| 6,501,973 B1 | 12/2002 | Foley et al. | |
| 6,515,308 B1 | 2/2003 | Kneissl et al. | |
| 6,535,541 B1 | 3/2003 | Boucart et al. | |
| 6,536,959 B1 | 3/2003 | Kuhn et al. | |
| 6,542,531 B1 | 4/2003 | Sirbu et al. | |
| 6,567,435 B1 | 5/2003 | Scott et al. | |
| 6,795,478 B1 * | 9/2004 | Hwang et al. | 372/96 |
| 6,829,281 B1 * | 12/2004 | Deng et al. | 372/96 |
| 6,876,686 B1 * | 4/2005 | Tandon et al. | 372/44 |
| 6,879,611 B1 * | 4/2005 | Johansson et al. | 372/45 |
| 2001/0004414 A1 | 6/2001 | Kuhn et al. | |
| 2002/0154675 A1 | 10/2002 | Deng et al. | |
| 2003/0072526 A1 | 4/2003 | Kathman et al. | |

FOREIGN PATENT DOCUMENTS

| | | |
|---|---|---|
| JP | 60123084 | 1/1985 |
| JP | 02054981 | 2/1990 |
| JP | 5299779 | 11/1993 |
| WO | WO 98/57402 | 12/1998 |

OTHER PUBLICATIONS

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Chua, et al., "Low–Threshold 1.57– μm VC–SEL's Using Strain–Compensated Quantum Wells and Oxide/Metal Backmirror," IEEE Photonics Technology Letters, vol. 7, No. 5, pp. 444–446, May 1995.

Chua, et al., "Planar Laterally Oxidized Vertical–Cavity Lasers for Low–Threshold High–Density Top–Surface–Emitting Arrays," IEEE Photonics Technology Letters, vol. 9, No. 8, pp. 1060–1062, Aug. 1997.

Cox, J. A., et al., "Guided Mode Grating Resonant Filters for VCSEL Applications", Proceedings of the SPIE, The International Society for Optical Engineering, Diffractive and Holographic Device Technologies and Applications V, San Jose, California, Jan. 28–29, 1998, vol. 3291, pp. 70–71.

Farrier, Robert G., "Parametric control for wafer fabrication: New CIM techniques for data analysis," Solid State Technology, pp. 99–105, Sep. 1997.

Fushimi, et al., "Degradation Mechanism in Carbon–doped GaAs Minority–carrier Injection Devices," 34$^{th}$ Annual IRPS Proceedings, Dallas, TX., Apr. 29–May 2, 1996, 8 pages.

G. G. Ortiz, et al., "Monolithic Integration of In0.2 GA0.8As Vertical Cavity Surface–Emitting Lasers with Resonance–Enhanced Quantum Well Photodetectors", Electronics Letters, vol. 32, No. 13, Jun. 20, 1996, pp. 1205–1207.

G. Shtengel et al., "High–Speed Vertical–Cavity Surface–Emitting Lasers", Photon. Tech. Lett., vol. 5, No. 12, pp. 1359–1361 (Dec. 1993).

Geib, et al., "Comparison of Fabrication Approaches for Selectively Oxidized VCSEL Arrays," Proceedings of SPIE, vol. 3946, pp. 36–40, 2000.

Graf, Rudolph, Modern Dictionary of Electronics, 6$^{th}$ ed., Indiana: Howard W. Sams & Company, 1984, p. 694.

Guenter et al., "Reliability of Proton–Implanted VCSELs for Data Communications", Invited paper, SPIE, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High–Power Single Mode Operation from Hybrid Ion Implanted/Selectively Oxidized VCSELs", 13th Annual Meeting IEEE Lasers and Electro–Optics Society 2000 Annual Meeting (LEOS 2000), Rio Grande, Puerto Rico, pp. 804–805.

Hawthorne, et al., "Reliability Study of 850 nm VCSELs for Data Communications," IEEE, pp. 1–11, May 1996.

Herrick, et al., "Highly reliable oxide VCSELs manufactured at HP/Agilent Technologies," Invited Paper, Proceedings of SPIE vol. 3946, pp. 14–19, 2000.

Hibbs–Brenner et al., "Performance, Uniformity and Yield of 850nm VCSELs Deposited by MOVPE", IEEE Phot. Tech. Lett., vol. 8, No. 1, pp. 7–9, Jan. 1996.

Hideaki Saito, et al., "Controlling polarization of quantum–dot surface–emitting lasers by using structurally anisotropic self–assembled quantum dots," American Institute of Physics, Appl, Phys. Lett. 71 (5), pp. 590–592, Aug. 4, 1997.

Hornak et al., "Low–Termperature (10K–300K) Characterization of MOVPE–Grown Vertical–Cavity Surface–Emitting Lasers", Photon. Tech. Lett., vol. 7, No. 10, pp. 1110–1112, Oct. 1995.

Huffaker et al., "Lasing Characteristics of Low Threshold Microcavity Layers Using Half–Wave Spacer Layers and Lateral Index Confinement", Appl. Phys. Lett., vol. 66, No. 14, pp. 1723–1725, Apr. 3, 1995.

Jewell et al., "Surface Emitting Microlasers for Photonic Switching & Intership Connections", Optical Engineering, vol. 29, No. 3, pp. 210–214, Mar. 1990.

Jiang et al., "High–Frequency Polarization Self–Modulation in Vertical–Cavity Surface–Emitting Lasers", Appl. Phys. Letters, vol. 63, No. 26, Dec. 27, 1993, pp. 2545–2547.

K.L. Lear et al., "Selectively Oxidized Vertical Cavity Surface–Emitting Lasers with 50% Power Conversion Efficiency", Elec. Lett., vol. 31, No. 3 pp. 208–209, Feb. 2, 1995.

Kash, et al., "Recombination in GaAs at the AlAs oxide–GaAs interface," Applied Physics Letters, vol. 67, No. 14, pp. 2022–2024, Oct. 2, 1995.

Kishino et al., "Resonant Cavity–Enhanced (RCE) Photodetectors", IEEE Journal of Quantum Electronics, vol. 27, No. 8, pp. 2025–2034.

Koley B., et al., "Dependence of lateral oxidation rate on thickness of AlAs layer of interest as a current aperture in vertical–cavity surface–emitting laser structures", Journal of Applied Physics, vol. 84, No. 1, pp. 600–605, Jul. 1, 1998.

Kuchibhotla et al., "Low–Voltage High Gain Resonant_ Cavity Avalanche Photodiode", IEEE Phototonics Technology Letters, vol. 3, No. 4, pp. 354–356.

Lai et al., "Design of Tunable GaAs/AlGaAs Multiple–Quantum–Well Resonant Cavity Photodetector", IEEE Journal of Quantum Electronics, vol. 30, No. 1, pp. 108–114.

Lee et al., "Top–Surface Emitting GaAs Four–Quantum–Well Lasers Emitting at 0–85 um", Electronics Letters, vol. 24, No. 11, May 24, 1990, pp. 710–711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251–1252.

Maeda, et al., "Enhanced Glide of Dislocations in GaAs Single Crystals by Electron Beam Irradiation," Japanese Journal of Applied Physics, vol. 20, No. 3, pp. L165–L168, Mar. 1981.

Magmusson, "Integration of Guided–Mode Resonance Filters and VCSELs", Electo–Optics Research Center, Department of Electrical Engineering, University of Texas at Arlington, May 6, 1997.

Martinsson et al., "Transverse Mode Selection in Large–Area Oxide–Confined Vertical–Cavity Surface–Emitting Lasers Using a Shallow Surface Relief", *IEEE Photon. Technol. Lett.*, 11(12), 1536–1538 (1999).

Miller et al., "Optical Bistability Due to Increasing Absorption", *Optics Letters*, vol. 9, No. 5, May 1984, pp. 162–164.

Min Soo Park and Byung Tae Ahn, "Polarization control of vertical–cavity surface–emitting lasers by electro–optic birefringence," Applied Physics Letter, vol. 76, No. 7, pp. 813–815, Feb. 14, 2000.

Morgan et al., "200 C, 96–nm Wavelength Range, Continuous–Wave Lasing from Unbonded GaAs MOVPE–Grown Vertical Cavity Surface–Emitting Lasers", *IEEE Photonics Technology Letters*, vol. 7, No. 5, May 1995, pp. 441–443.

Morgan et al., "High–Power Coherently Coupled 8×8 Vertical Cavity Surface Emitting Laser Array", *Appl. Phys Letters*, vol. 61, No. 10, Sep. 7, 1992, pp. 1160–1162.

Morgan et al., "Hybrid Dielectric/AlGaAs Mirror Spatially Filtered Vertical Cavity Top–Surface Emitting Laser", *Appl. Phys. Letters*, vol. 66, No. 10, Mar. 6, 1995, pp. 1157–1159.

Morgan et al., "Novel Hibrid–DBR Single–Mode Controlled GaAs Top–Emitting VCSEL with Record Low Voltage", 2 pages, dated prior to Dec. 29, 2000.

Morgan et al., "One Watt Vertical Cavity Surface Emitting Laser", *Electron. Lett.*, vol. 29, No. 2, pp. 206–207, Jan. 21, 1993.

Morgan et al., "Producible GaAs–based MOVPE–Grown Vertical–Cavity Top–Surface Emitting Lasers with Record Performance", *Elec. Lett.*, vol. 31, No. 6, pp. 462–464, Mar. 16, 1995.

Morgan et al., "Progress and Properties of High–Power Coherent Vertical Cavity Surface Emitting Laser Arrays", *SPIE*, Vo. 1850, Jan. 1993, pp. 100–108.

Morgan et al., "Progress in Planarized Vertical Cavity Surface Emitting Laser Devices and Arrays", *SPIE*, vol. 1562, Jul. 1991, pp. 149–159.

Morgan et al., "Spatial–Filtered Vertical–Cavity Top Surface–Emitting Lasers", CLEO, 1993, pp. 138–139.

Morgan et al., "Submilliamp, Low–Resistance, Continuous–Wave, Single–Mode GaAs Planar Vertical–Cavity Surface Emitting Lasers", Honeywell Technology Center, Jun. 6, 1995.

Morgan et al., "Transverse Mode Control of Vertical–Cavity Top–Surface Emitting Lasers", *IEEE Photonics Technology Letters*, vol. 4, No. 4, Apr. 1993, pp. 374–377.

Morgan et al., "Vertical–cavity surface–emitting laser arrays", Invited Paper, *SPIE*, vol. 2398, Feb. 6, 1995, pp. 65–93.

Morgan et al., Vertical–cavity surface emitting lasers come of age, Invited paper, *SPIE*, vol. 2683, 0–8194–2057, Mar. 1996, pp. 18–29.

Morgan, "High–Performance, Producible Vertical Cavity Lasers for Optical Interconnects", *High Speed Electronics and Systems*, vol. 5, No. 4, Dec. 1994, pp. 65–95.

Naone R.L., et al., "Tapered–apertures for high–efficiency miniature VCSELs", LEOS newsletter, vol. 13, No. 4, pp. 1–5, Aug. 1999.

Nugent et al., "Self–Pulsations in Vertical–Cavity Surface–Emitting Lasers", *Electronic Letters*, vol. 31, No. 1, Jan. 5, 1995, pp. 43–44.

Oh, T. H. et al., "Single–Mode Operation in Antiguided Vertical–Cavity Surface–Emitting Laser Using a Low–Temperature Grown AlGaAs Dielectric Aperture", *IEEE Photon. Technol. Lett*, 10(8), 1064–1066 (1998).

Osinski, et al., "Temperature and Thickness Dependence of Steam Oxidation of AIAs in Cylindrical Mesa Structure," IEEE Photonics Technology Letters, vol. 13, No. 7, pp. 687–689, Jul. 2001.

Peck, D. Stewart, Comprehensive Model for Humidity Testing Correlation, IEEE/IRPS, pp. 44–50, 1986.

Ries, et al., "Visible–spectrum ($\lambda$=650nm) photopumped (pulsed, 300 K) laser operation of a vertical–cavity AIAs–AIGaAs/InAIP–InGAP quantum well heterostructure utilizing native oxide mirrors," Applied Physics Letters, vol. 67, No. 8, pp. 1107–1109, Aug. 21, 1995.

S.S. Wang and R. Magnusson, "Multilayer Waveguide–Grating Filters", *Appl. Opt.*, vol. 34, No. 14, pp. 2414–2420, 1995.

S.S. Wang and R. Magnusson, "Theory and Applications of Guided–Mode Resonance Filters", *Appl. Opt.*, vol. 32, No. 14, pp. 2606–2613, 1993.

Sah, et al., "Carrier Generation and Recombination in P–N Junctions and P–N Junction Characteristics," Proceedings of the IRE, pp. 1228–1243, Sep., 1957.

Schubert, "Resonant Cavity Light–Emitting Diode", *Appl. Phys. Lett.*, vol. 60, No. 8, pp. 921–923, Feb. 24, 1992.

Shi, et al., "Photoluminescence study of hydrogenated aluminum oxide–semiconductor interface," Applied Physics Letters, vol. 70, No. 10, pp. 1293–1295, Mar. 10, 1997.

Smith, R.E. et al., Polarization–Sensitive Subwavelength Antireflection Surfaces on a Semiconductor for 975 NM, *Optics Letters*, vol. 21, No. 15, Aug. 1, 1996, pp. 1201–1203.

Spicer, et al., "The Unified Model For Schottky Barrier Formation and MOS Interface States in 3–5 Compounds," Applications of Surface Science, vol. 9, pp. 83–01, 1981.

Suning Tang et al., "Design Limitations of Highly Parallel Free–Space Optical Interconnects Based on Arrays of Vertical Cavity Surface–Emitting Laser Diodes, Microlenses, and Photodetectors", Journal of Lightwave Technology, vol. 12, No. 11, Nov. 1, 1994, pp. 1971–1975.

T. Mukaihara, "Polarization Control of Vertical–cavity Surface–Emitting Lasers by a Birefringent Metal/Semiconductor Polarizer Terminating a Distributed Bragg Reflector," Tokyo Institute of Technology, Precision and Intelligence Laboratory, pp. 183–184.

Tao, Andrea, "Wet–Oxidation of Digitally Alloyed AIGaAs," National Nanofabrication Users Network, Research Experience for Undergraduates 2000, 2 pages.

Tautm, et al., Commerialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface–Emitting Lasers," Japan J. Appl. Phys. vol. 33 (1994) pp. L227–L229, Part 2, No. 2B, Feb. 15, 1994.

Tu, Li–Wei et al., "Transparent conductive metal–oxide contacts in vertical–injection top–emitting quantum well lasers", Appl. Phys. Lett. 58 (8) Feb. 25, 1991, pp. 790–792.

Wieder, H.H., "Fermi level and surface barrier of $Ga_xIn_{1-x}As$ alloys," Applied Physics Letters, vol. 38, No. 3, pp. 170–171, Feb. 1, 1981.

Wipiejewski, et al., "VCSELs for datacom applications," Invited Paper, Part of the SPIE Conference on Vertical–Cavity Surface–Emitting Lasers III, San Jose, California, SPIE vol. 3627, pp. 14–22, Jan. 1999.

Y. M. Yang et al., "Ultralow Threshold Current Vertical Cavity Surface Emitting Lasers Obtained with Selective Oxidation", *Elect. Lett.*, vol. 31, No. 11, pp. 886–888, May 25, 1995.

Yablonovitch et al., "Photonic Bandgap Structures", *J. Opt. Soc. Am. B.*, vol. 10, No. 2, pp. 283–295, Feb. 1993.

Young et al., "Enhanced Performance of Offset–Gain High Barrier Vertical–Cavity Surface–Emitting Lasers", *IEEE J. Quantum Electron.*, vol. 29, No. 6, pp. 2013–2022, Jun. 1993.

U.S. Appl. No. 09/751,422, filed Dec. 29, 2000, entitled "Resonant Reflector for Use with Optoelectronic Devices".

U.S. Appl. No. 09/751,423, filed Dec. 29, 2000, entitled "Spatially Modulated Reflector for an Optoelectronic Device".

Shul, et al., "Comparison of Plasma Etch Techniques For III–V Nitrides," Solid–State Electronics, vol. 42, No. 12, pp. 2259–2267, 1998.

http://www.elume.com/low–k–ii.html, Low–K Materials II, 2 pages, Jun. 1, 2003.

* cited by examiner

Standard Layout Geometry

| Feature | Variable | Dimension | Notes |
|---|---|---|---|
| Oxide Aperture | A | Variable | VCSEL Aperture |
| Oxide Trench ID | B | A+20 | 10 um lateral oxidation |
| Thin Trench OD | - | B+5 | 2.5 um wide trenches |
| Wide Trench OD | D | B+8 | 4 um wide trenches |
| Isolation | - | B-4 | Implant isolation |
| Aperture Via | - | B-4 | Area without thick coating |
| Inner Metal ID | C | A+M | Metal aperture pullback variation |
| Inner Metal OD | - | B-2 | Partially covers trench |
| Contact Via ID | - | C+3 | optional? Extends below metal ID |
| Contact Via OD | - | B-6 | Slightly less than aperture via |
| Air Bridge ID | - | B-2 | For patternable trench fill-ins |
| Air Bridge OD | - | B+12 | Matched to wide trenches |
| AB Aperture D | - | C+4 | Larger than metal ID |
| Outer Metal ID | - | B+10 | Partially covers wide trench |
| Outer Metal OD | - | B+18 | 4 um wide outer metal ring |
| SA Coplanar ID | - | D+8 | Largest diameter: 42 um |
| SA Coplanar OD | - | 180 | Set to near edge of die |
| HOM(Metal) Filter | F | Variable | Circle/polygonal pattern in aperture area |
| HOM(Etch) Filter | F | Variable | Circle/polygonal pattern in aperture area |

Oxide Aperture Variations (A): 5, 6, 7, 8, 9, 10, 11, 12, 13, 14 um
Metal Pullback (diameter) (M): 1, 3, 5 um
Higher Order Mode Filter (diameter) (F): .5, 1, 2 um

*Figure 190*

LONG WAVELENGTH VCSEL DEVICE PROCESSING

BACKGROUND

The invention pertains to processing and fabrication of devices, and particularly to that of on-chip light sources. More particularly, the invention pertains to the processing and fabrication of vertical cavity surface emitting lasers (VCSELs).

Methods for processing long wavelength VCSELs have mostly been limited to intricate, non-uniform, and most importantly, non-robust fabrication steps. Although suitable for academic level research or limited samples, they are not suitable for a large volume market driven production. There is a need for such production process.

SUMMARY

The present invention may cover a set of manufacturable methods and layout designs for volume batch processing of long wavelength VCSELs or other laser devices.

The processing details shown in this invention cover the necessary fabrication steps to create a VCSEL device from the original crystal material grown on a wafer. The VCSEL designs covered here include those applicable to the 1200 to 1800 nm wavelength range.

Proposed below are the various types of processing flows. They cover specific cases, including the air bridge or planarization processes. The coplanar contact option is included in one of the process flows. Additional options for self aligned Fetch and substrate thinning are also included. One may select a particular process flow or a combination of steps of different process flows for each or both wavelengths of interest, i.e., 1310 nm and 1550 nm, or other wavelengths as applicable.

BRIEF DESCRIPTION OF THE FIGURES

FIGS. 54–80 illustrate a process for making a laser structure having a contact bridge over a trench on a planarized spin-on material and a backside contact FIGS. 81–107 reveal a process for a laser structure having a contact air bridge over a trench and a backside contact.

FIGS. 172–181 show a self-aligned (SA) Fetch process for replacing the first portion of a process of a laser structure.

FIGS. 189–190 show more dimensions applicable to the various laser structures.

DESCRIPTION

Figure 1:
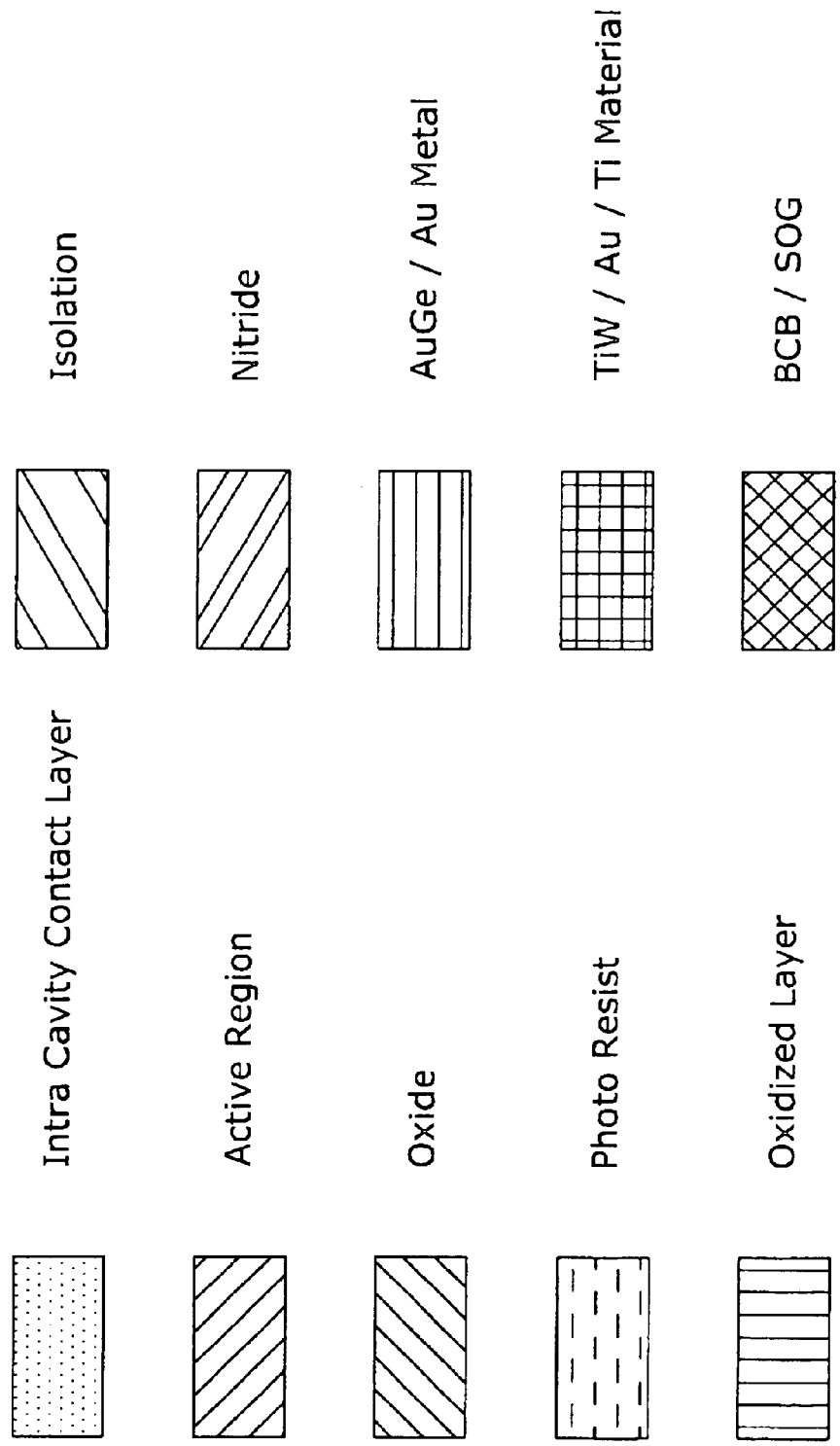
FIG. 1 is a key of symbols for certain figures.
Figure 2:
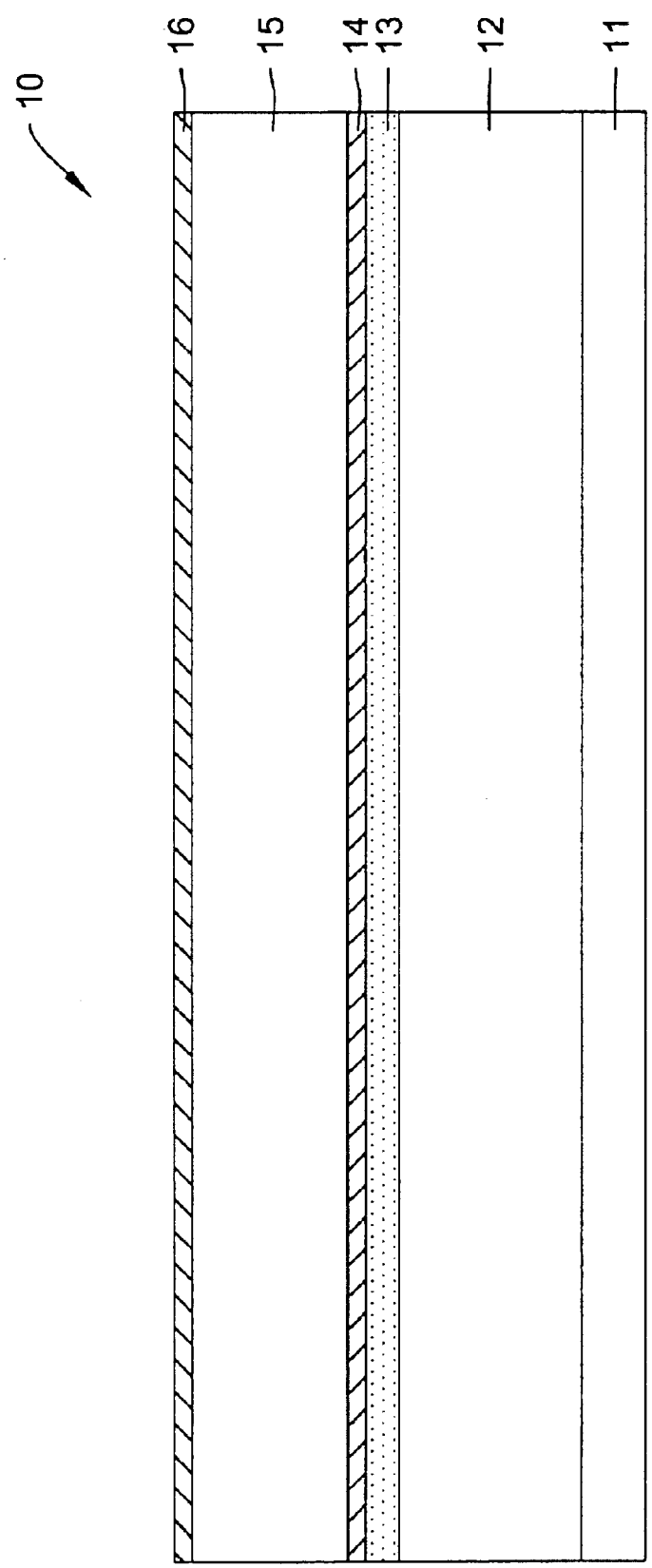
FIGS. 2, 2a and 3–33 reveal a process for making a laser structure having a coplanar contact and an air bridge over a trench for the other content.

The Figures in the present description may utilize various graphic symbols to aid in disclosure of the invention. FIG. 1 is a Table showing some symbols used in some of the figures. The process of making a structure 10 may start with a bottom DBR (distributed Bragg reflector) mirror 12 formed on a substrate 11, as shown in FIG. 2. Situated on mirror 12 may be an intra cavity contact layer 13. On layer 13 may be an active region or layer 14, with one or more quantum wells. A top DBR mirror 15 may be formed on active layer 14. On mirror 15 may be a one-half wavelength thick oxide layer 16 formed with plasma enhanced chemical vapor deposition (PECVD).

Figure 2A:
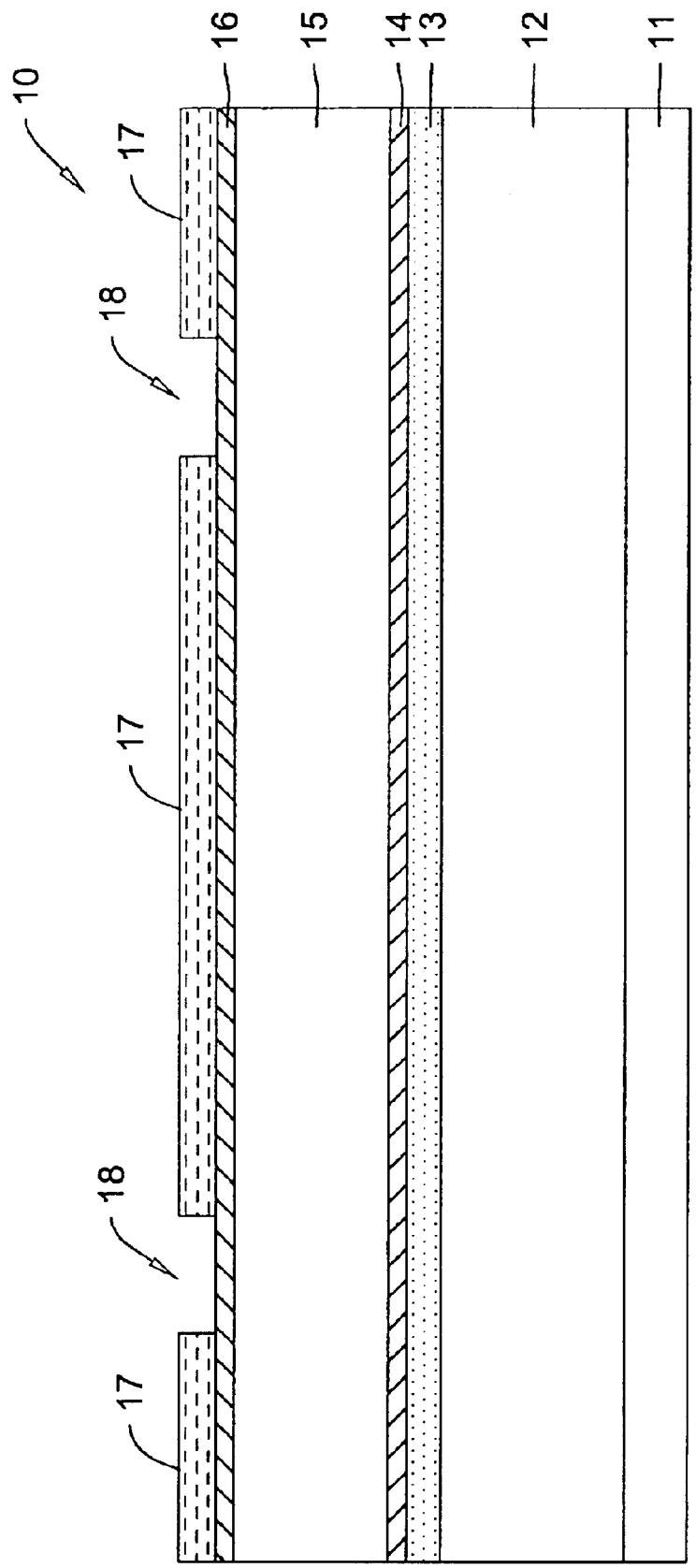
Figure 3:
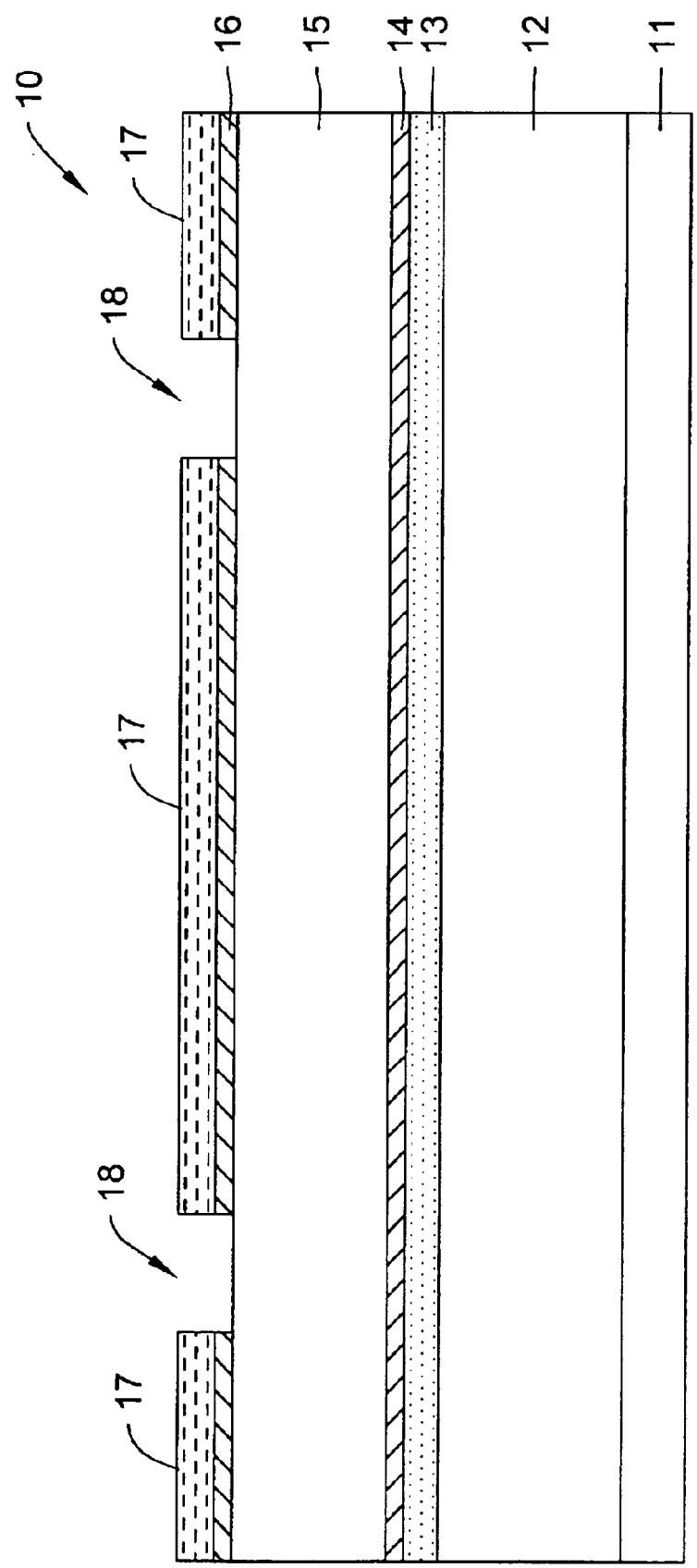
Figure 4:
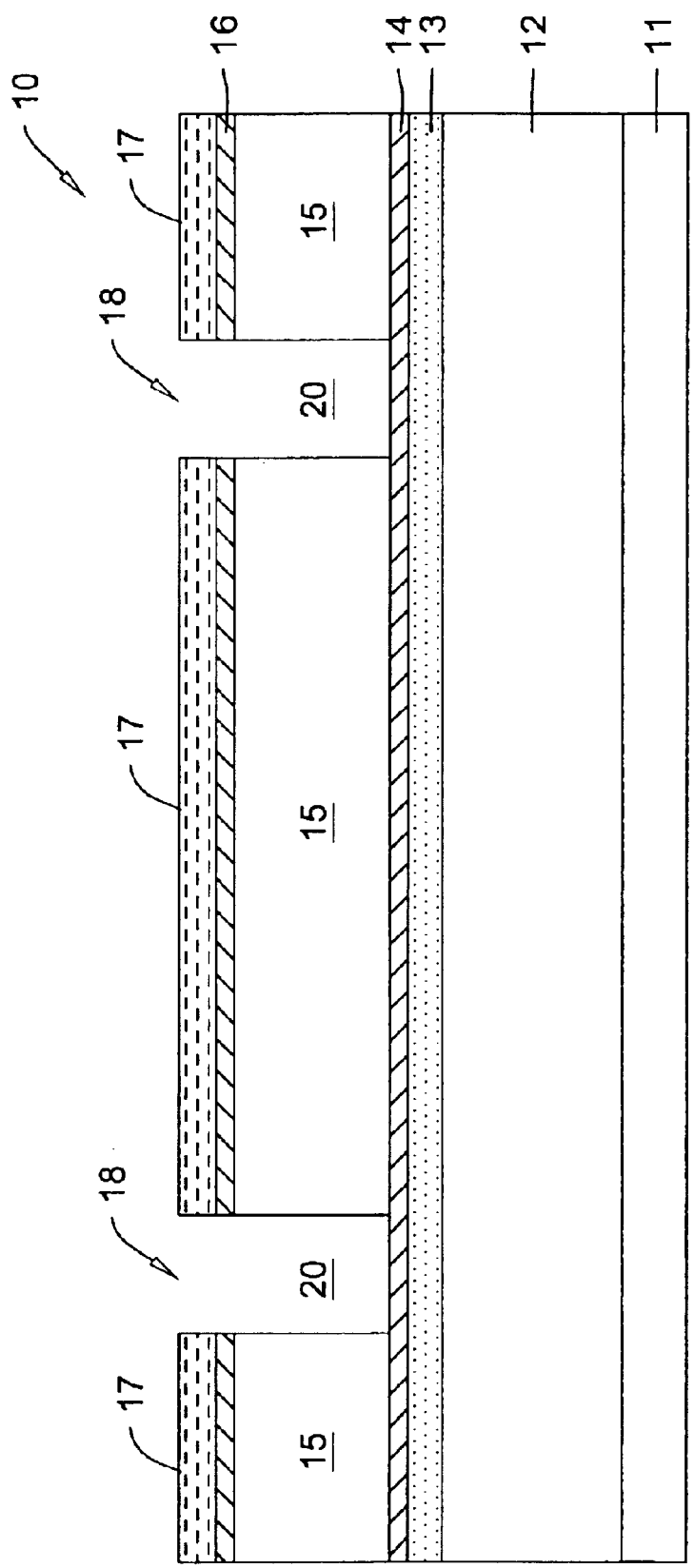
Figure 5:
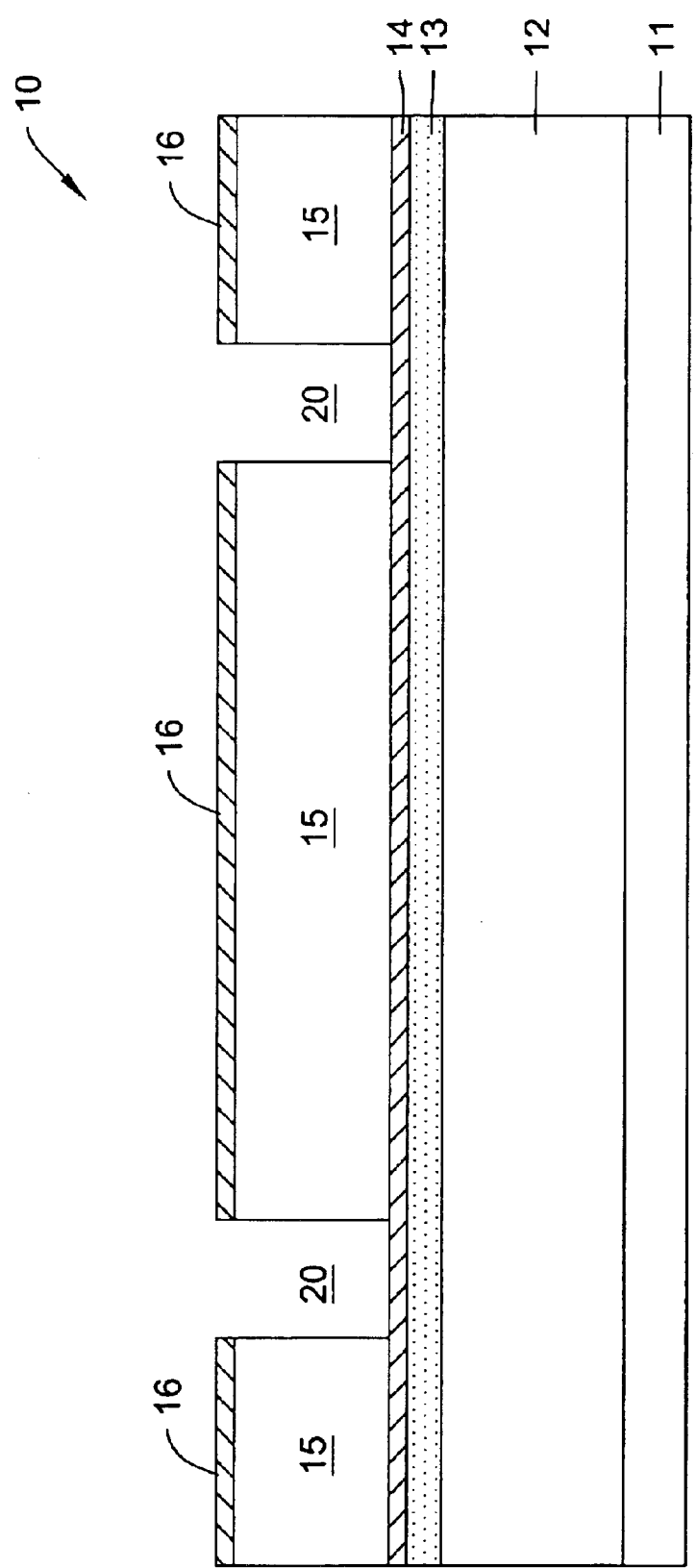
Figure 6:
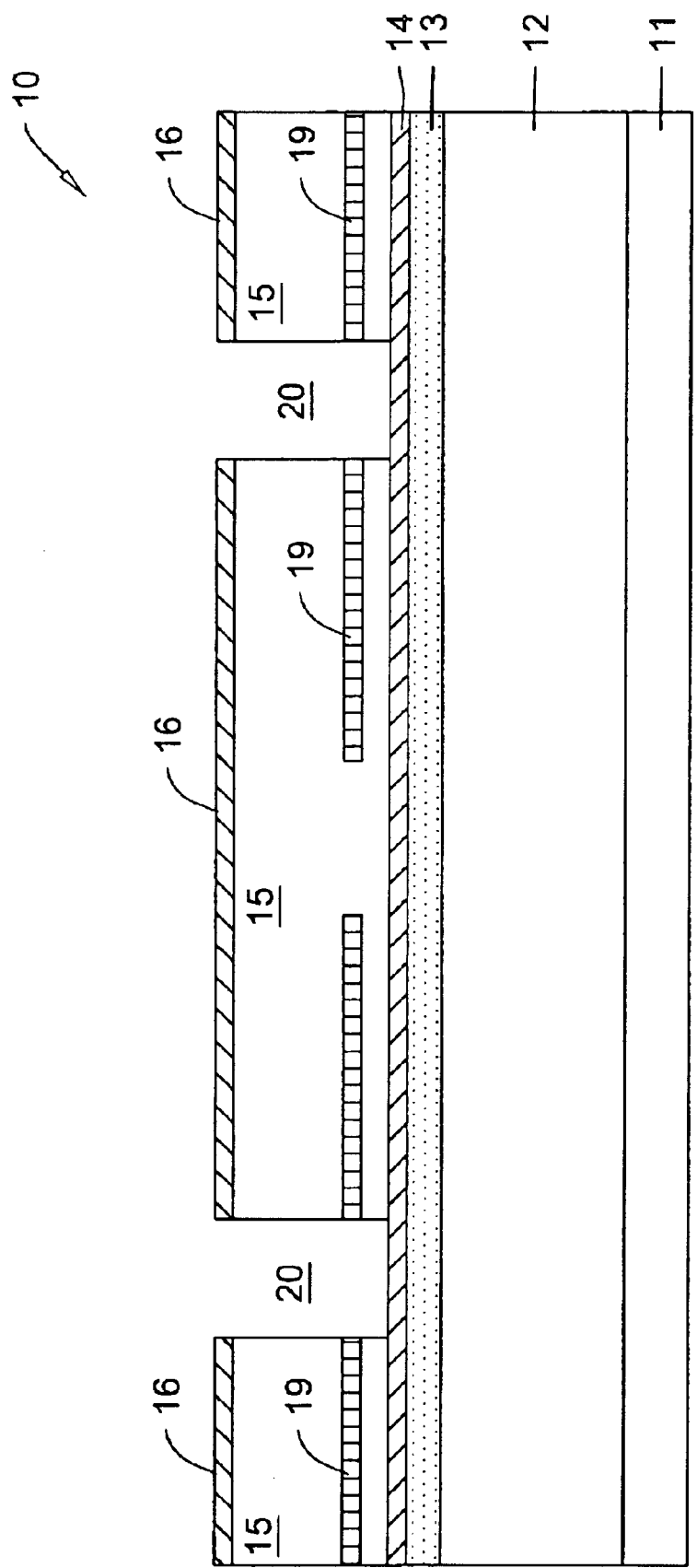

A relatively wide trench photo resist 17 may be formed on oxide layer 16, as in FIG. 2a. A LAM etch may be applied and portions of oxide layer 16 may be etched away through photo resist 17 openings 18, in view of FIG. 3. An ICP (inductively coupled plasma) etch may be used through the same openings 18 to etch away mirror 16 down to active region 14, as shown in FIG. 4, to make a trench 20. In FIG. 5, photo resist 17 may be stripped off from oxide layer 16. There may be a layer 19 in mirror 16 that has a high aluminum content. This structure may be placed in an environment of hot vapor for wet oxidation of layer 19 in the remaining portions of mirror 15, as noted in FIG. 6.

Figure 7:
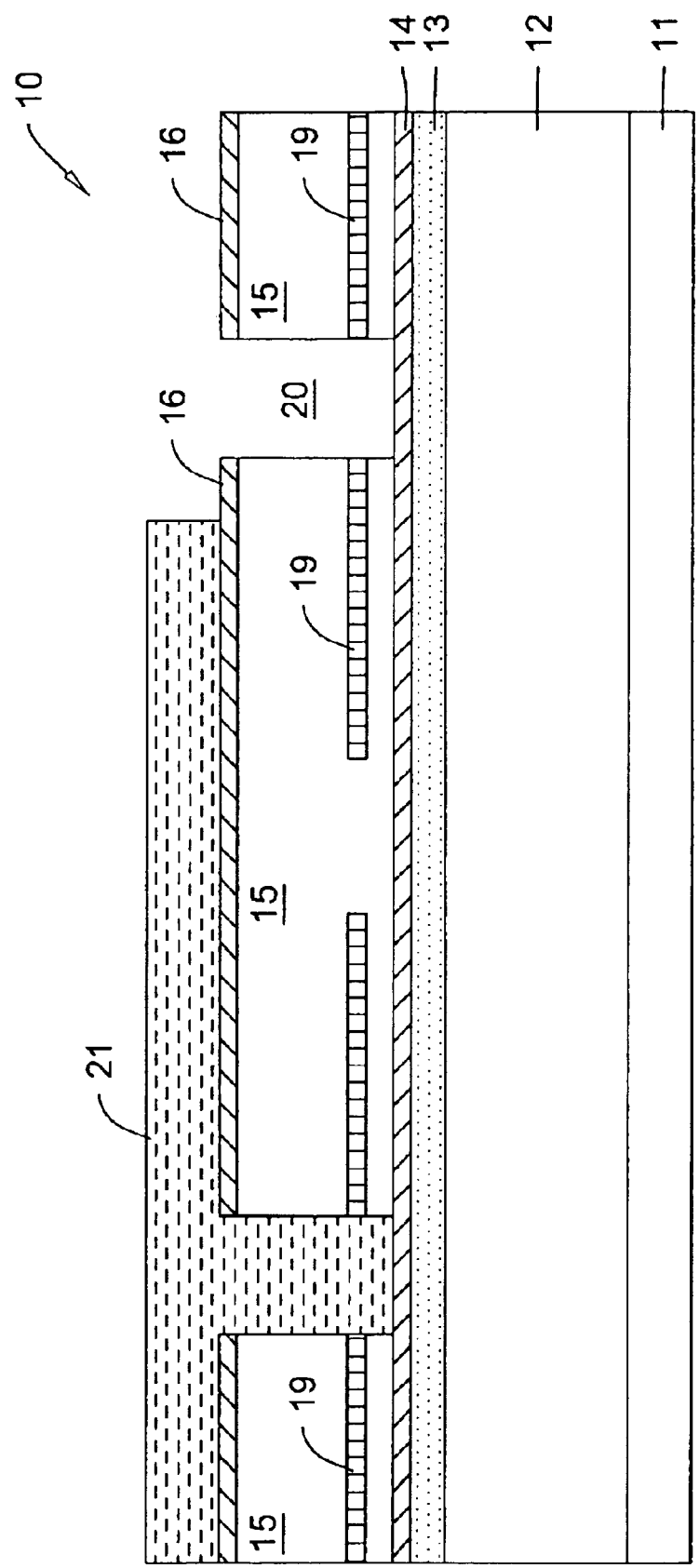

An isolation photo resist may be applied on portions of oxide layer 16 and in part of trench 20 as shown on the left side of FIG. 7. An ion implant 22 may be applied at area of trench 20. A multiple level ion implant may be performed and affect portions of the structure not covered by photo resist 21. Isolation ion implant 22 may affect portions of top mirror 15 on both sides of trench 20 on the right side of FIG. 8. At the bottom of that part of trench 20, ion implant 22 may affect active layer 14, contact layer 13 and may reach into a portion of bottom mirror 12 below trench 20. Photo resist 21 may be stripped as noted in FIG. 9.

Figure 10:
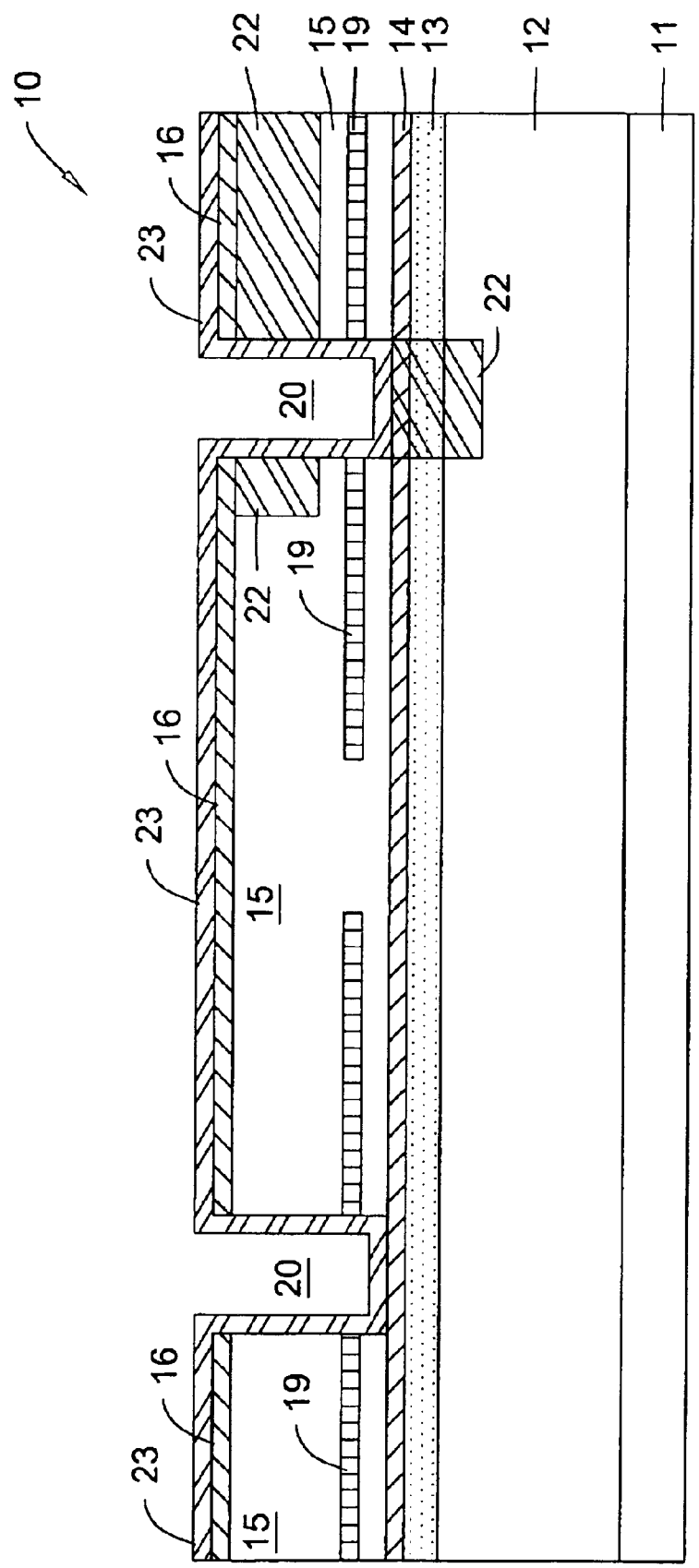
Figure 11:
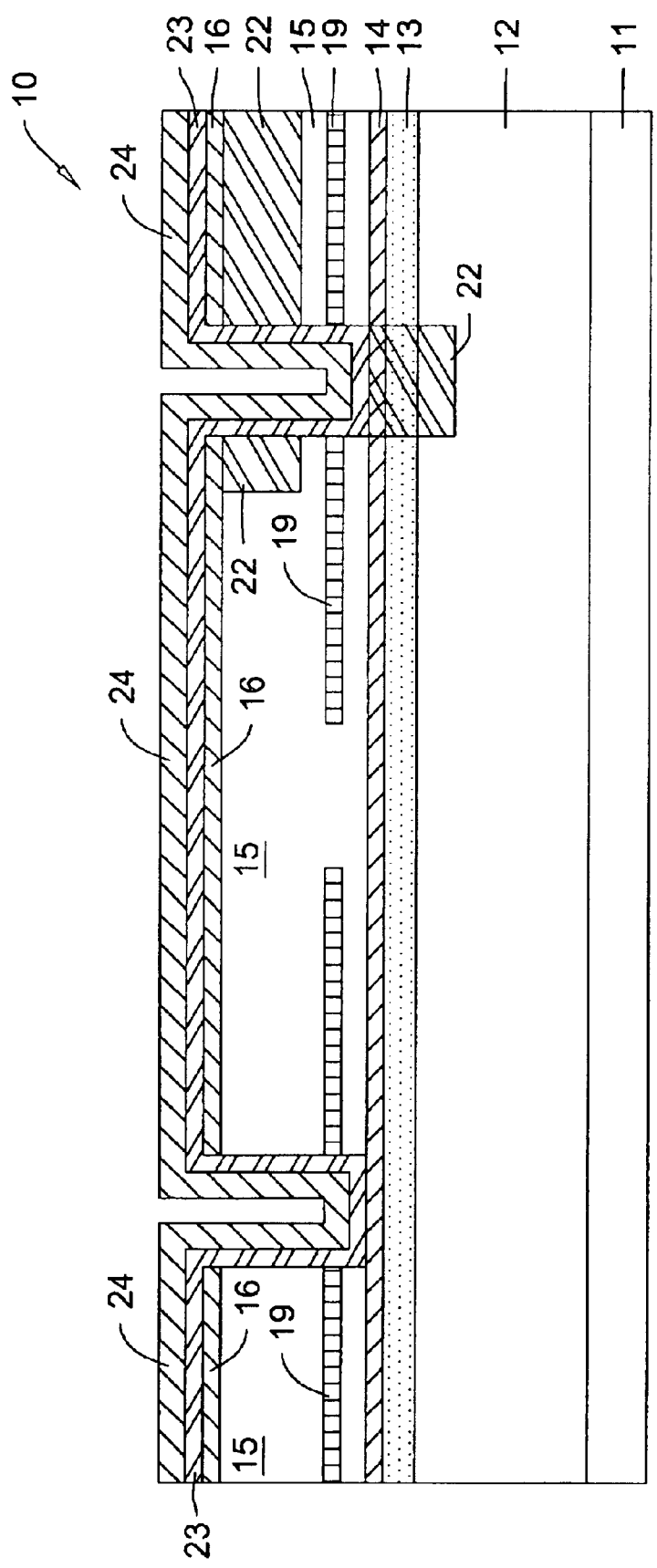

An about 0.5 micron thick layer of nitride 23 may be formed with PECVD on oxide layer 16 and on the sides and the bottom of trench 20, as illustrated in FIG. 10. An about one micron thickness of oxide 24 may be formed on nitride layer 23 in FIG. 11, using PECVD.

Figure 12:
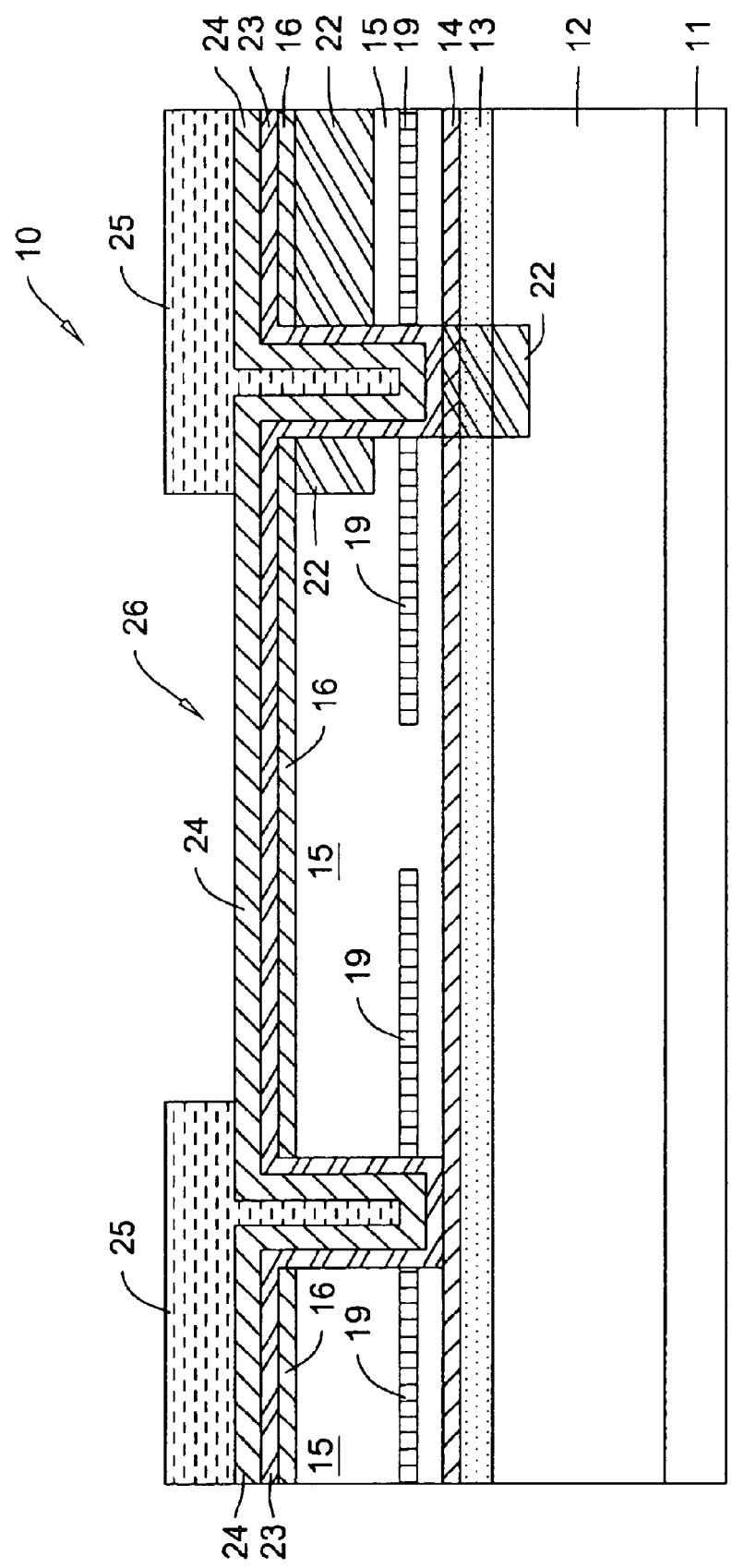
Figure 13:
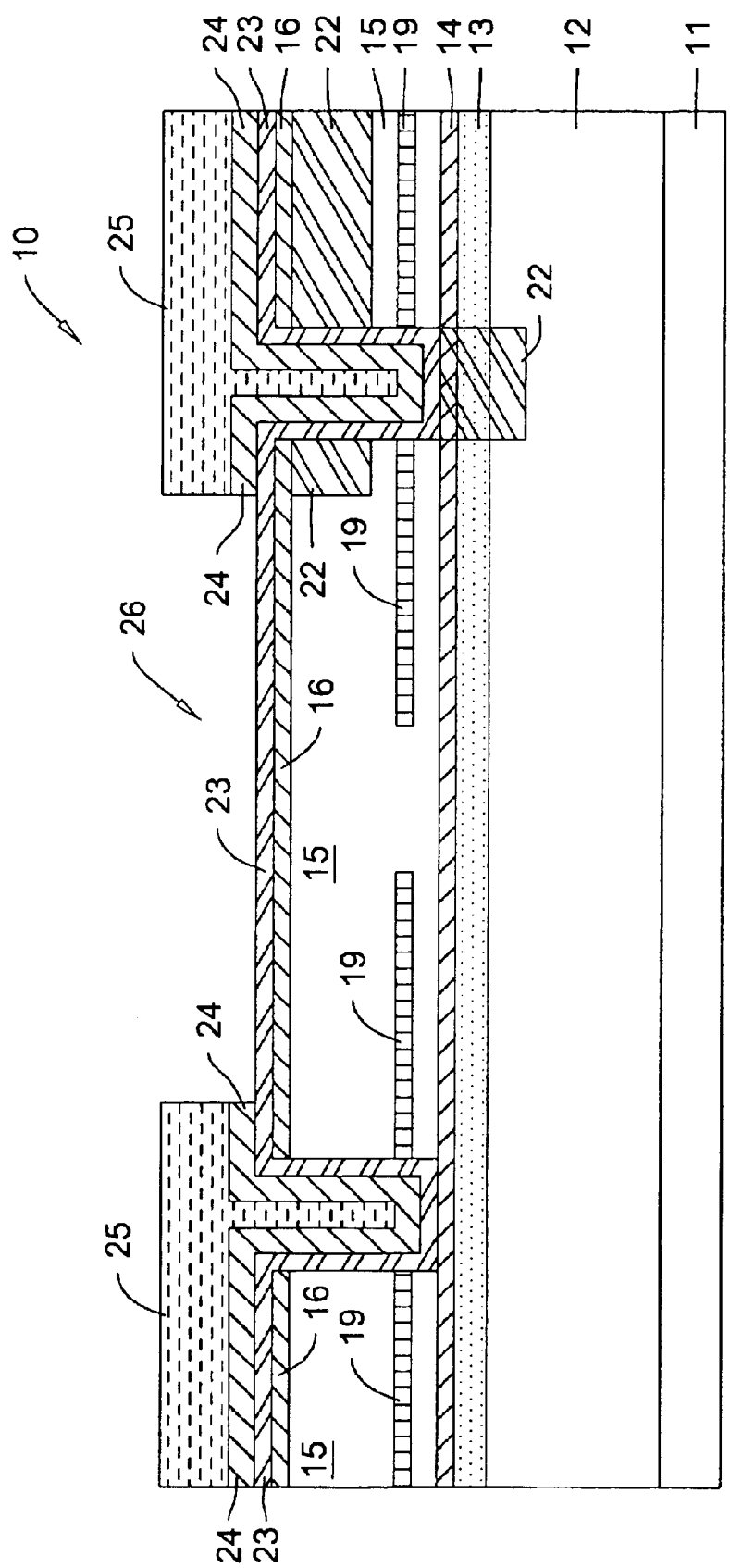
Figure 14:
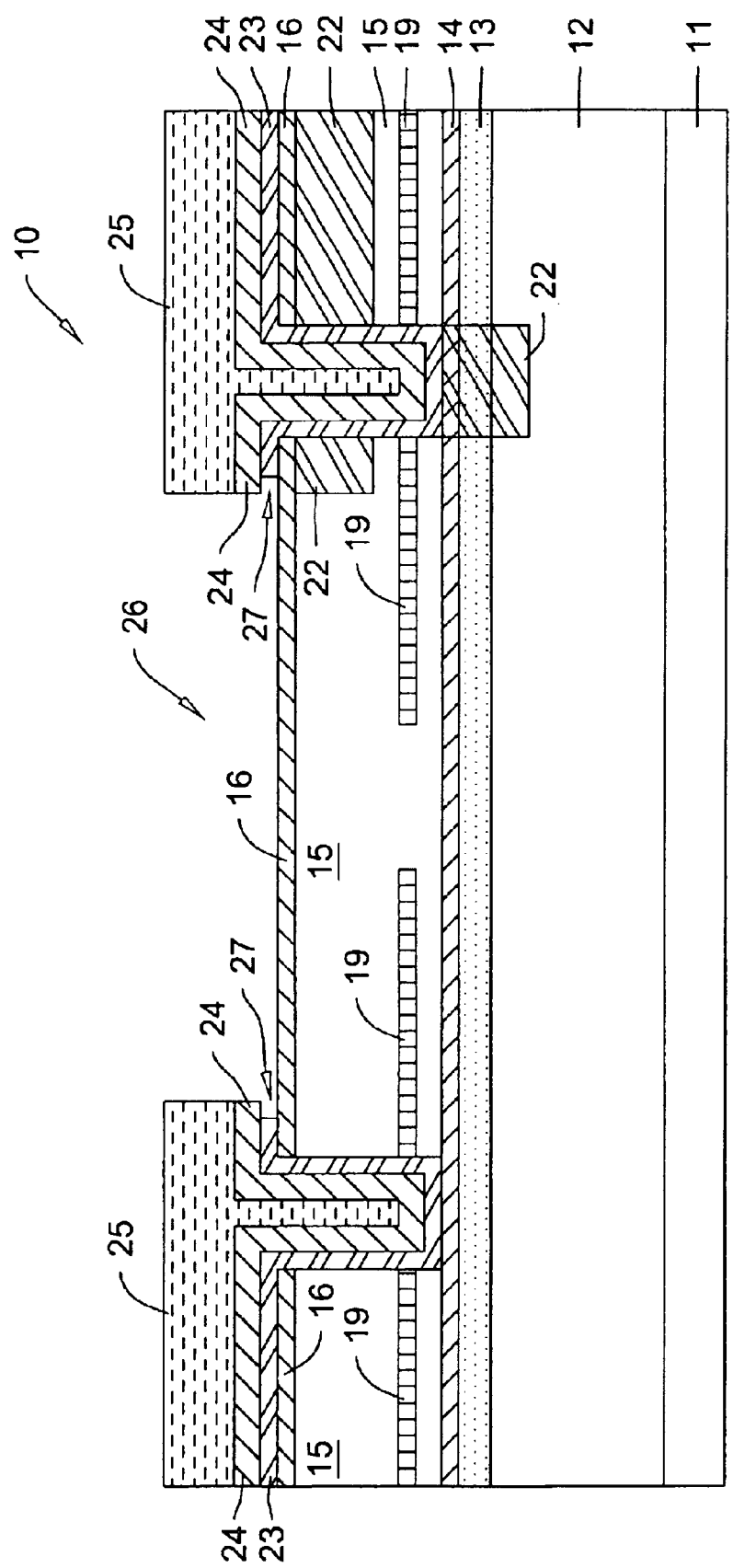
Figure 15:
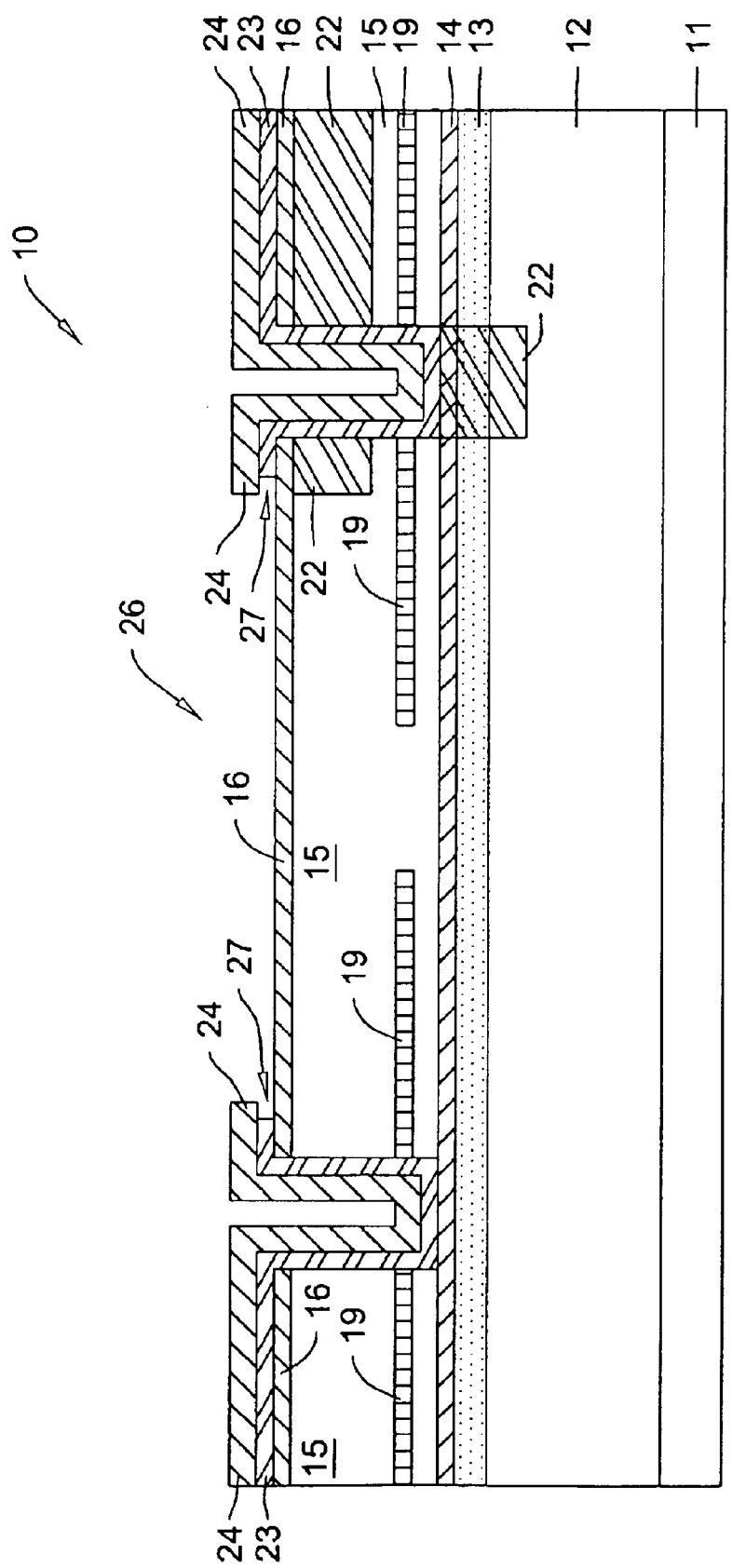

To form an aperture via (i.e., a hole or an opening), a photo resist 25 may be applied on portions of oxide layer 24, including those portions in trench 20, from an outer edge, or so, to a brief distance past trench 20 towards the center, but at a certain distance from the structure center which may be about equidistant from circular trench 20. This may result in an opening 26 in photo resist 25 situated at the center of the structure, as shown in FIG. 12. In FIG. 13, oxide layer 24 in opening 26 may be removed with a LAM etch. This etch tends not to remove nitride layer 23. A selective etch may be used to remove the portion of the nitride layer 23 in opening 26 with a slight under cut 27, which may be optional, below oxide layer 24, as shown in FIG. 14. This etch may stop at oxide layer 16 since it is selective to the nitride and during this period of etching does not affect oxide layer 16 or oxide layer 24. Photo resist 25 may be stripped from the structure, as indicated in FIG. 15.

Figure 16:
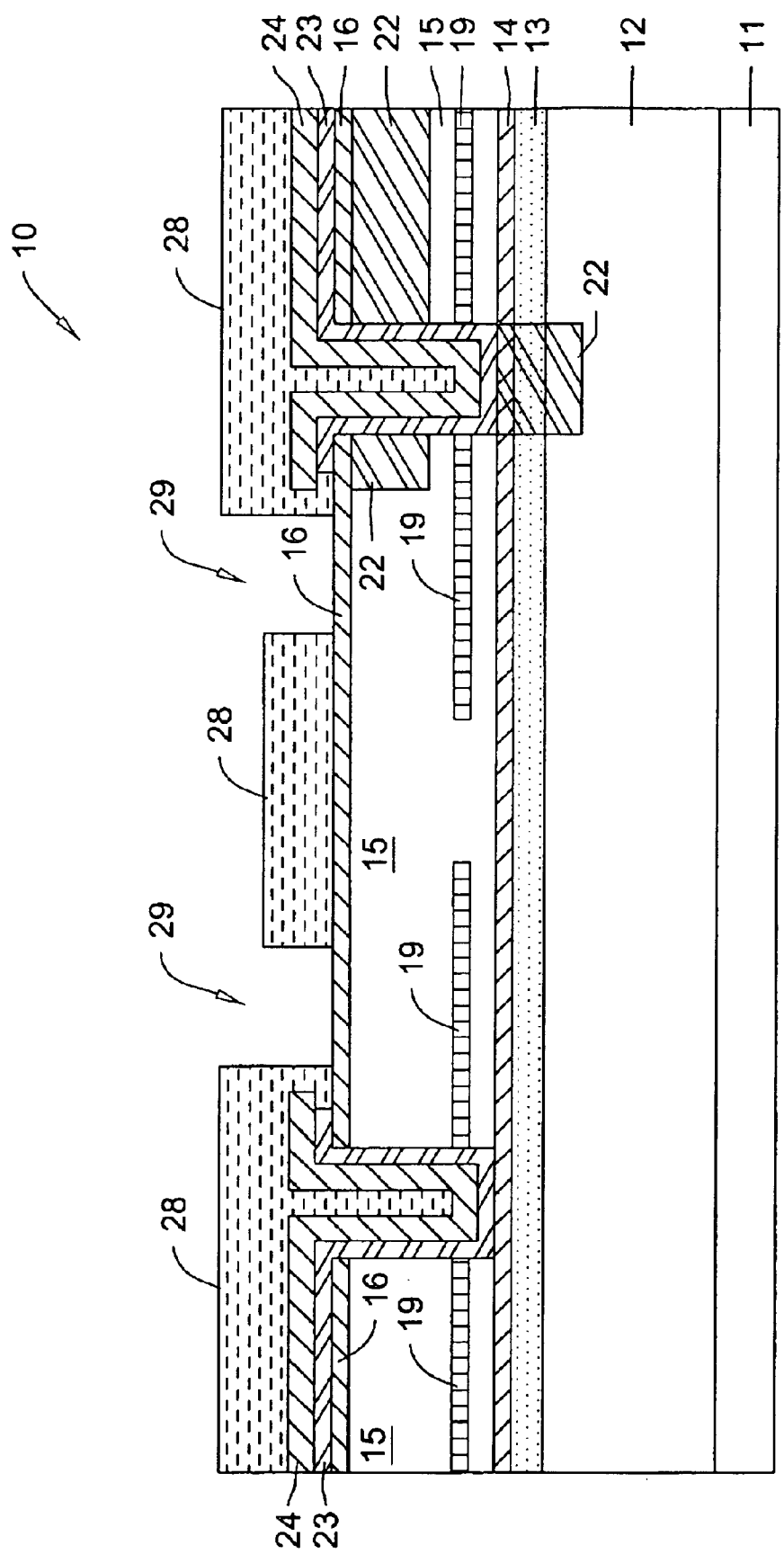
Figure 17:
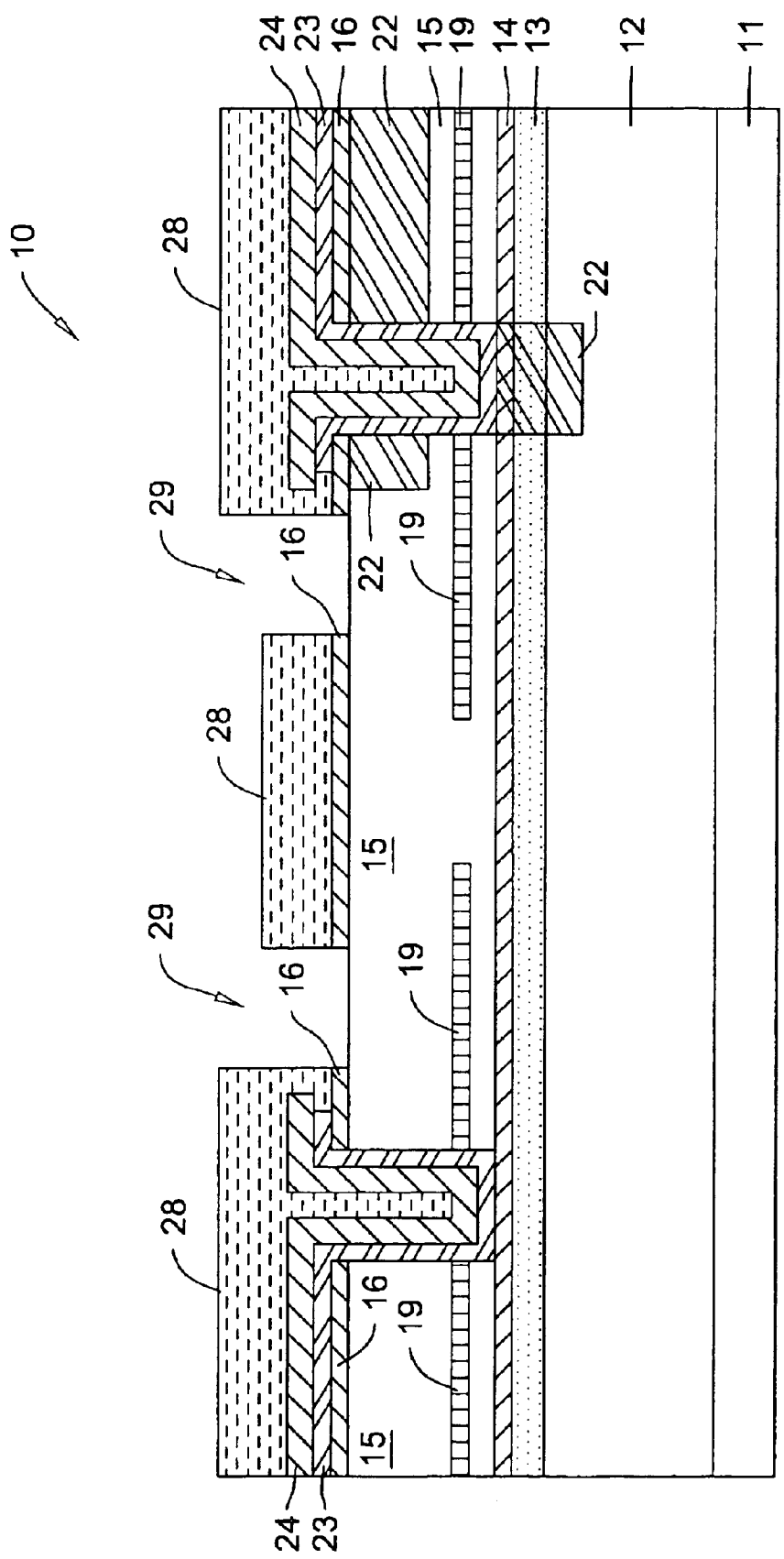
Figure 18:
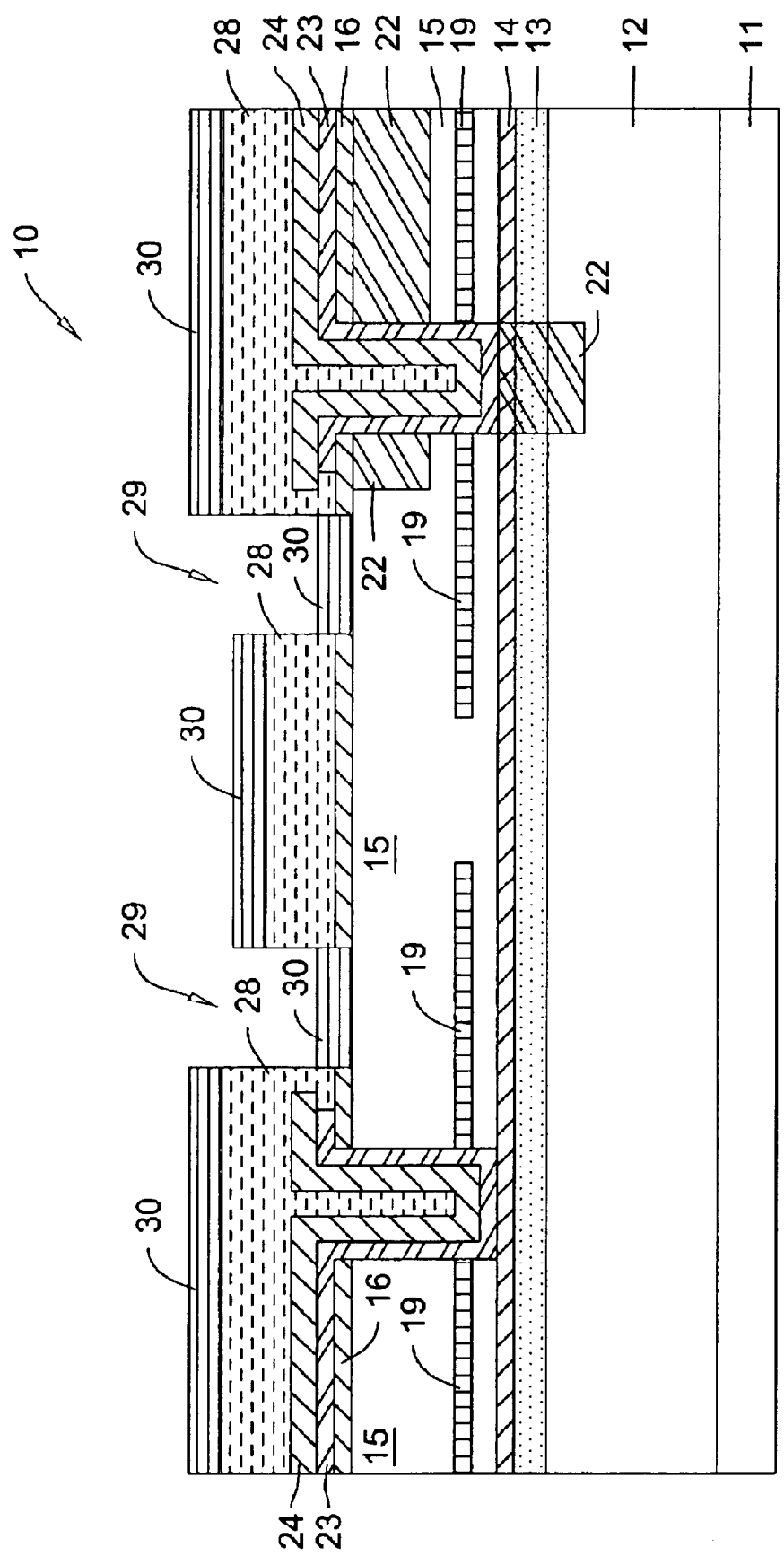
Figure 19:
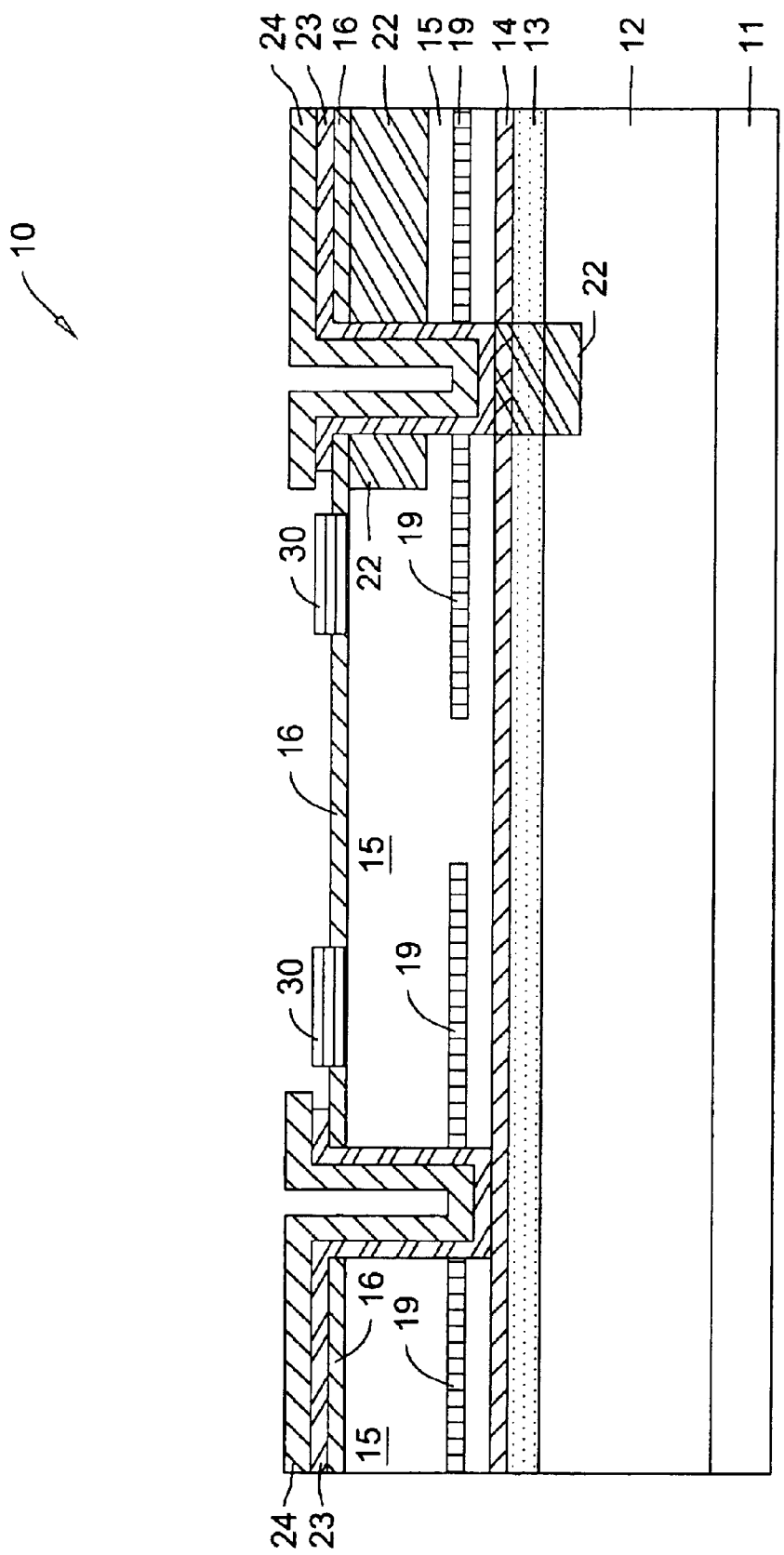

Another photo resist 28, having a pattern with an opening 29 having a shape of a closed loop or circle for a contact via, may be applied on the structure in FIG. 16. A LAM etch may be applied through opening 29 to remove an exposed portion of layer oxide layer 16. This portion of oxide layer 16 is shown removed down to top mirror 15 in FIG. 17. Next a buffered oxide etch may be applied, having an effect not shown. A layer 30 of AuGe/Au may be e-beam deposited on exposed surfaces of top mirror 15 and photo resist 28, as indicated in FIG. 18. A strip and liftoff may be applied to photo resist 28 along with metal layer 30 formed on the photo resist. The result is shown by FIG. 19. Remaining metal layer 30 may be an electrical contact for the resulting device of the structure. Next, metal layer 30 may be annealed.

Figure 20:
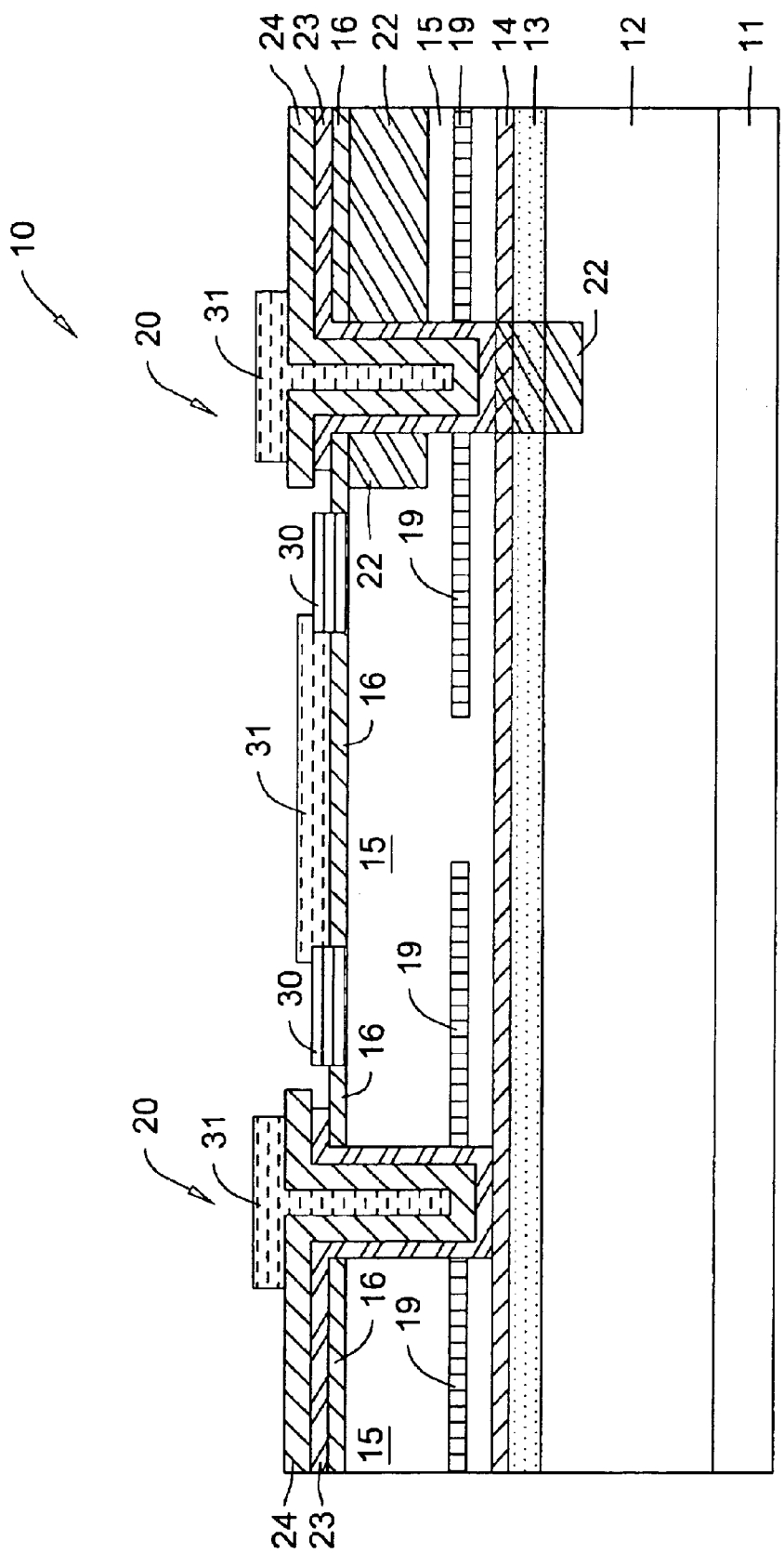
Figure 21:
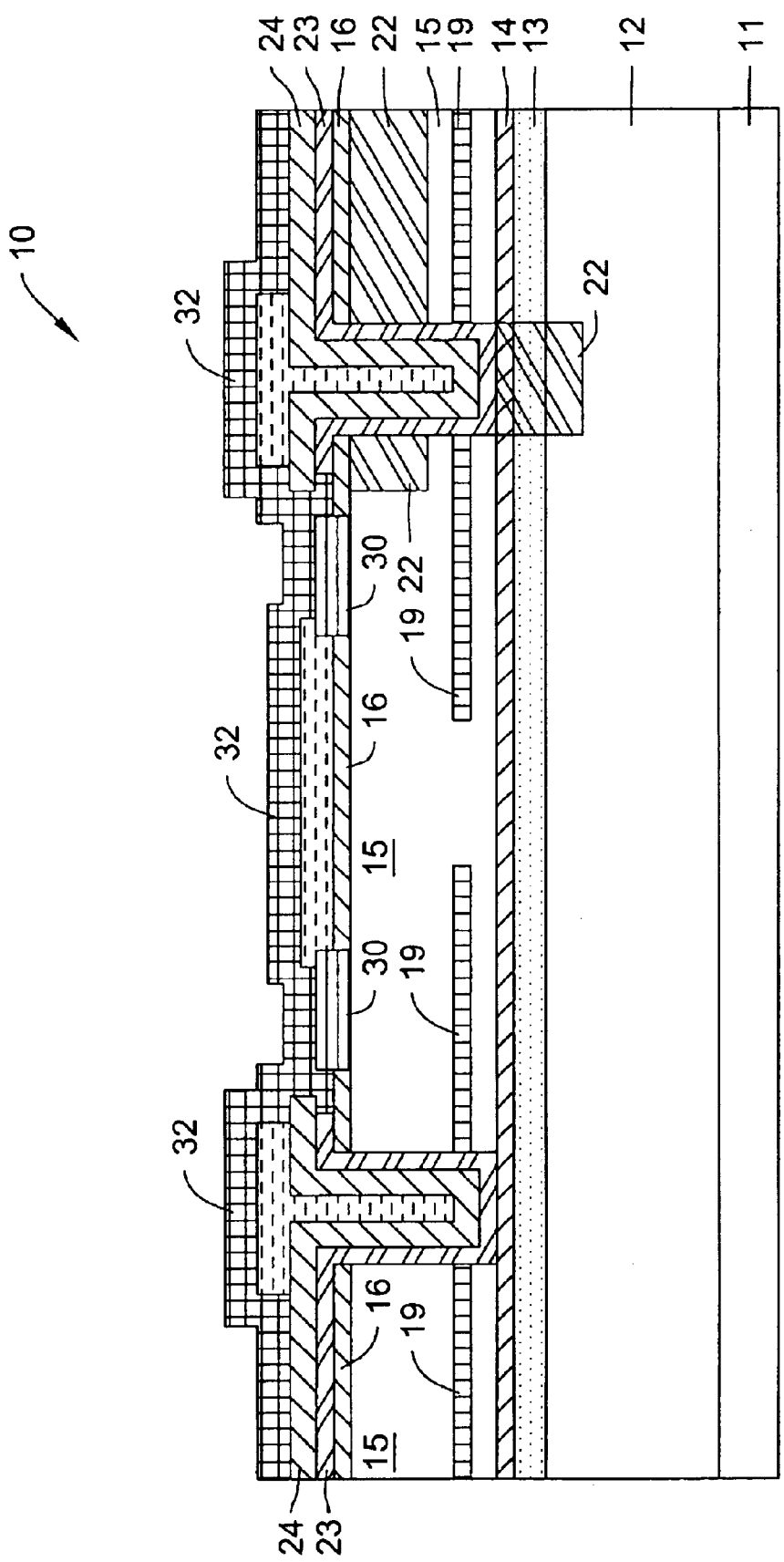

In FIG. 20, photo resist layer 31 portions may be applied for eventual forming of a metal air bridge over trench 20 to connect metal layer 30 or electrical contact to a terminal external to the internal confines of trench 20. FIG. 21 shows a layer 32 on the structure as a result of sputter deposition of TiW/Au/Ti.

Figure 22:
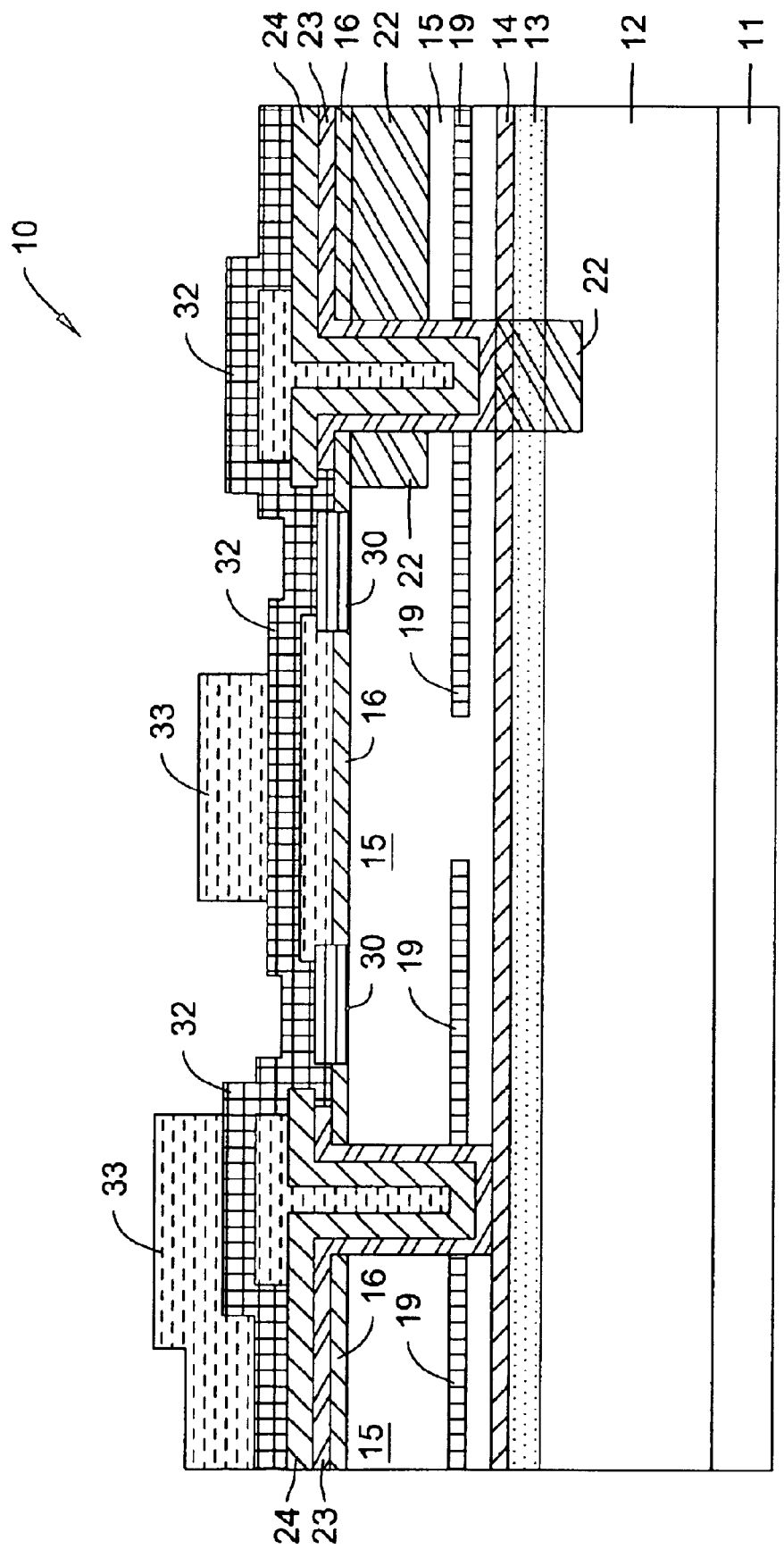
Figure 23:
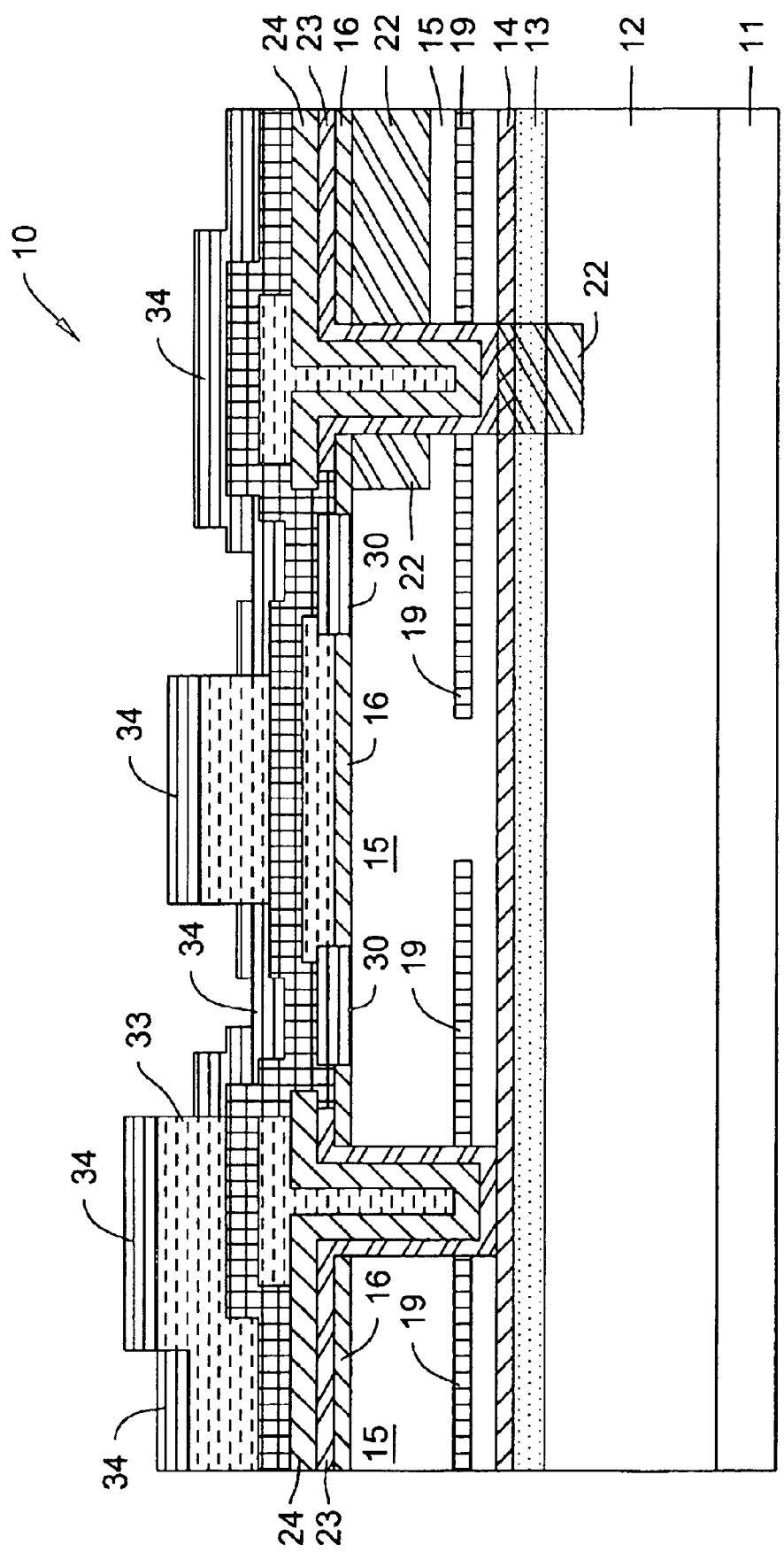
Figure 24:
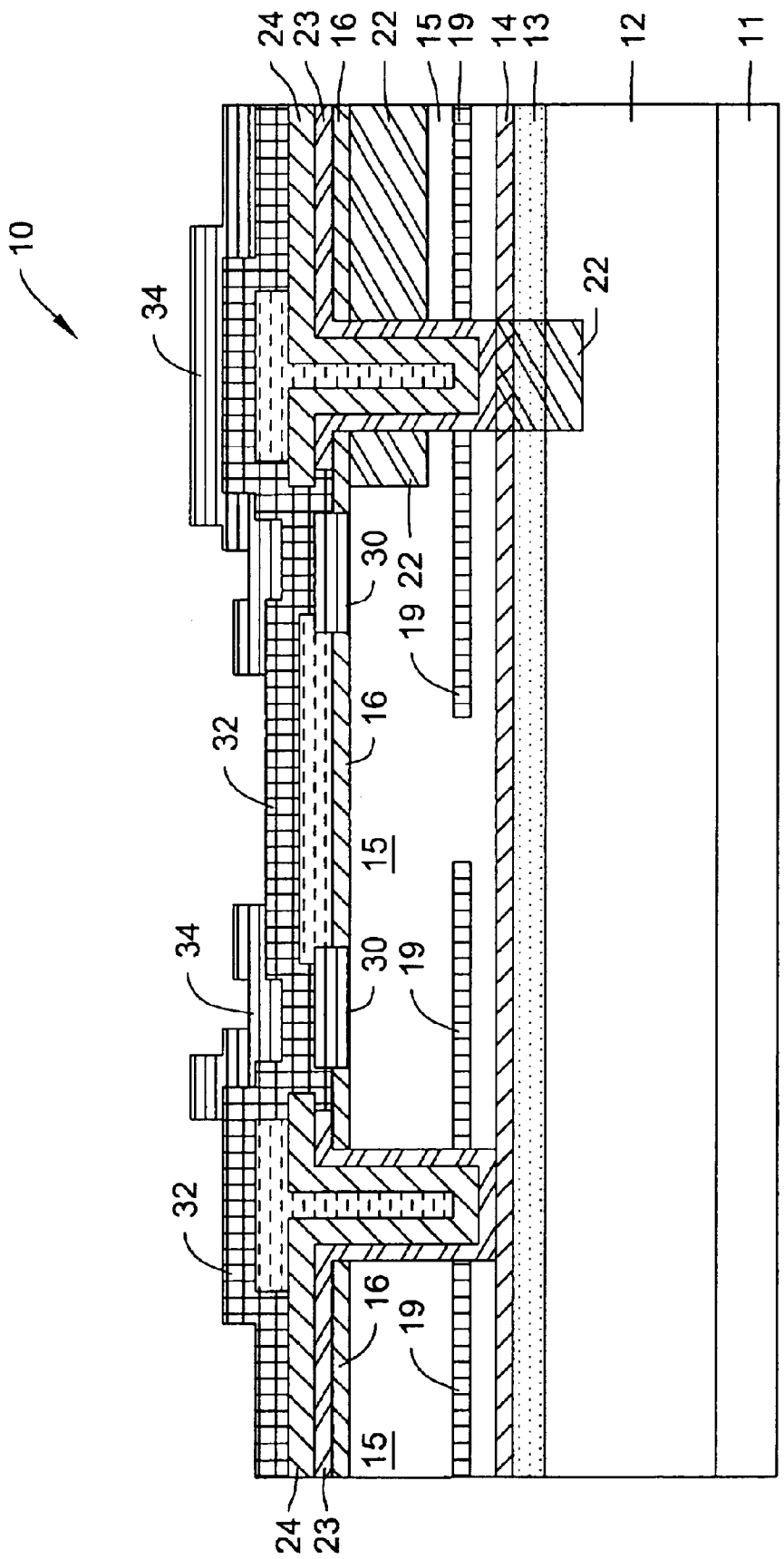
Figure 25:
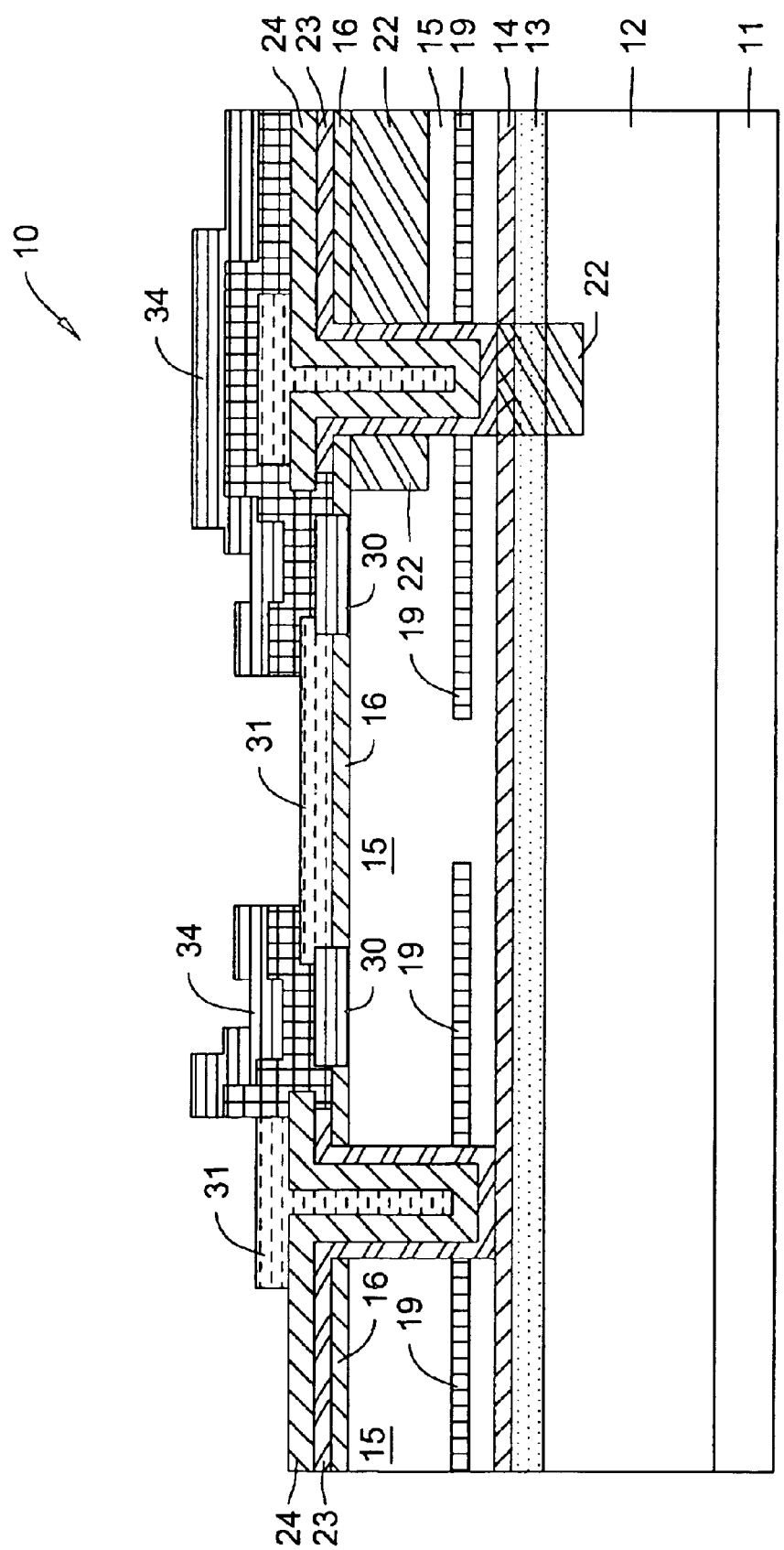
Figure 26:
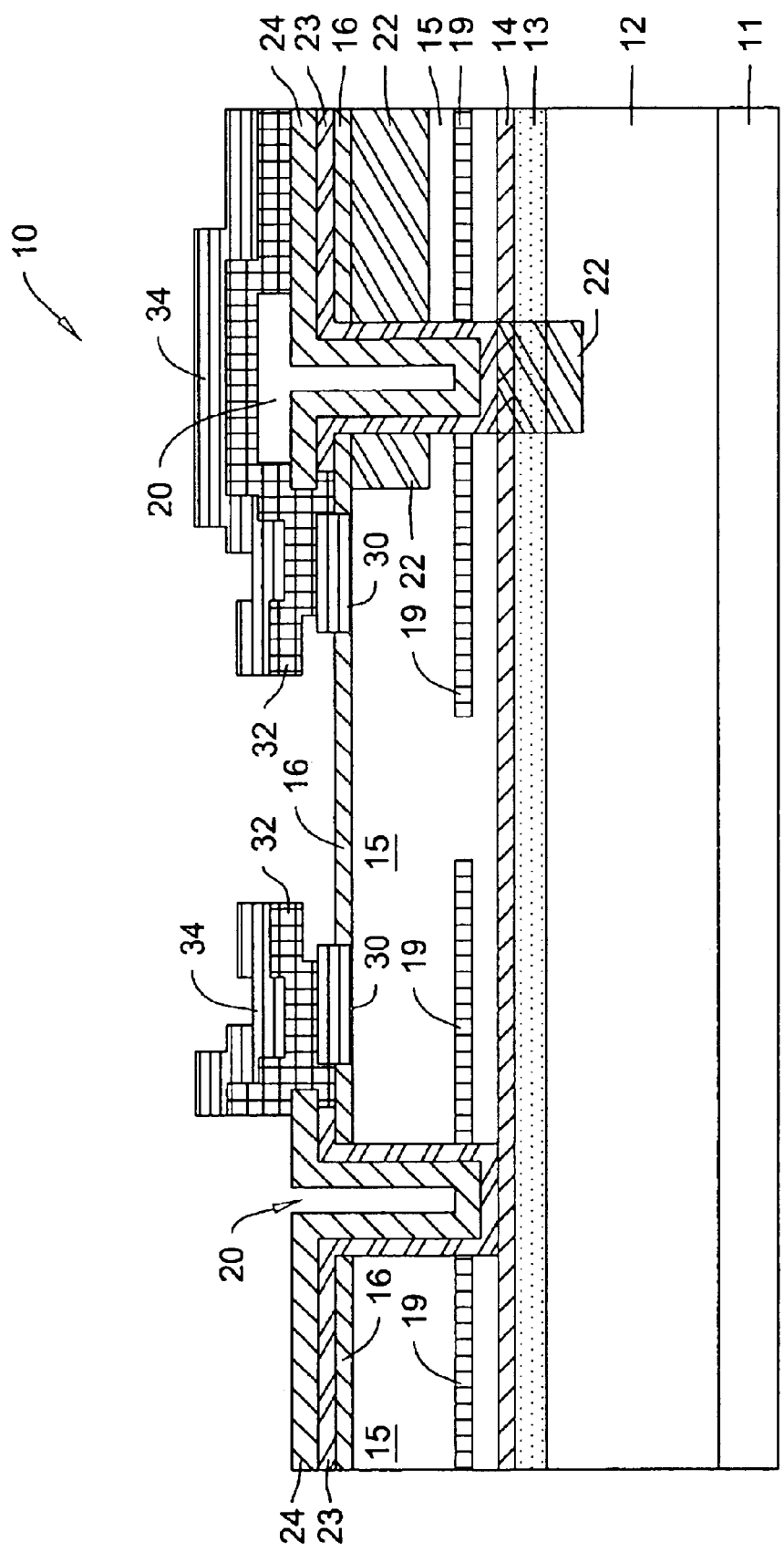

In FIG. 22, a photo resist layer 33 with a pattern for bond metal may be applied. Then, a BHF (buffered hydrofluoric acid) etch of Ti may be done on layer 32. The effect is not shown in FIG. 22. FIG. 23 illustrates an electroplating a layer 34 of Au on the structure in areas not covered by photo resist 33. Then in FIG. 24, the stripping of photo resist 33 may be made from the structure. Then a BHF etch of Ti may be done. The effect is not shown in FIG. 24. The Au and TiW of layer 32 may be subjected to an ion mill, the removal of those exposed portions of layer 32 are apparent in FIG. 25. In FIG. 26, photo resist 31 in and above trench 20 may be removed.

Figure 27:
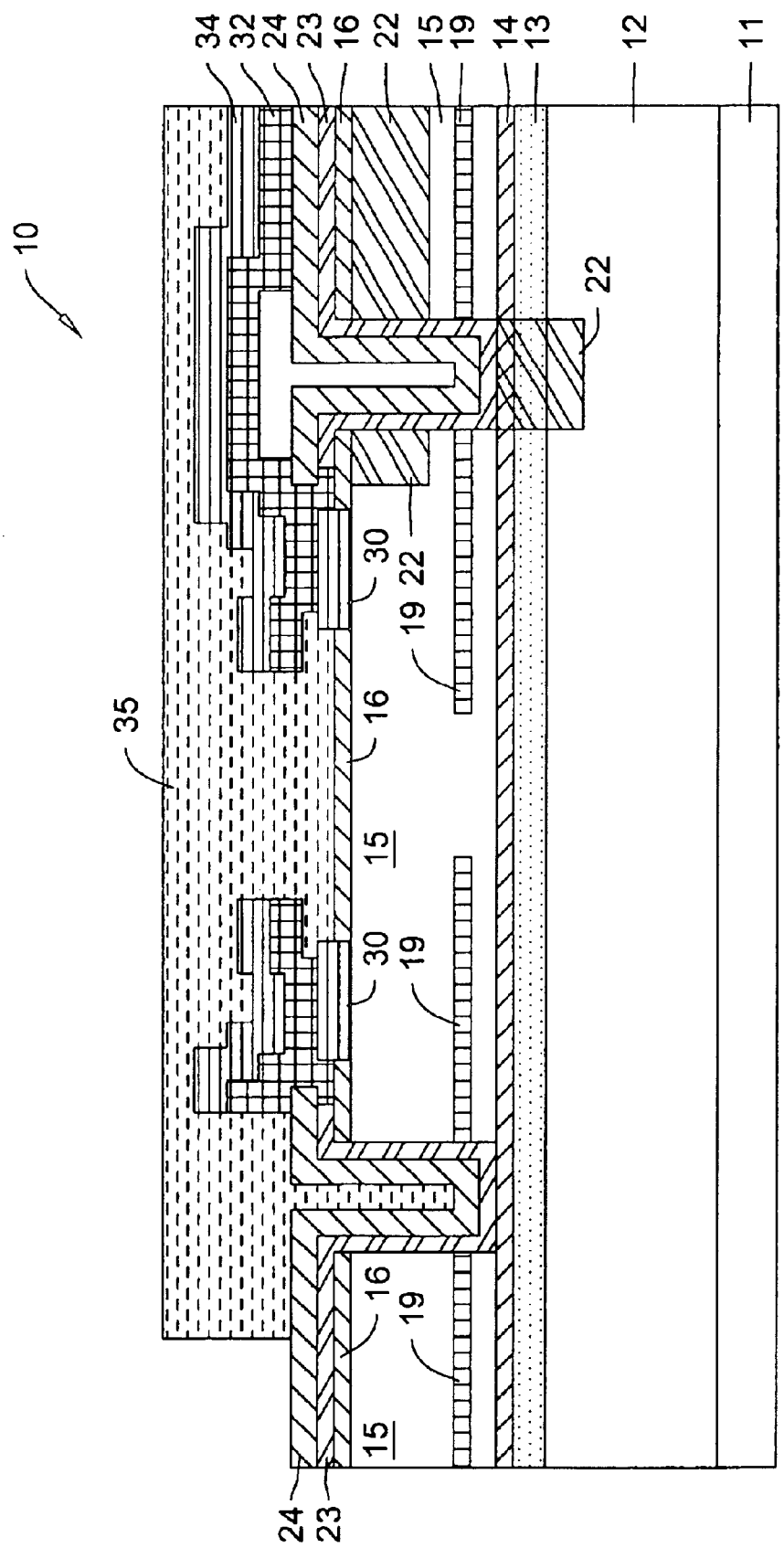
Figure 28:
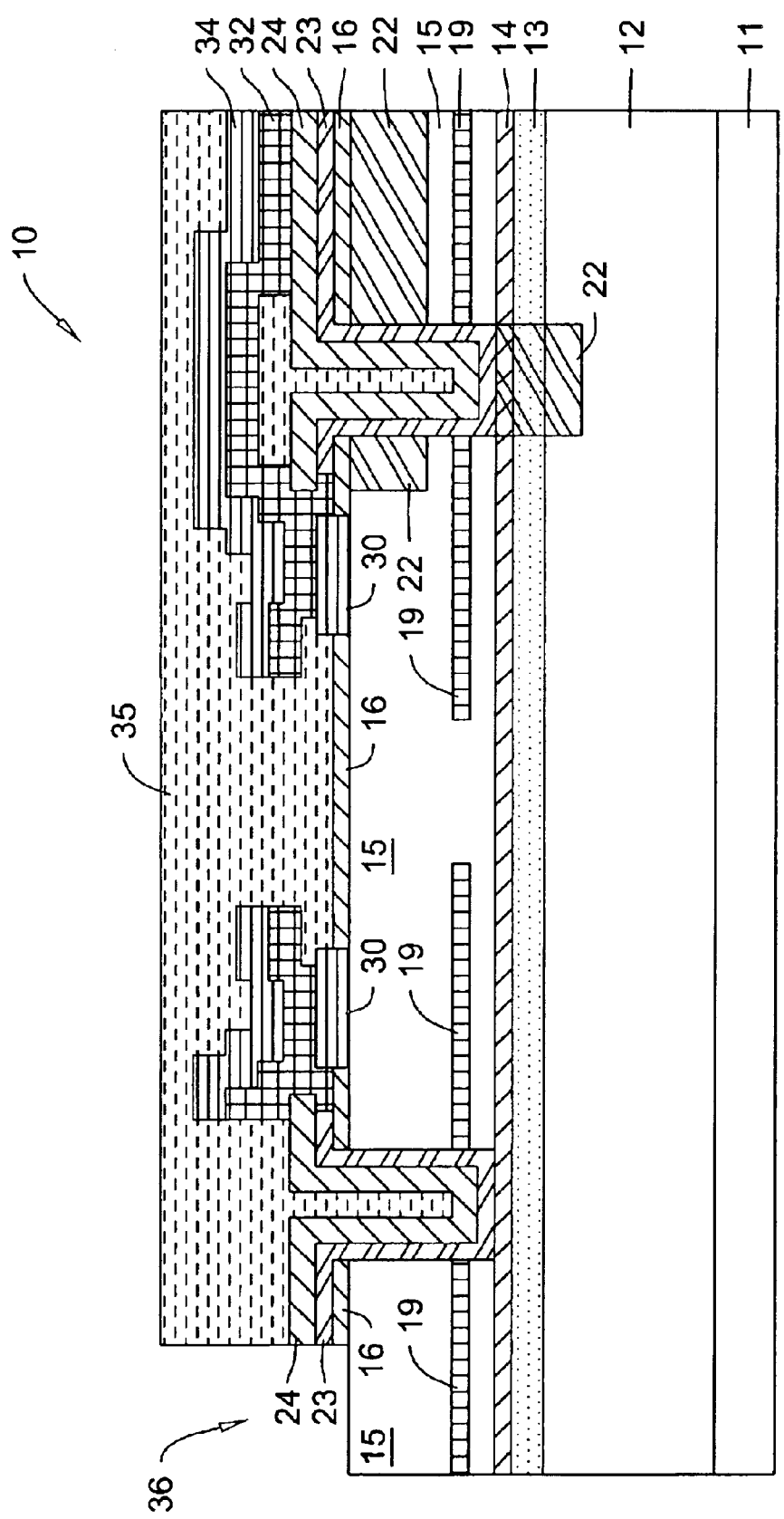
Figure 29:
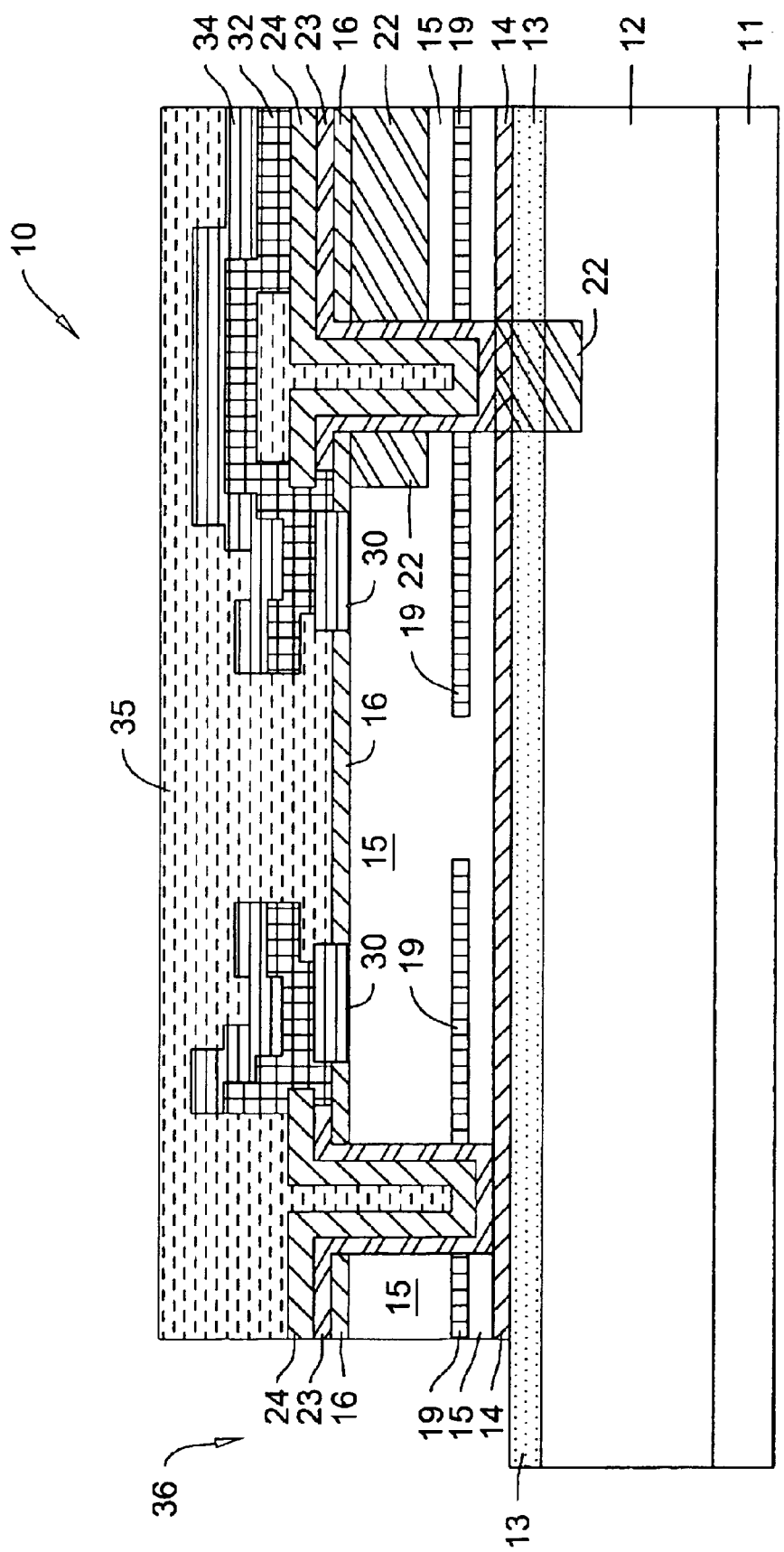
Figure 30:
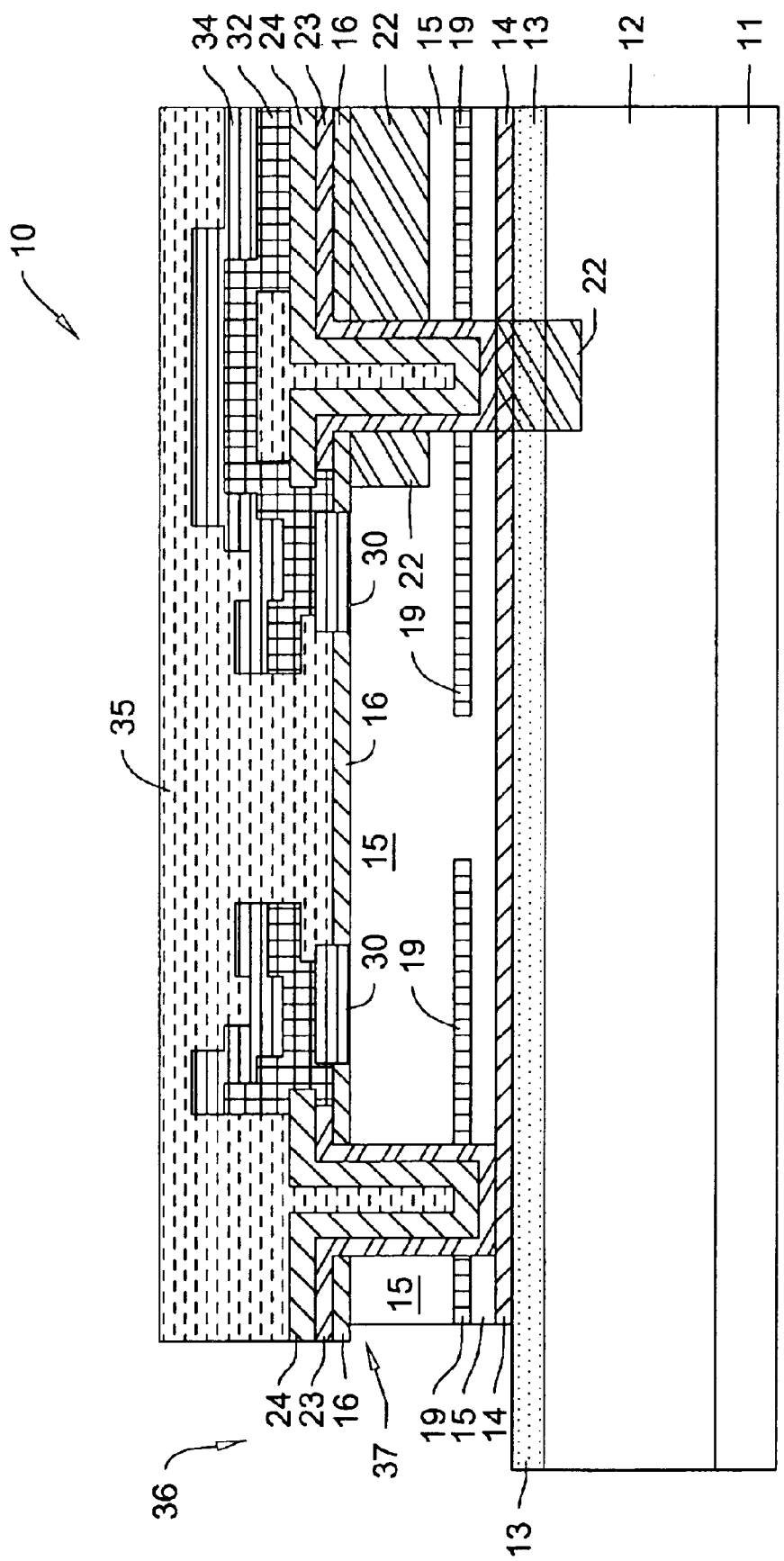
Figure 31:
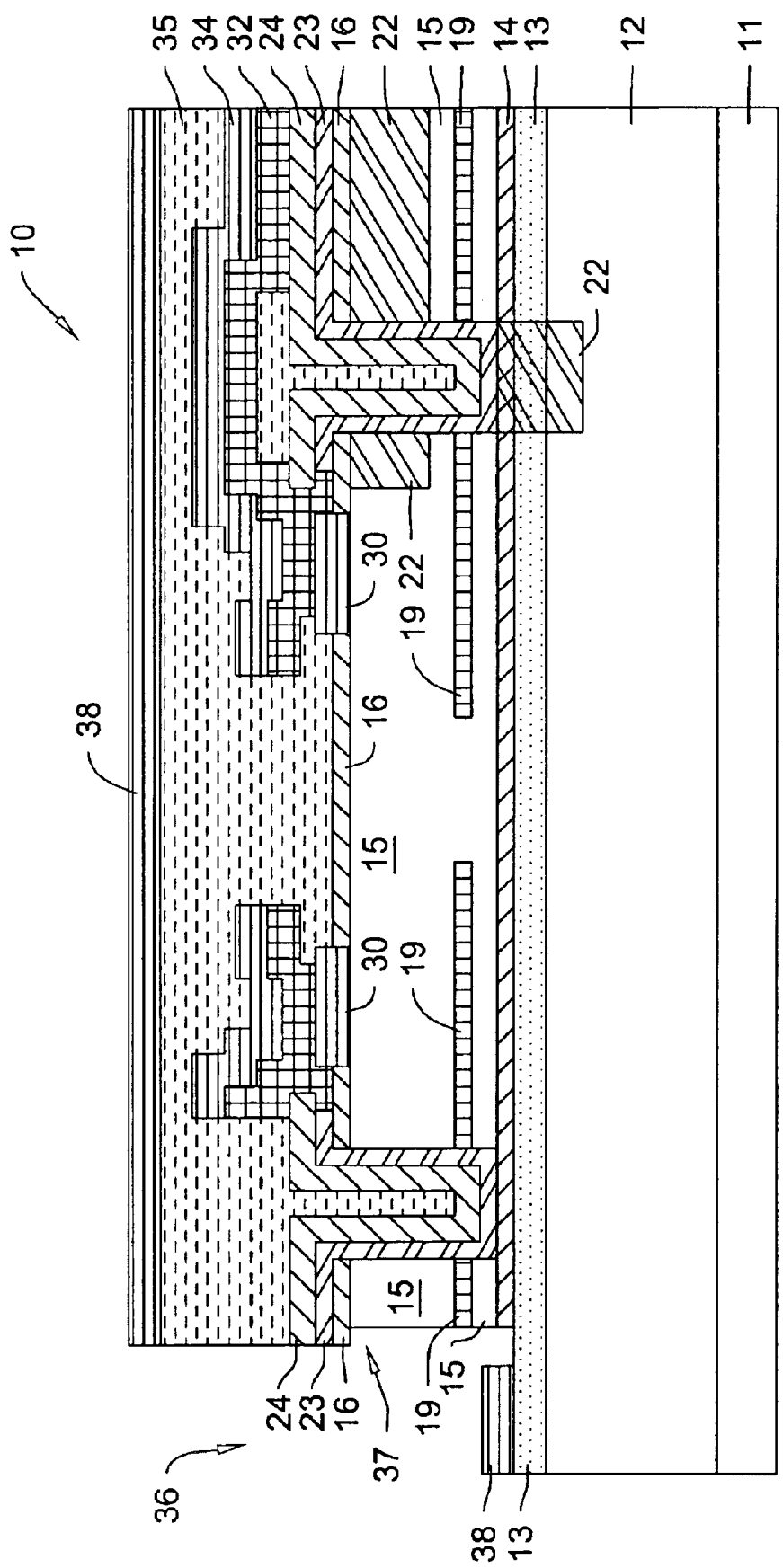
Figure 32:
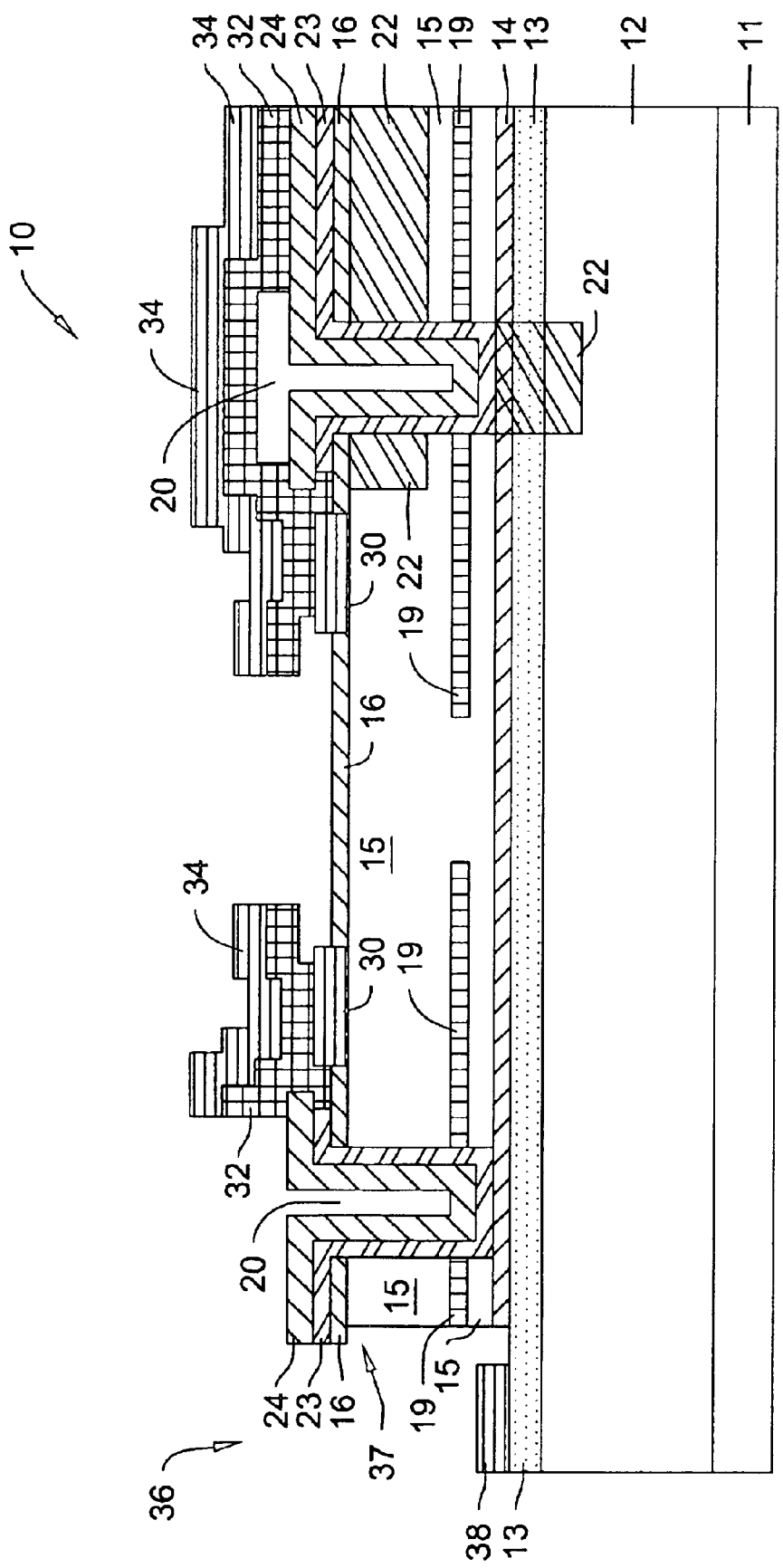
Figure 33:
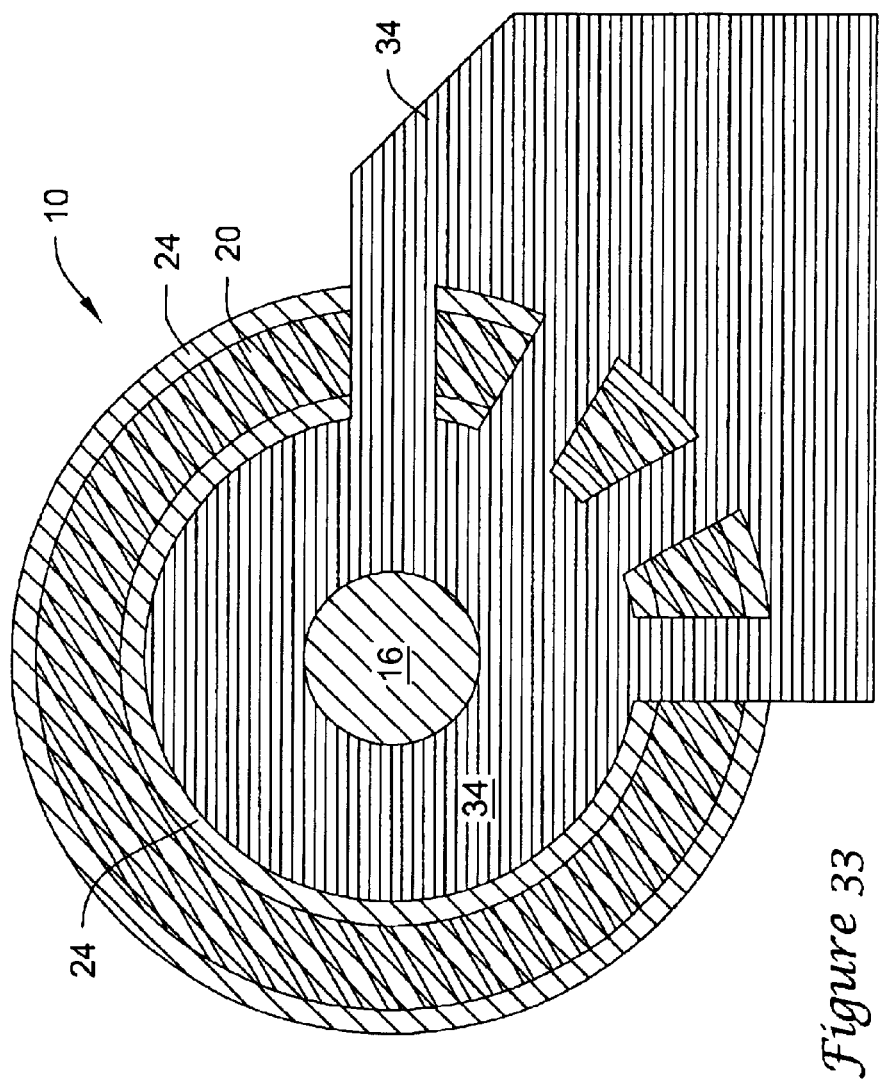

FIG. 27 shows an application of a photo resist 35 for a planned etching of a place for a coplanar contact. A LAM etch may be effected to remove a portion of oxide layer 24, nitride layer 23 and oxide layer 16, in that order, in an area 36 not covered by photo resist 35, as illustrated in FIG. 28. An ICP or wet etch (S/C) may be effected for removing a portion of top mirror 15 and active region 14 in the same area 36 not covered by photo resist 35. The absence of portions of mirror 15 and region 14 are apparent in FIG. 29. Next, a wet etch may be used to do an under cut 37 (S/C) below oxide layer 16, mirror 15 and active region 14, as shown in FIG. 30. An e-beam deposition of a layer 38 of AuGe/Au material may be applied to a potion of intra cavity contact layer 13. Open area 36 of photo resist 35 may permit such deposition on layer 13 and photo resist 35 may prevent layer 38 from being put on the main structure by receiving a portion of layer 38, as FIG. 31 illustrates. Layer 38 on contact layer 13 may become the other electrical (coplanar) contact for the structure. Under cut 37 may prevent layer 38 from contacting top mirror 15 and active region 14 upon a deposition of the conductive material for layer 38. Photo resist 35 and layer 38 on the photo resist may be stripped and removed from the structure, as shown in FIG. 32. The remaining portion of layer 38 may be regarded as contact 38. The alloy of contact 38 may be annealed which is not illustrated in FIG. 32. FIG. 32 shows the resulting structure of the above-described process. FIG. 33 is a top view of a VCSEL structure 10 with wide trench 20 and an intra cavity.

Figure 34:
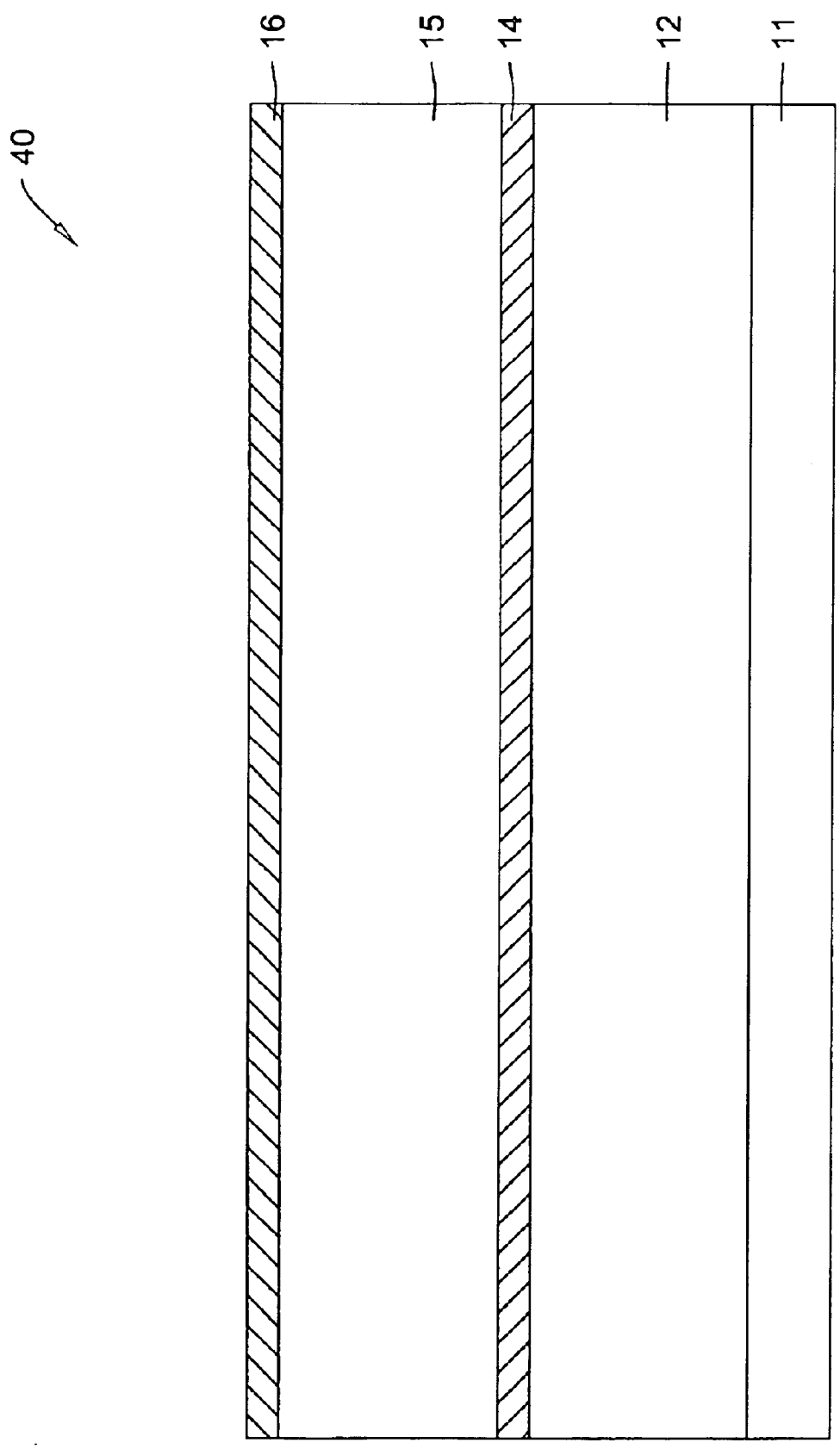
FIGS. 34–53 show a process for making a laser structure having a contact bridge over a narrow trench on a planarized dielectric and a backside contact.
Figure 35:
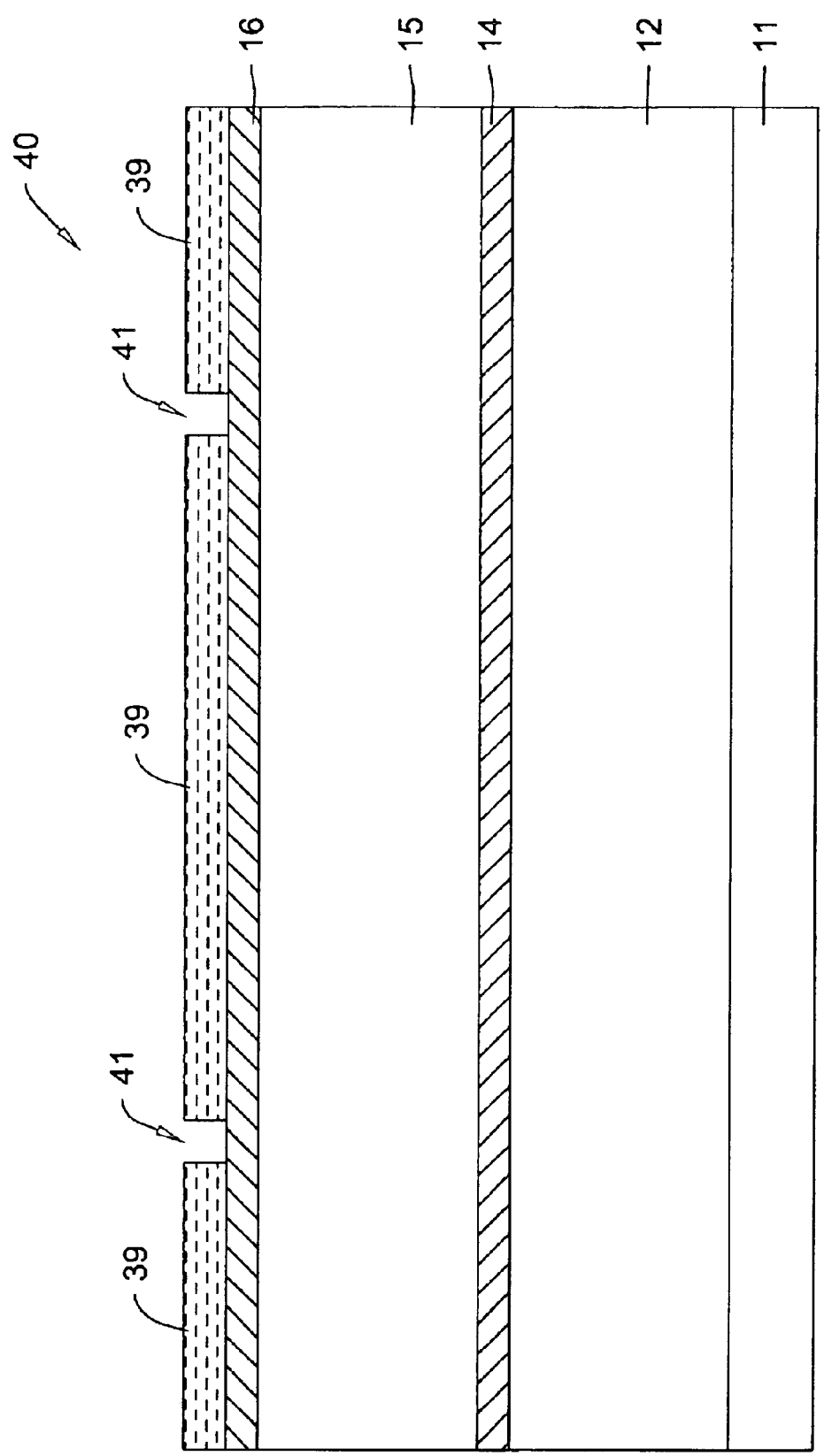
Figure 36:
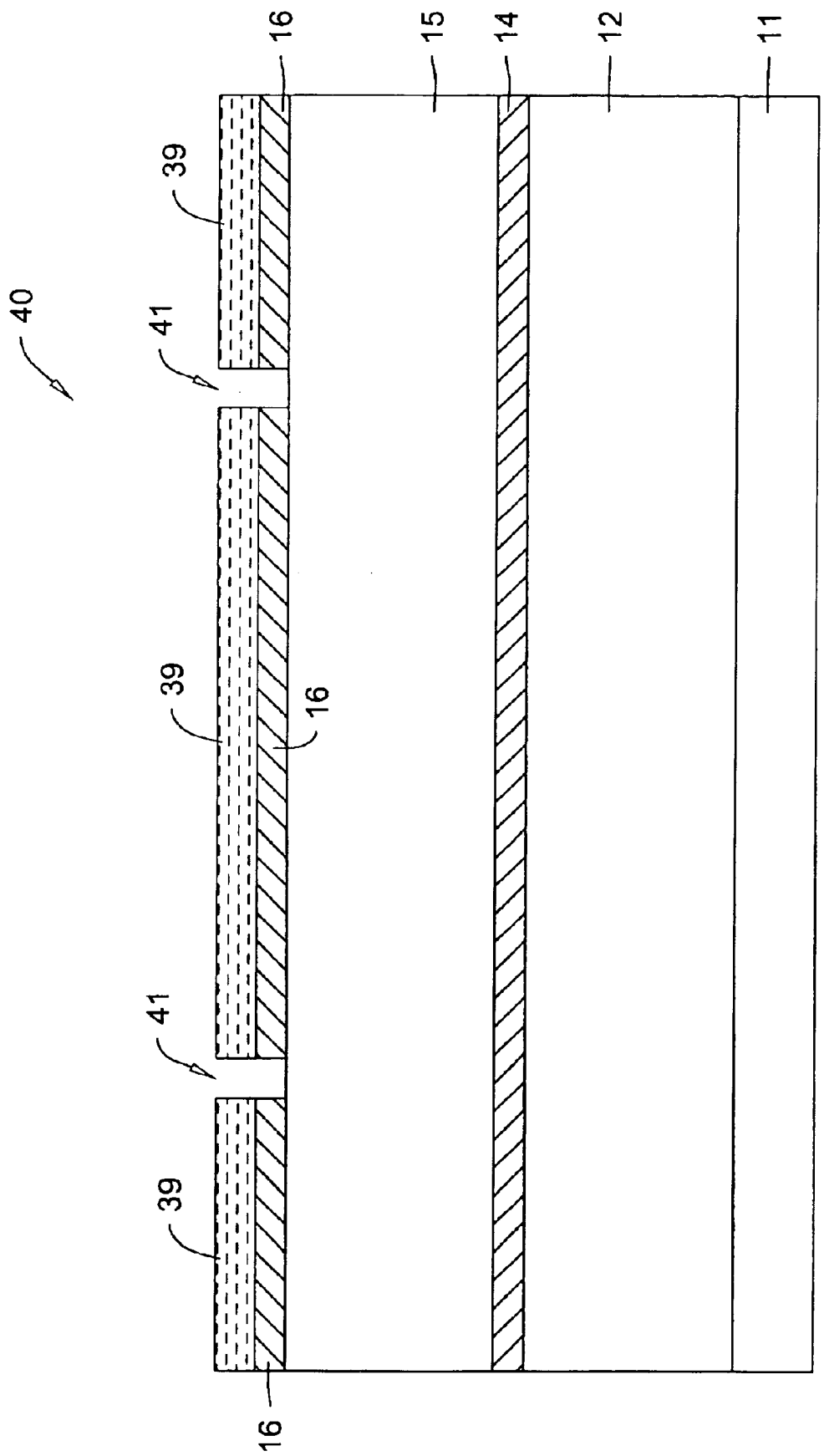
Figure 37:
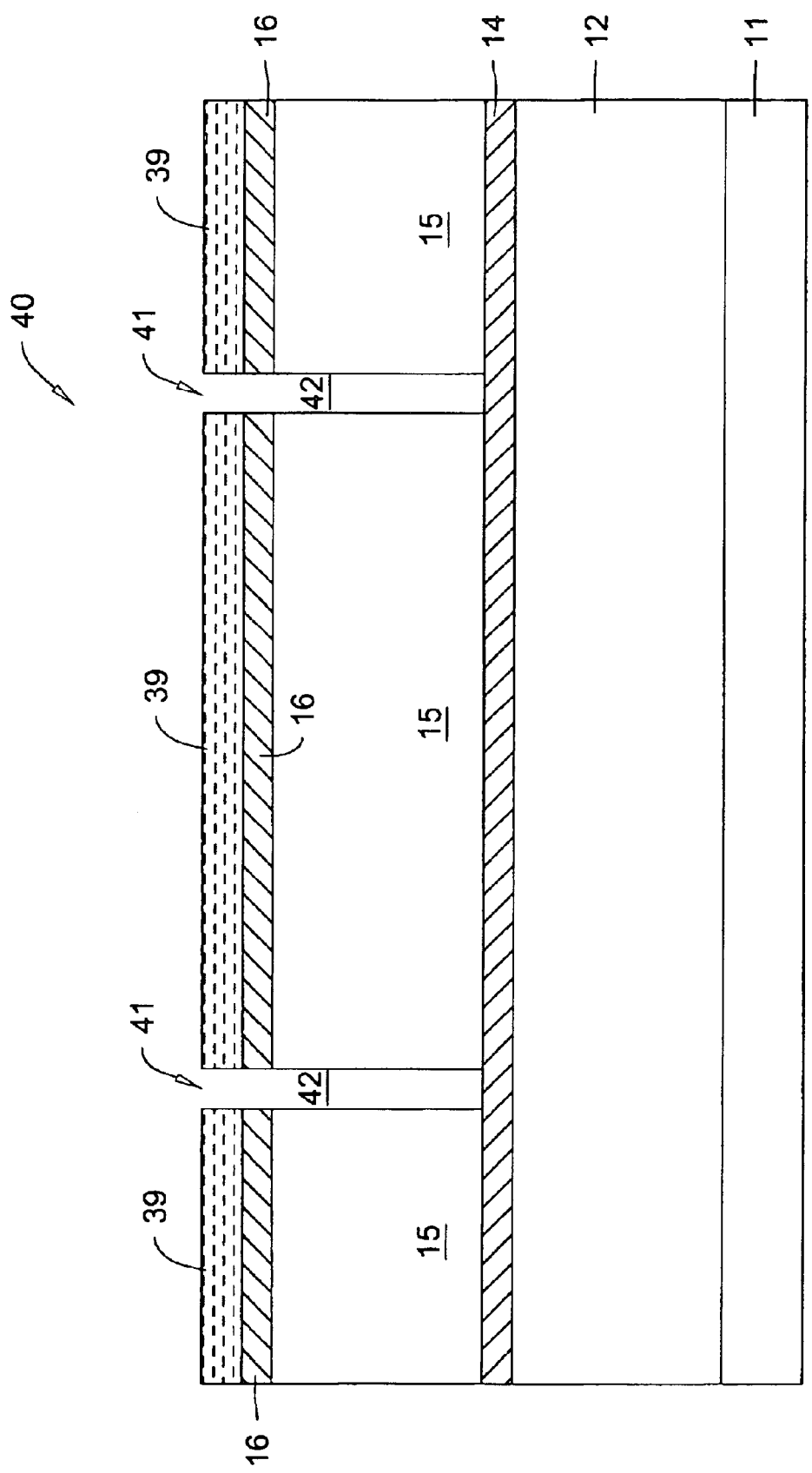

Another process may involve dielectric planarization, no Fetch (filter etch), a thin trench and a thick pad dielectric. FIG. 34 shows a basic starting structure 40 of a VCSEL having a bottom DBR mirror 12 on a substrate 11, an active region or layer 14 on mirror 12, and a top DBR mirror 15 on active layer 14. A one-half wavelength thick oxide layer 16 may be formed on mirror 15 with PECVD, as shown in FIG. 34. A photo resist layer 39 with a thin trench spoke and torus pattern for etching a trench in oxide 16 and mirror 15 may be applied on oxide layer 16 as in FIG. 35. Layer 39 may have an opening 41 for etching the trench. FIG. 36 shows the etched oxide layer through opening 41. Trench 42 may be ICP etched down to active layer 14 through opening 41, as shown in FIG. 37.

Figure 8:
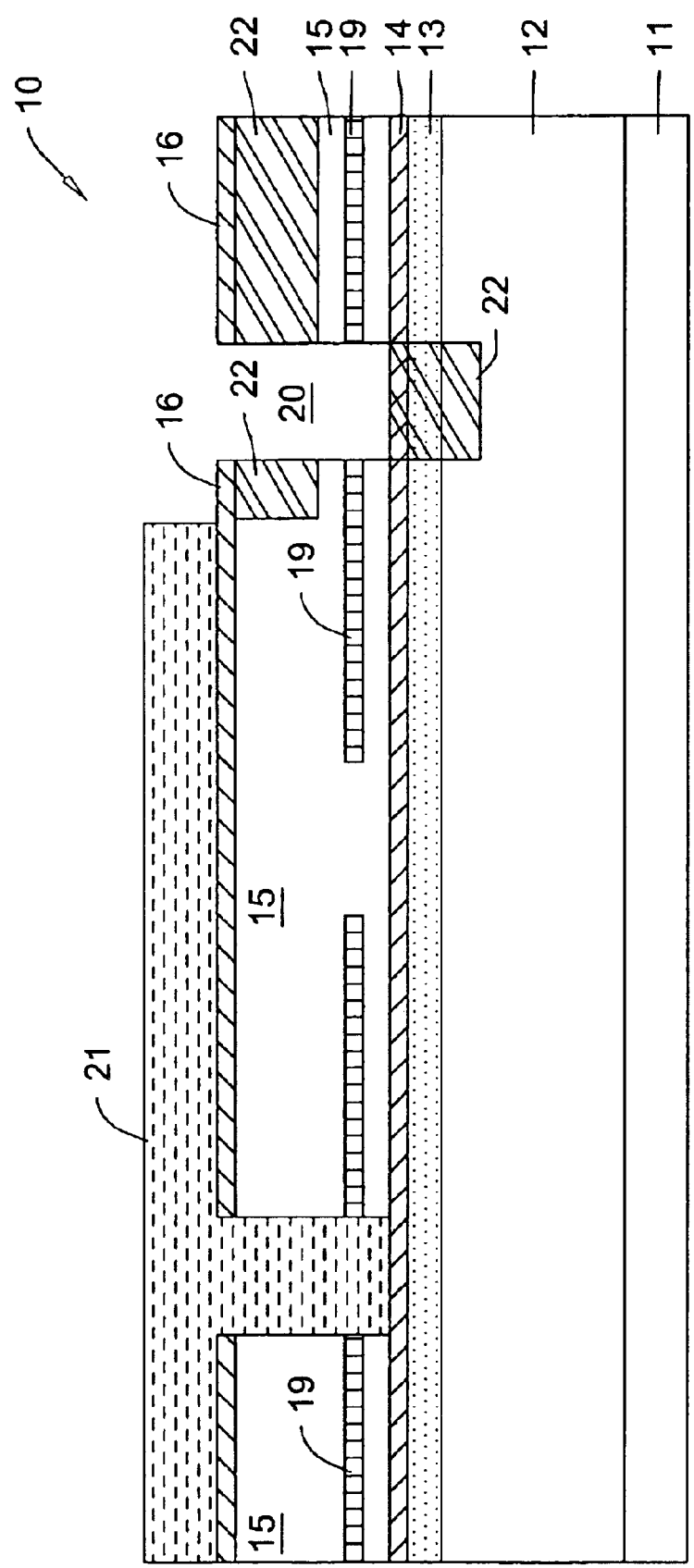
Figure 9:
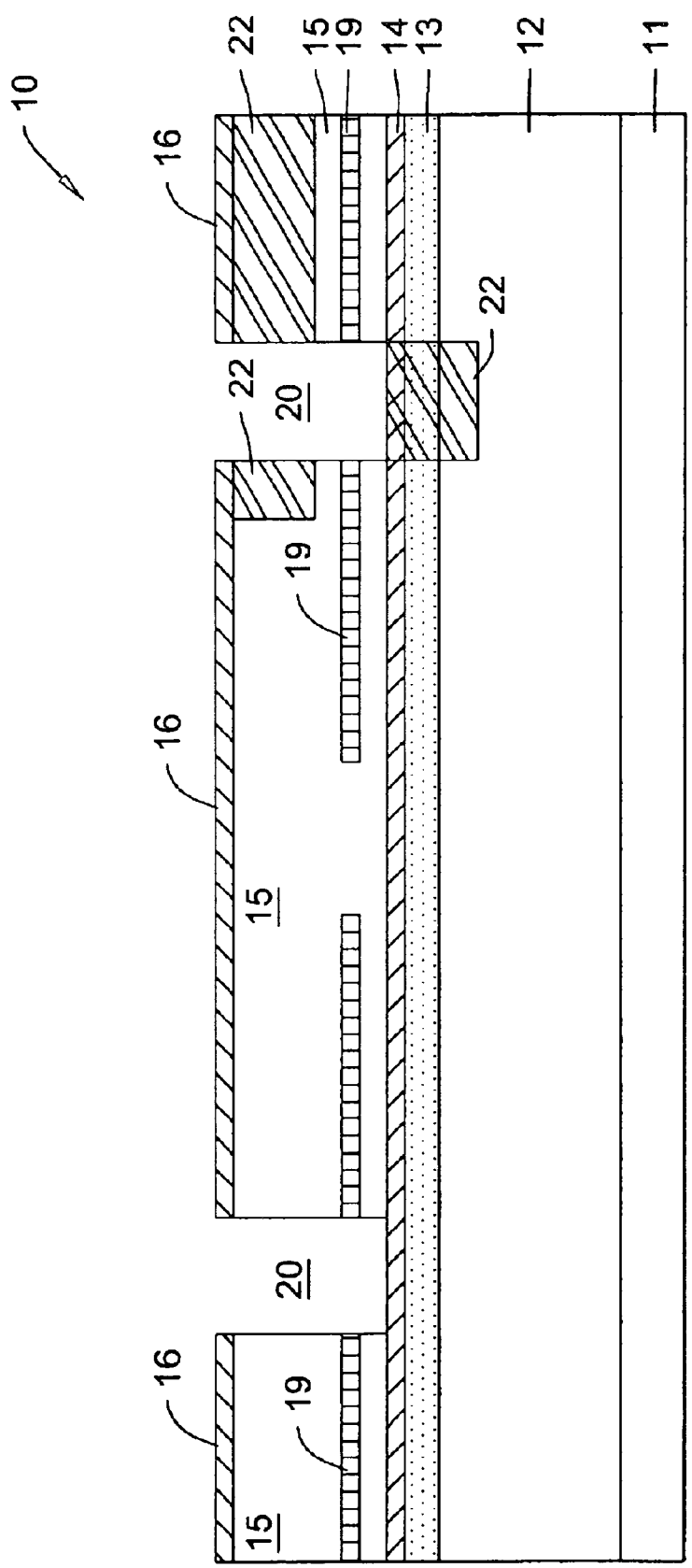
Figure 38:
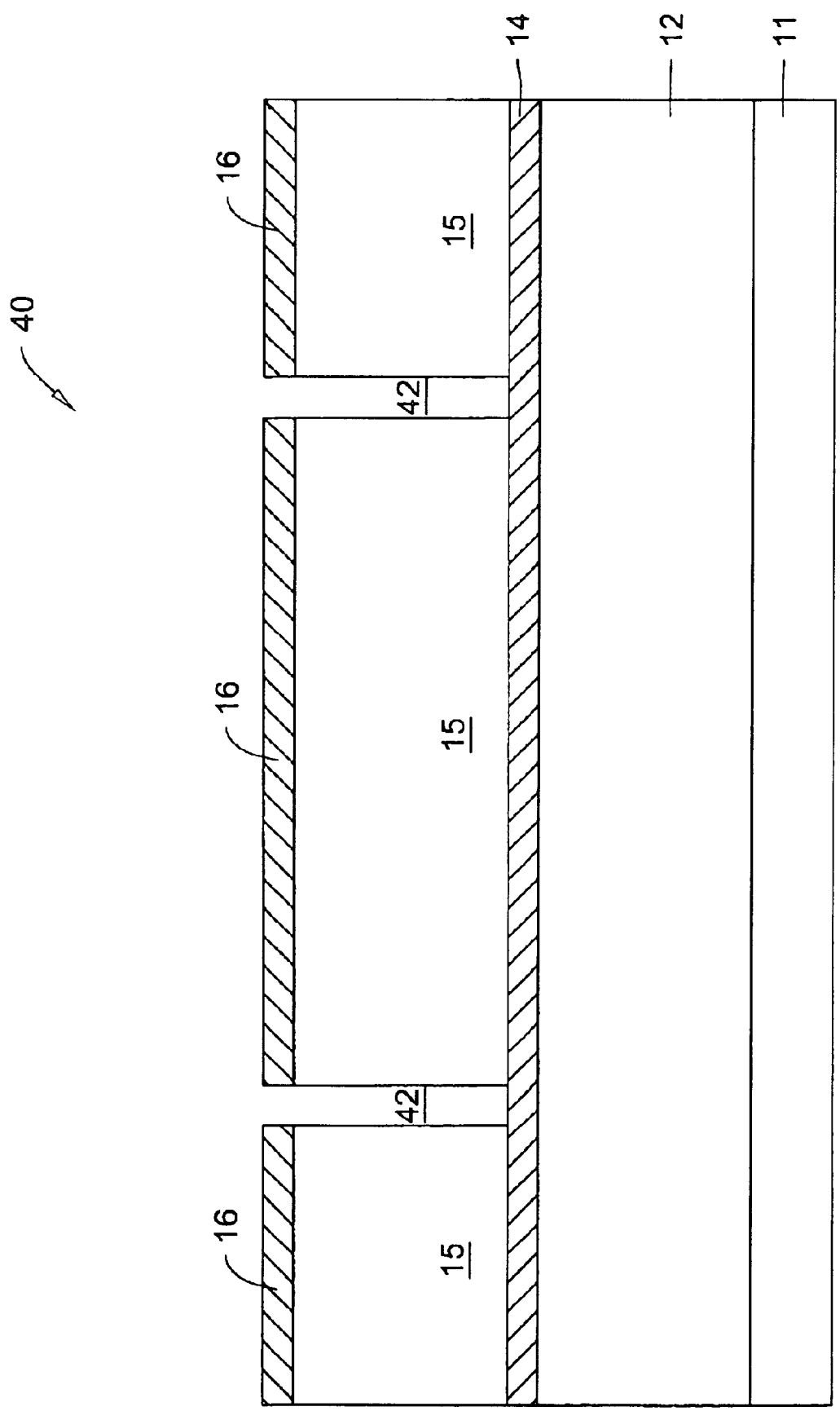
Figure 39:
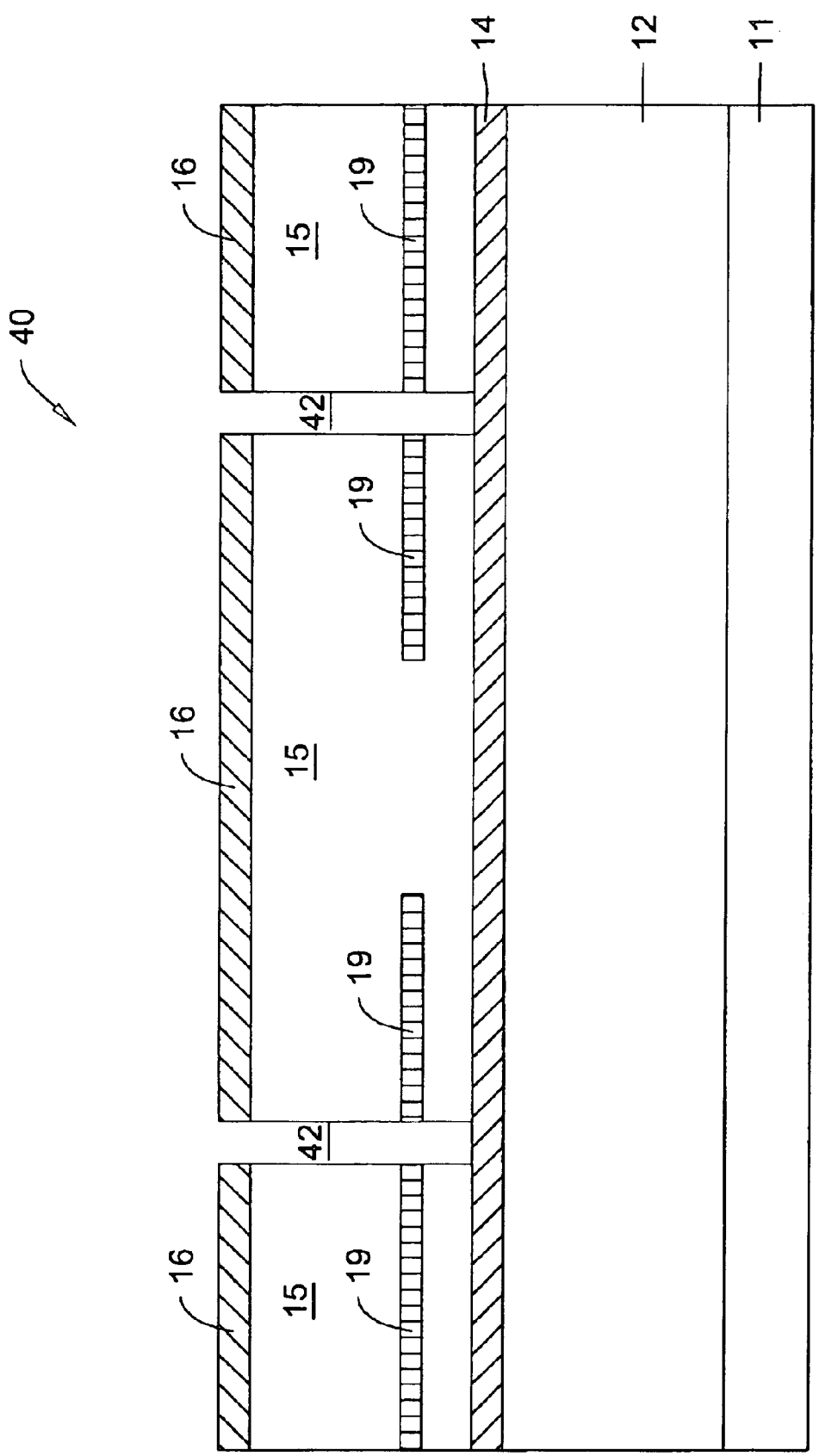

FIG. 38 shows the strip and removal of photo resist layer 39. Through wet oxidization via trenches 42, an oxidizable layer in mirror 15 may be oxidized to an extent to result in an oxidized layer 19 for a current aperture. Oxidized layers 19 are revealed in FIG. 39. At this step of the process, structure 40 may be masked for an isolation implant, and have the structure impinged with ions at doses of multiple levels such as 7e14 and higher, and then the mask may be removed. These steps are not shown for this process but are similar to the steps for structure 10 as shown in FIGS. 7–9. These implantation steps are optional.

Figure 40:
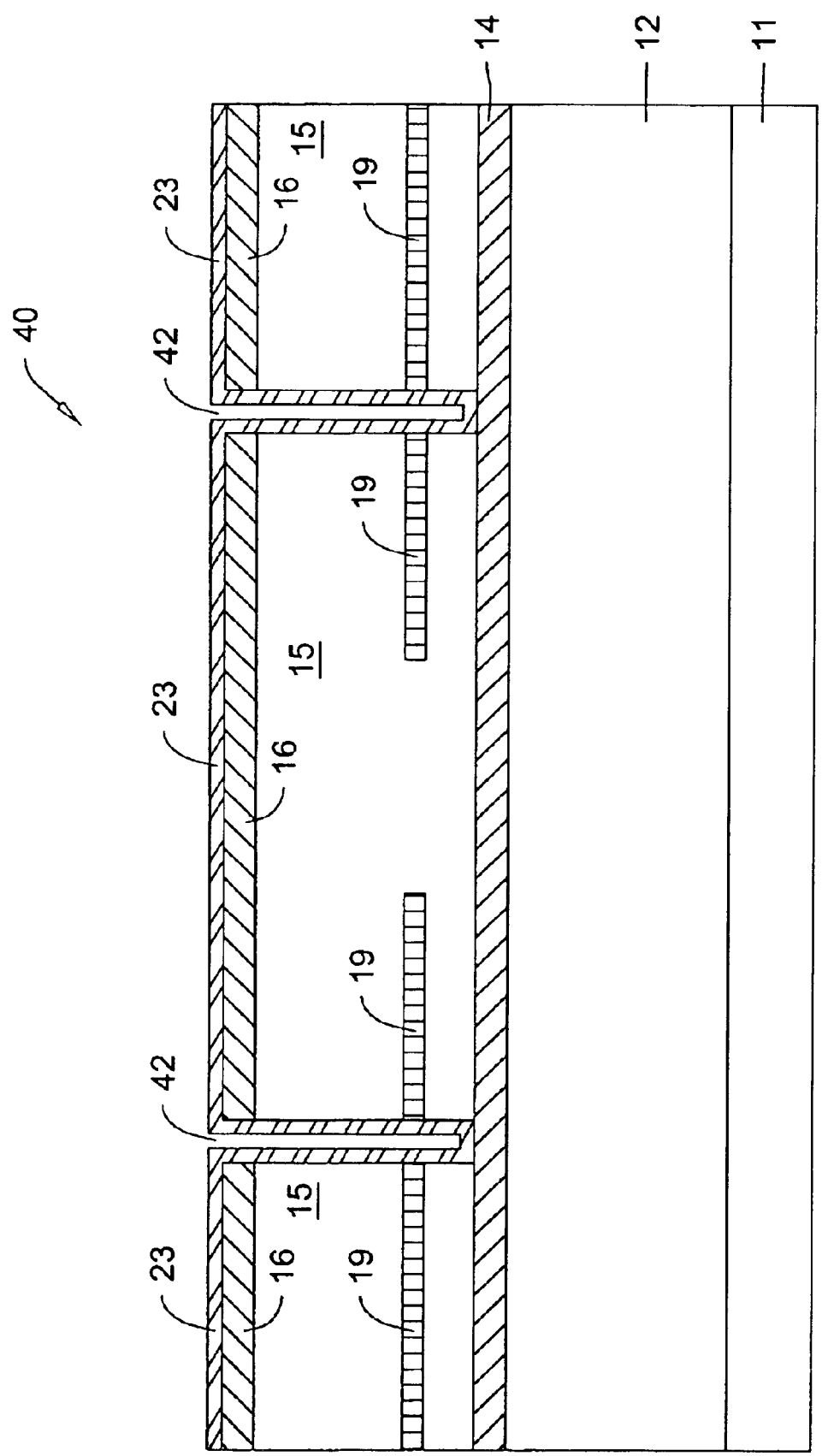
Figure 41:
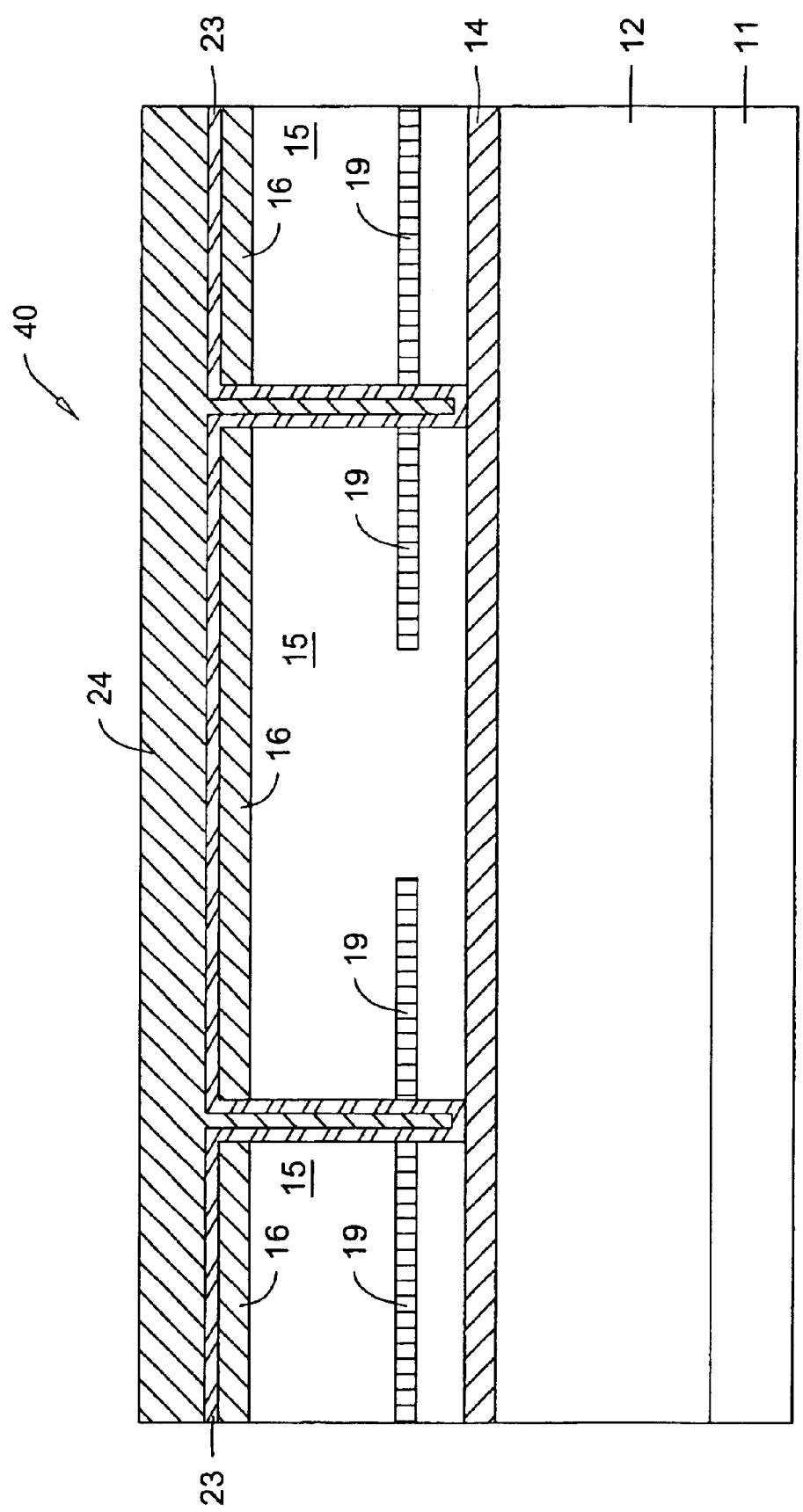

A layer 23 of nitride of about a 0.5 micron thickness may be applied with a PECVD process on oxide layer 16 and in trenches 42 as shown in FIG. 40. On nitride layer 23, about a 2.0 micron thick layer 24 of oxide may be applied with a PECVD process on nitride layer 23, as revealed in FIG. 41.

Figure 42:
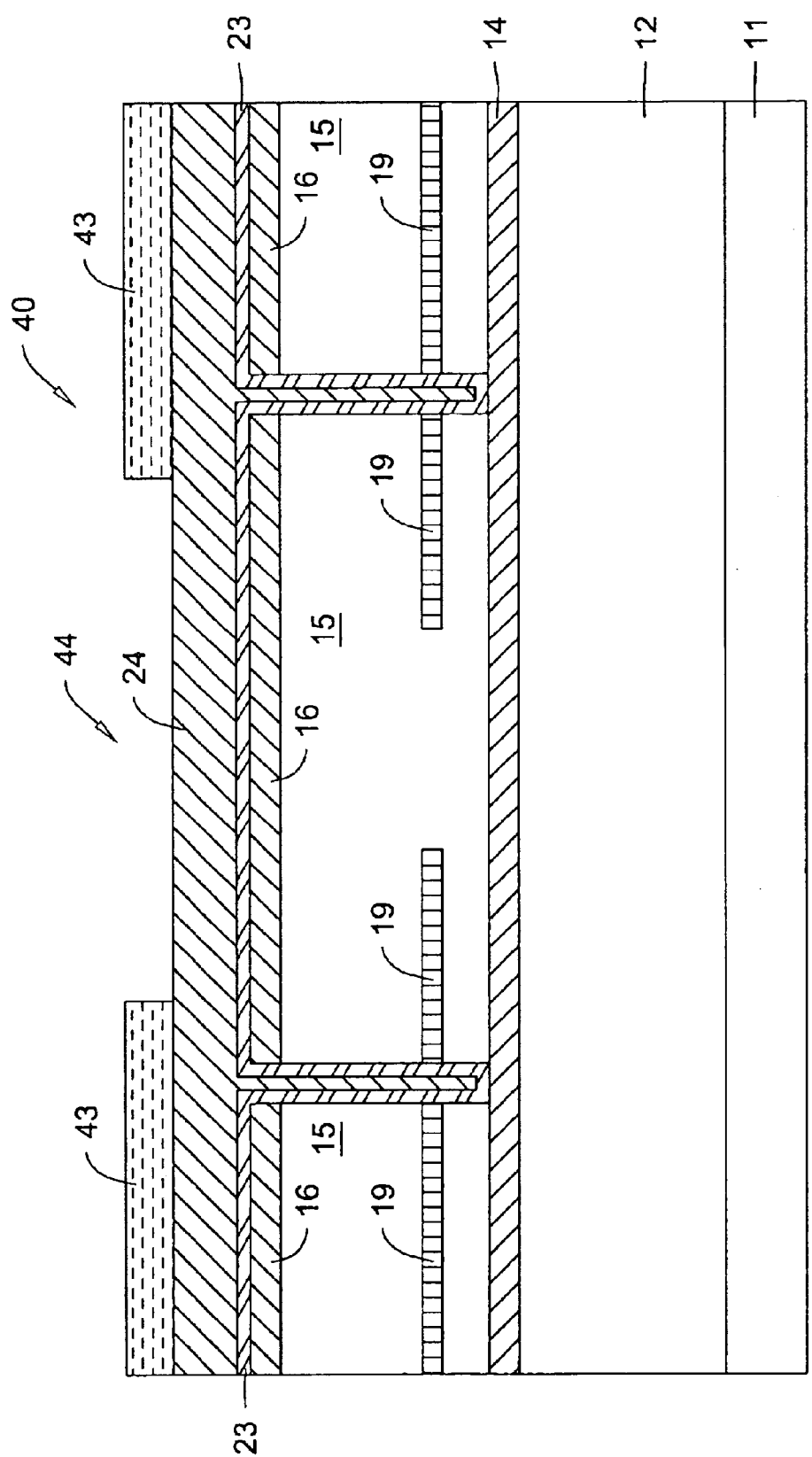
Figure 43:
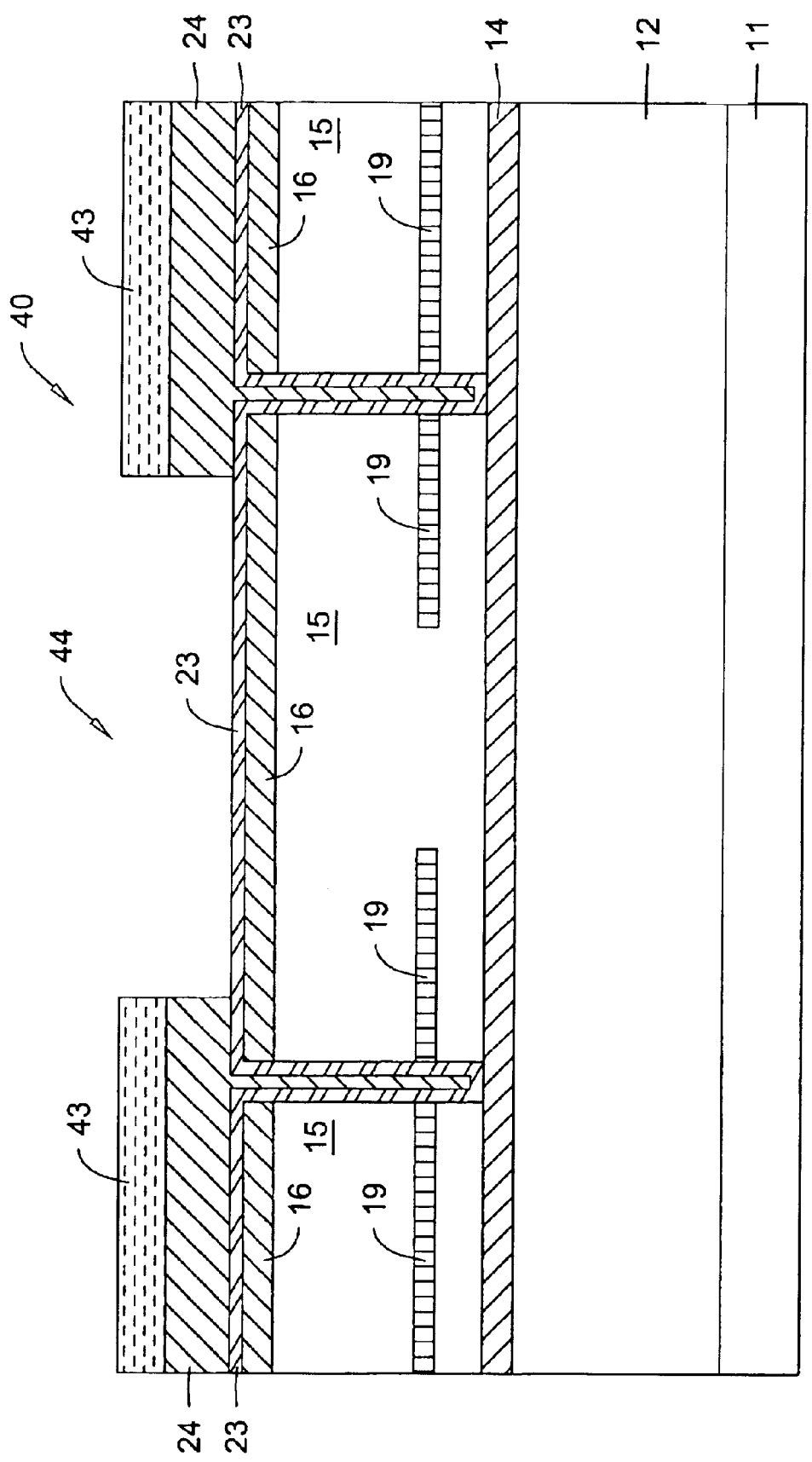
Figure 44:
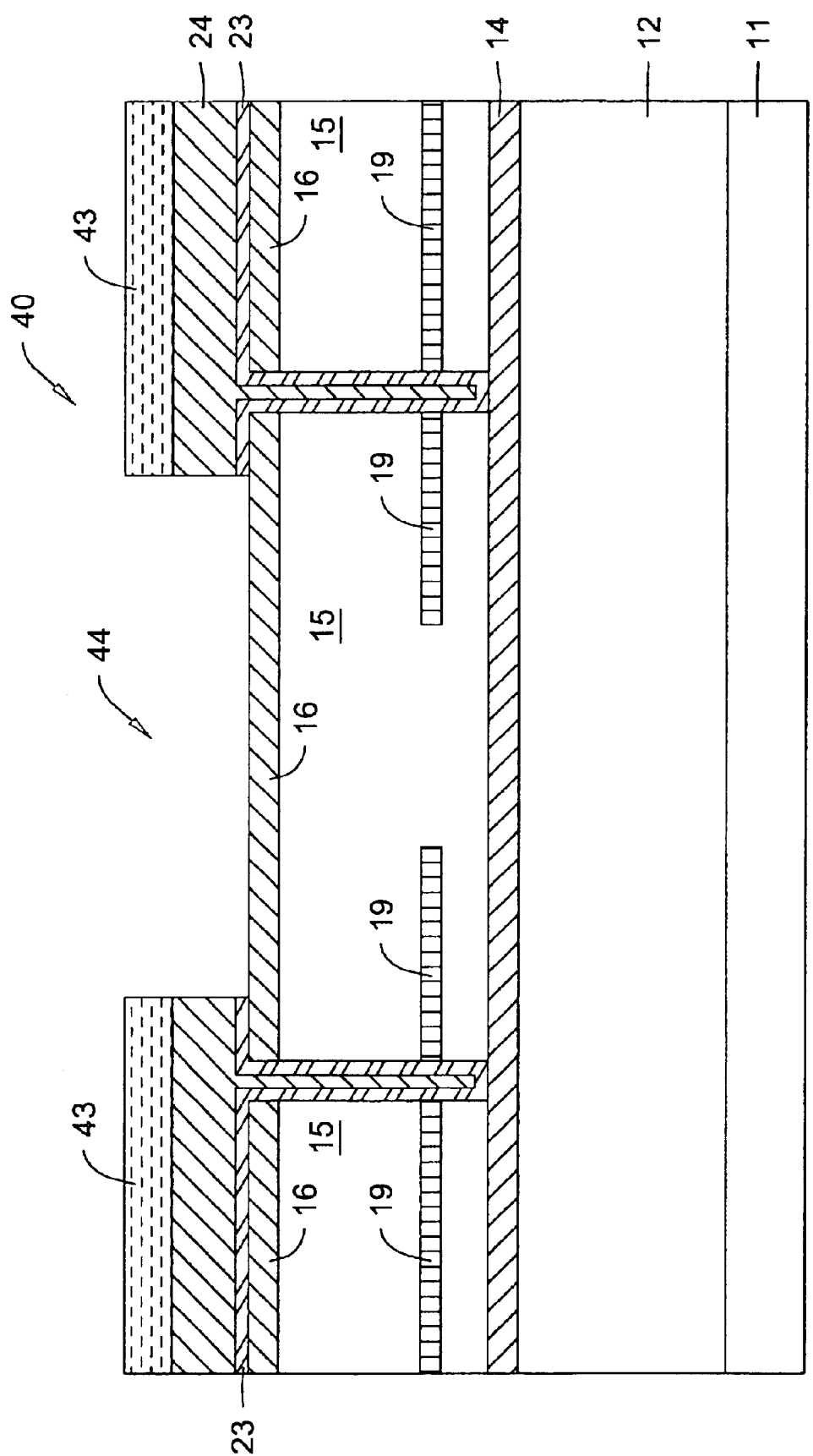
Figure 45:
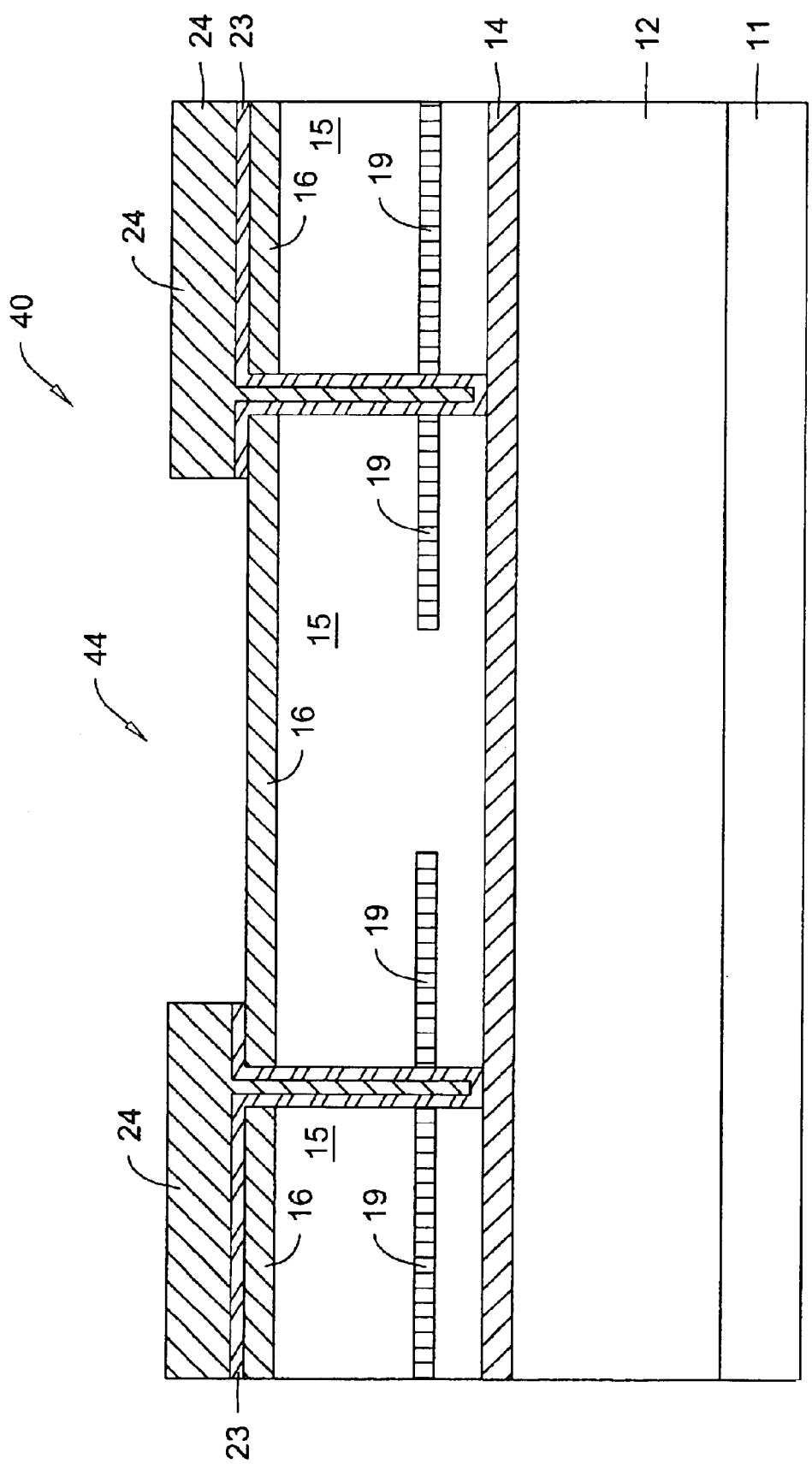

A photo resist layer 43 with an opening 44 may be formed on oxide layer 24, as shown in FIG. 42. The pattern of layer 43 may be for a circular aperture having a diameter similar to the isolation if it were applied, but smaller than trench 42. In FIG. 43, oxide layer 24 in opening 44 may be etched down to nitride layer 23. This etch may result in a sloped sidewall to layer 24. Nitride layer 23 in opening 44 may be etched down to one-half wave oxide layer 16, as shown in FIG. 44. Then photo resist layer may be stripped off, as shown in FIG. 45.

Figure 46:
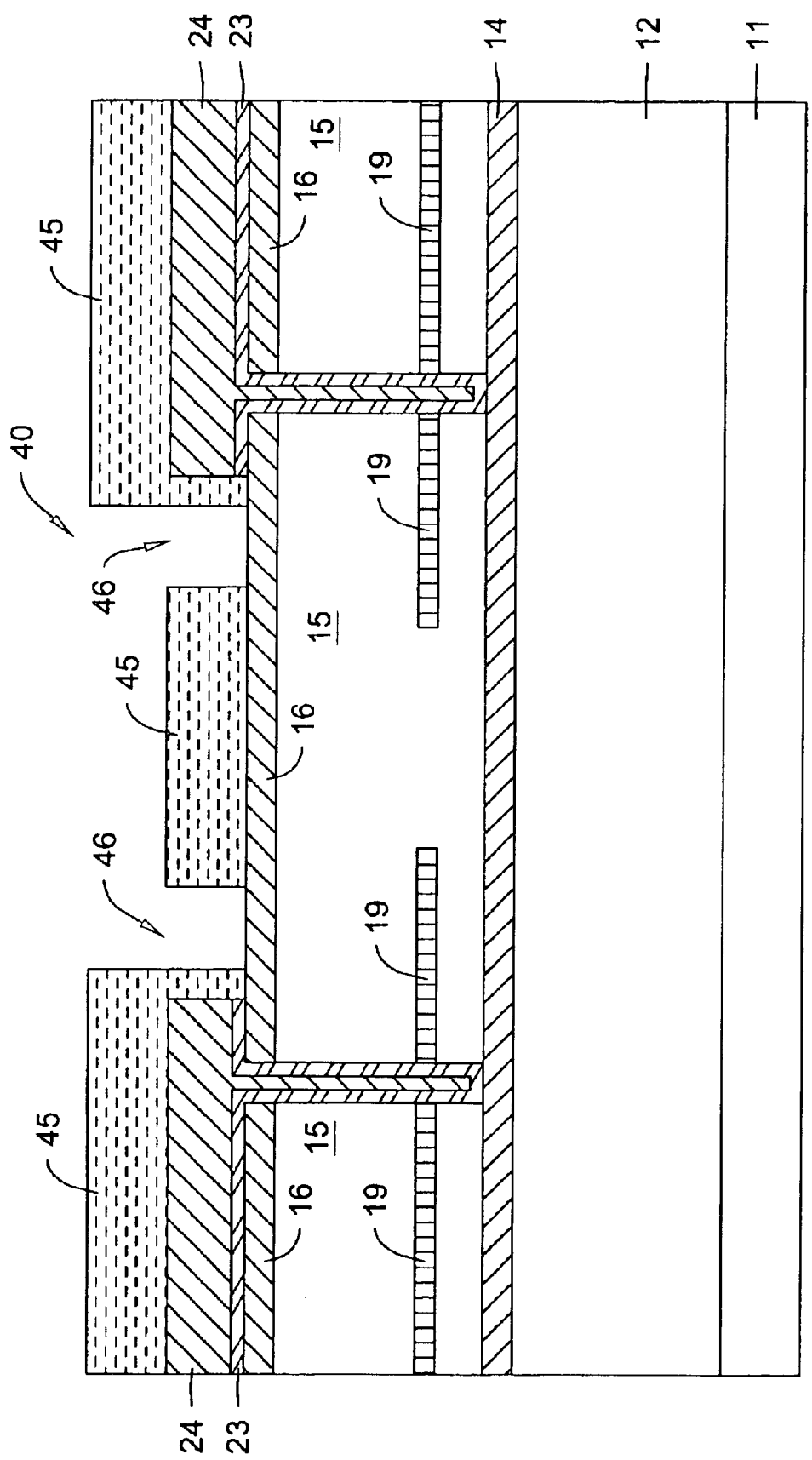
Figure 47:
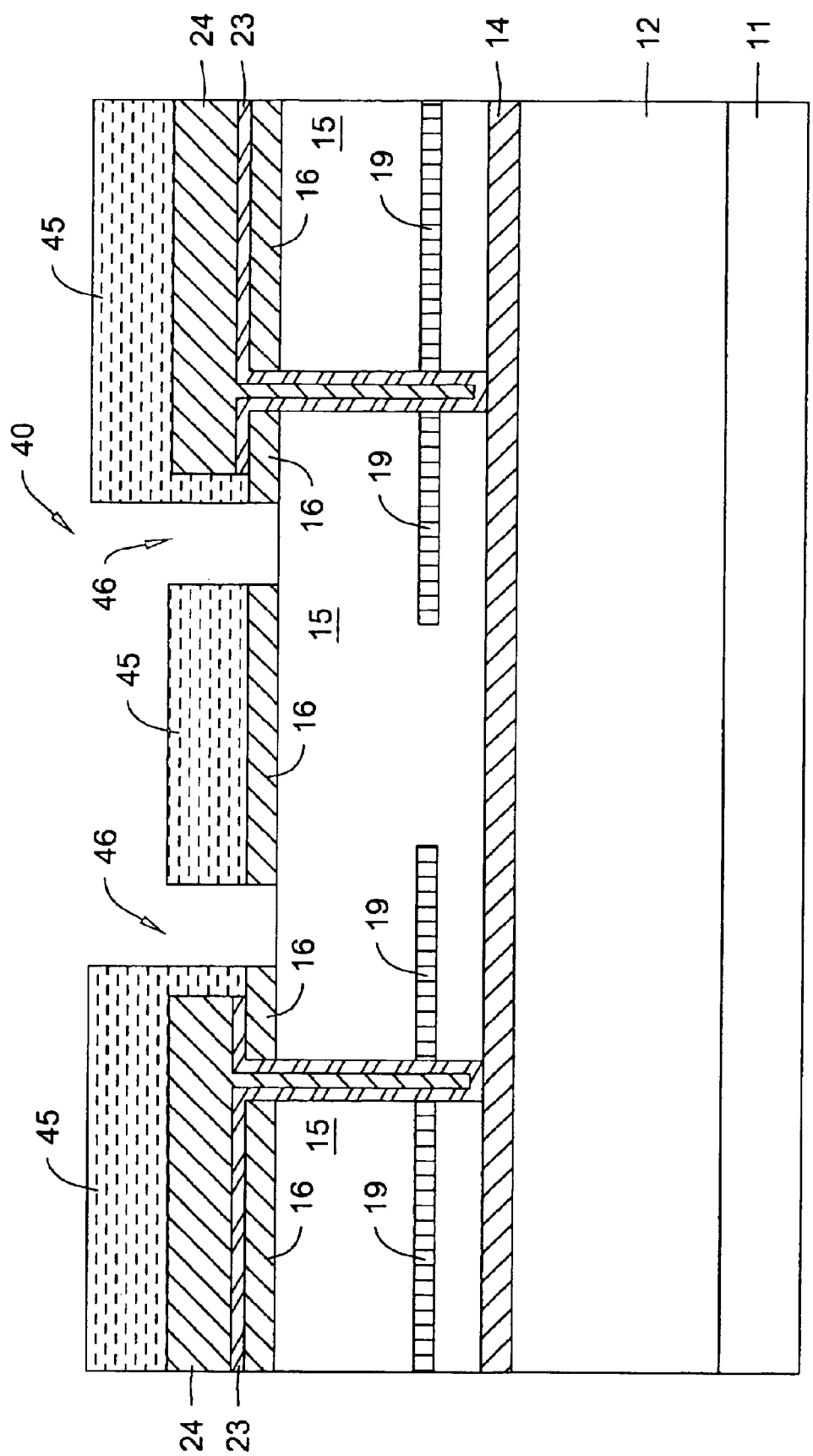
Figure 48:
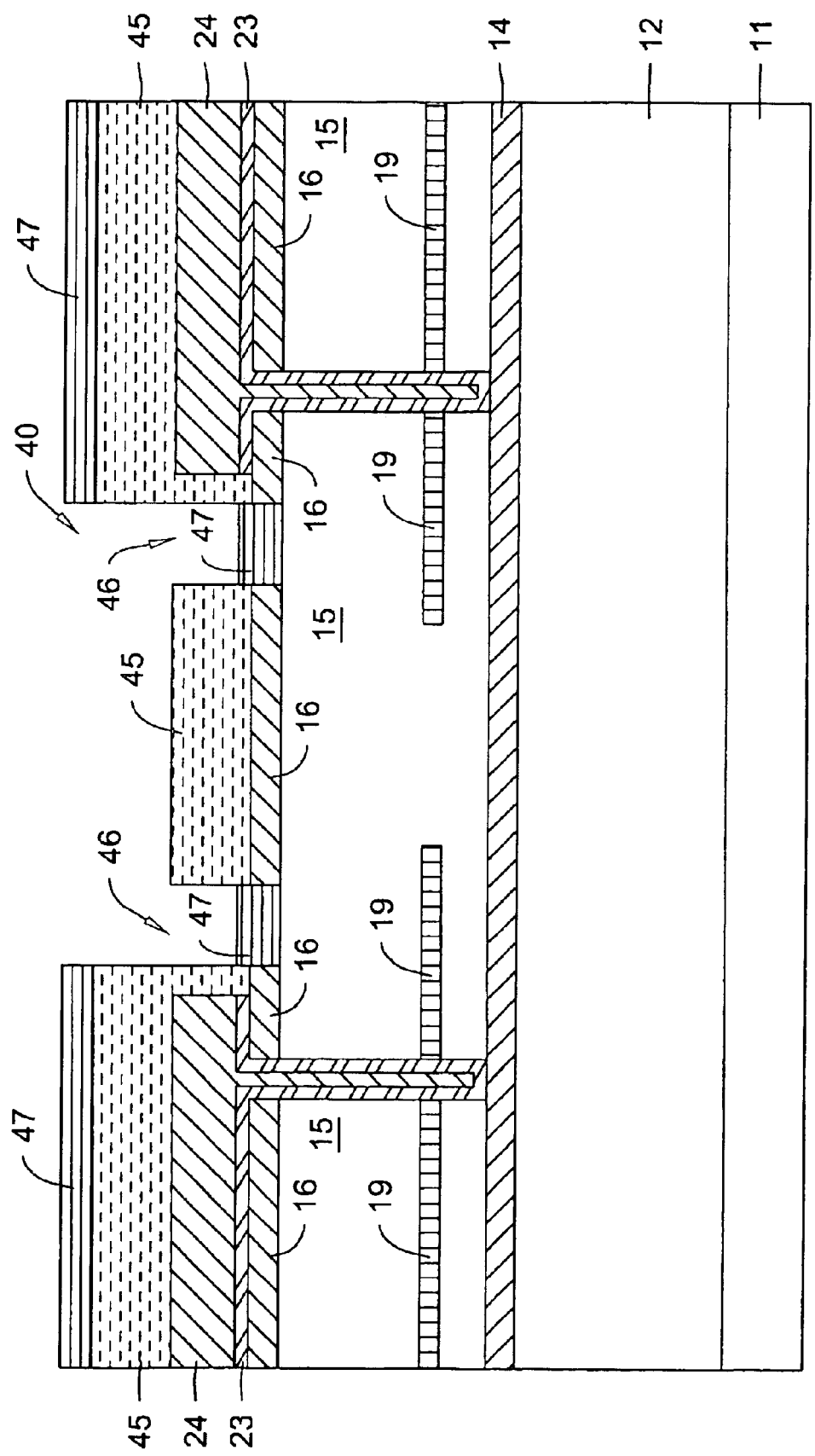
Figure 49:
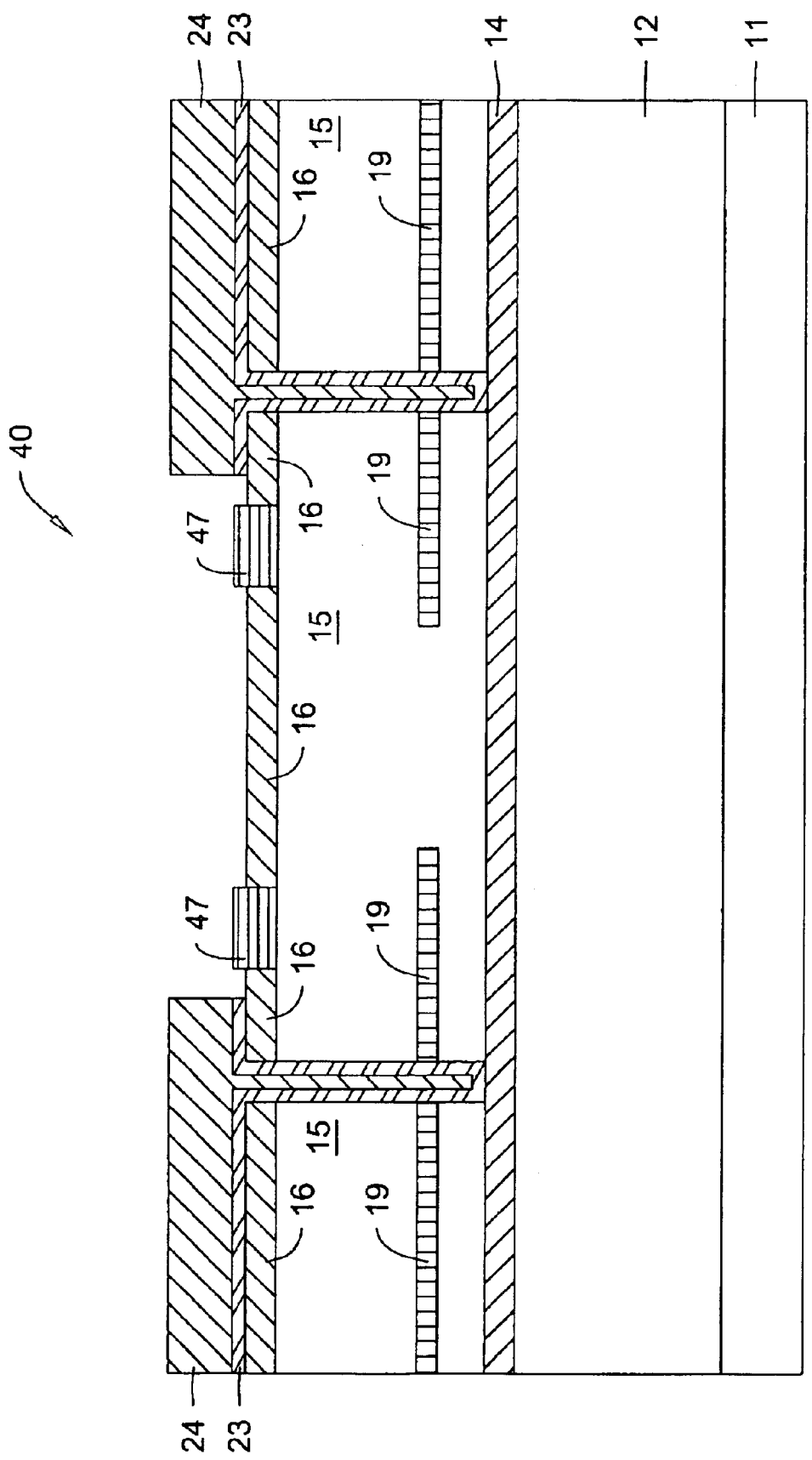

A lift-off resist plus photo resist (LOR+PR) layer 45 having a torus pattern for opening an area 46 to a metal contact may be applied on exposed layers 16 and 24, as shown in FIG. 46. In area 46, oxide layer 16 may be etched down to the top of mirror 15, as in FIG. 47. An ebeam deposition of an Au/Ge alloy may be formed as an n-ohmic contact 47 on the top of mirror 15 in area 46, as revealed in FIG. 48. There may be a strip and liftoff of photo resist 45 and metal 47 on it, with the result shown in FIG. 49.

Figure 50:
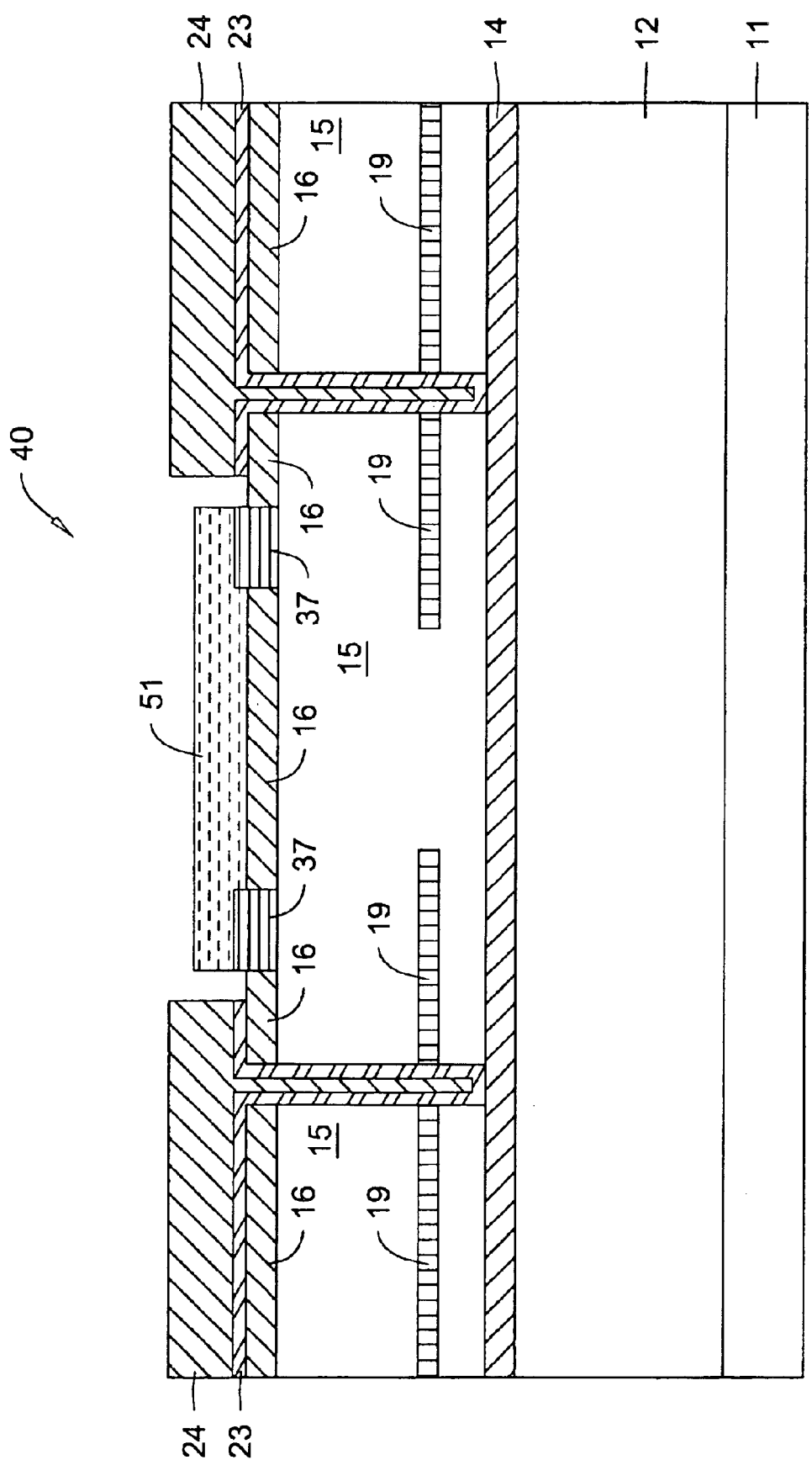
Figure 51:
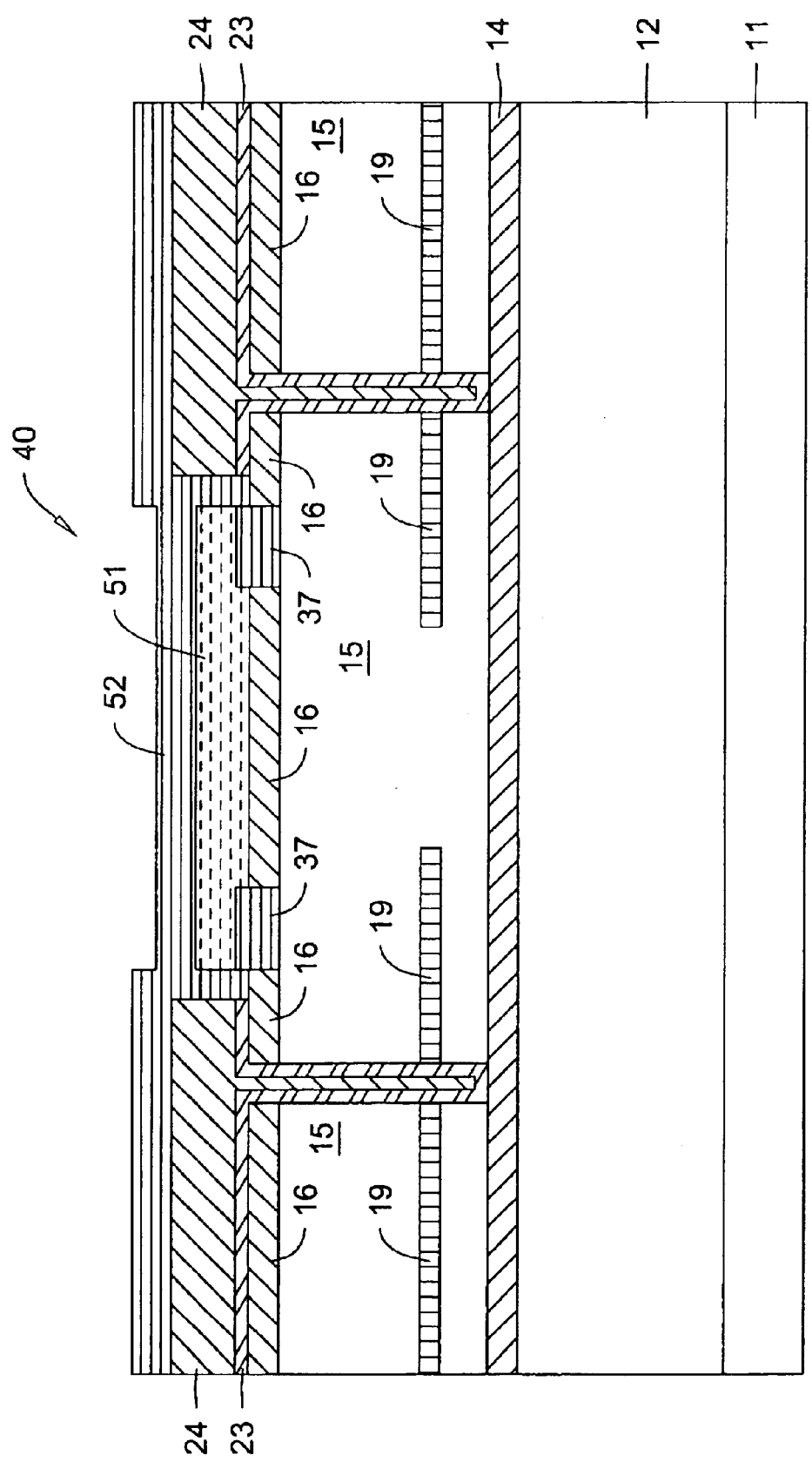
Figure 52:
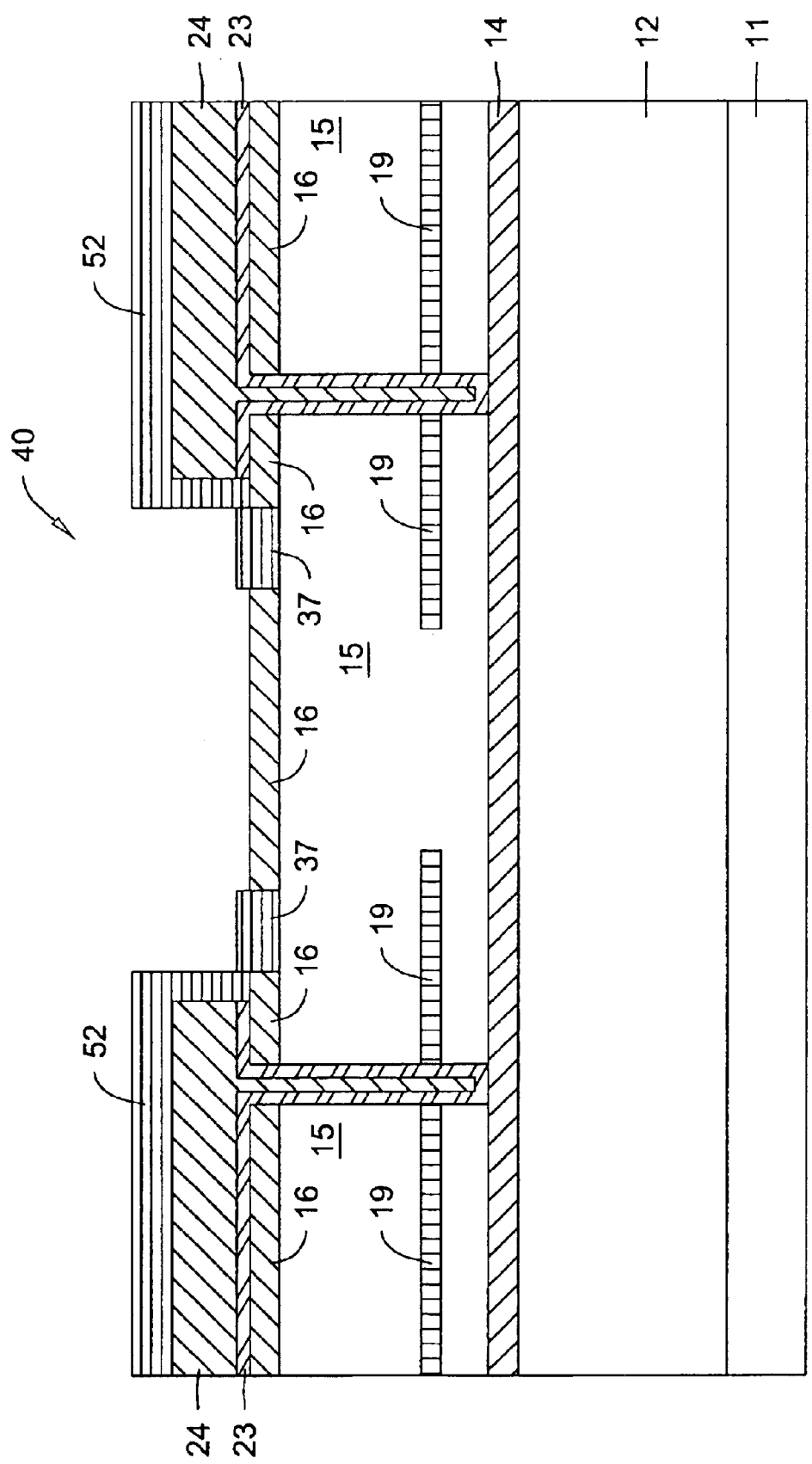

A photo resist layer 51 may be applied on contact 47 and layer 16 inside contact 47, as shown in FIG. 50. Then a layer 52 of metal such as Au/Ge alloy may be ebeam deposited on layer 24, a small portion of layer 52 where it may connect with contact 37 and on photo resist layer 51, as indicated in FIG. 51. FIG. 52 shows structure 40 with photo resist 51 and metal 52 on resist 51 stripped and lifted off. Contact 37 may be connected to metal 52 for an off-structure 40 electrical connection. An n-ohmic Au/Ge alloy contact 53 may be ebeam deposited on the backside of structure 40, that is, on the bottom side of substrate 11, as shown in FIG. 52. Then contact metal 37, 52 and 53 may be RTA annealed (i.e., rapid thermal anneal).

Figure 54:
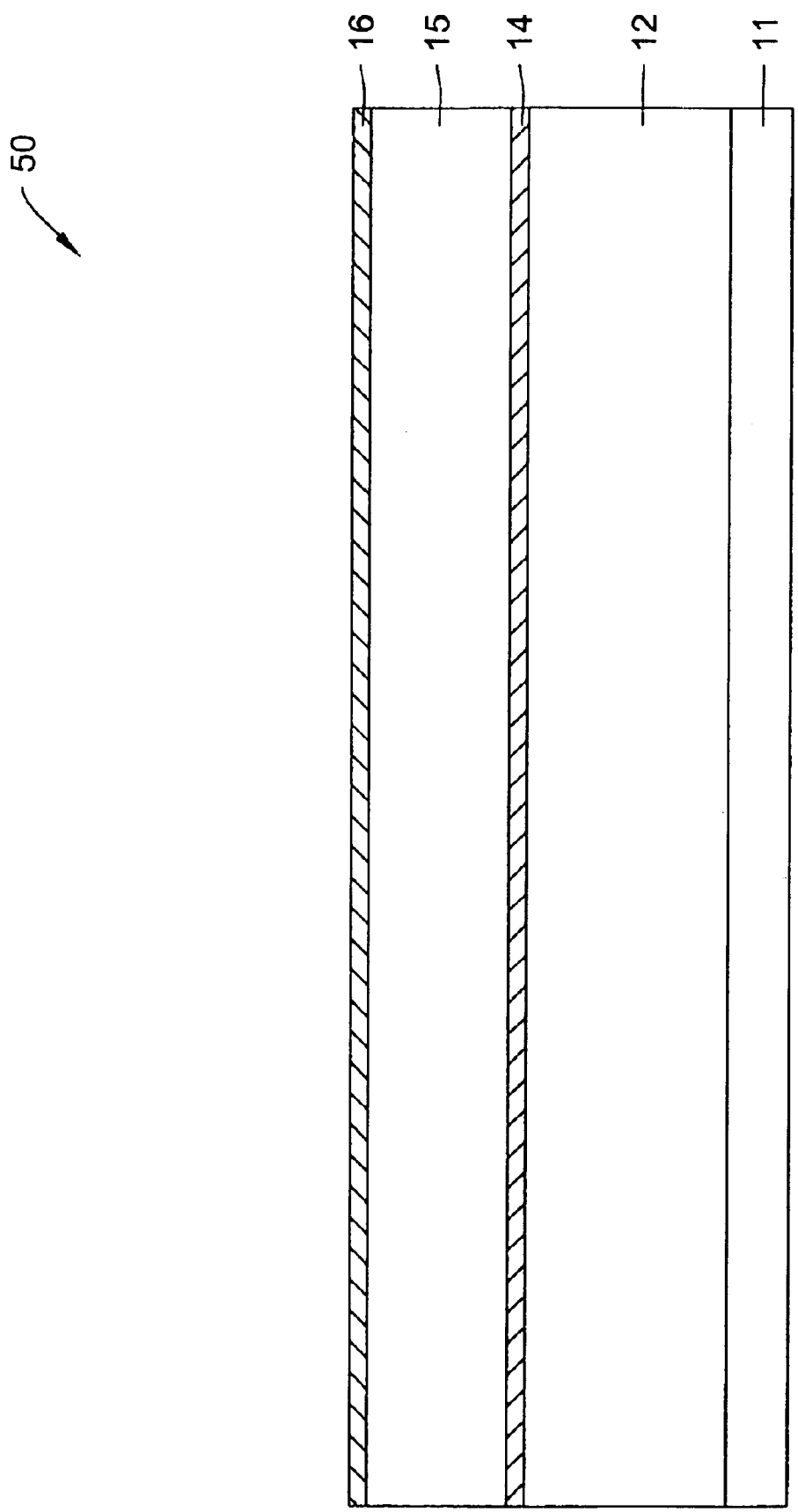
Figure 55:
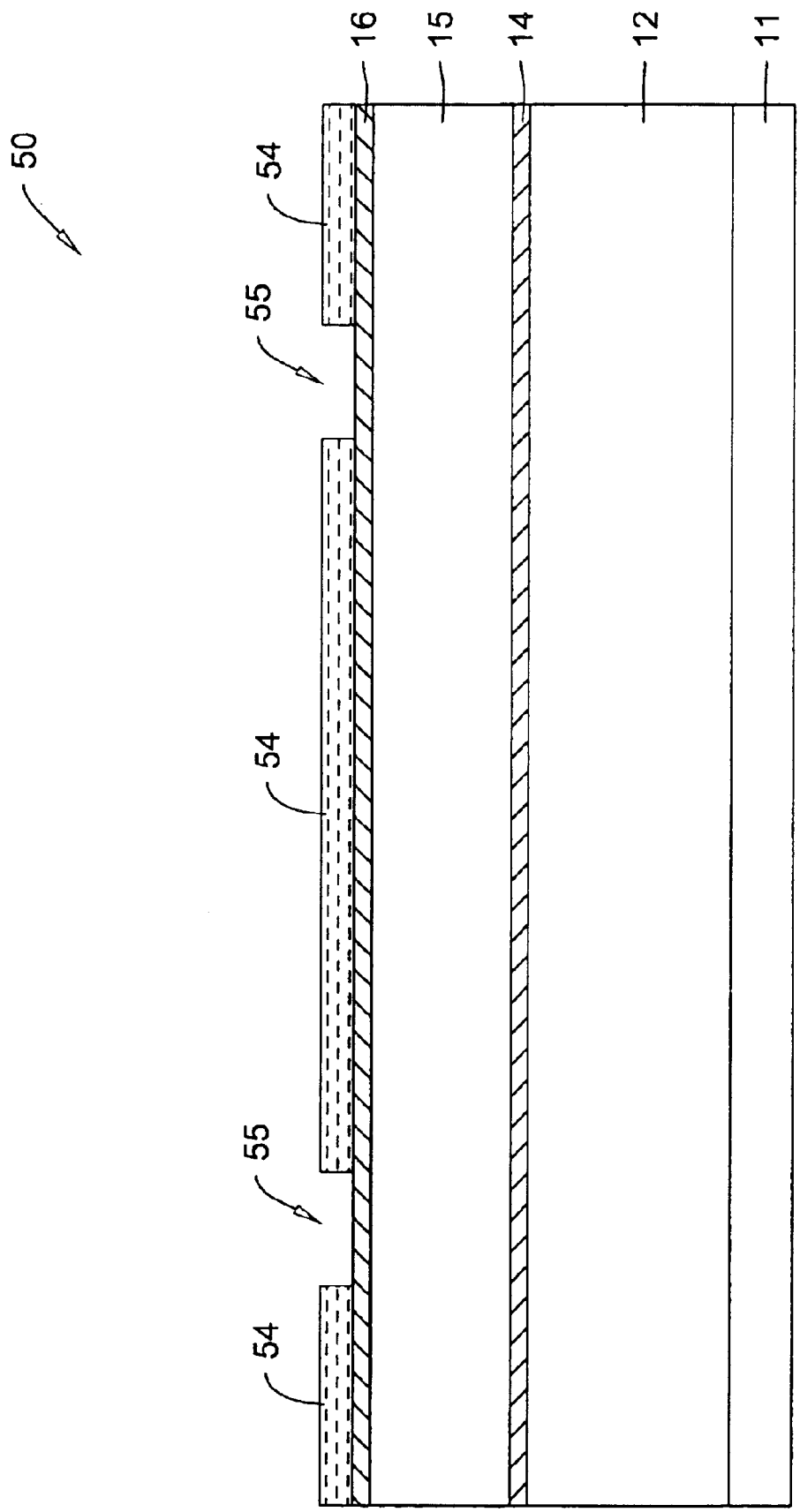
Figure 56:
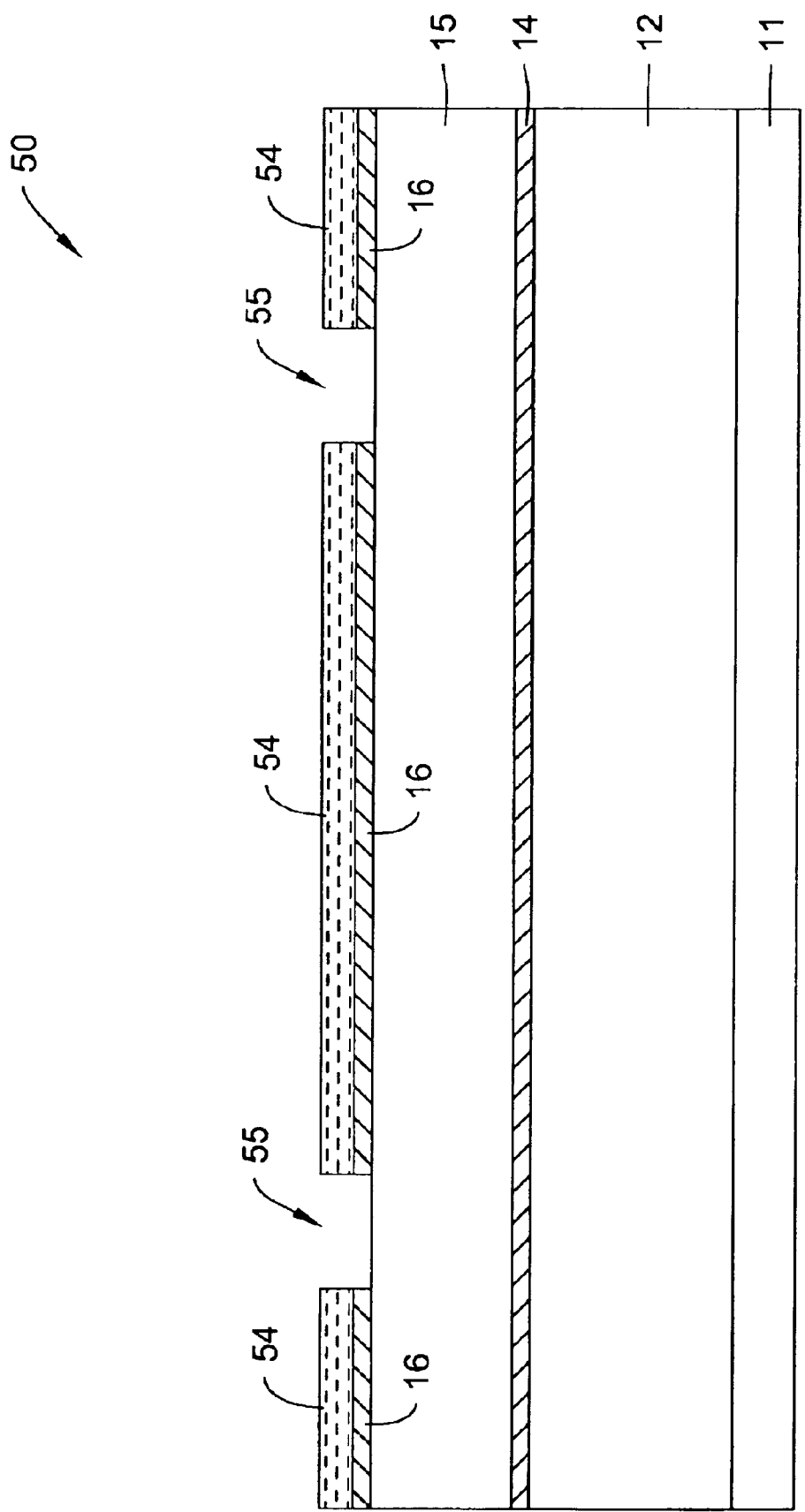
Figure 57:
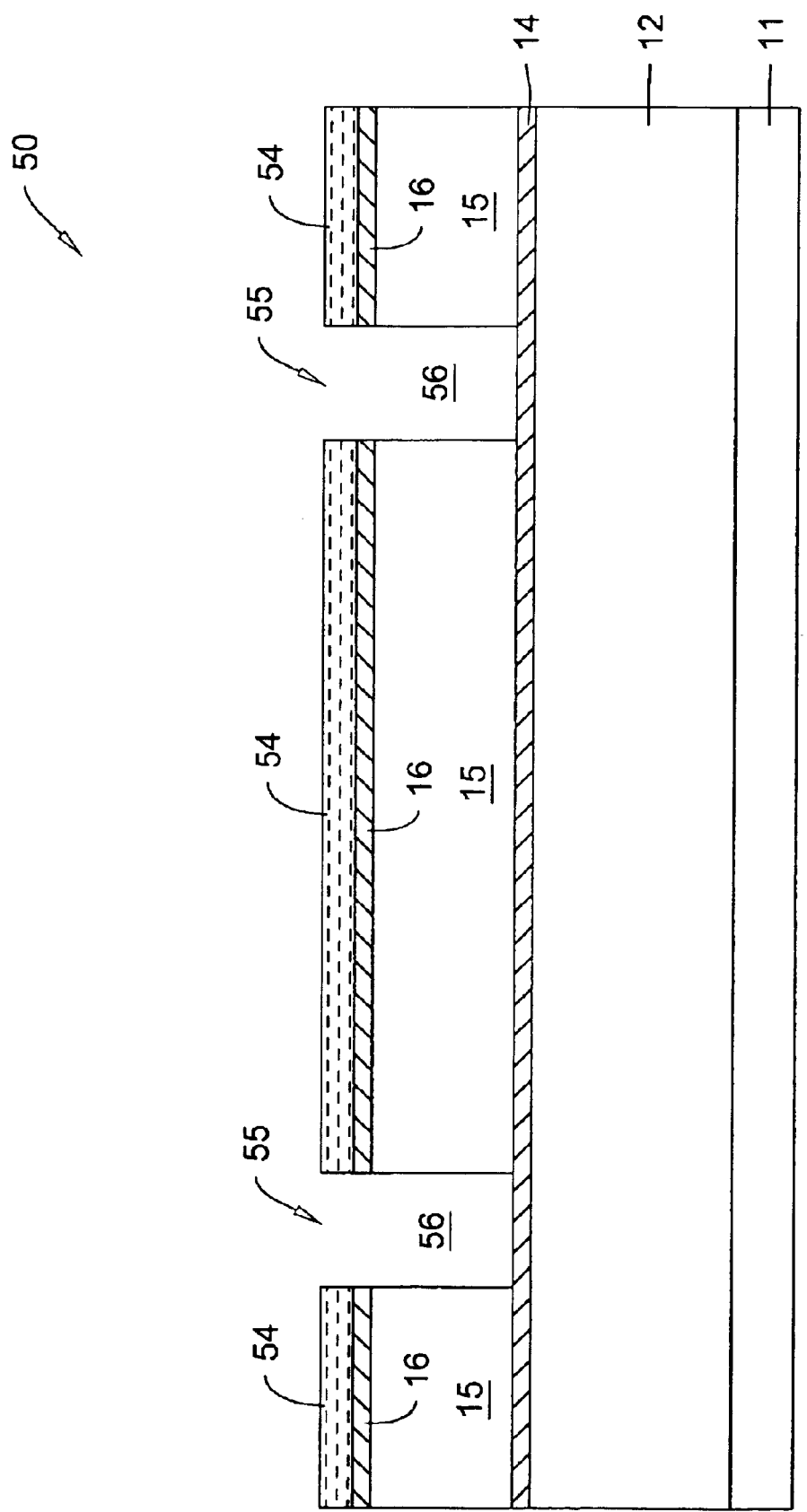
Figure 58:
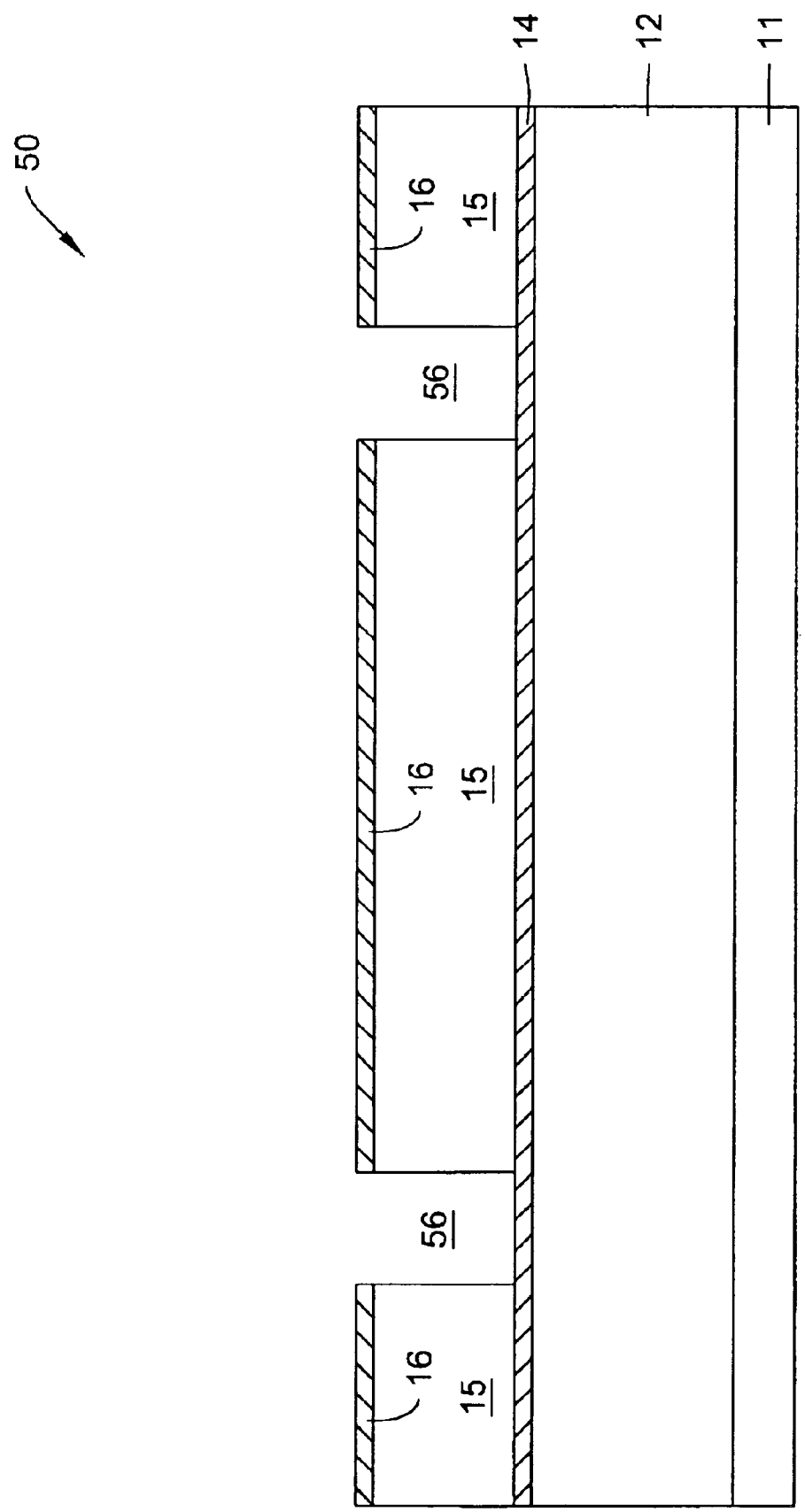

FIG. 54 shows the beginning of structure 50 to which another process may be applied. It may include BCB or SOG planarization, thick pad dielectric, wide trench and no Fetch. A one-half wave thick oxide layer 16 may be deposited on mirror 15 with PECVD. A wide trench spoke and torus pattern 54 with open area 55 may be applied on layer 16, shown in FIG. 55. A portion of oxide layer 16 in open area 55 may be etched down to mirror 15 as in FIG. 56. Area 55 may be also ICP etched through mirror 15 down to active layer 14 thereby resulting in a wide isolation trench 56, shown in FIG. 57. The bottom of trench 56 may also be some distance above or into active region 14. FIG. 58 shows the stripping result of photo resist 54.

Figure 59:
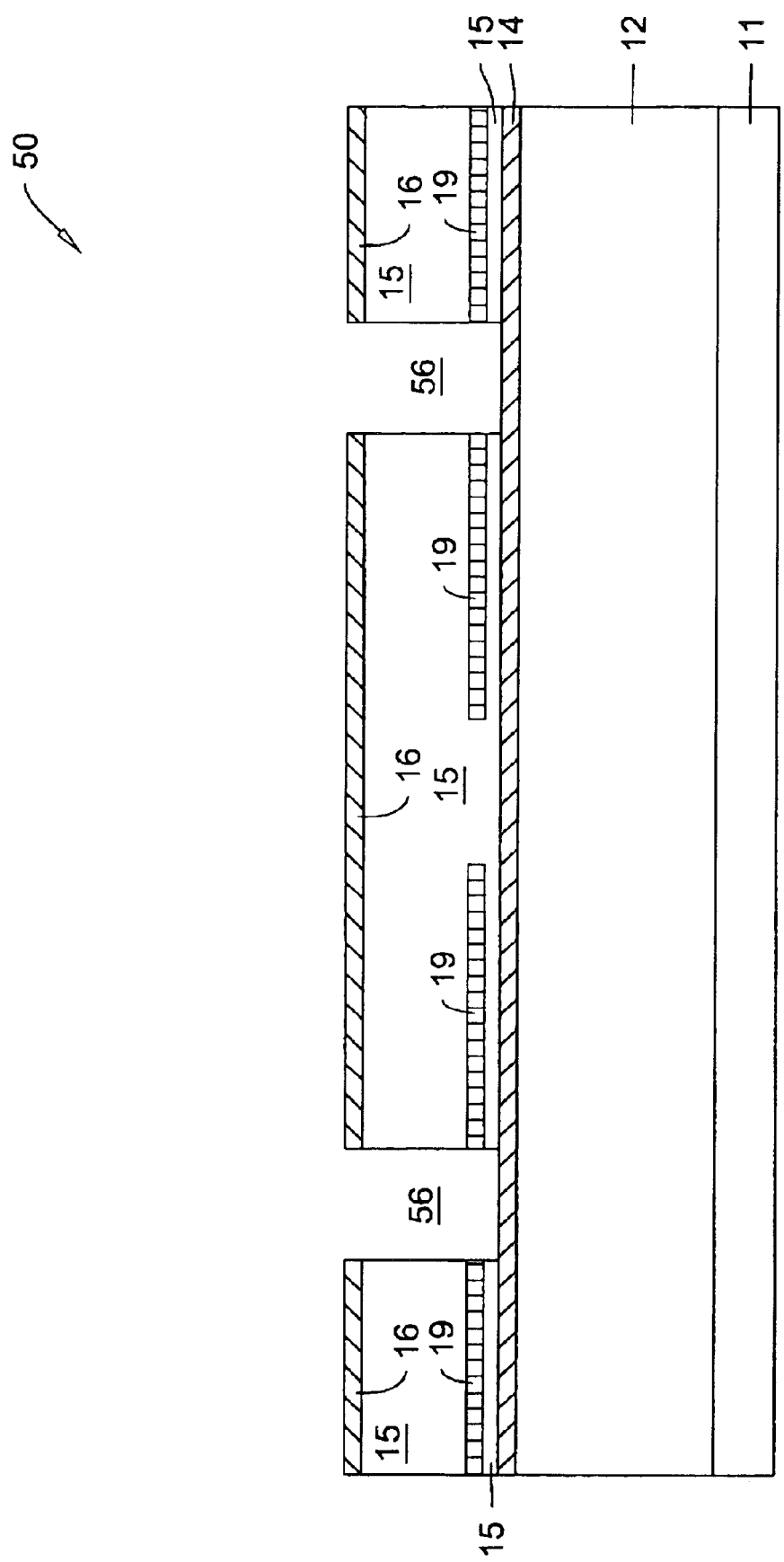
Figure 60:
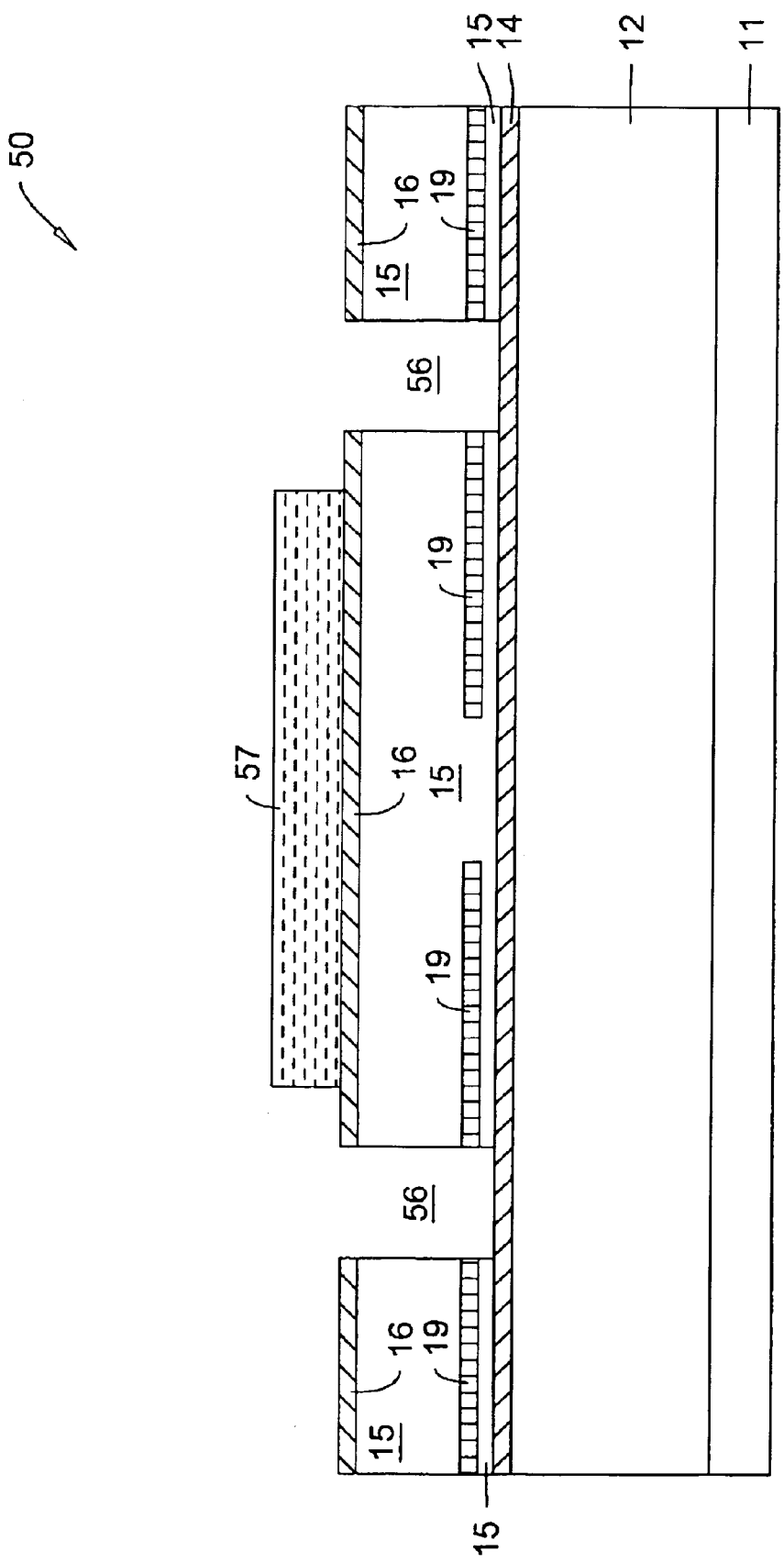
Figure 61:
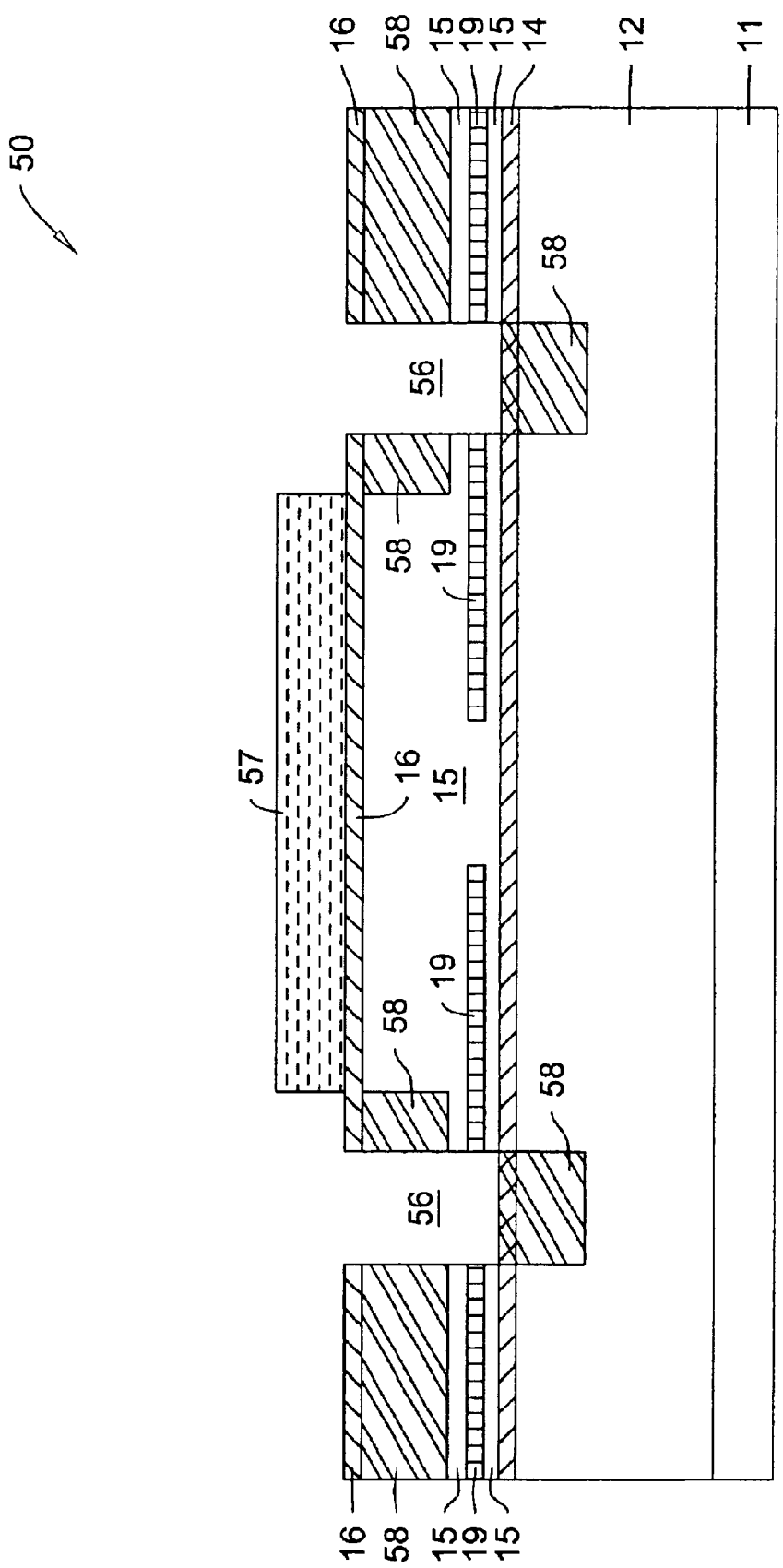
Figure 62:
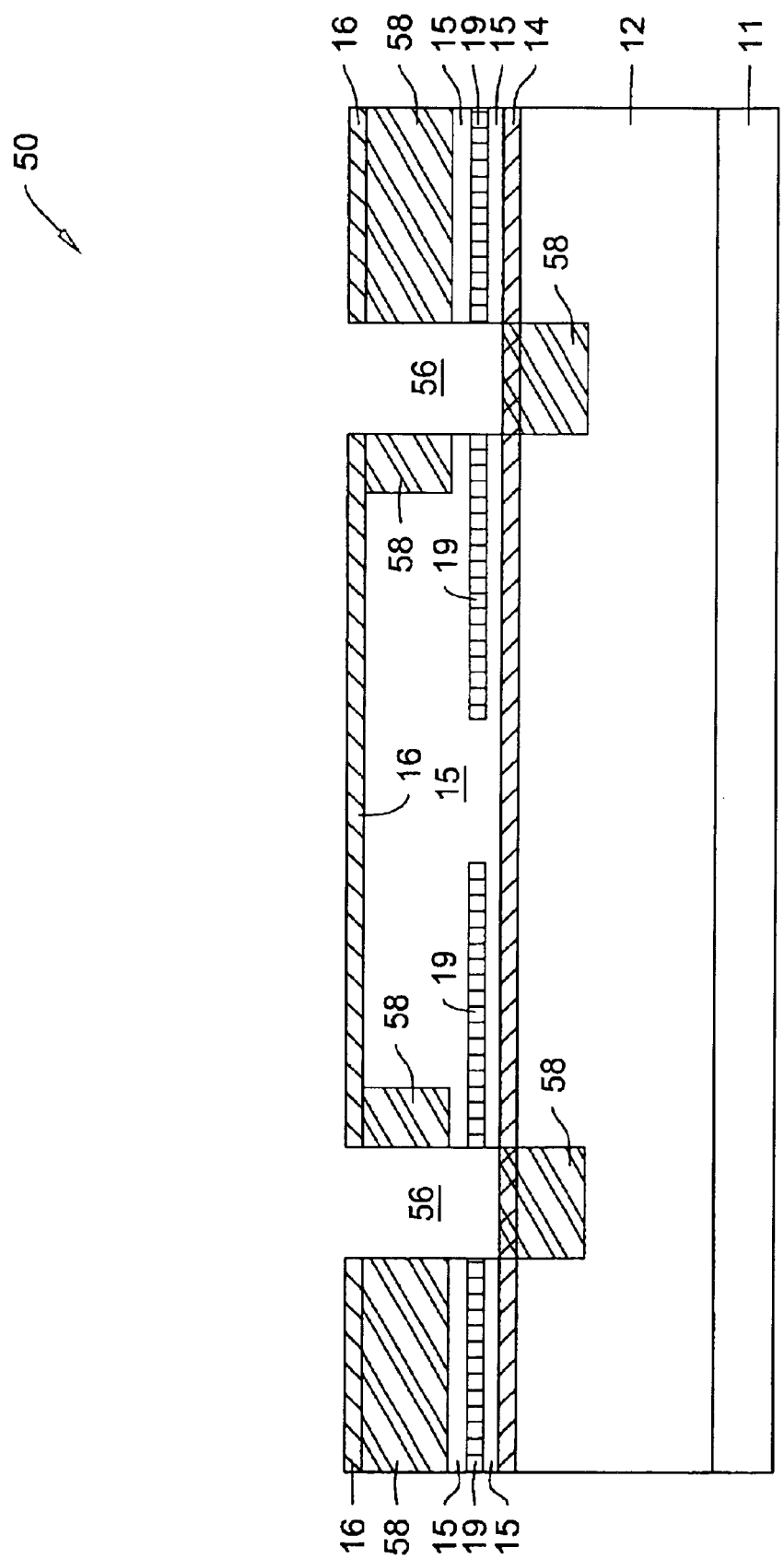

Structure 50 may be placed in an environment of wet oxidation to oxidize an oxidizable layer in mirror 15 to result in an oxidized layer 19. Layer 19 may form a current aperture in mirror 15, as shown in FIG. 59. A photo resist layer 57 having a circular pattern for an isolation implant 58 may be deposited on oxide layer 16, as shown in FIG. 60. An ion implant of multiple levels at 7e14 and higher doses, may be applied resulting in an isolation implant 58 shown in FIG. 61. Photo resist 57 may be stripped in FIG. 62. The isolation implant steps of FIGS. 60–62 may be optional.

Figure 63:
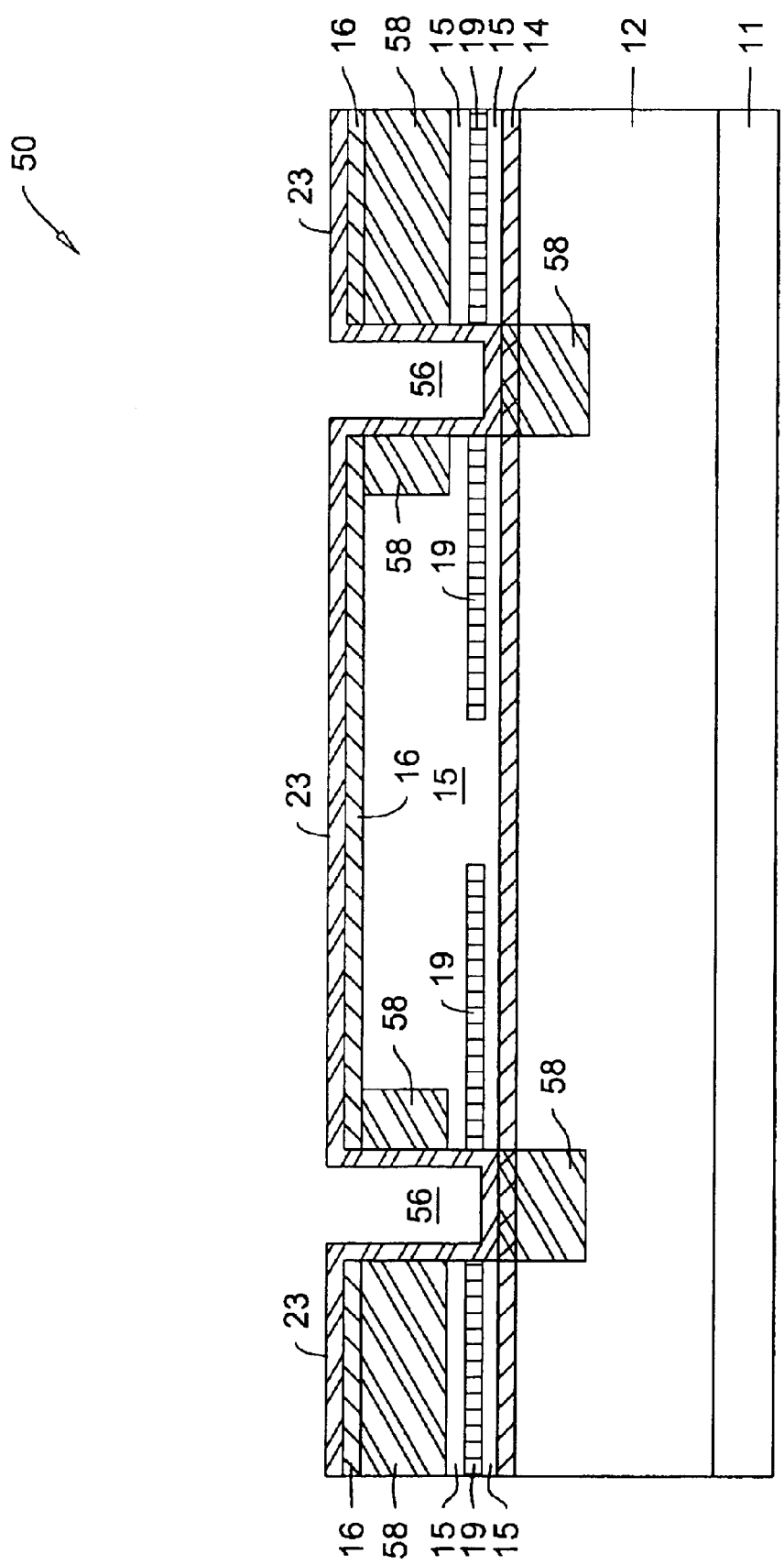
Figure 65:
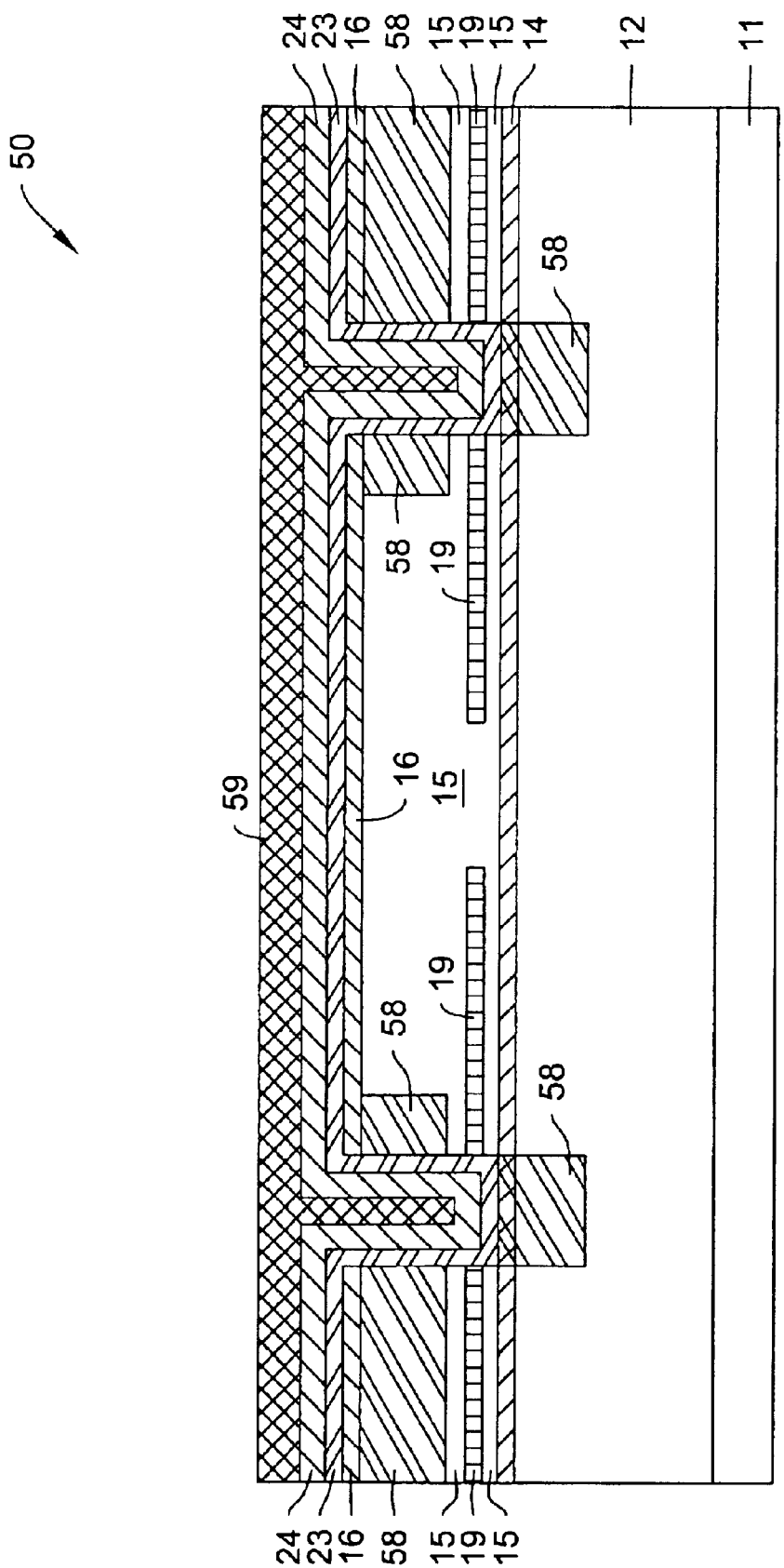
Figure 66:
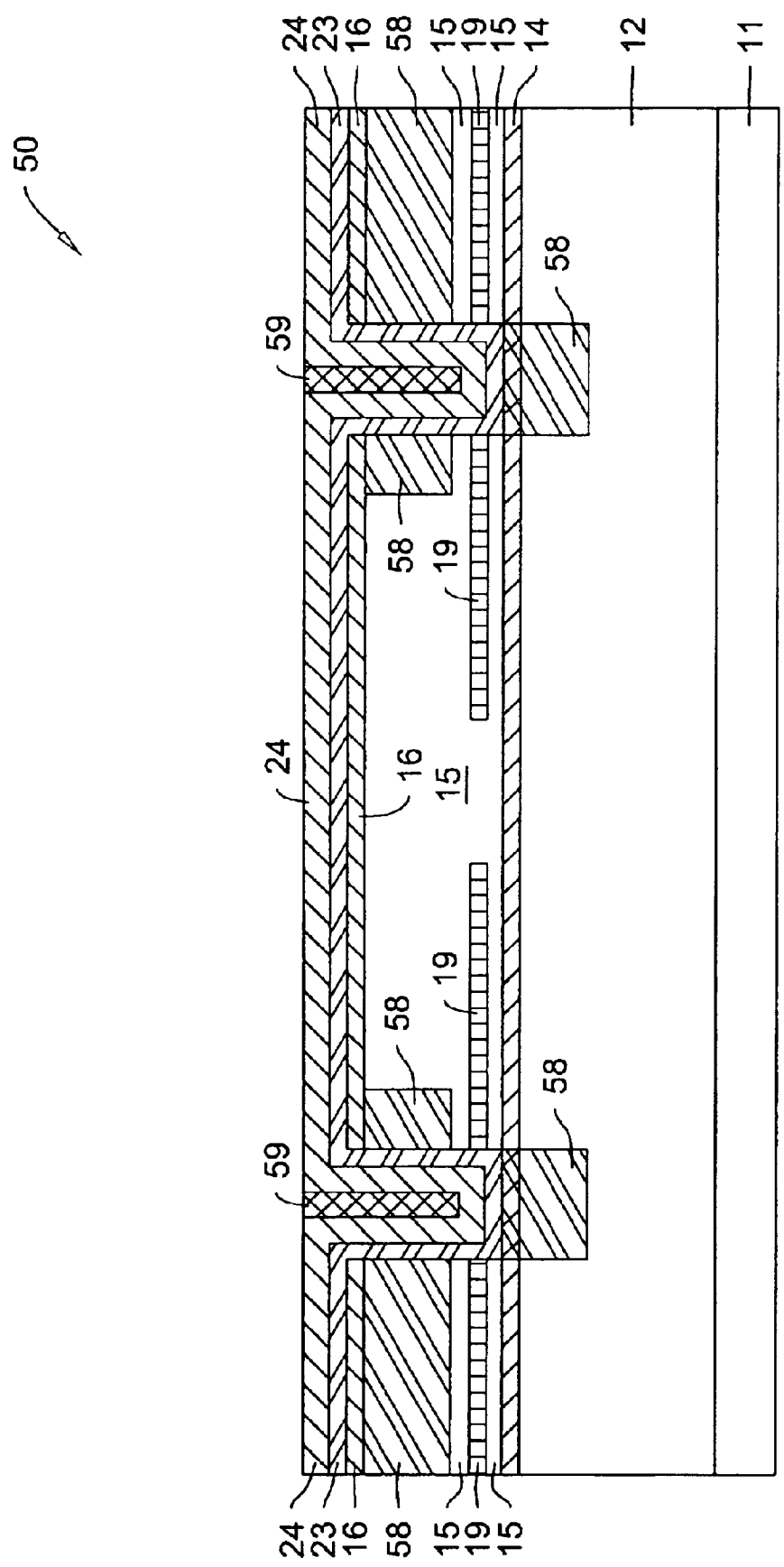

As shown in FIG. 63, an about 0.5 mirror layer 23 may be applied to structure 50 with PECVD. On layer 23, an about 1.0+ micron thick dielectric oxide layer 24 may be applied with PECVD. One may spin on BCB (benzocylobutene) or SOG (spin-on glass) 59 on layer 24 including filling trenches 56, as in FIG. 65. Layer 59 may be planarized to the top horizontal surface of oxide layer 24, as shown in FIG. 66. Then planarized material 59 may be baked and hardened.

Figure 67:
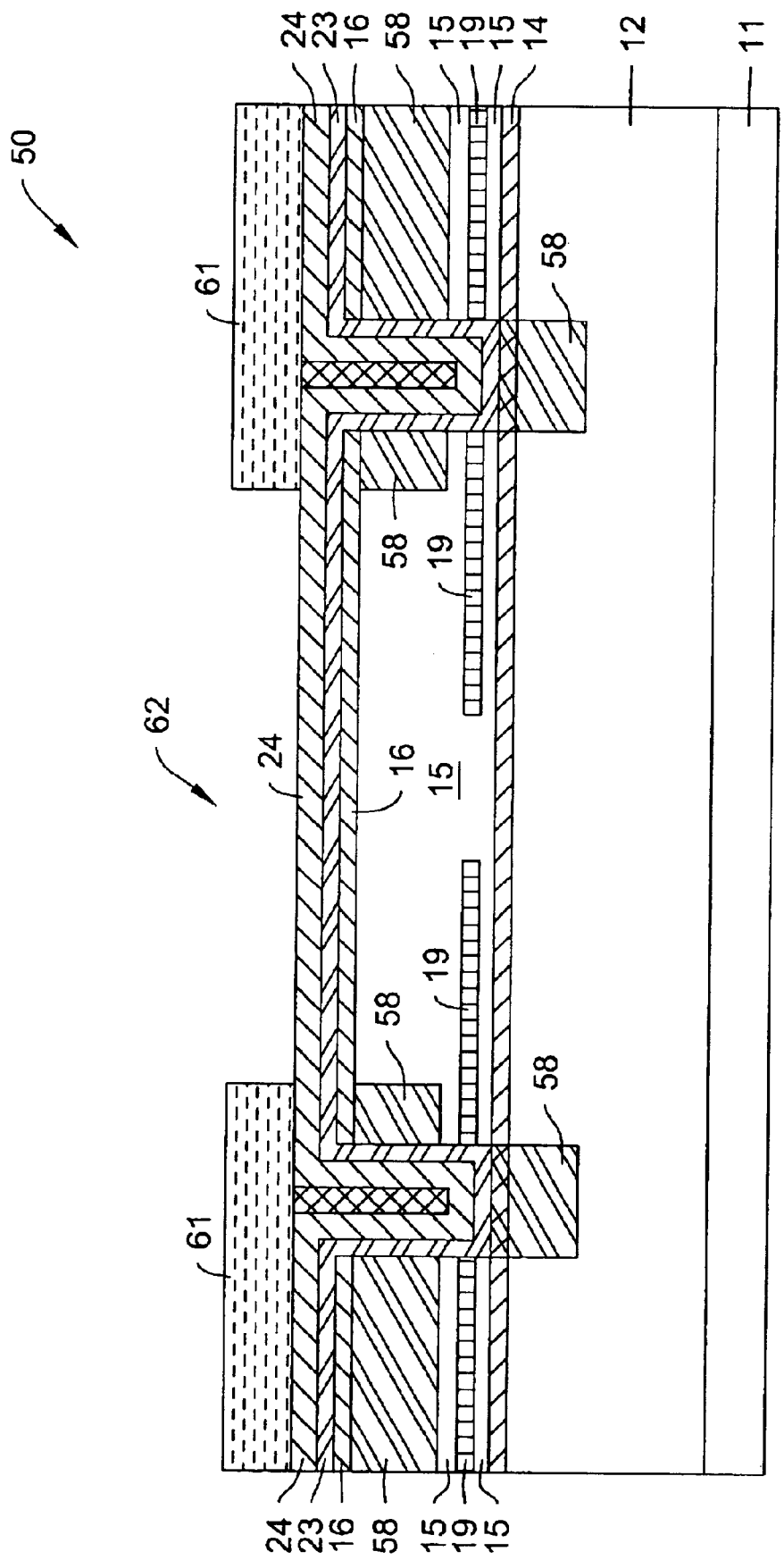
Figure 68:
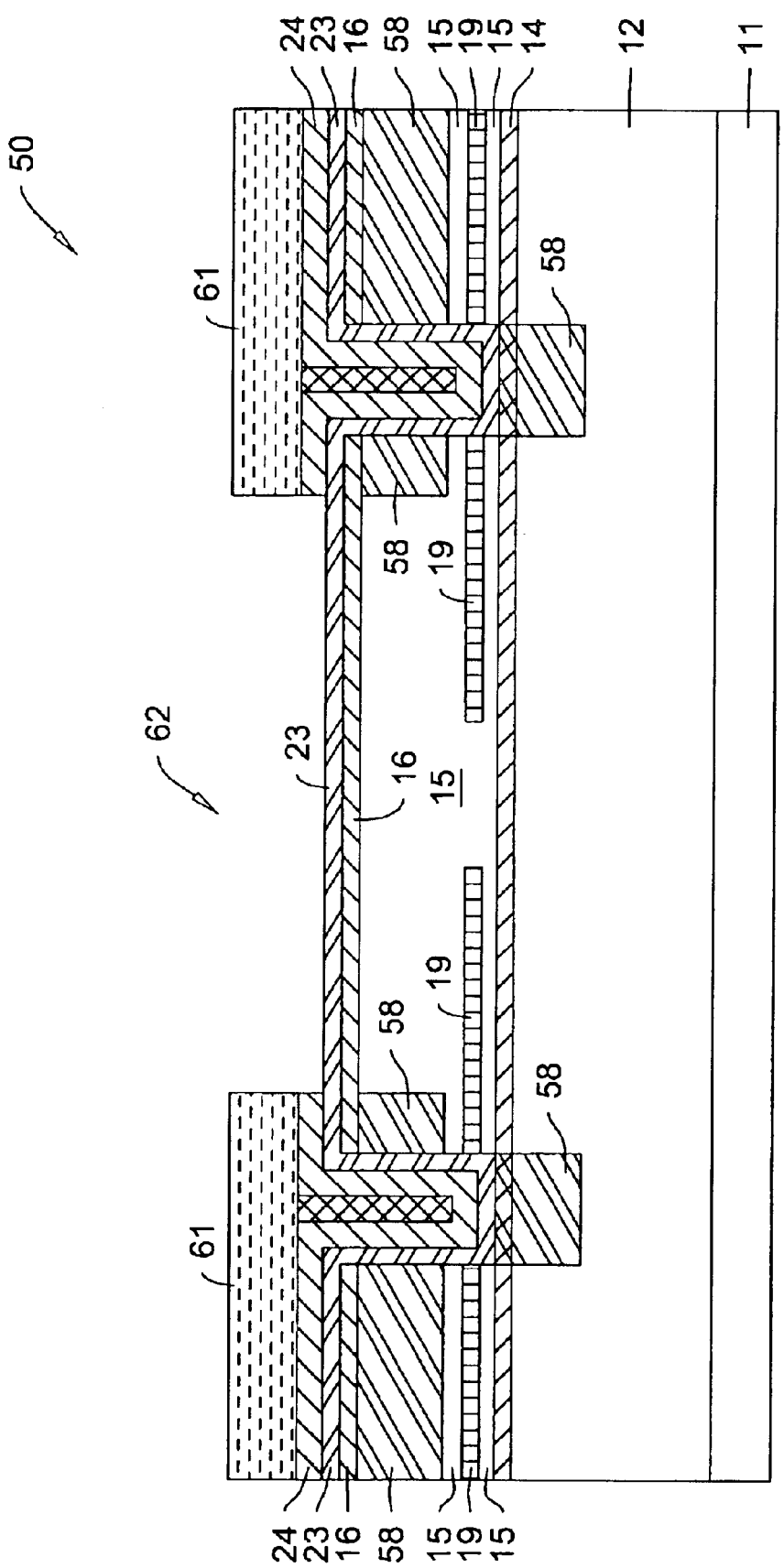
Figure 69:
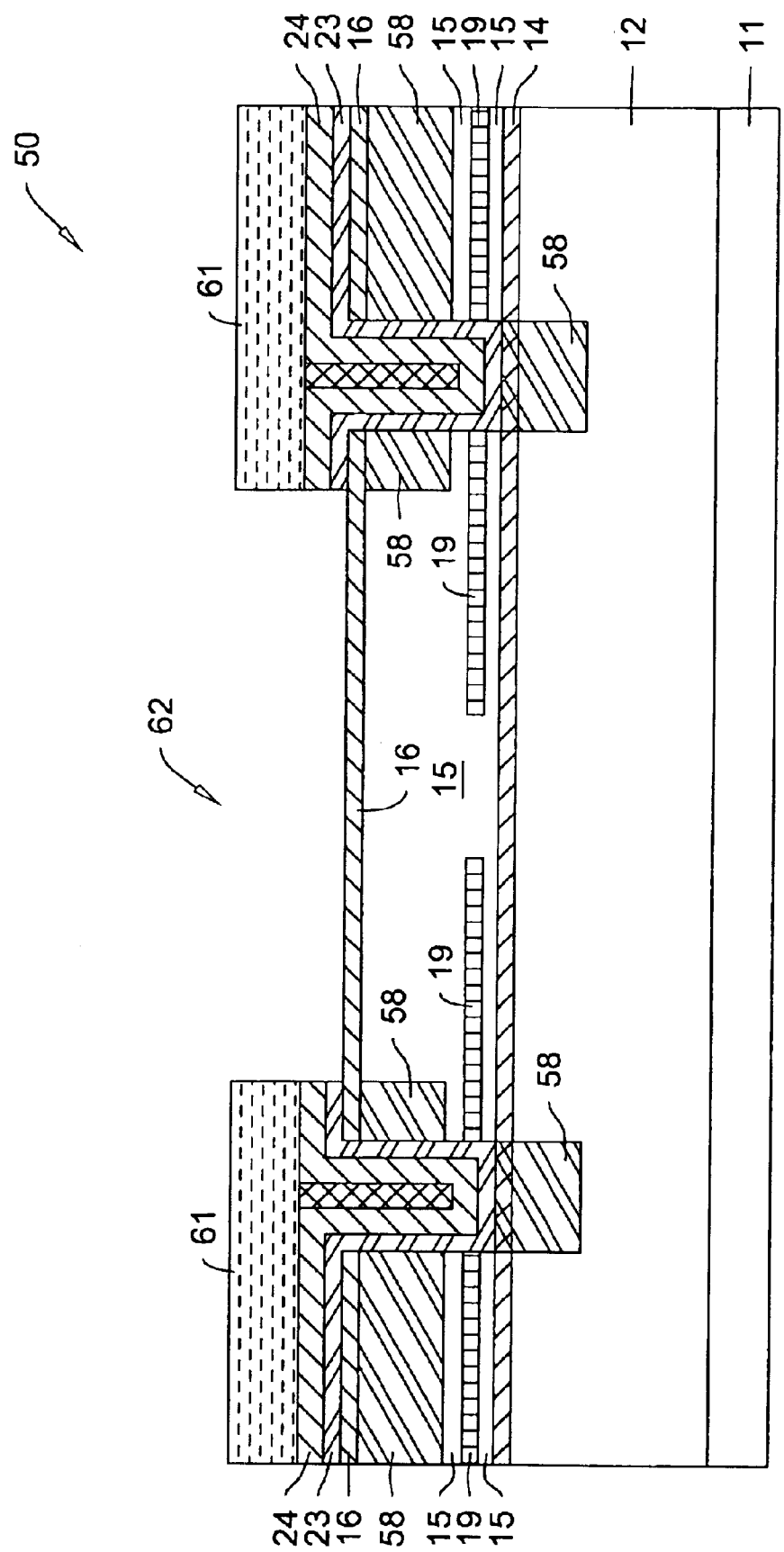
Figure 70:
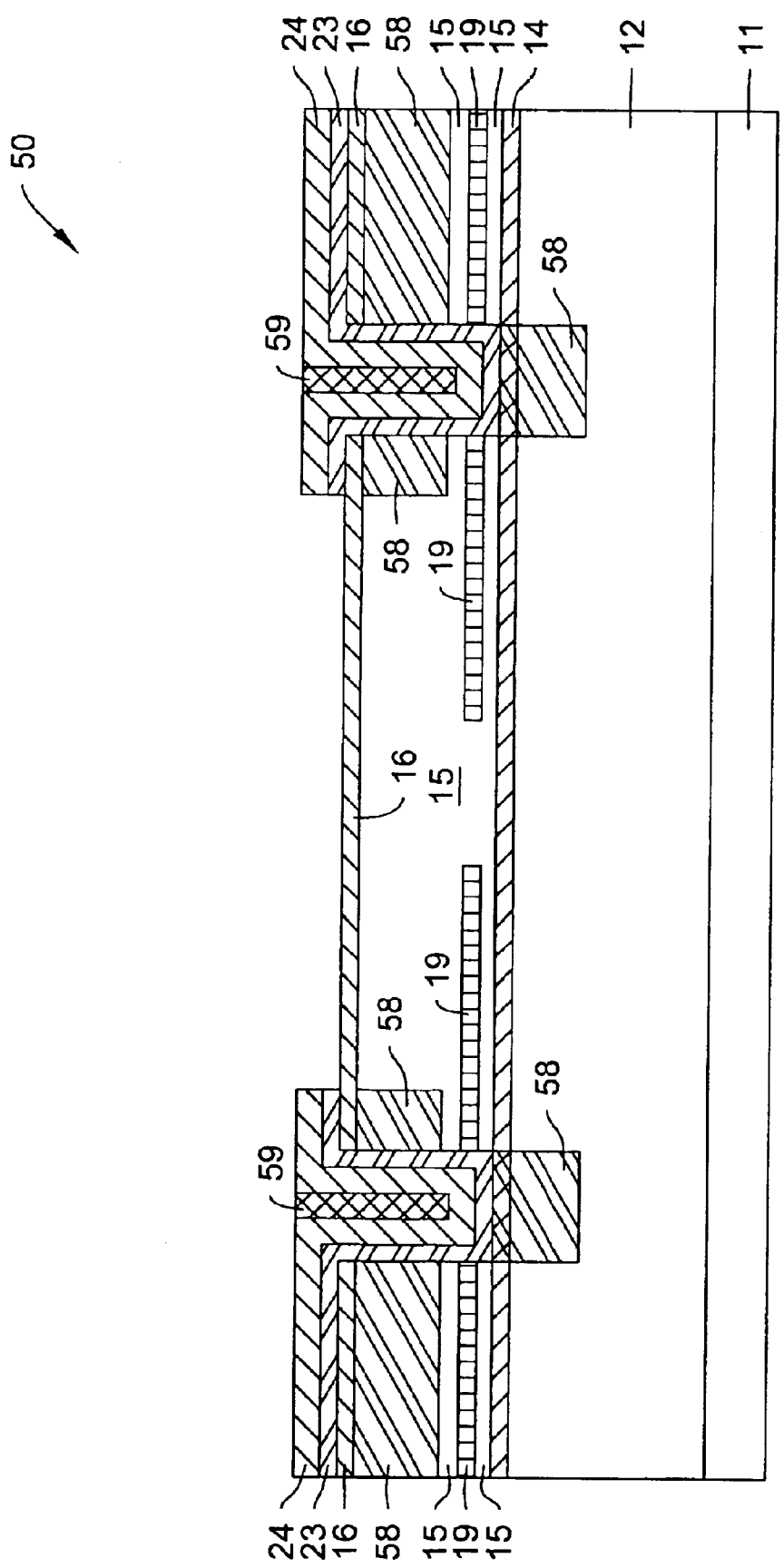
Figure 7I:
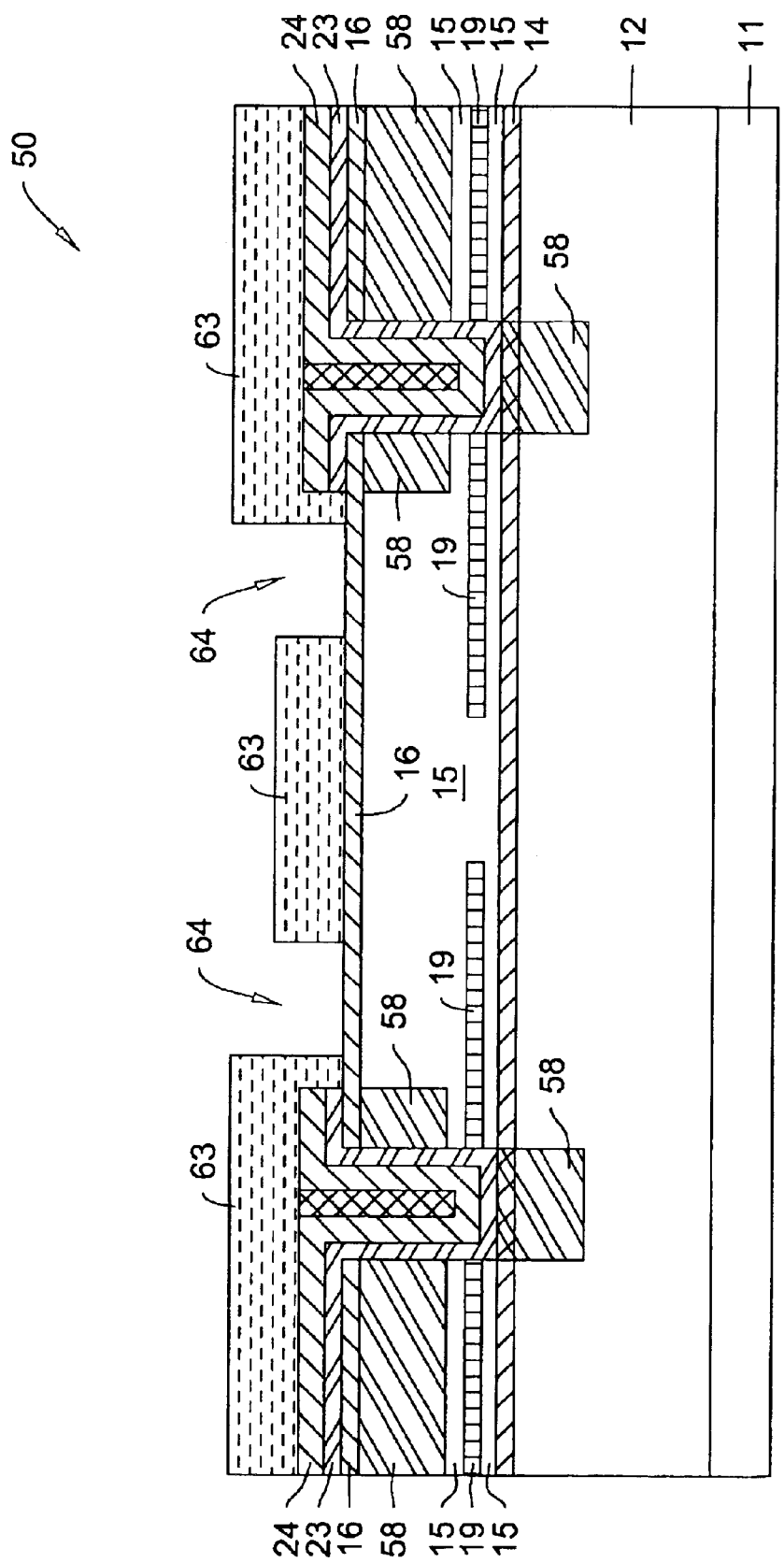

A photo resist 61 may be deposited on oxide layer 24 and material 59 with a circular-like pattern for an aperture having a diameter similar to that of isolation 58 but smaller than the trench 56 diameter. Mask 61 with an open area 62 is shown in FIG. 67. Oxide layer 24 in area 62 may be etched out with a sloped sidewall. Nitride layer 23 in area 62 may be etched out with a selective to stop at the surface of oxide layer 16. These etching steps are shown in FIGS. 68 and 69, respectively. FIG. 70 shows structure 50 with mask 61 stripped.

Figure 72:
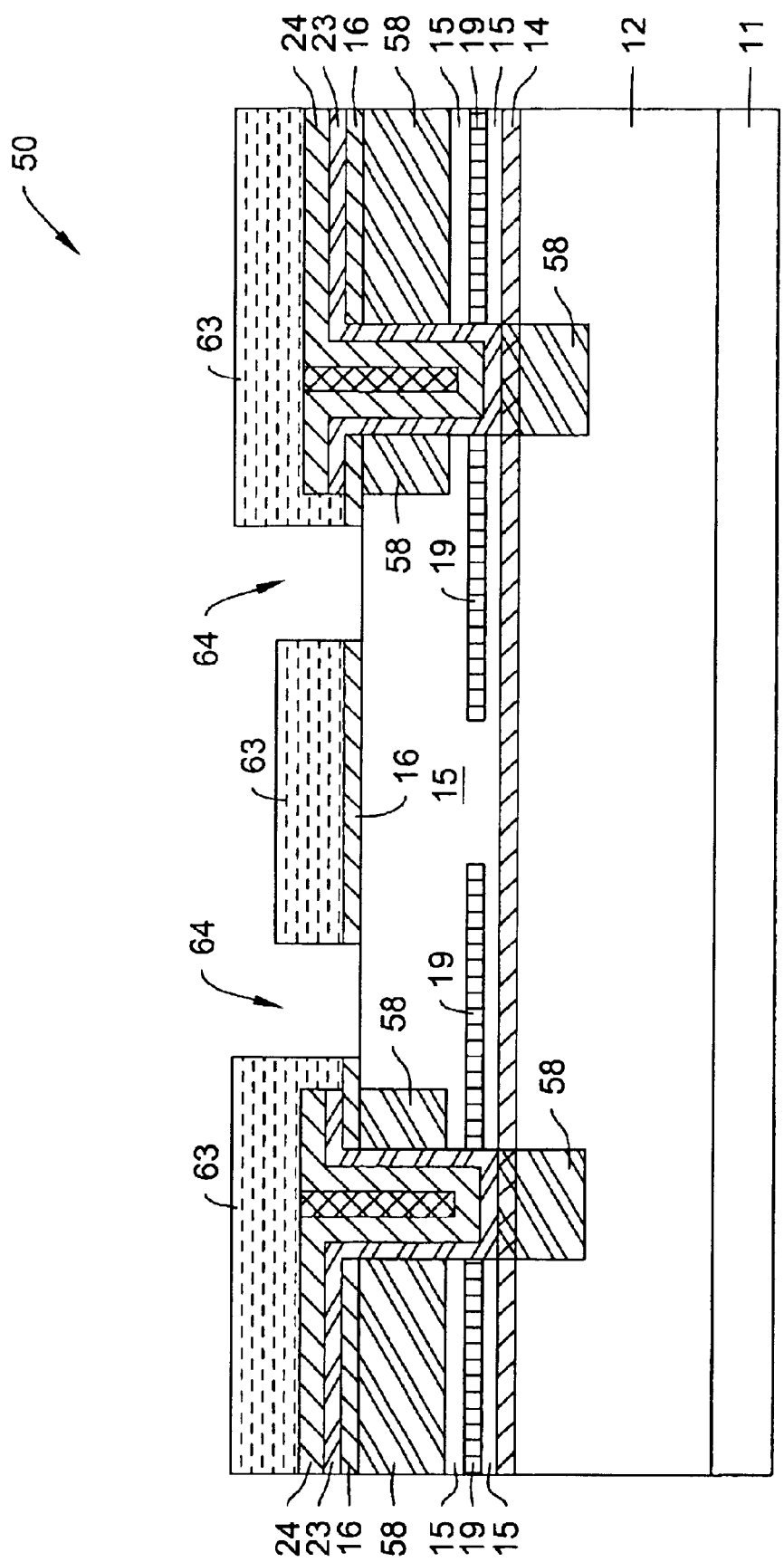
Figure 73:
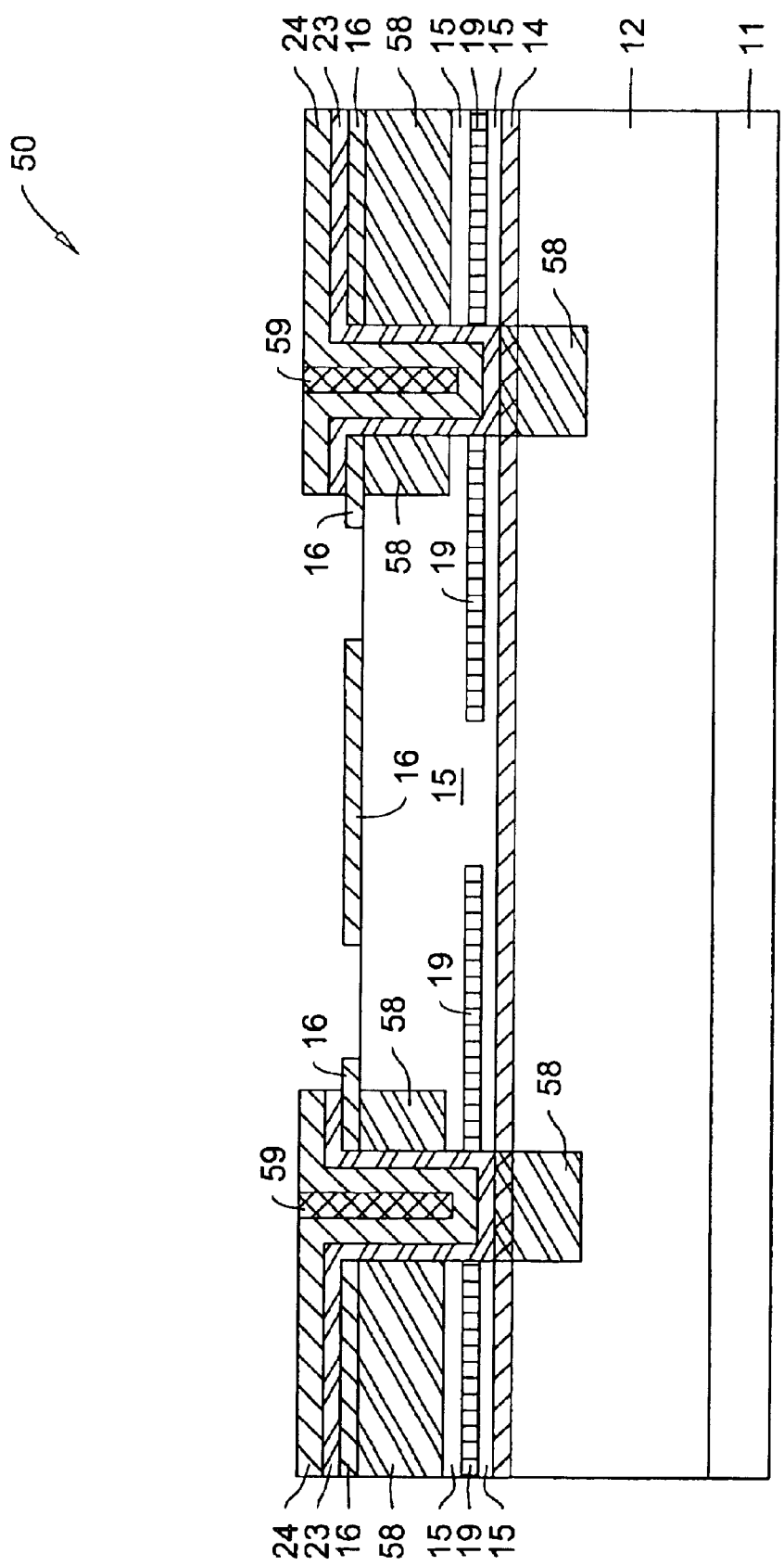

A mask or photo resist layer 63 with openings 64 for a metal contact with a torus pattern may be deposited on the surfaces of oxide layers 16 and 24. A portion of oxide layer 16 in area 64 may be etched away down to the top of mirror 15, as shown in FIG. 72. FIG. 73 shows photo resist material 63 stripped from structure 50.

Figure 74:
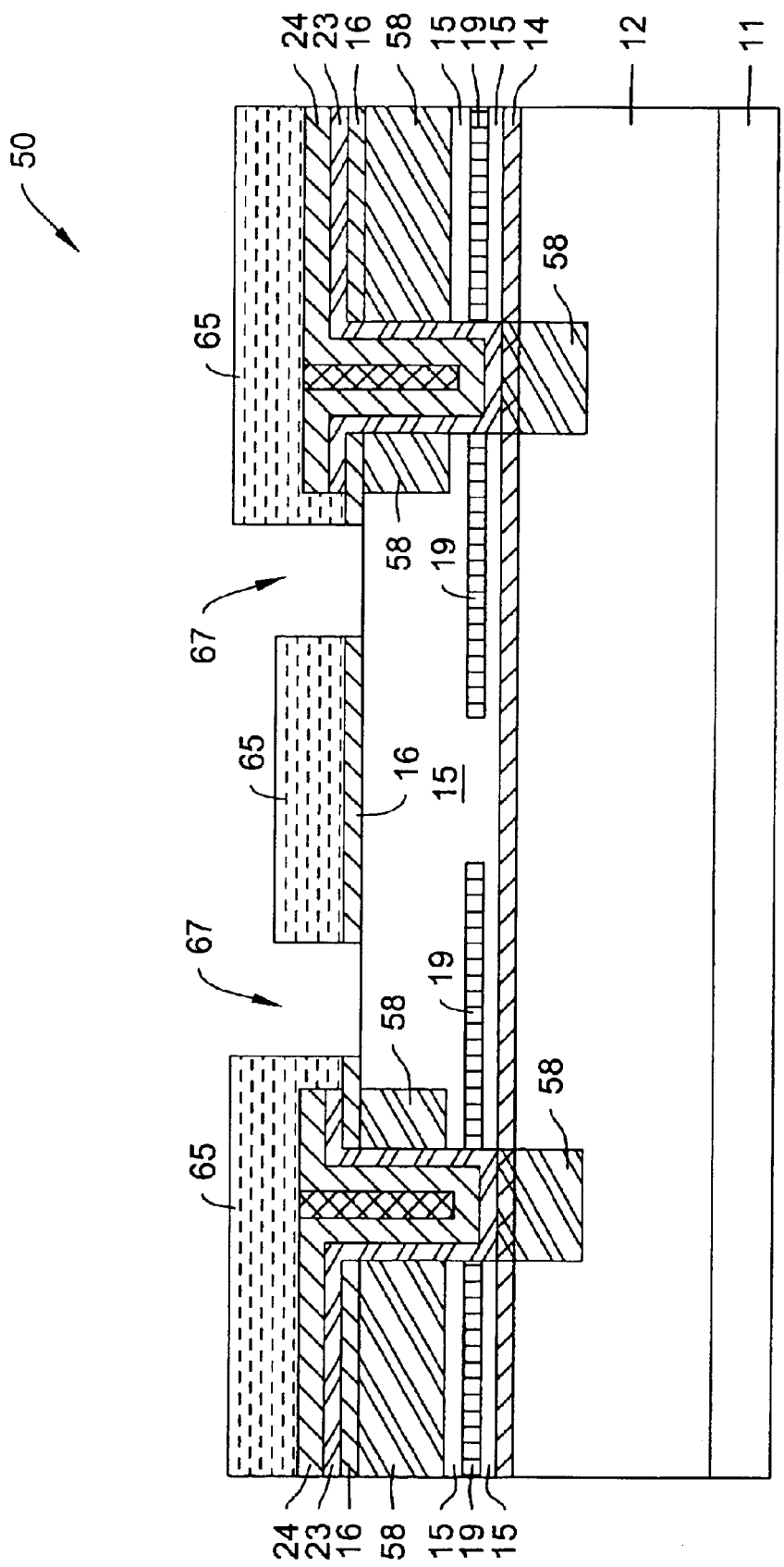
Figure 75:
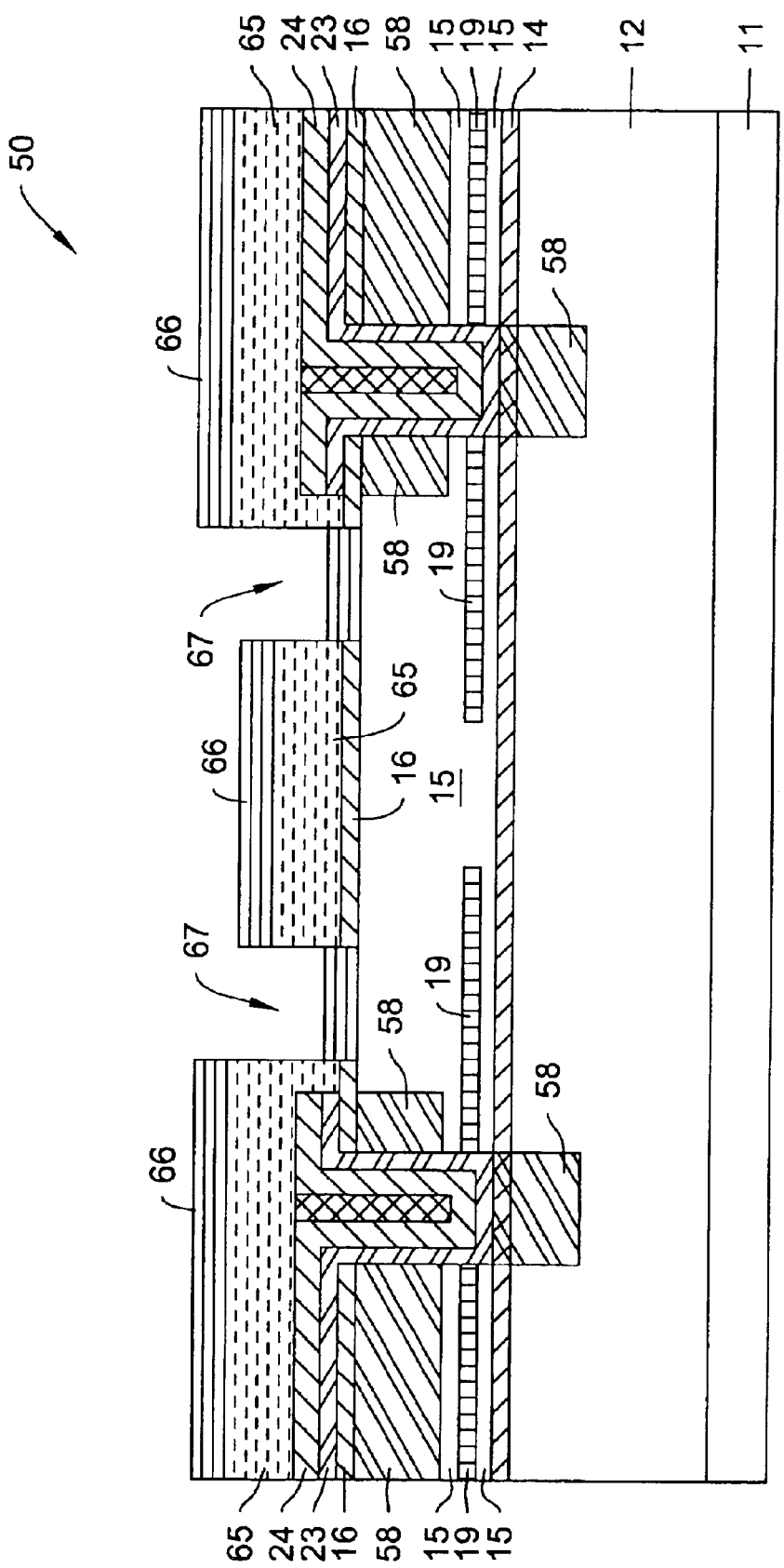
Figure 76:
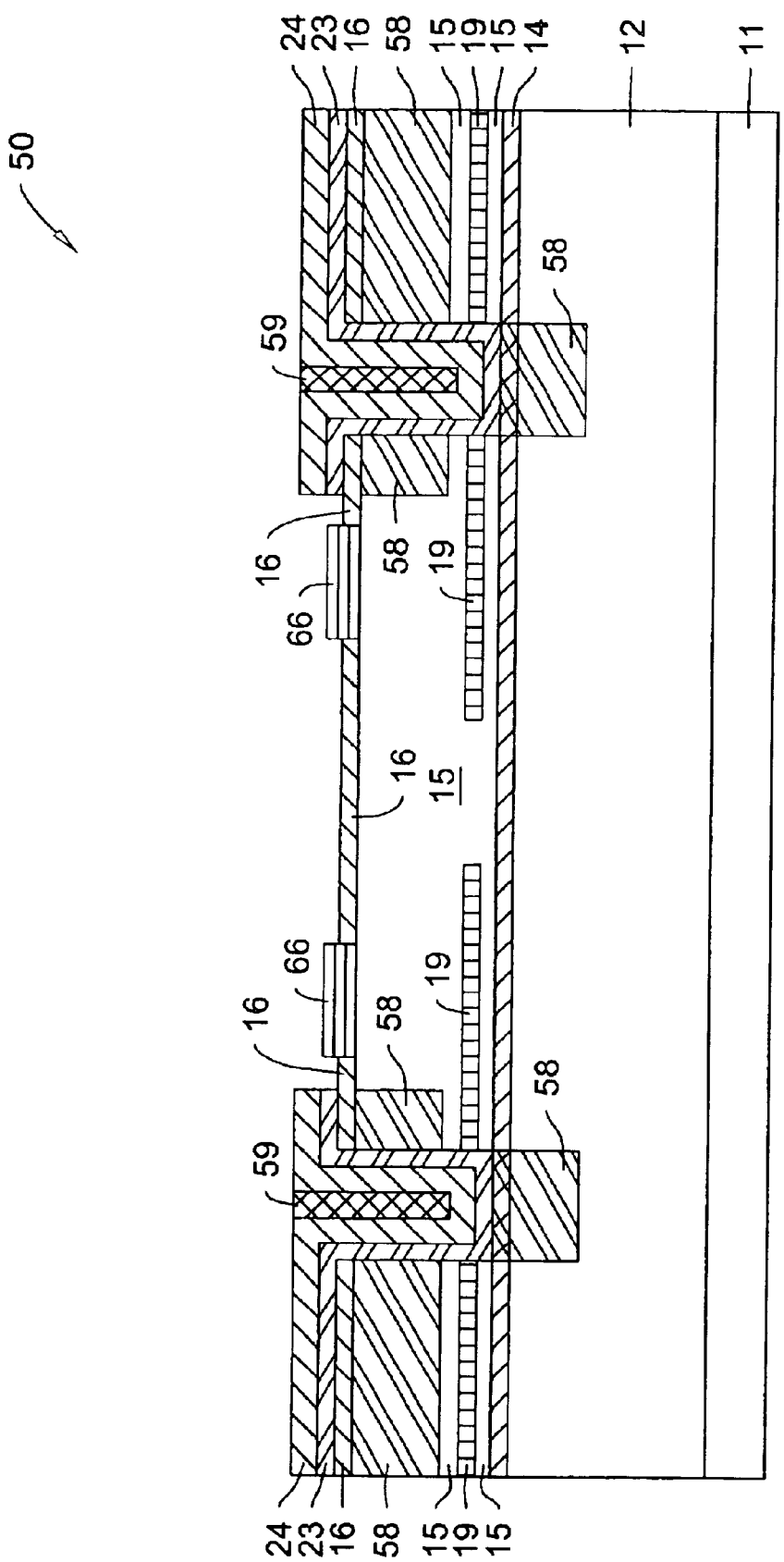
Figure 77:
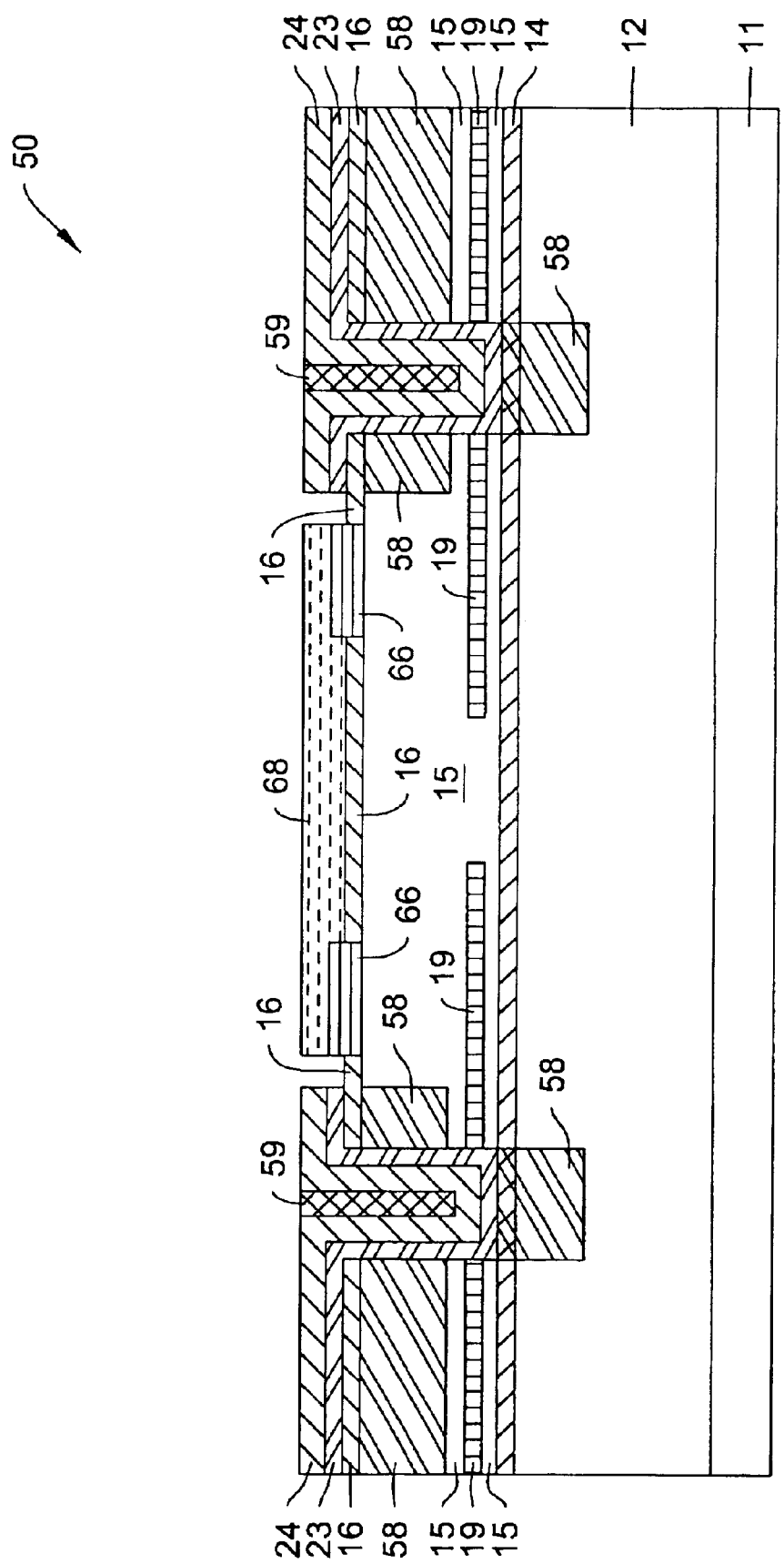
Figure 78:
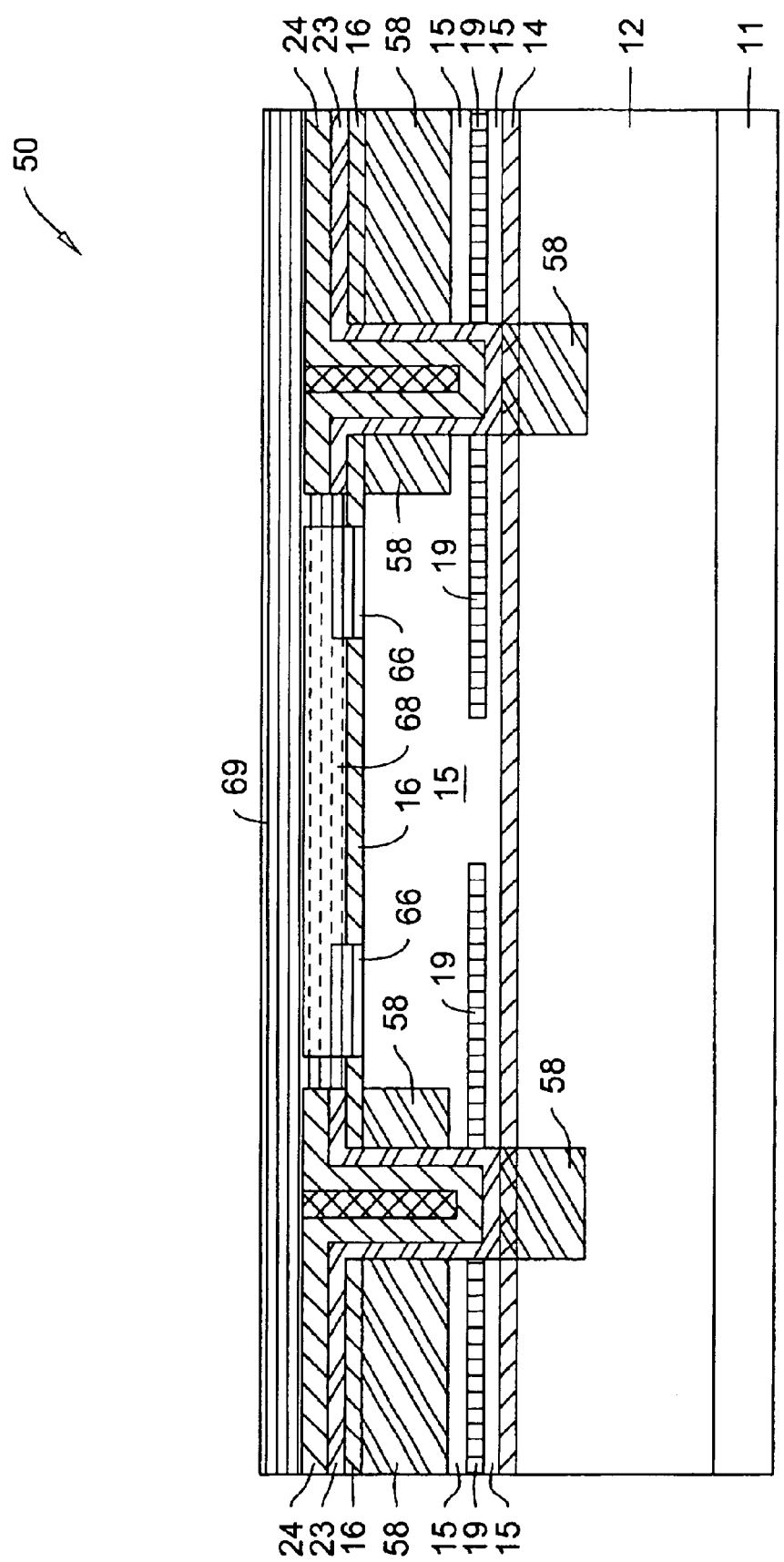
Figure 79:
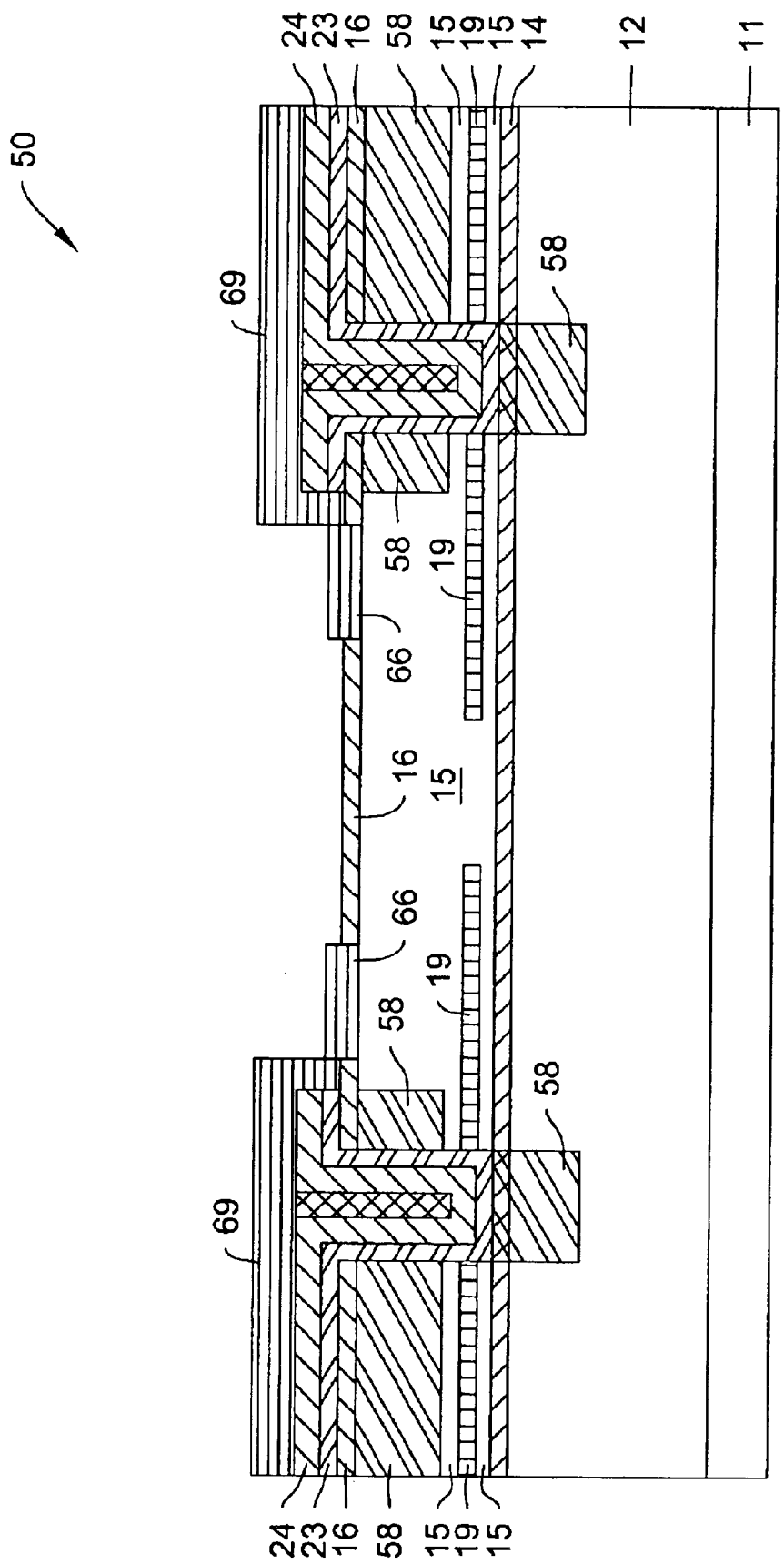

A photo resist (LOR+PR) 65 for a metal full aperture and bond pad pattern may be applied on portions of layers 16, 24 and 59, as shown in FIG. 74. Then an n-ohmic contact 66 may be made with the beam deposition of a thick Au/Ge alloy in area 67 on mirror 15. The results of this deposition are shown in FIG. 75. Metal 66 on photo resist 65, and photo resist 65 may be lifted off and stripped, respectively, as in FIG. 76. A mask 68 may be applied for the bond pad connection metal layer. Metal layer 69 may be applied with electrical contact to contact 66. These steps are shown in FIGS. 77 and 78, respectively. Photo resist 68, and metal 69 on photo resist 68 may be stripped and lifted off, respectively, as revealed in FIG. 79. An n-ohmic contact 71 may be ebeam deposited on the backside of substrate 11. The deposited material may be an Au/Ge alloy. The metal of structure may be annealed (i.e., RTA).

Figure 81:
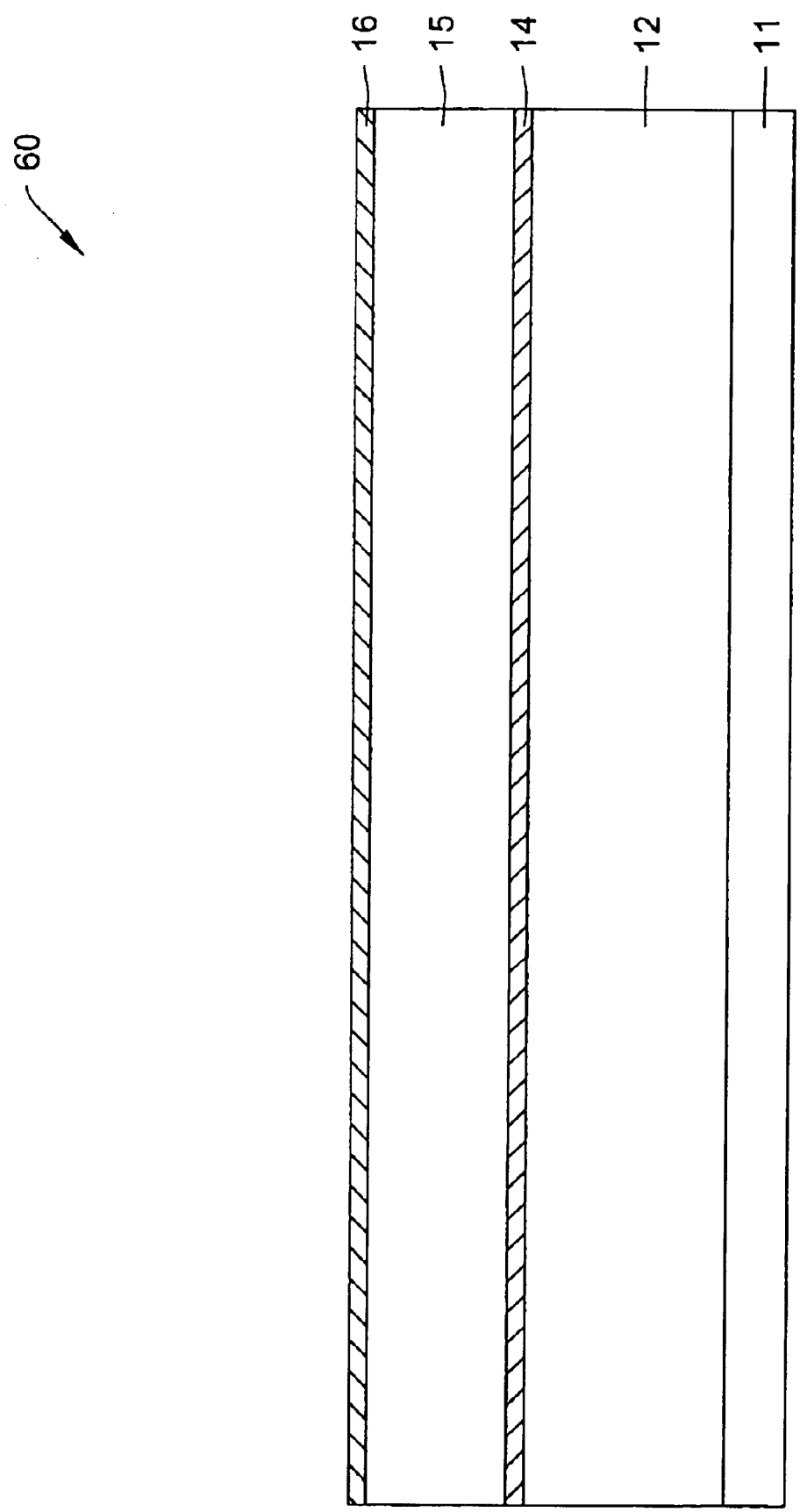
Figure 82:
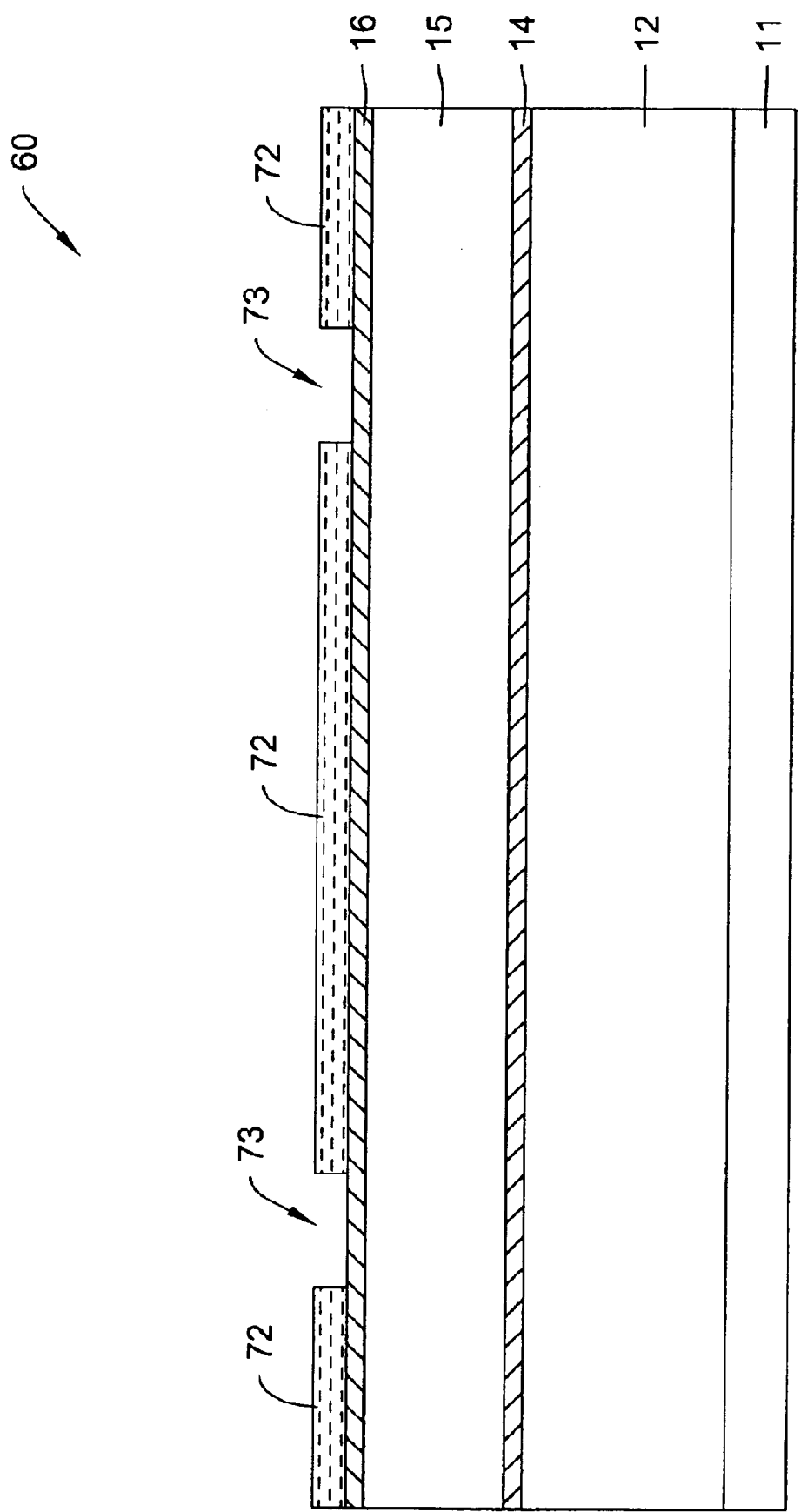
Figure 83:
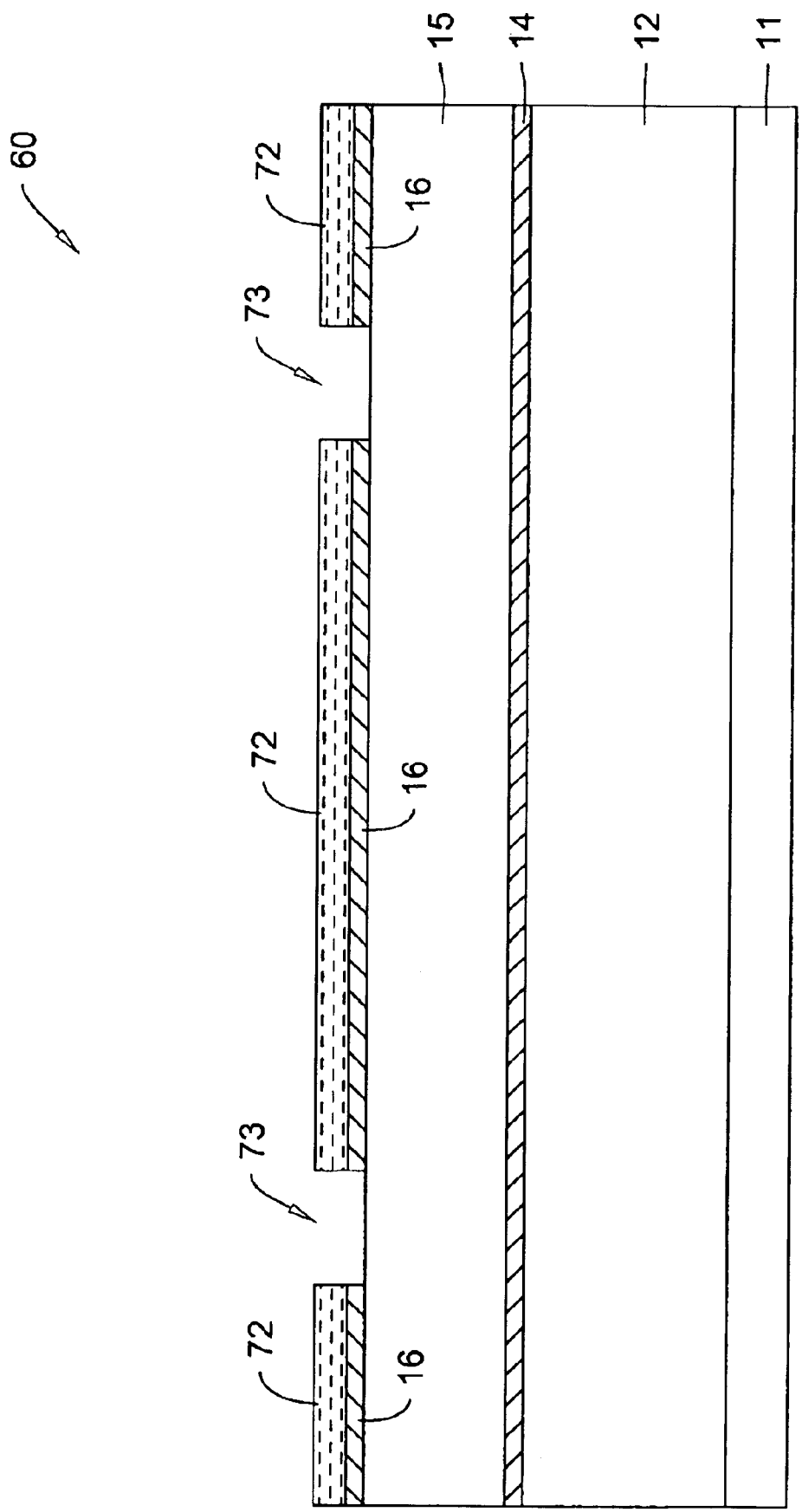
Figure 84:
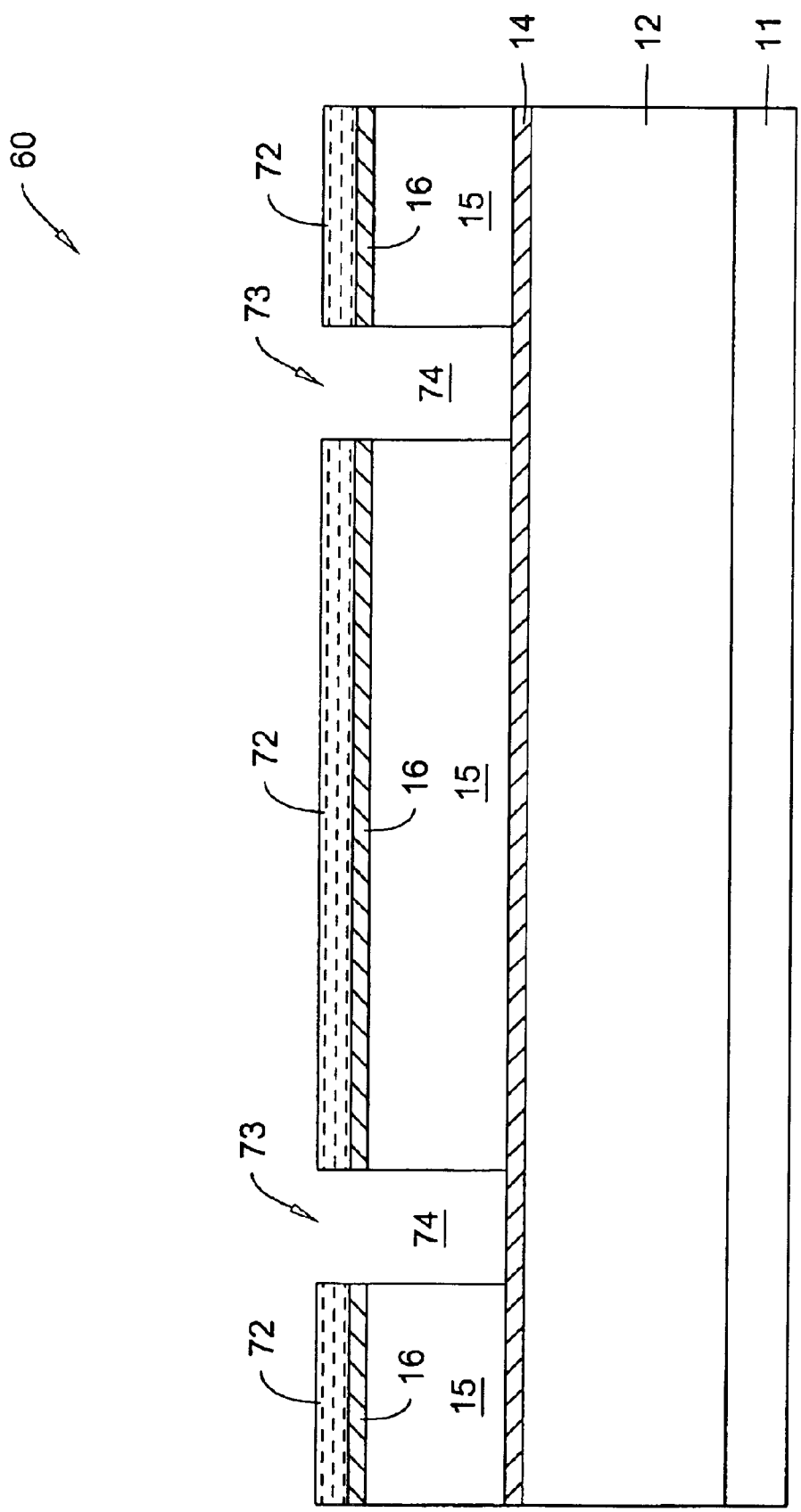
Figure 85:
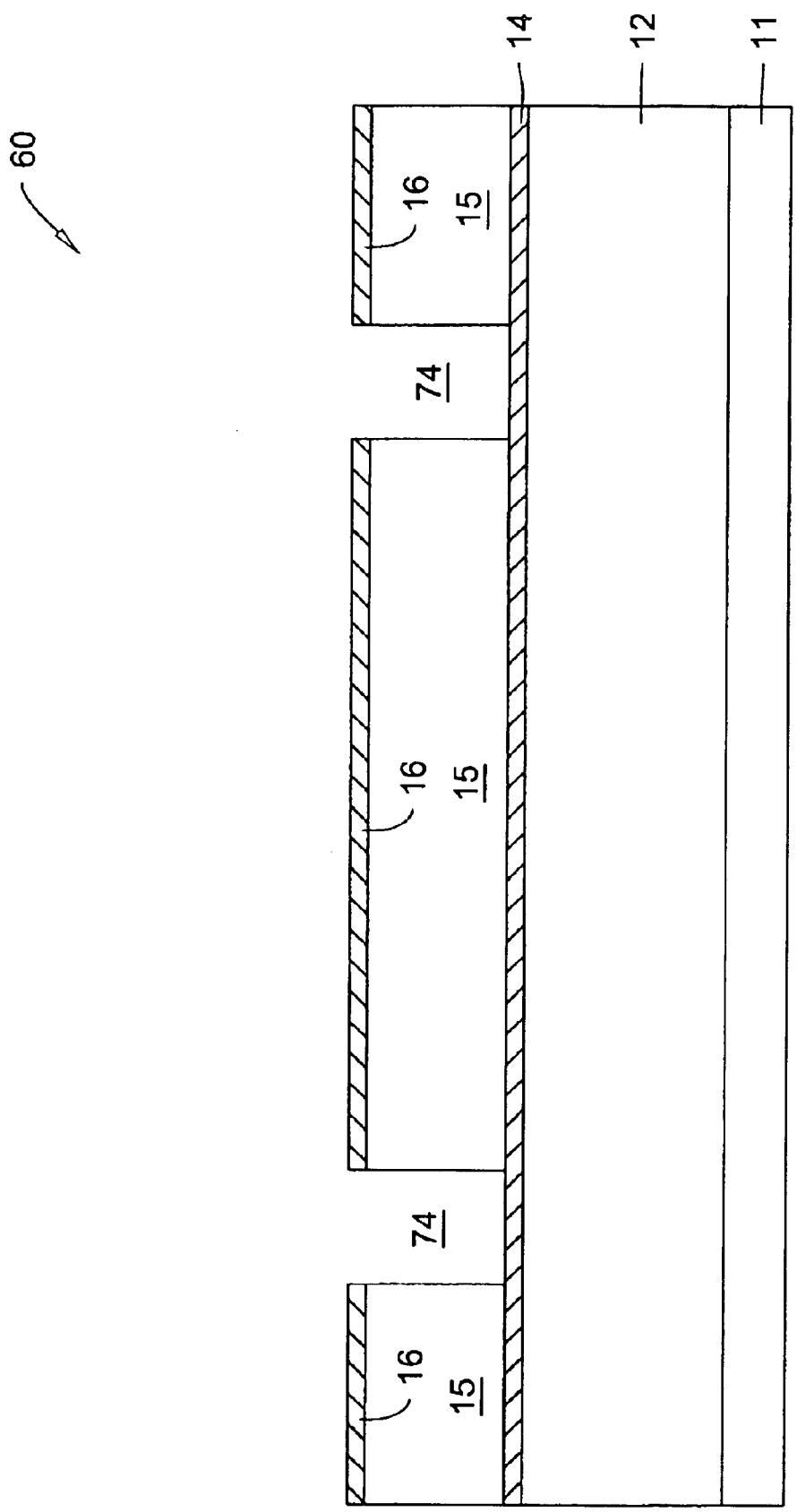

Another process involving the making of an air bridge, a wide trench and a thick pad dielectric but no Fetch, may begin with a one-half wavelength thick oxide layer 16 deposited with PECVD on a mirror 15, as shown in FIG. 81. A mask 72 for a wide trench spoke and torus pattern for oxide and isolation trench etching may be deposited on oxide layer 16, as revealed for structure 60 in FIG. 82. A portion of oxide layer 16 in open area 73 of mask 72 may be etched down to the top of mirror 15. Area 73 may extended by an ICP etching of mirror 15 down to active region or layer 14 resulting in a trench 74. The oxide layer 16 and mirror 15 etching results are in FIGS. 83 and 84, respectively. In FIG. 85, photo resist or mask 72 may be stripped.

Figure 86:
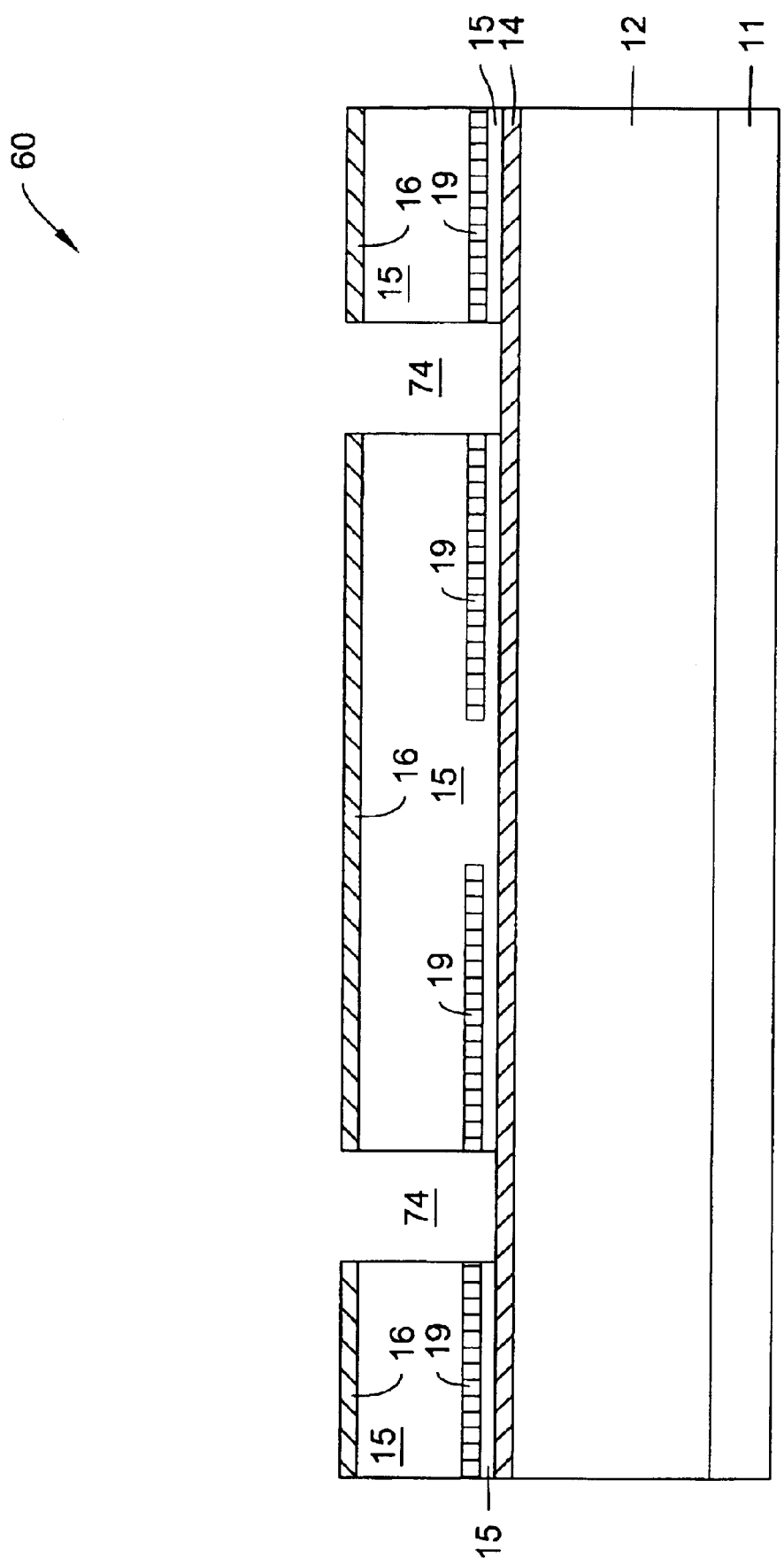

Structure 60 may be immersed in an environment resulting in wet oxidation of an oxidizable layer in mirror 15 to provide a current aperture with oxidized layer 19, as shown in FIG. 86.

Figure 87:
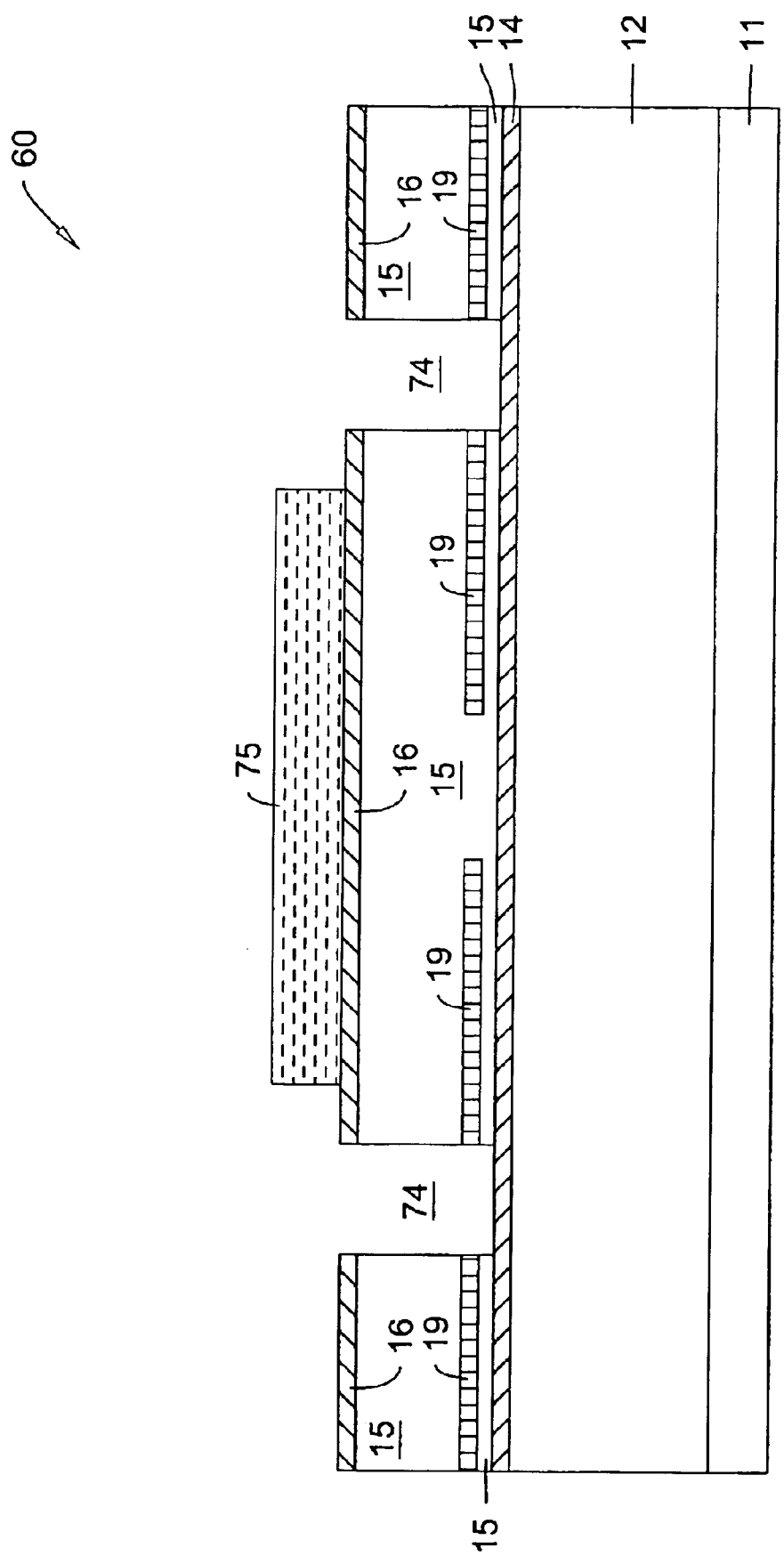
Figure 89:
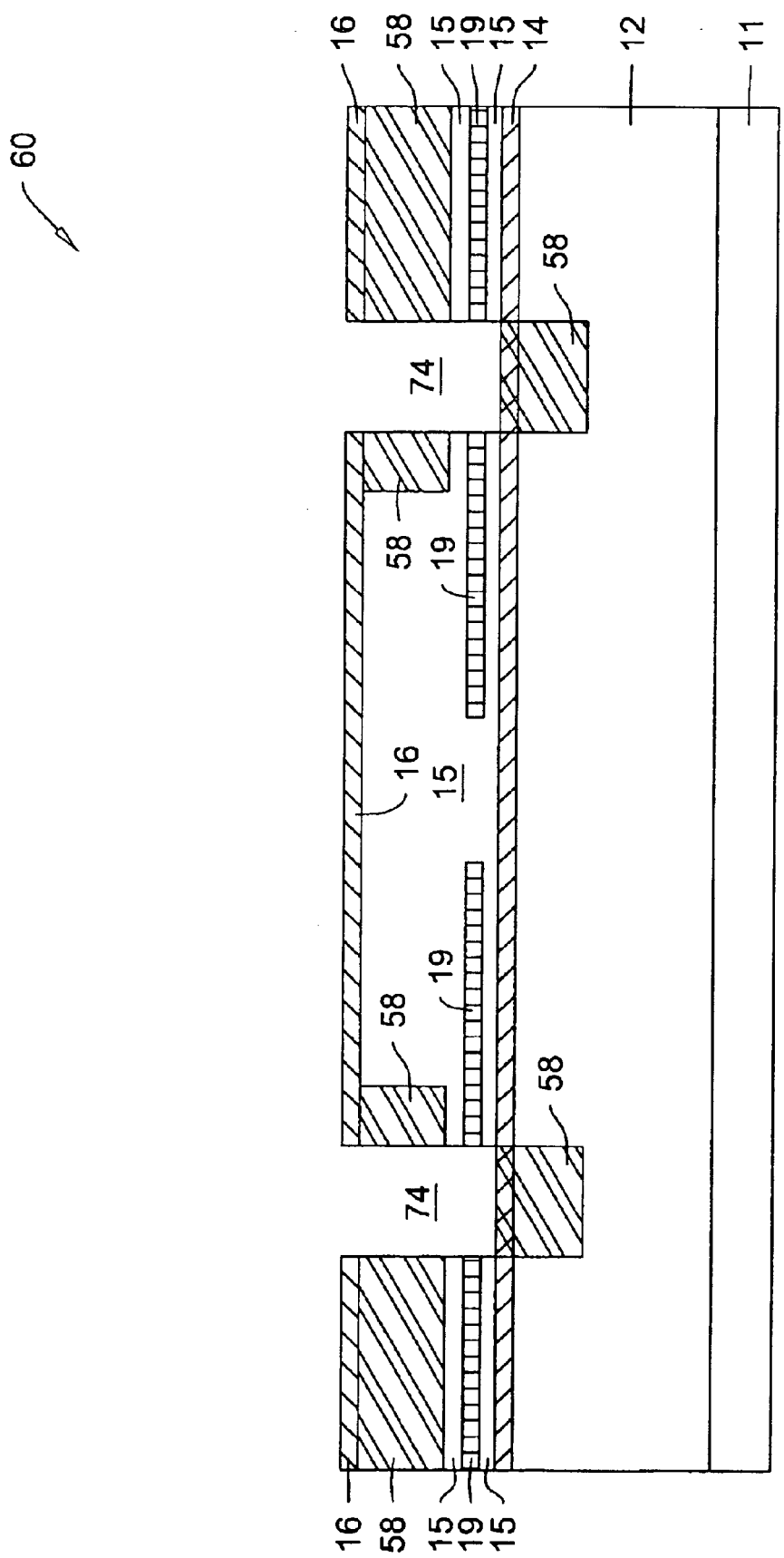

An isolation implant may be provided for structure 60, but may be optional depending on the desired design and application of structure 60. For such implant, a mask 75 having a circular pattern may be formed on layer 16 at about the center of structure 60 in FIG. 87. An ion implant may be performed from the top direction at multiple levels, such as 7e14 and higher doses. An isolation implant 58 may affect structure 60 in most areas except below mask 75. The results are shown in FIG. 89. In FIG. 89, mask 75 may be stripped.

Figure 90:
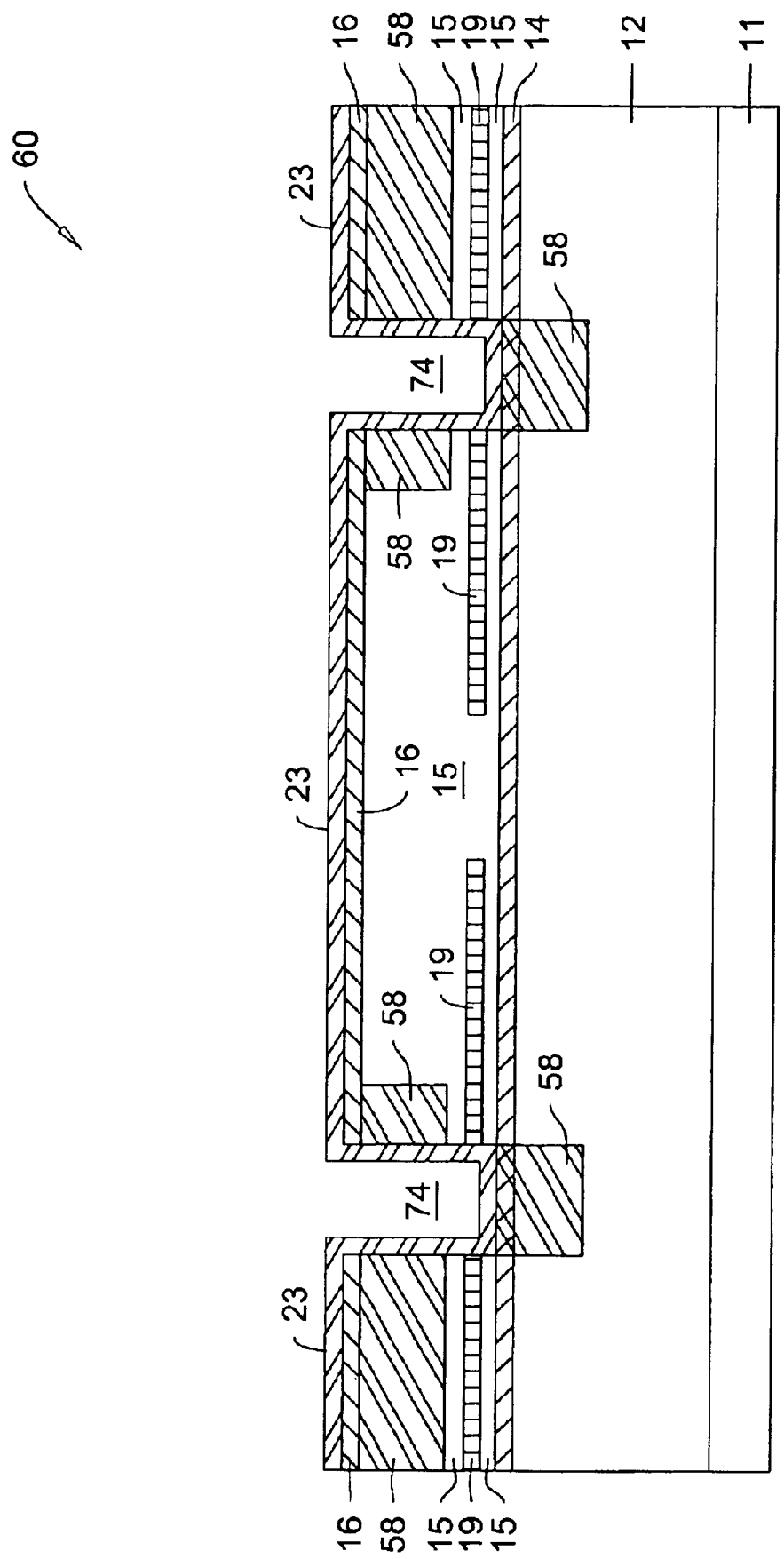
Figure 91:
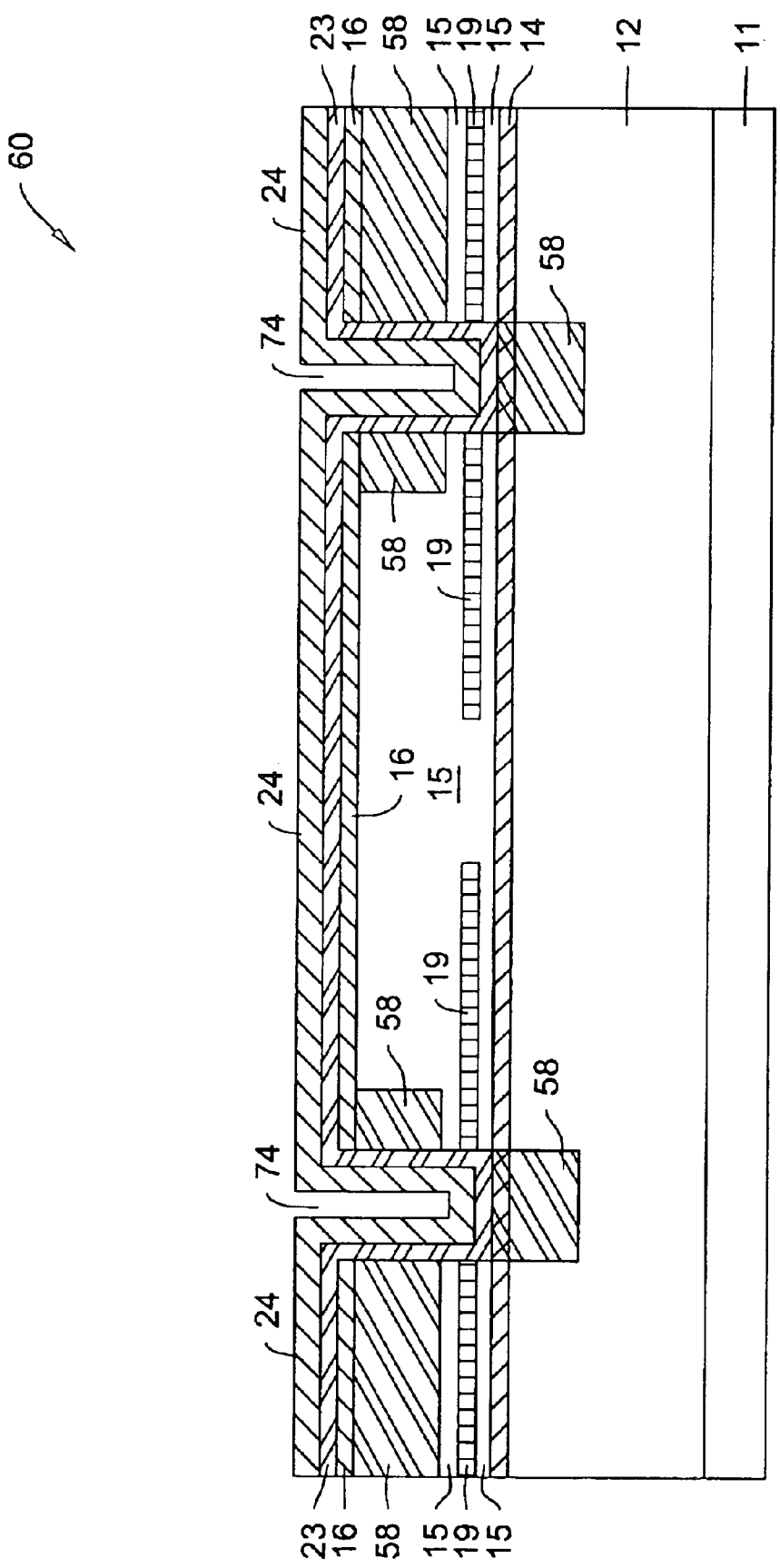

About a 0.5 micron thick nitride layer 23 may be applied with PECVD on structure 60 as indicated in FIG. 90. On layer 23, a thick dielectric oxide layer 24 of a one micron plus thickness may be deposited via PECVD as shown in FIG. 91.

Figure 92:
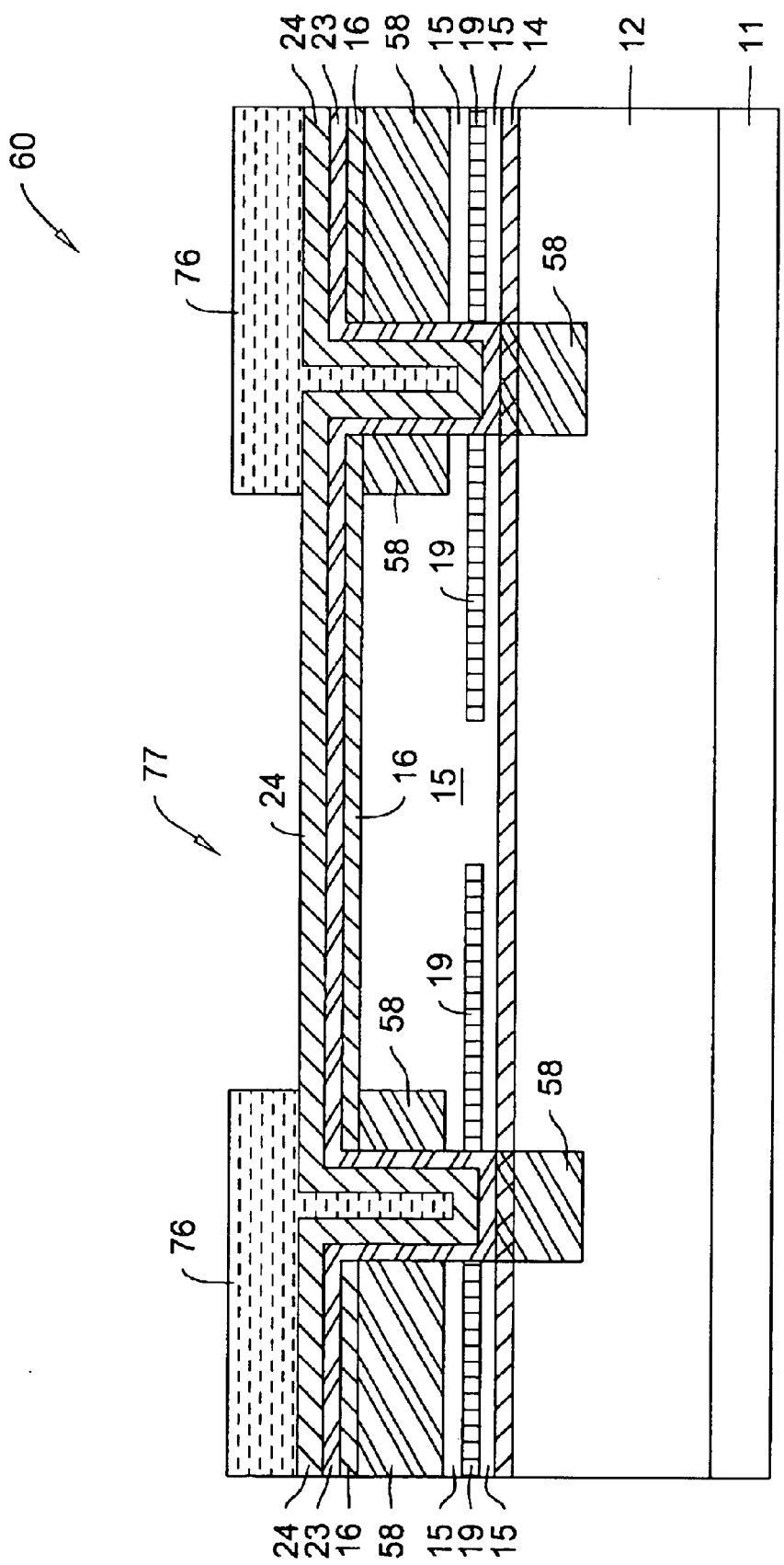
Figure 93:
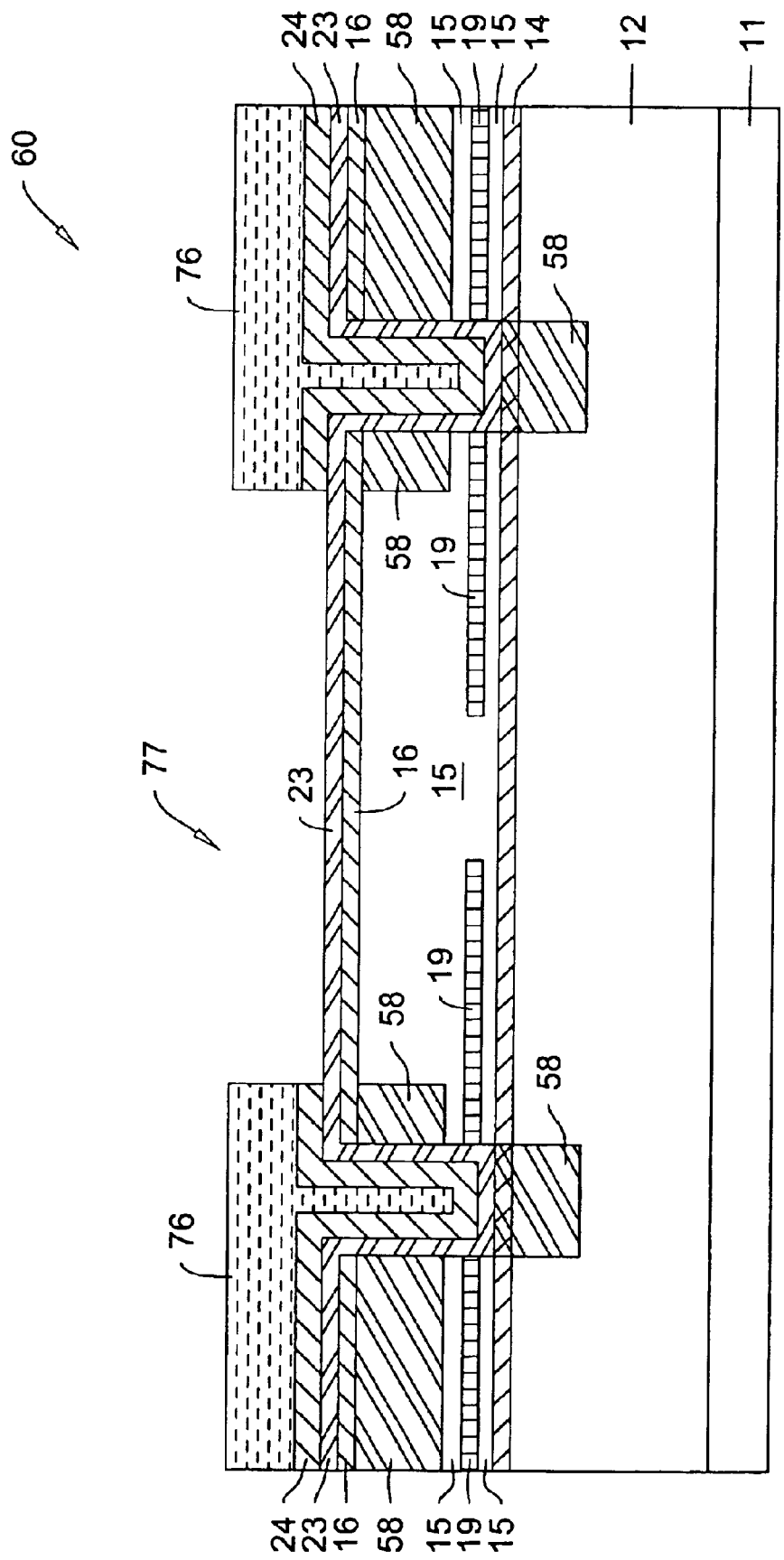
Figure 94:
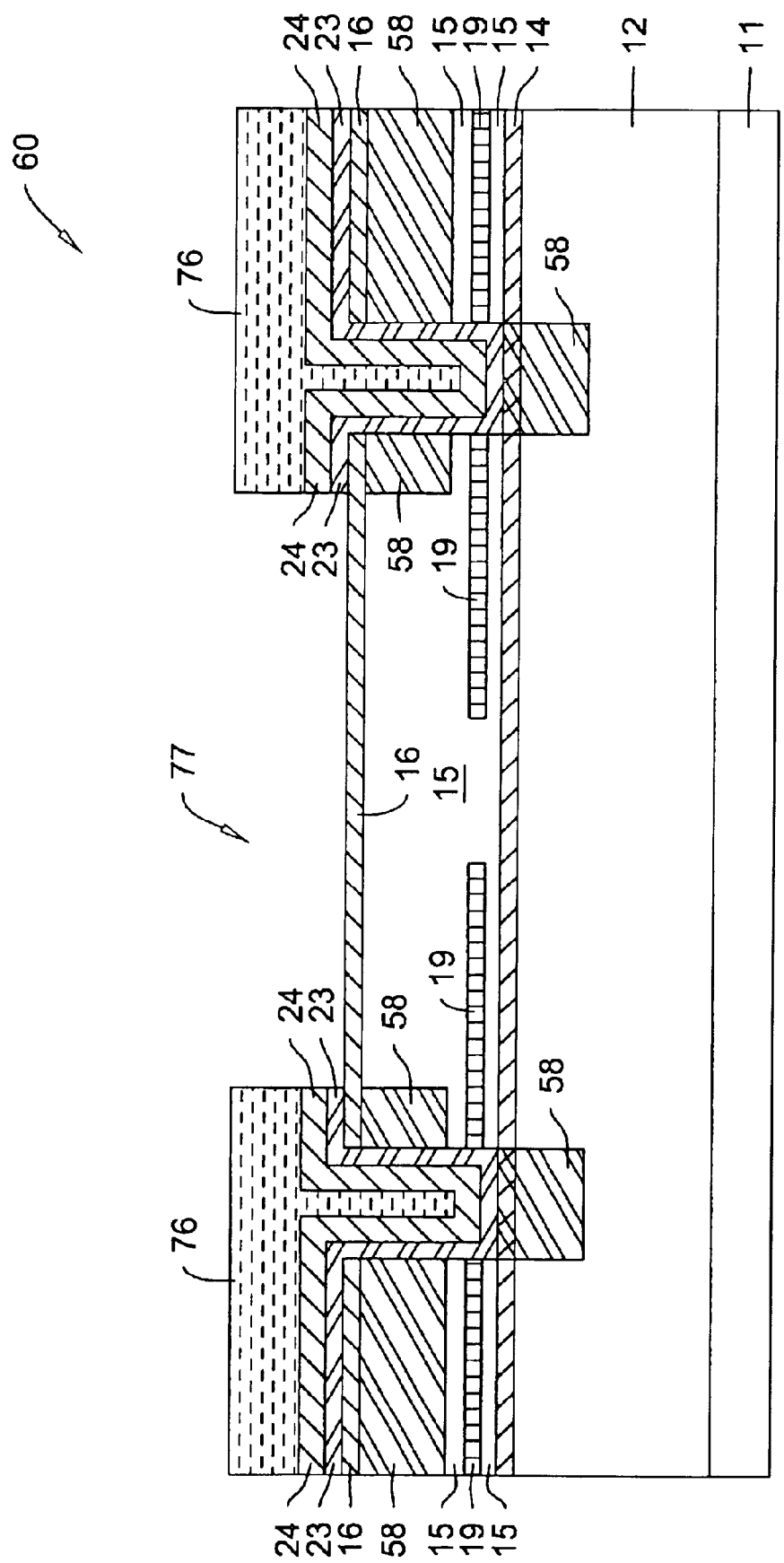
Figure 95:
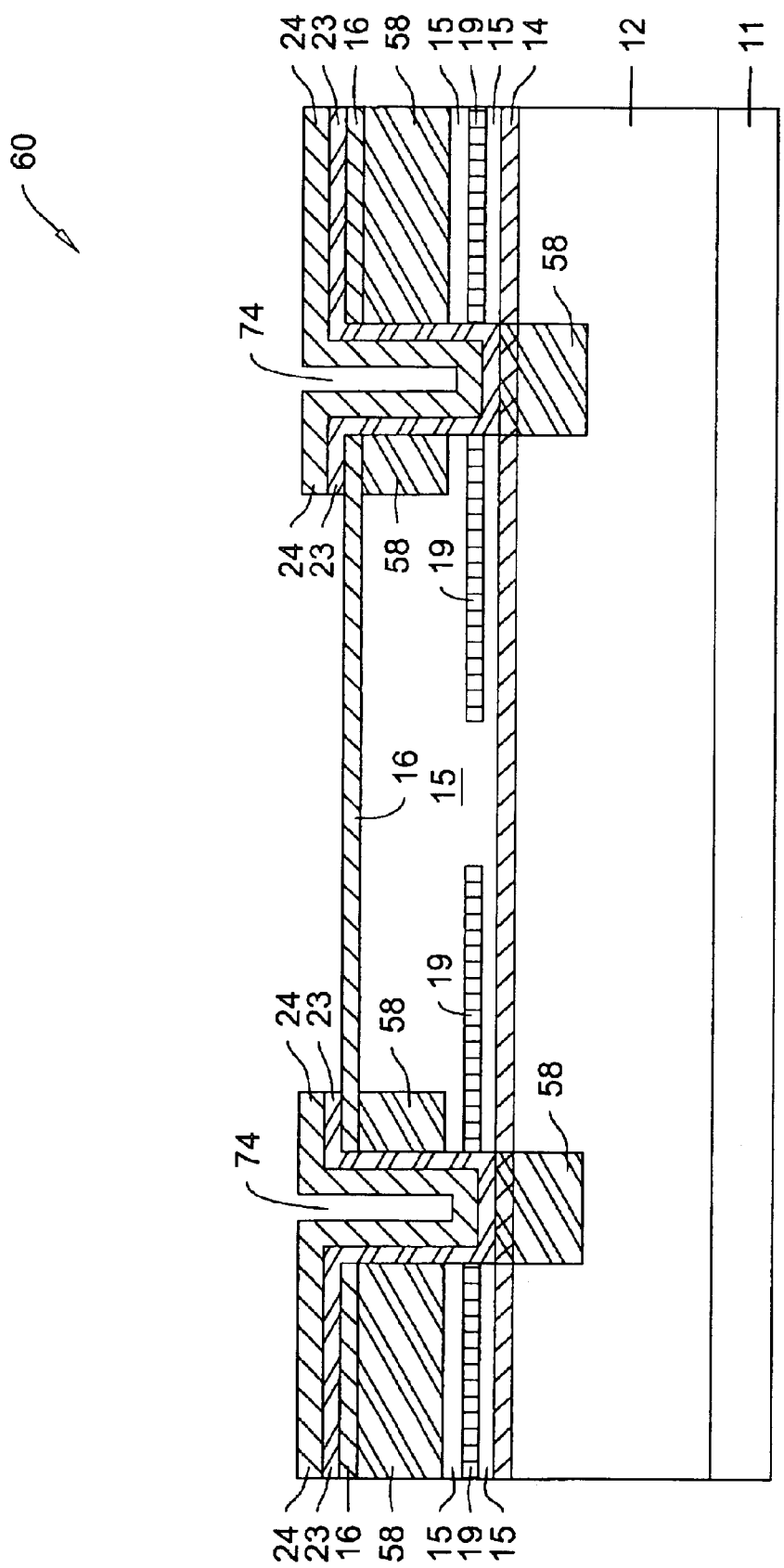

A mask of photo resist 76 having a circular pattern, having an opening 77 with a diameter similar to the diameter of isolation 58, but smaller than the trench diameter, may be formed on structure 60, filling in trench 74 and covering a portion of oxide layer 24, as shown in FIG. 92. Oxide layer 24 in opening 77 may be etched with a sloped sidewall. Nitride layer may be etched with another agent that is selective to stop on the original one-half wavelength oxide layer 16. These etching results are shown in FIGS. 93 and 94, respectively. Photo resist 76 may be stripped from structure 60, including from trench 74, as indicated in FIG. 95.

Figure 96:
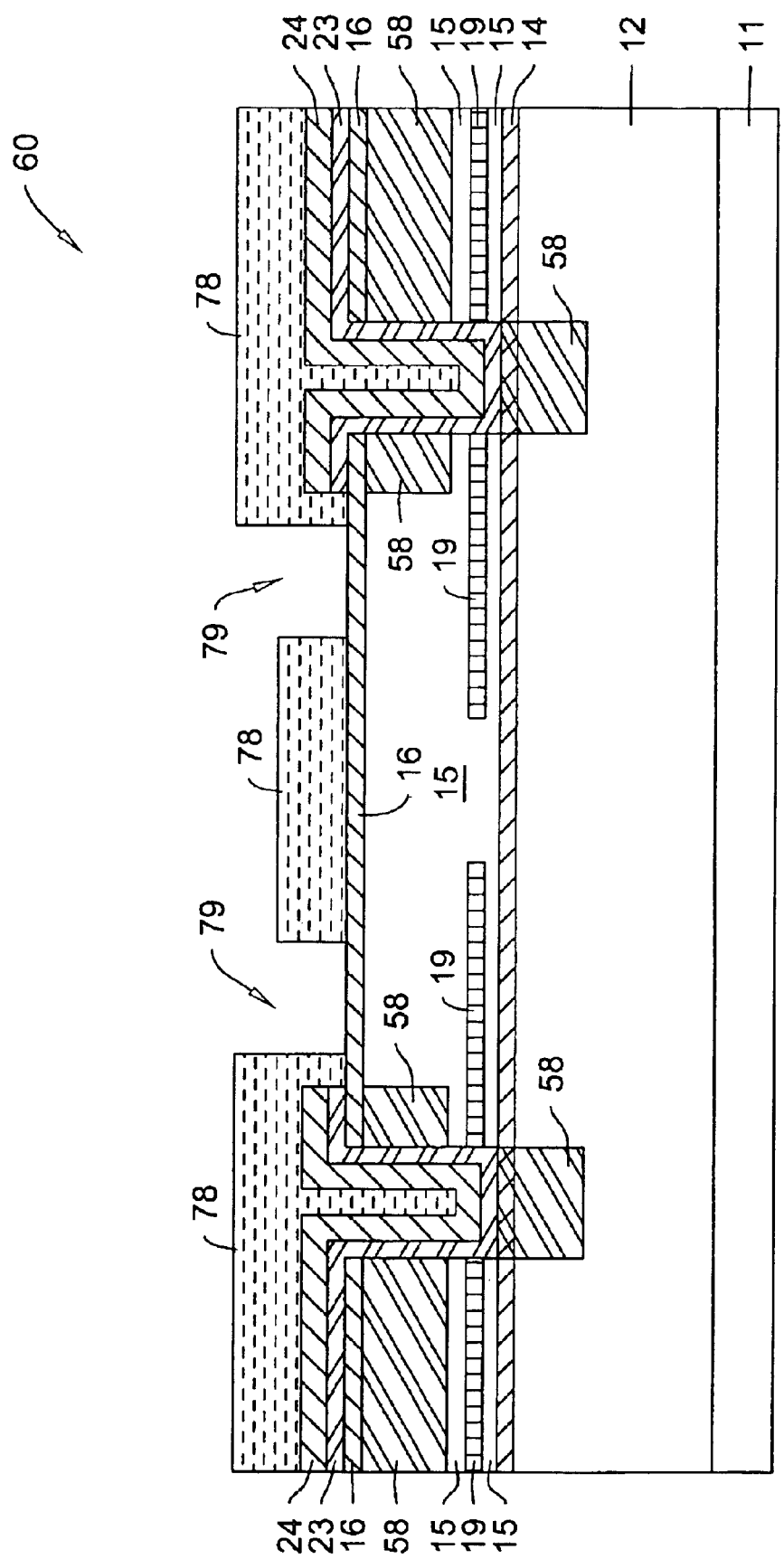
Figure 97:
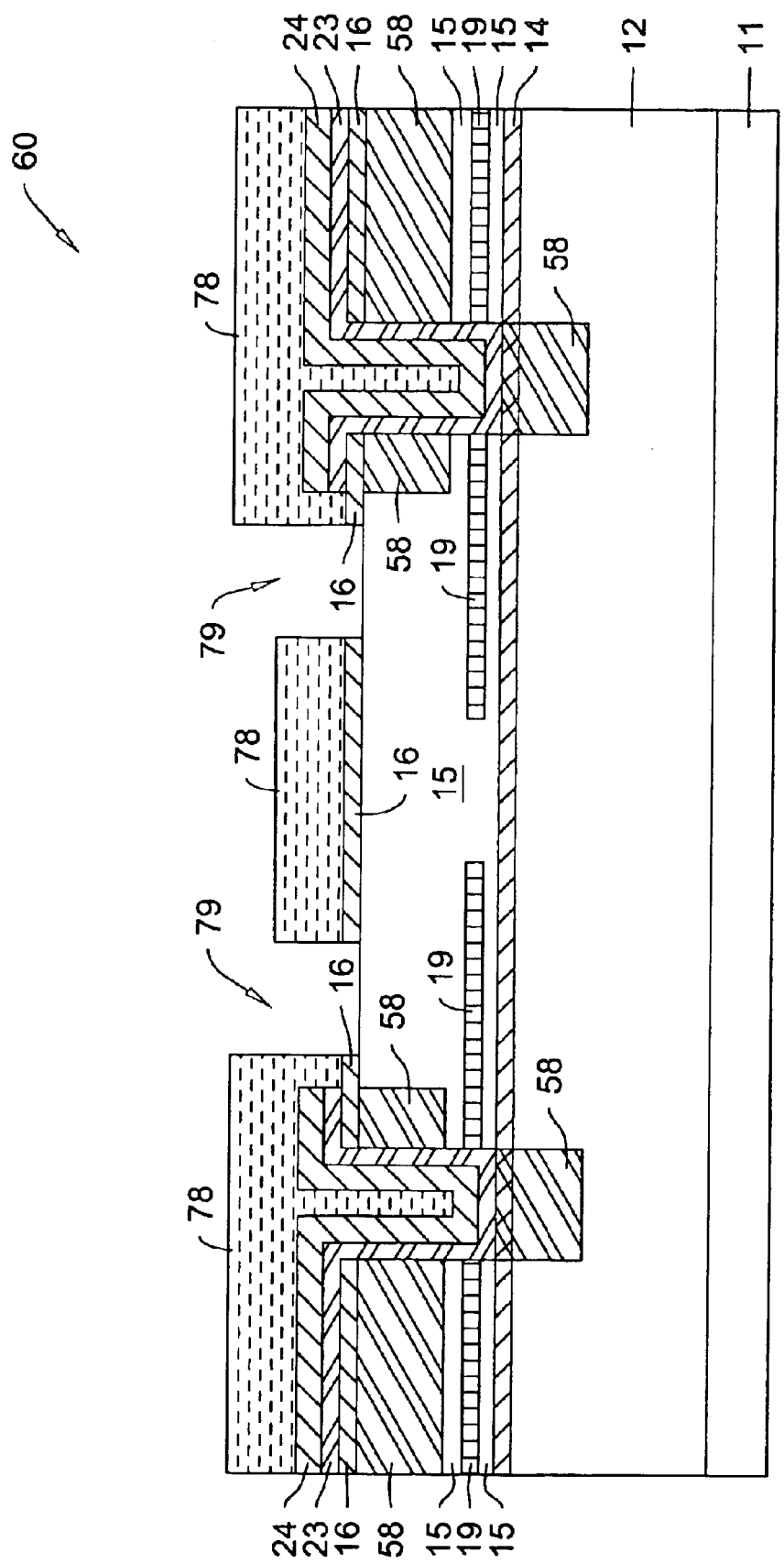
Figure 98:
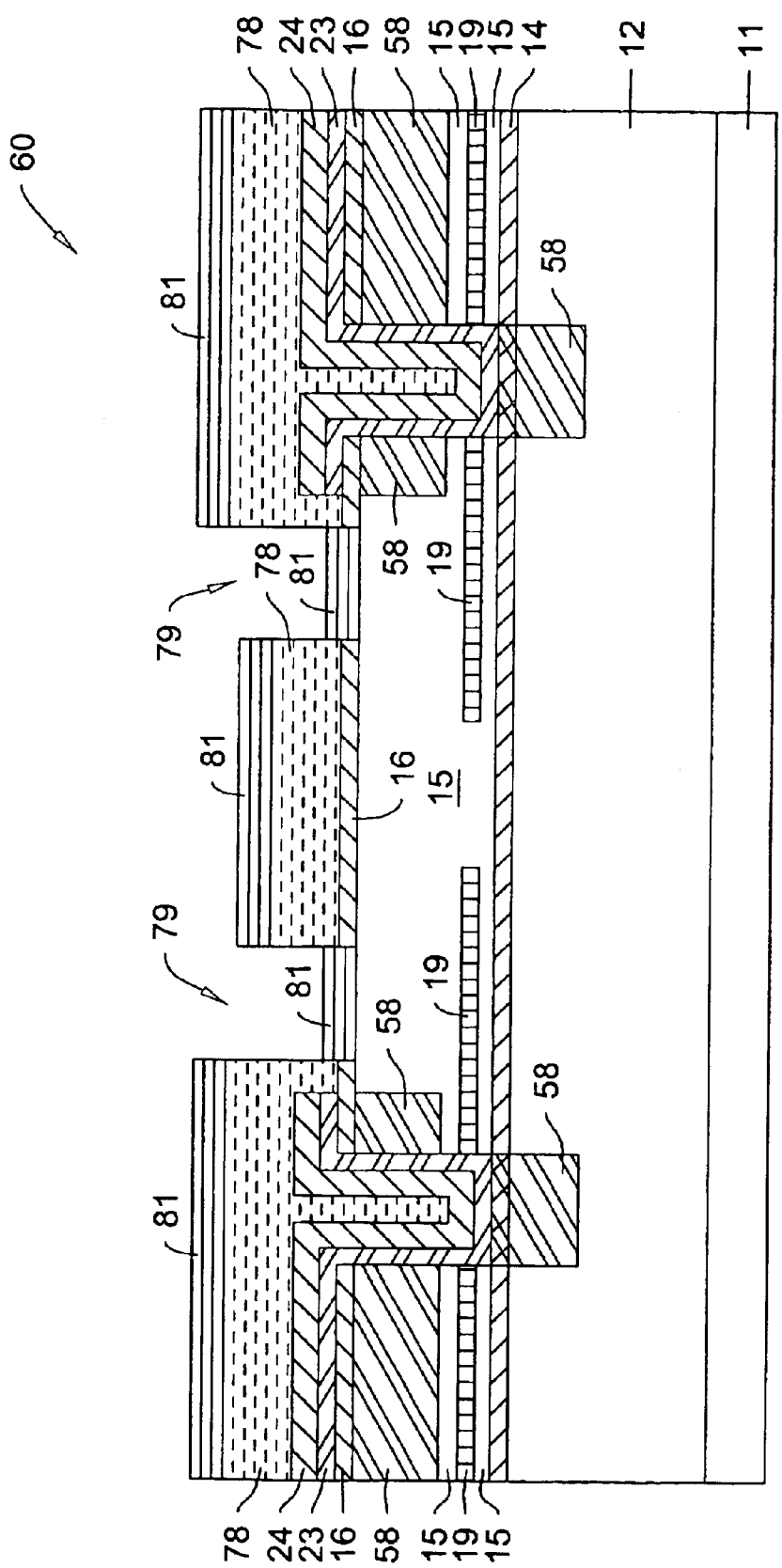
Figure 99:
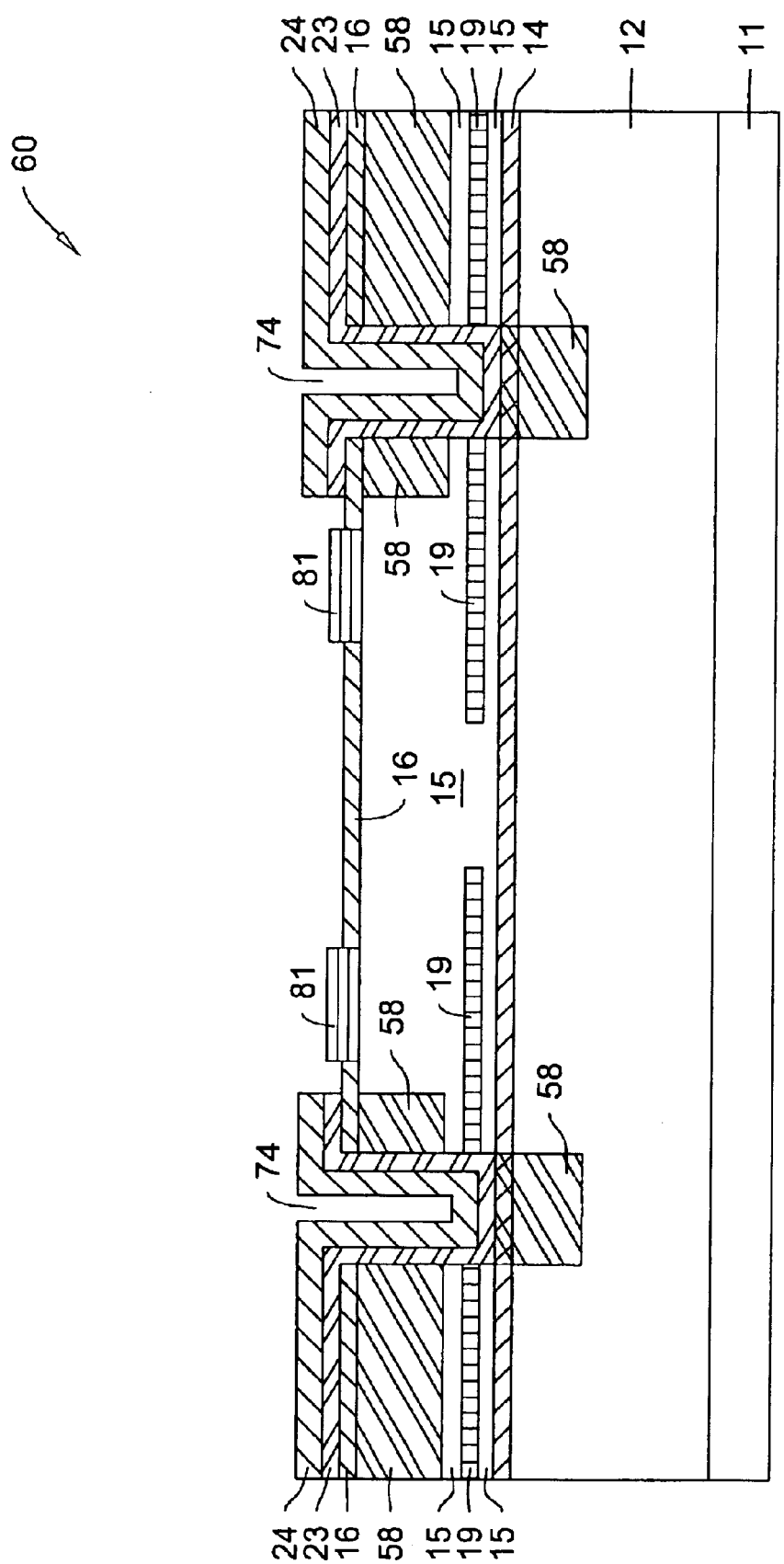

A mask of photo resist 78 having a torus pattern for opening an area 79 for a metal contact may be applied as in FIG. 96. In area 79, oxide layer 16 may be etched off the top of mirror 15 as in FIG. 97. Then a buffered oxide etch (BOE) may be performed. On the top of structure 60, layer 81 of an n-ohmic Au/Ge/Au alloy may be formed with an ebeam deposition. The deposition is illustrated in FIG. 98. After that, there may be a metal layer 81 liftoff and a photo resist 78 strip as in FIG. 99.

Figure 100:
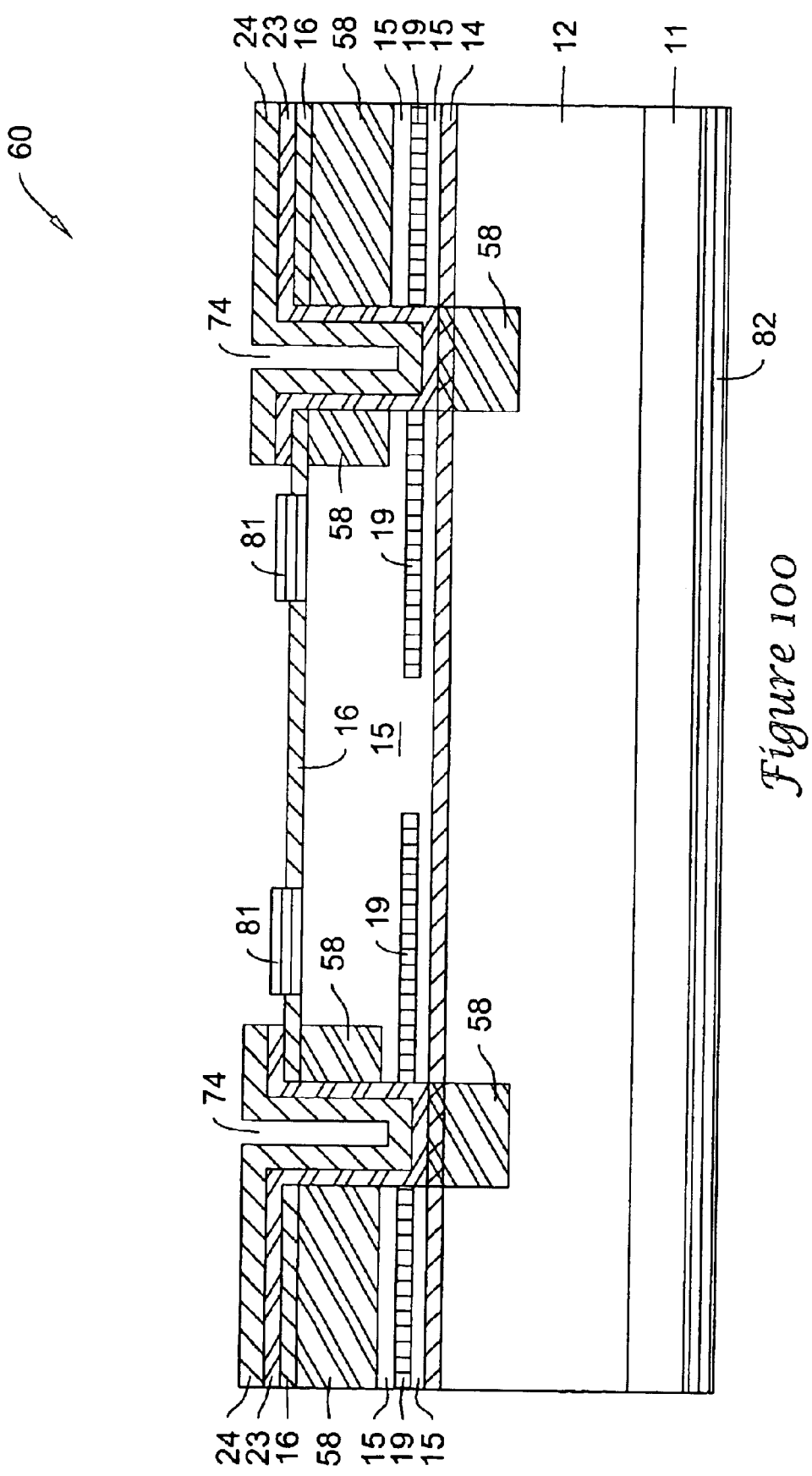

The backside of substrate 11 may have a layer of AuGe/Au alloy ebeam deposited as an n-ohmic contact 82, illustrated in FIG. 100. The metal may be RTA annealed (i.e., with rapid thermal annealing).

Figure 101:
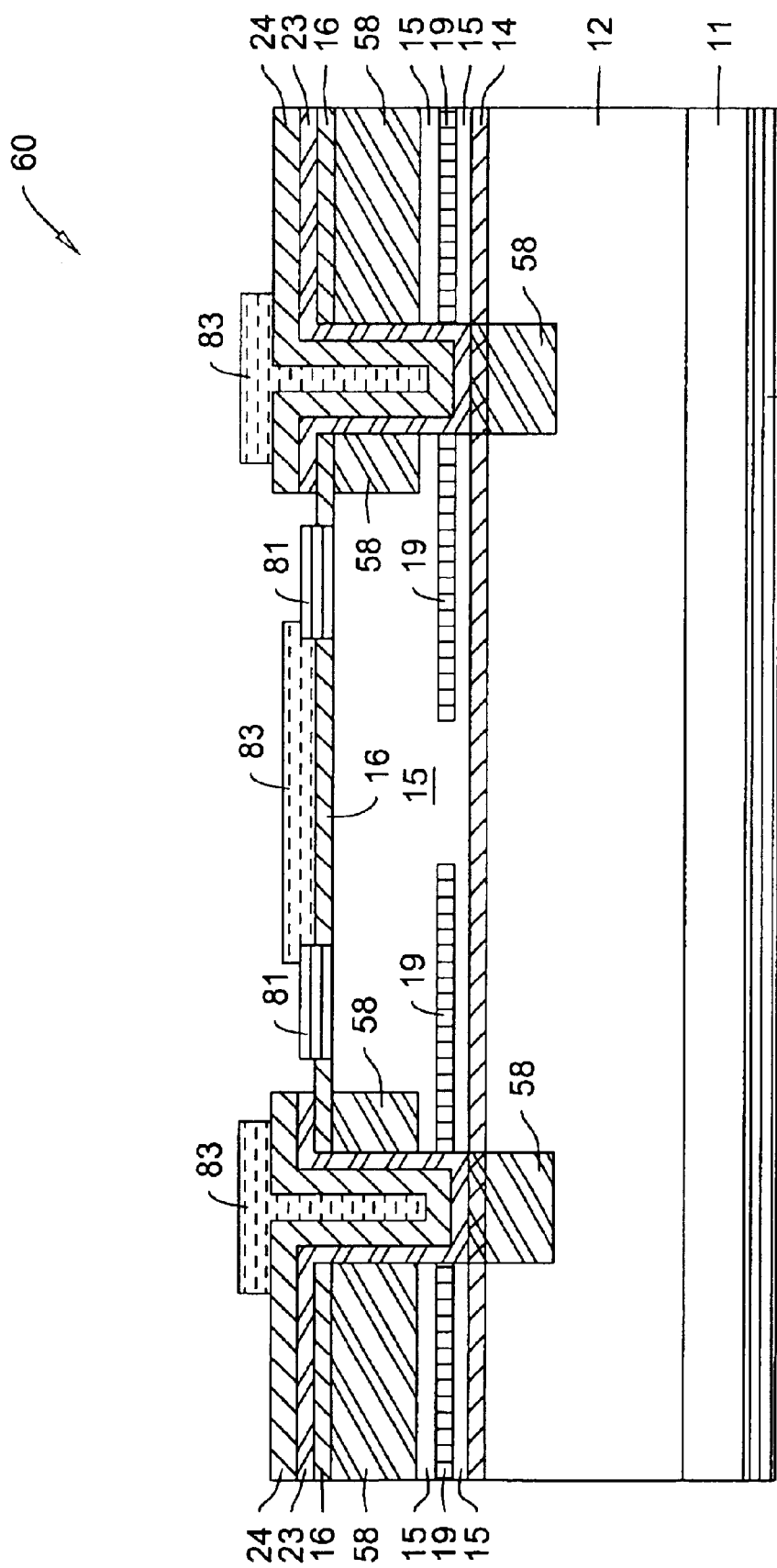
Figure 102:
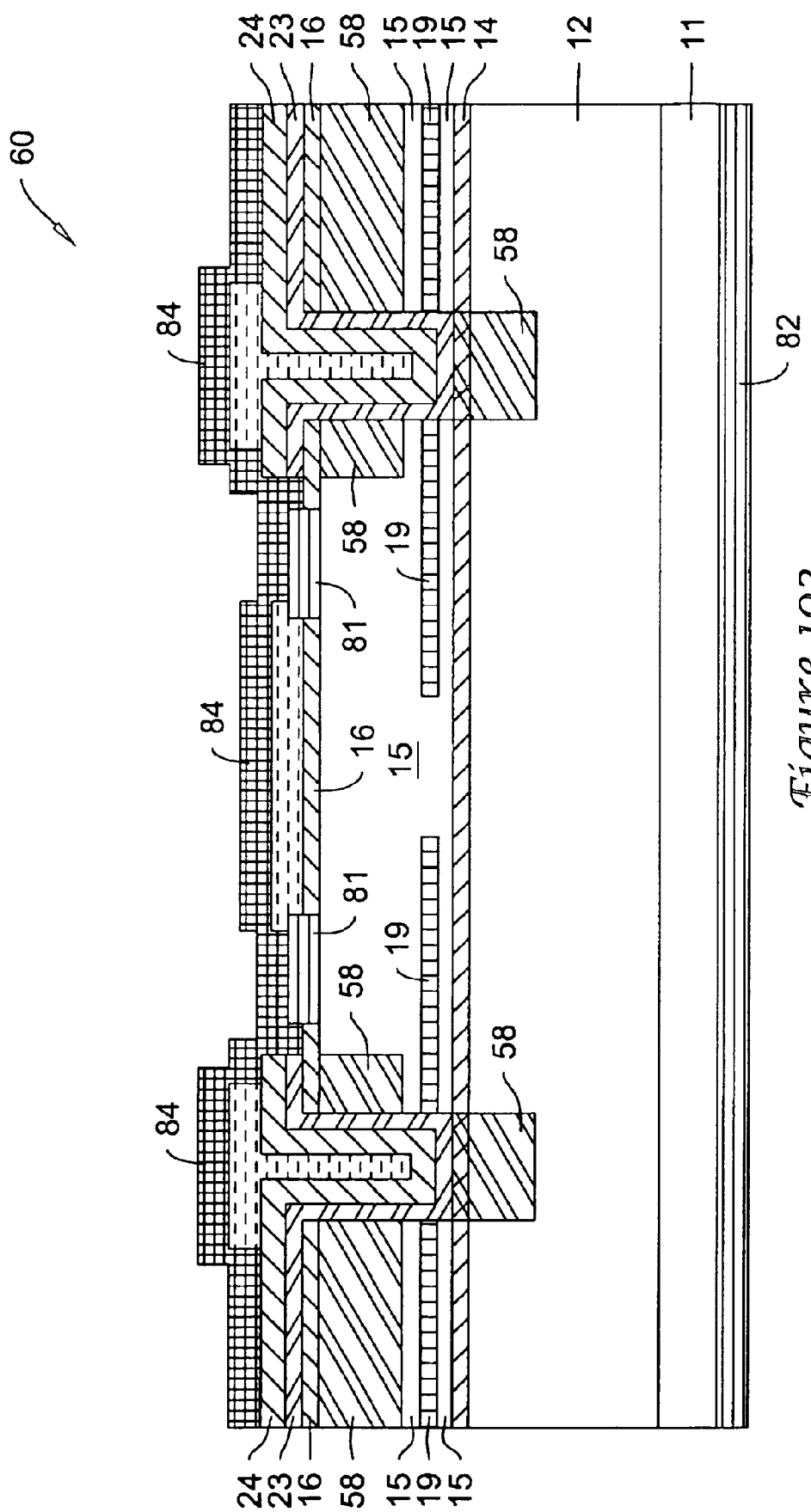
Figure 103:
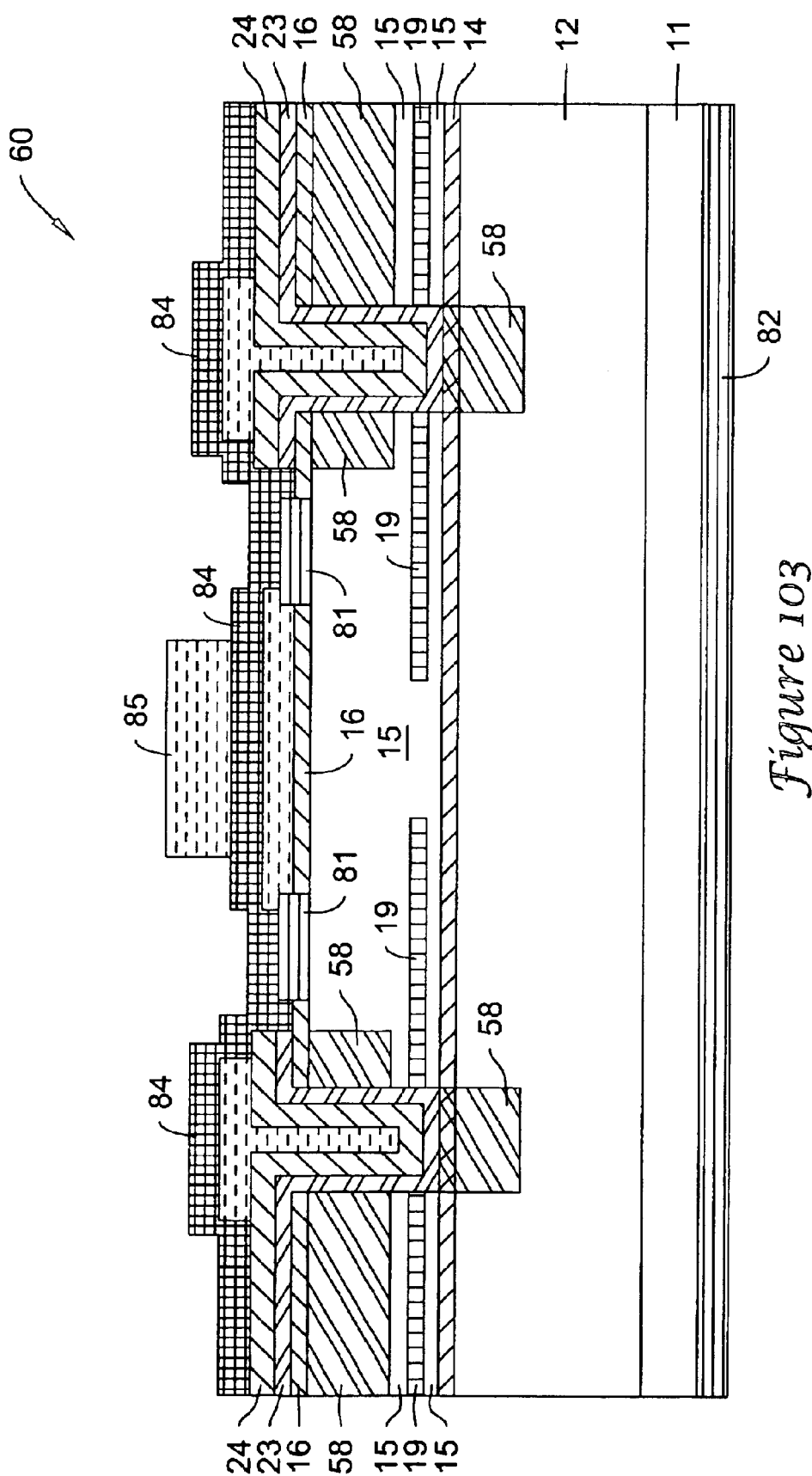
Figure 104:
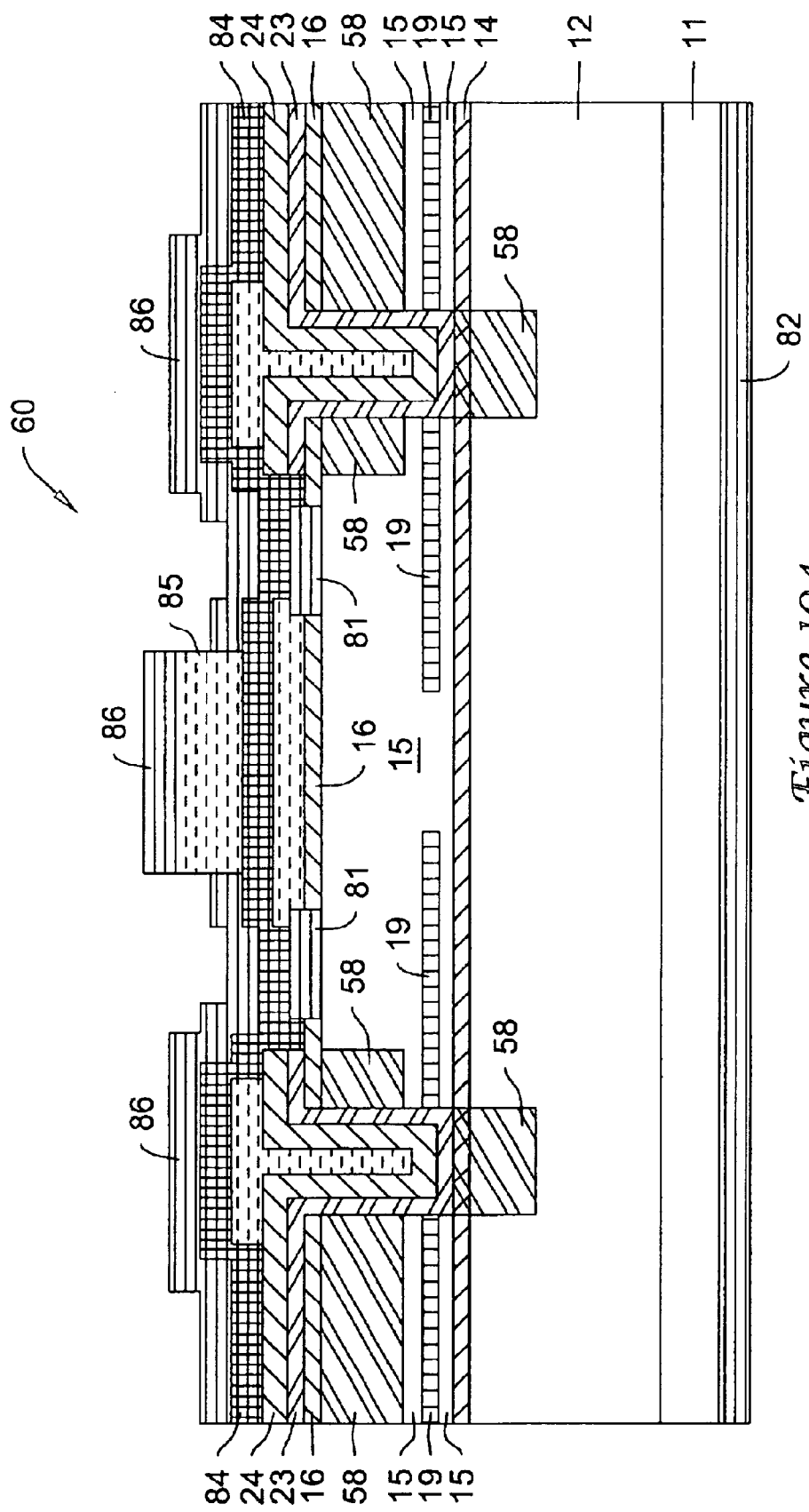
Figure 105:
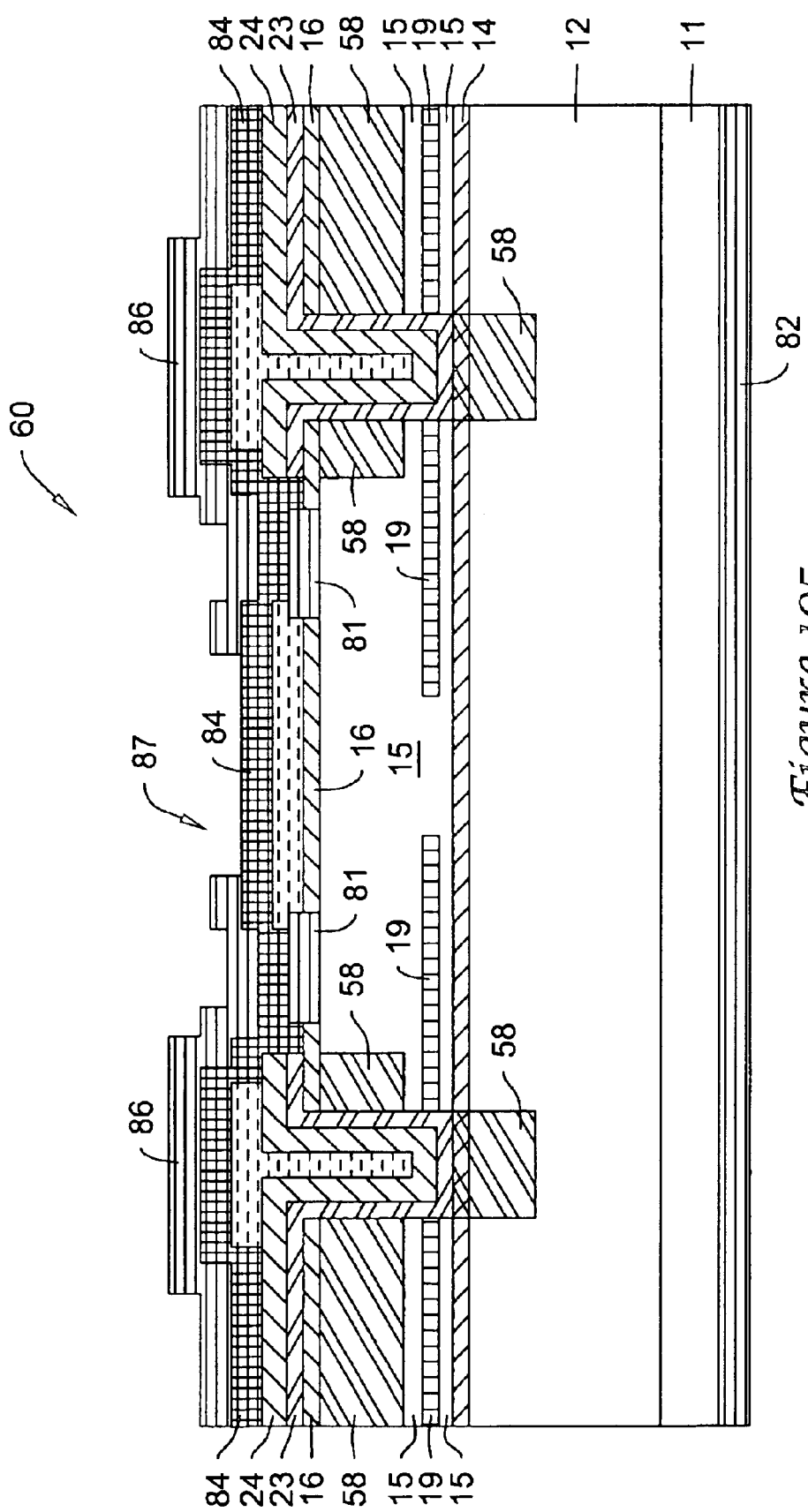
Figure 106:
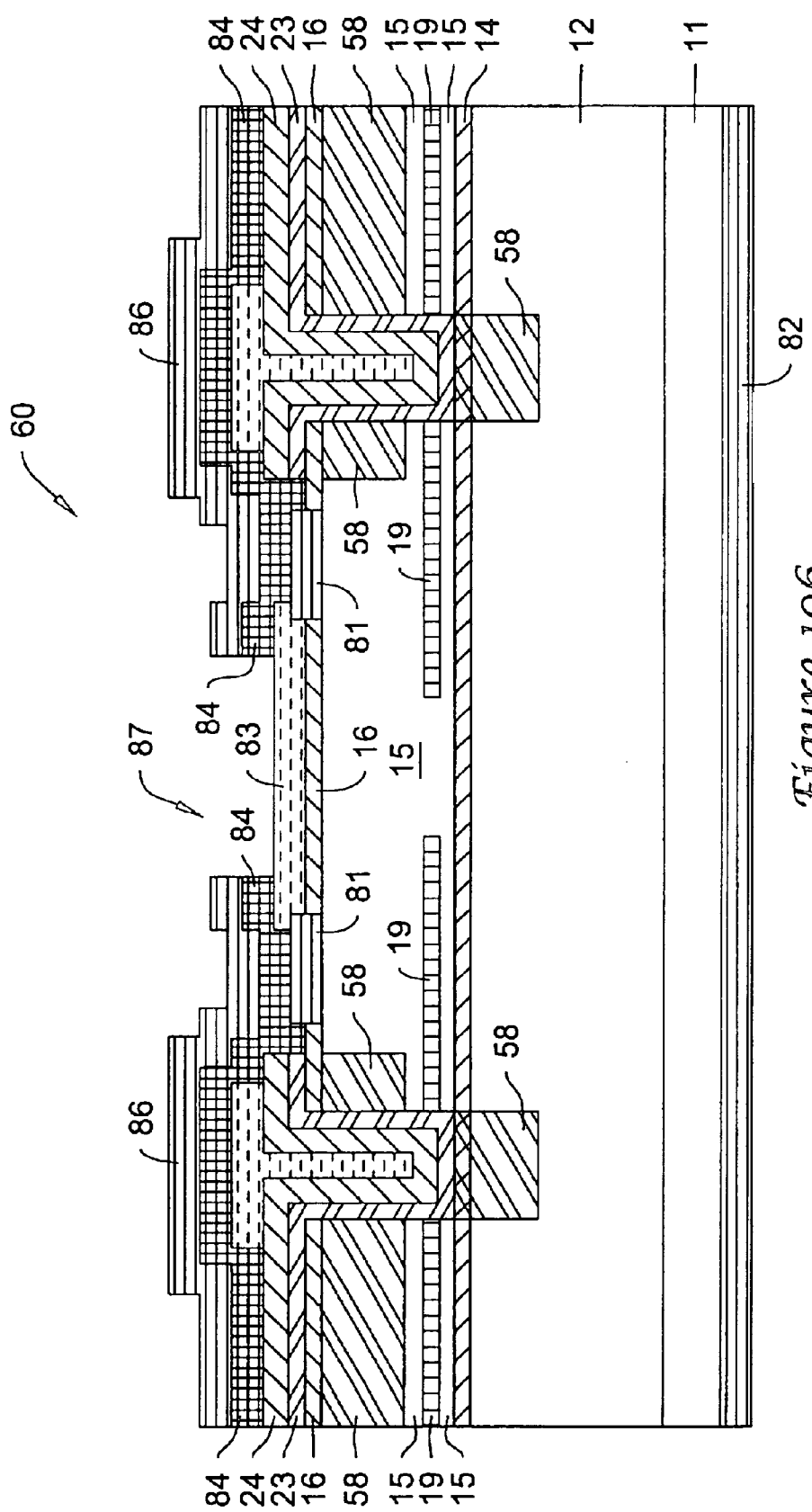
Figure 107:
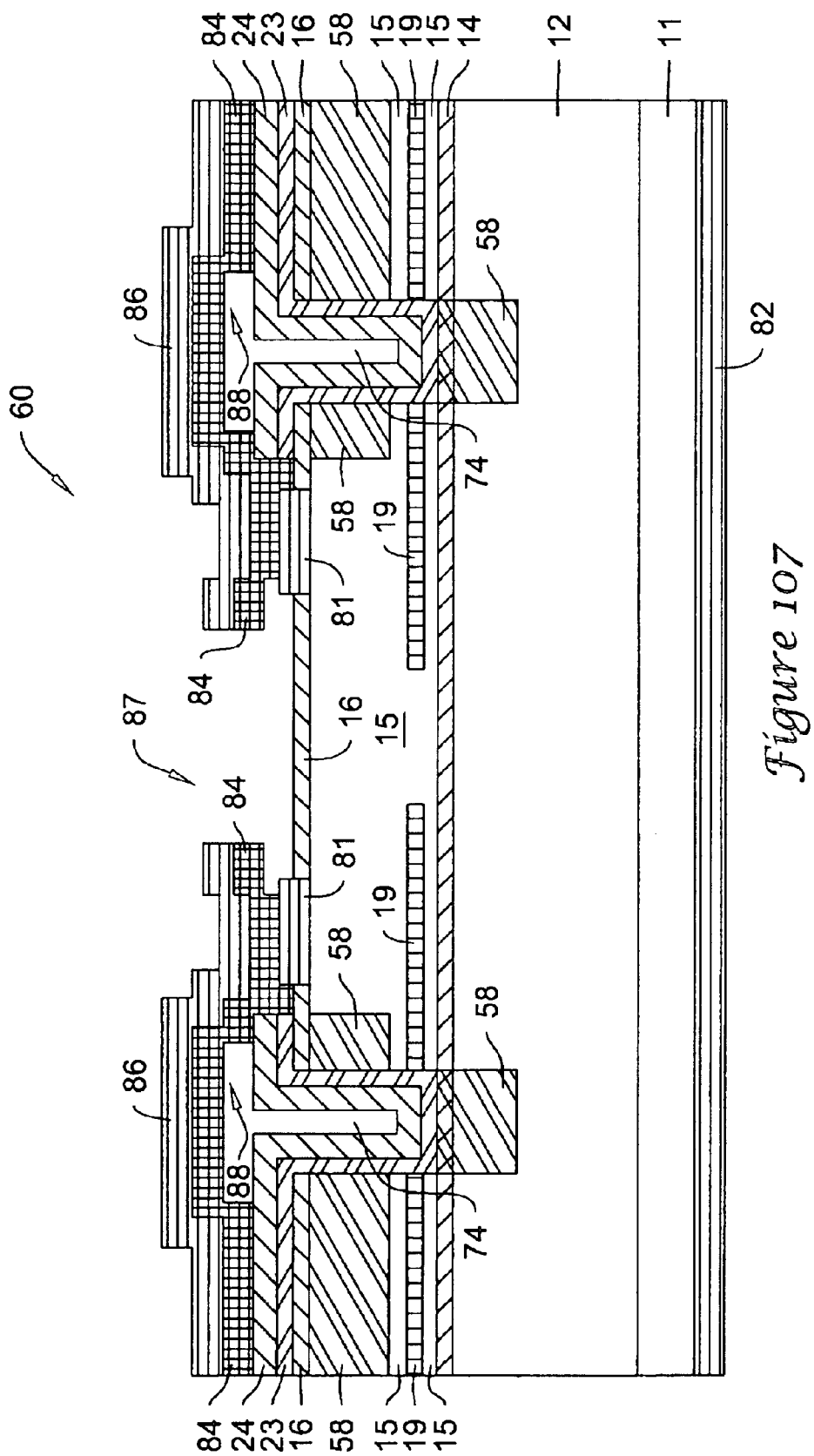

In FIG. 101, a material 83 like a masking or photo resist is deposited to fill in trenches 76 and cover the aperture to protect it. On structure 60, to build an air bridge, a plating base material 84 of TiW/Au/Ti may be sputtered, as illustrated in FIG. 102. A bond metal fill aperture and bond pad pattern (LOR+PR) mask 85 may be applied as in FIG. 103. A BHF etch may be applied in the case of Ti. Then the top pf structure 60 may be electro-plated with an about 2.0+ micron thick layer 86 of Au as illustrated in FIG. 104. In FIG. 105, photo resist 85 may be stripped, and layer 86 on photo resist may be lifted off. A BHF etch may be applied to the Ti. In opening 87 between the ends of layers 86, the Au and TiW material of layer 84 is ion milled down to material 83, as shown in FIG. 106. Photo resist material 83 may be stripped from area 87. Also stripped may be material 83 from trench 74 thereby resulting in the formation of air bridge 88, as illustrated in FIG. 107.

Figure 108:
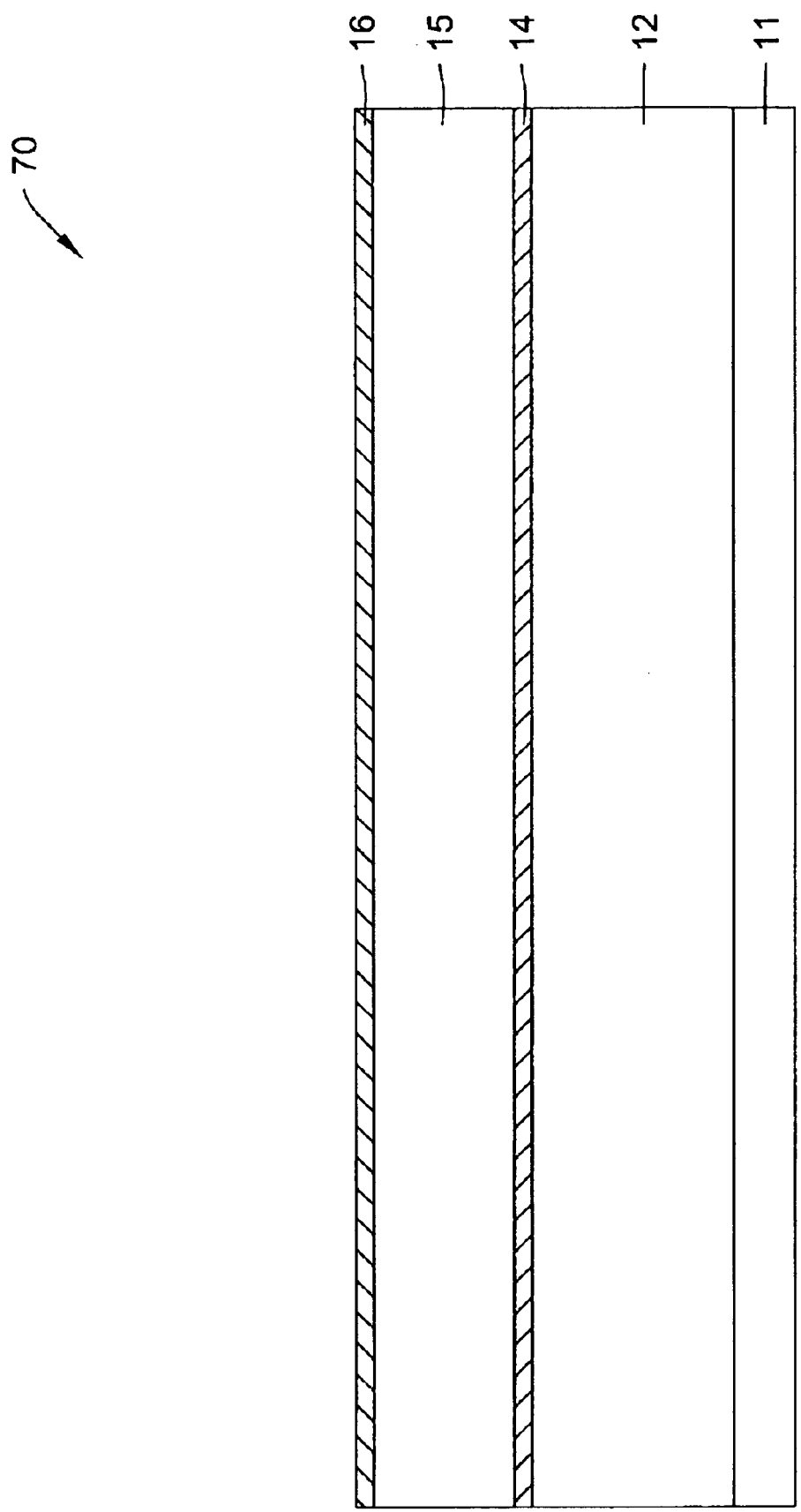
FIGS. 108–126 show a process for making a laser structure having a contact bridge over a trench on planarized spin-on material and a backside contact.

Another process may use BCB or SOG planarization, a thin pad dielectric and a wide trench but no Fetch. This process may start with a basic laser device for building a structure 70. The device may have a substrate 11, a bottom DBR mirror 12 formed in the substrate, an active region or layer 14 formed on mirror 12, and a top DBR mirror 15 formed on active layer 14. An about one-fourth wave-length thick layer 16 of an oxide may be PECVD deposited on the top of mirror 15, as shown in FIG. 108.

Figure 109:
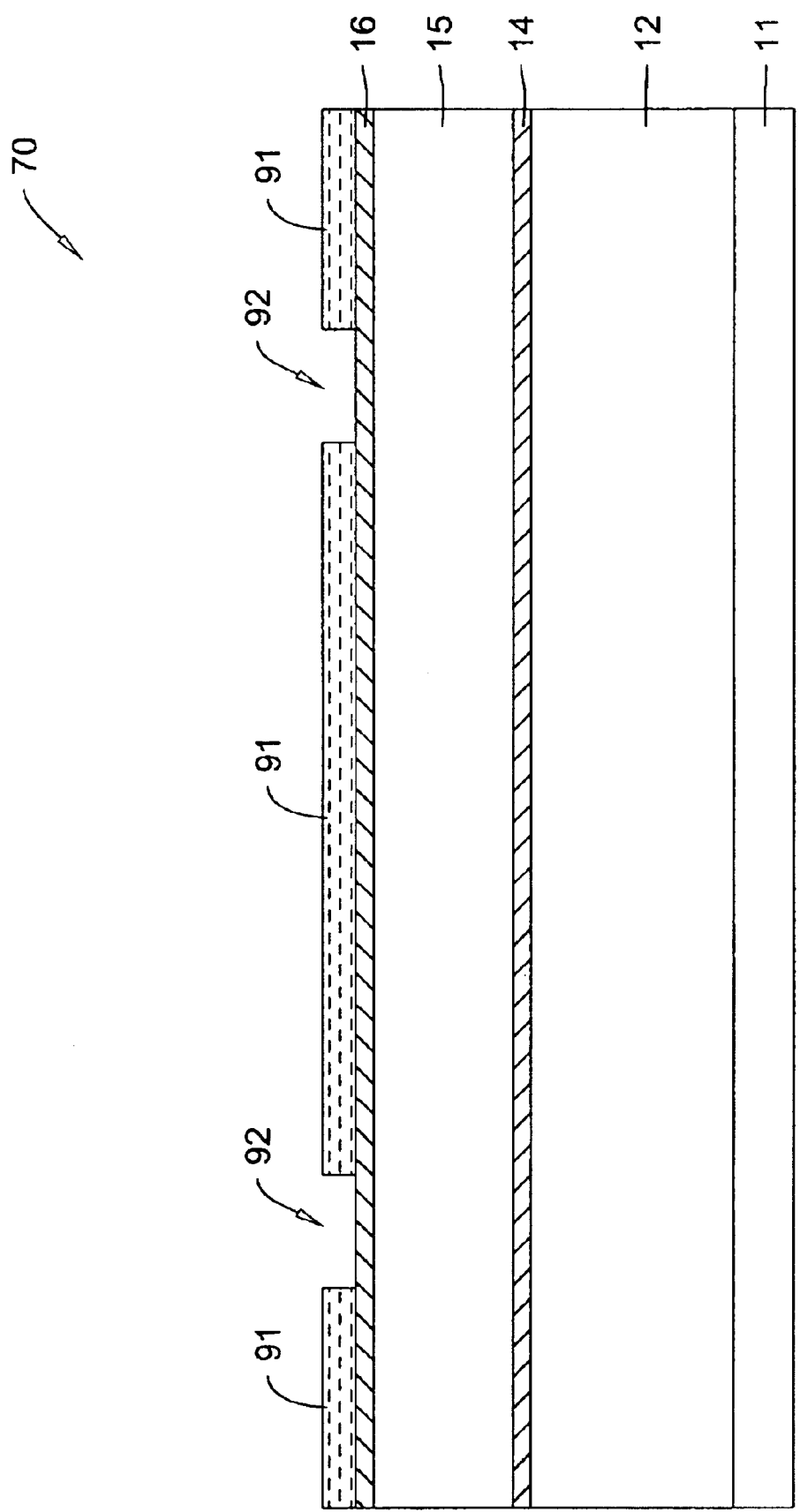
Figure 110:
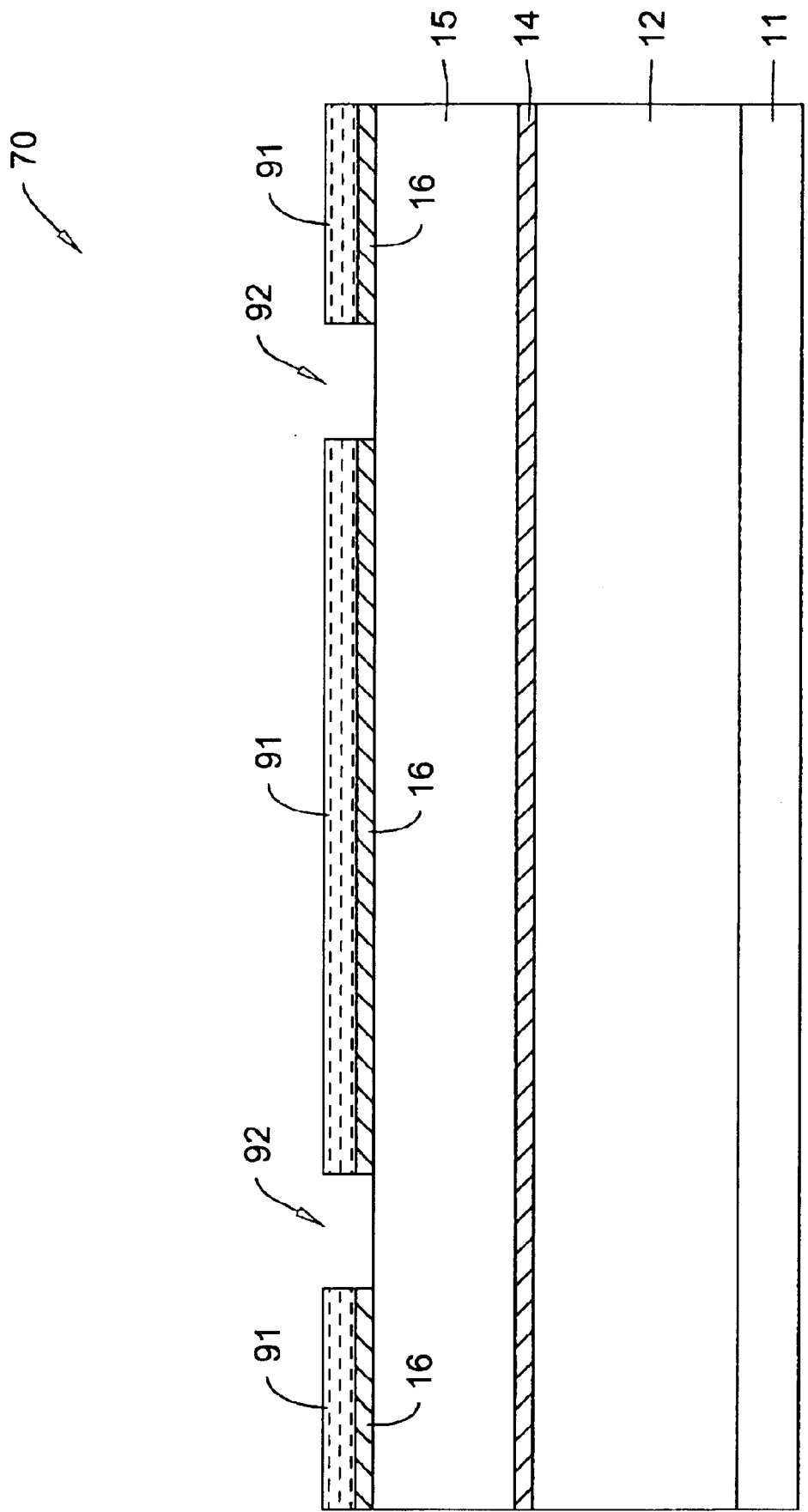
Figure 111:
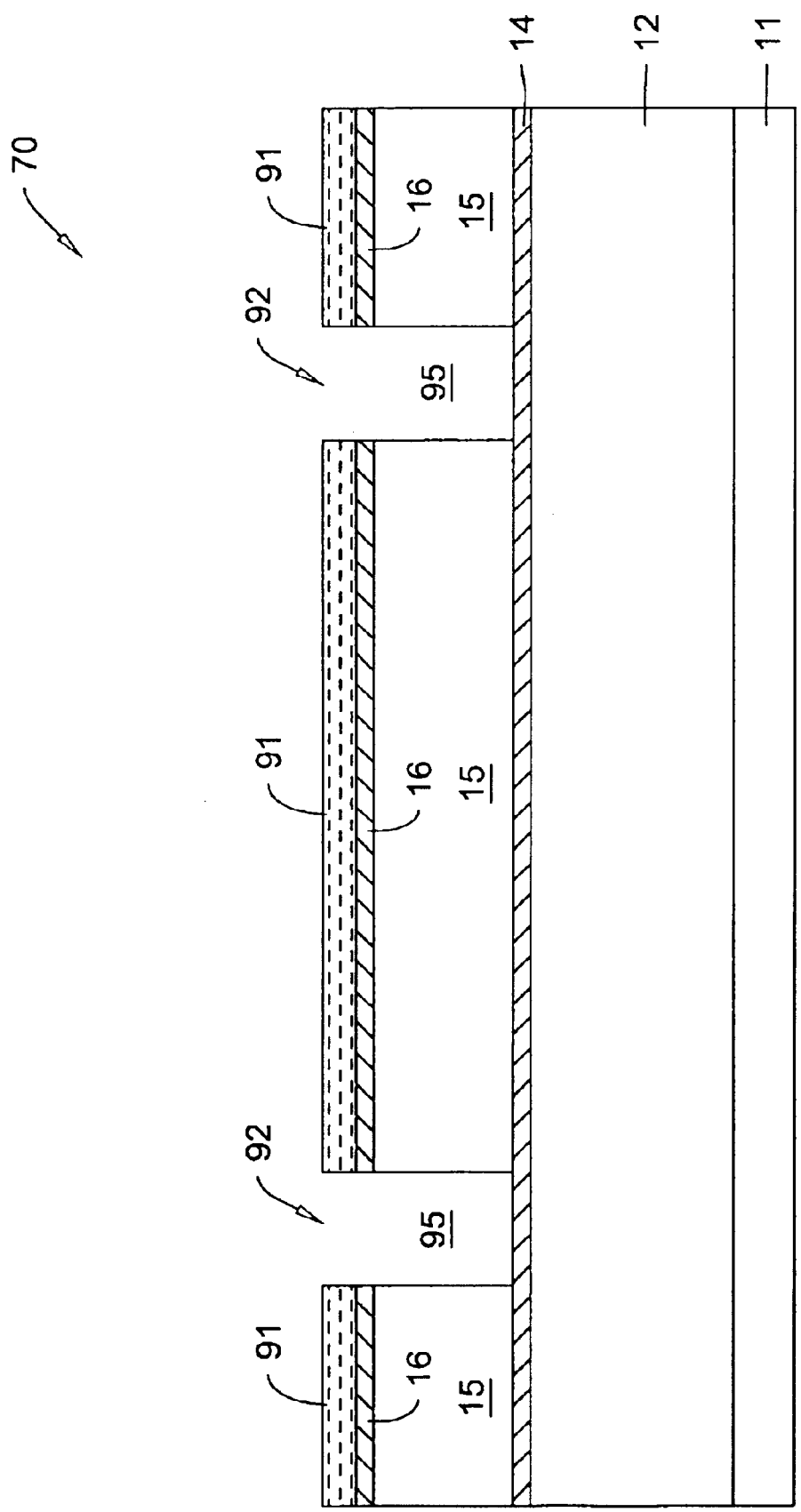
Figure 112:
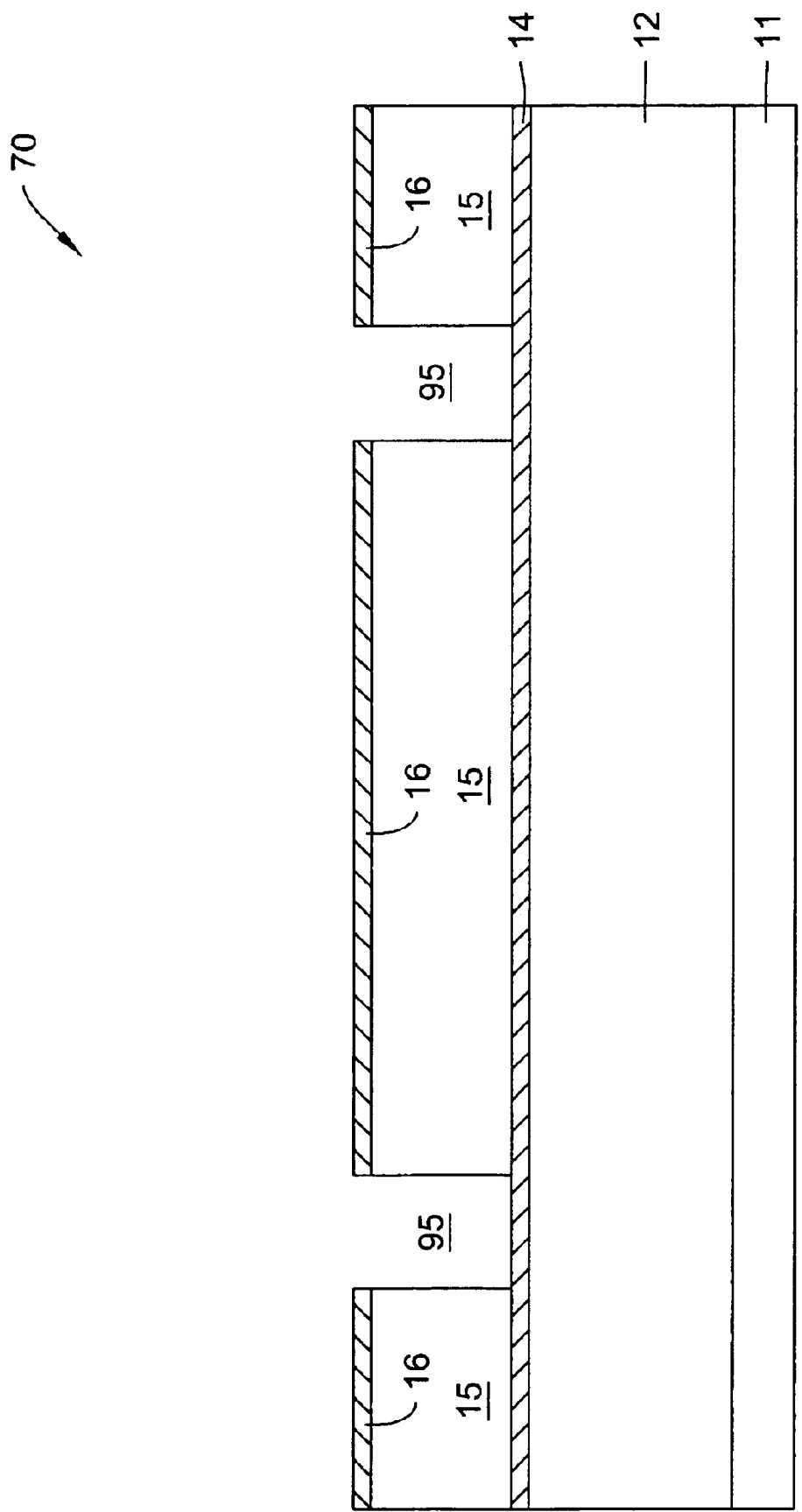
Figure 113:
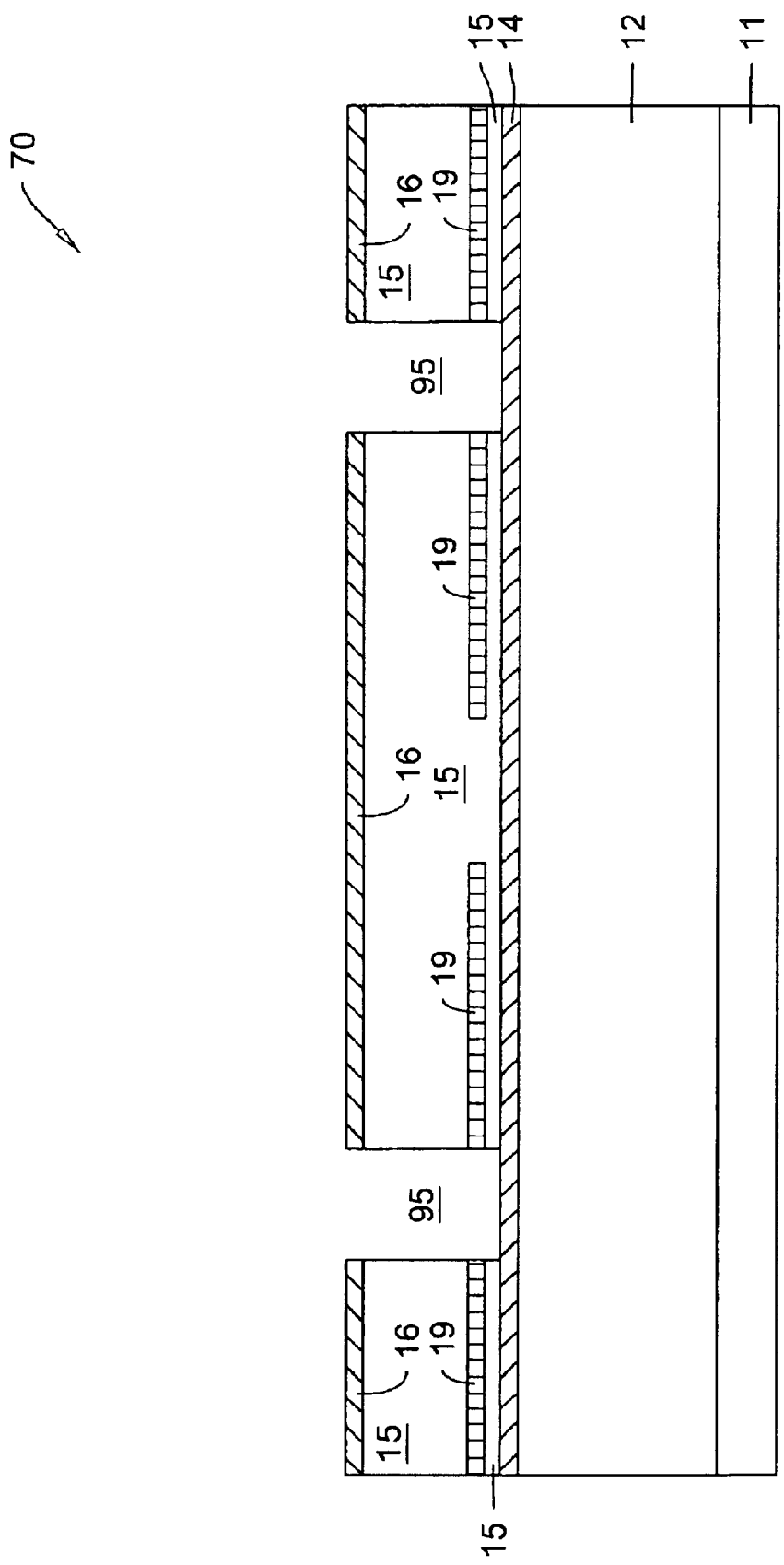
Figure 114:
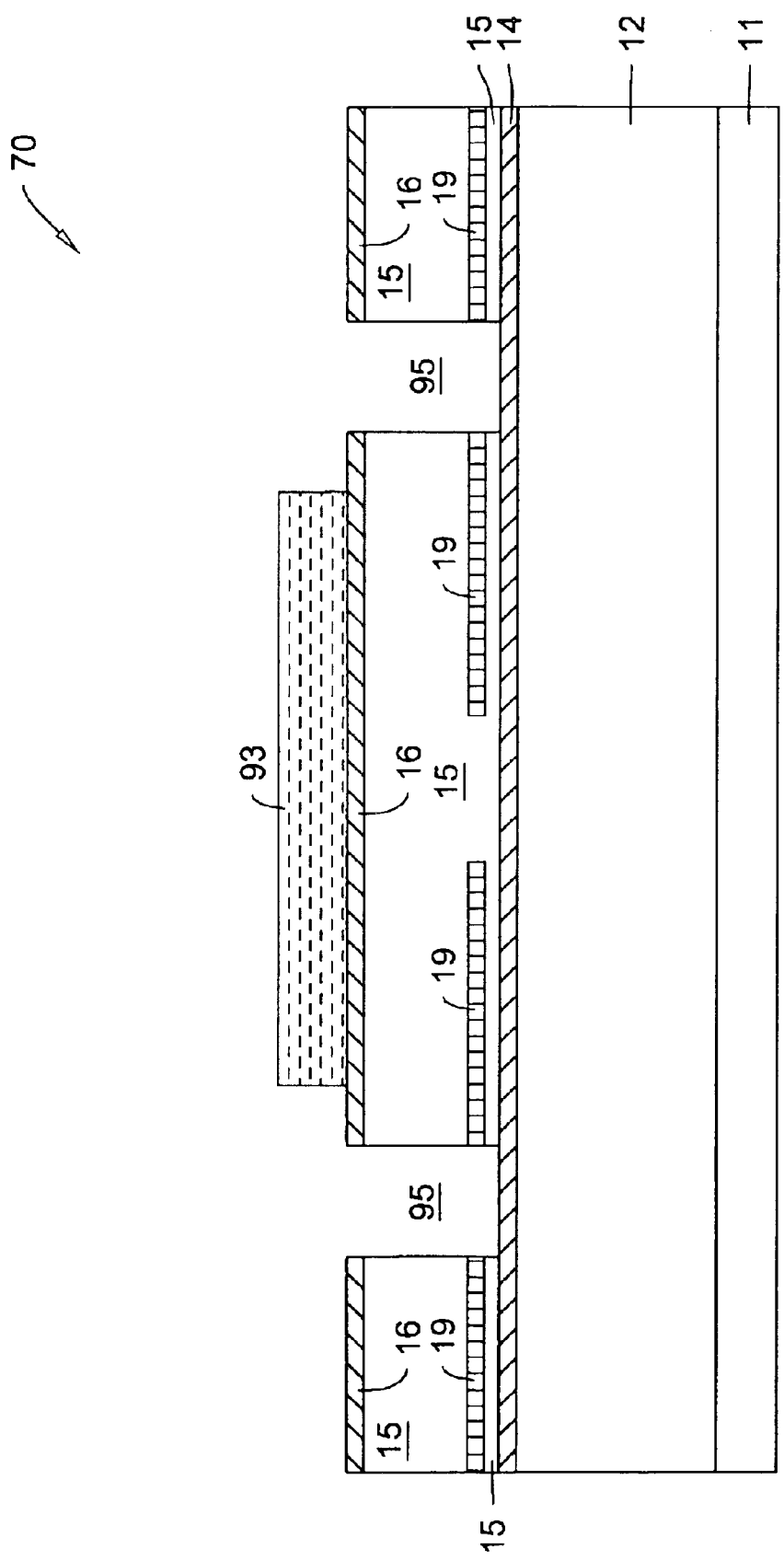
Figure 115:
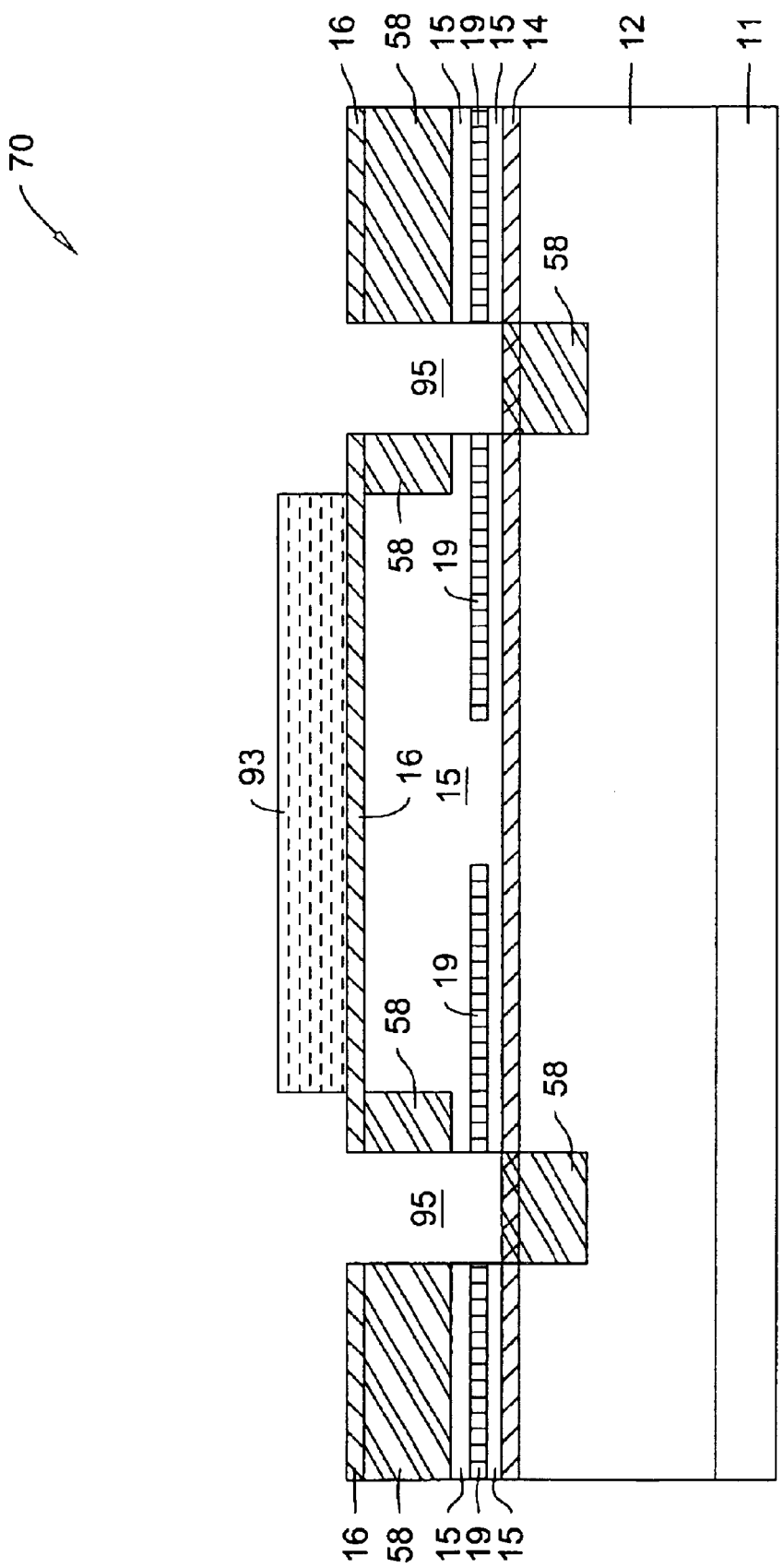
Figure 116:
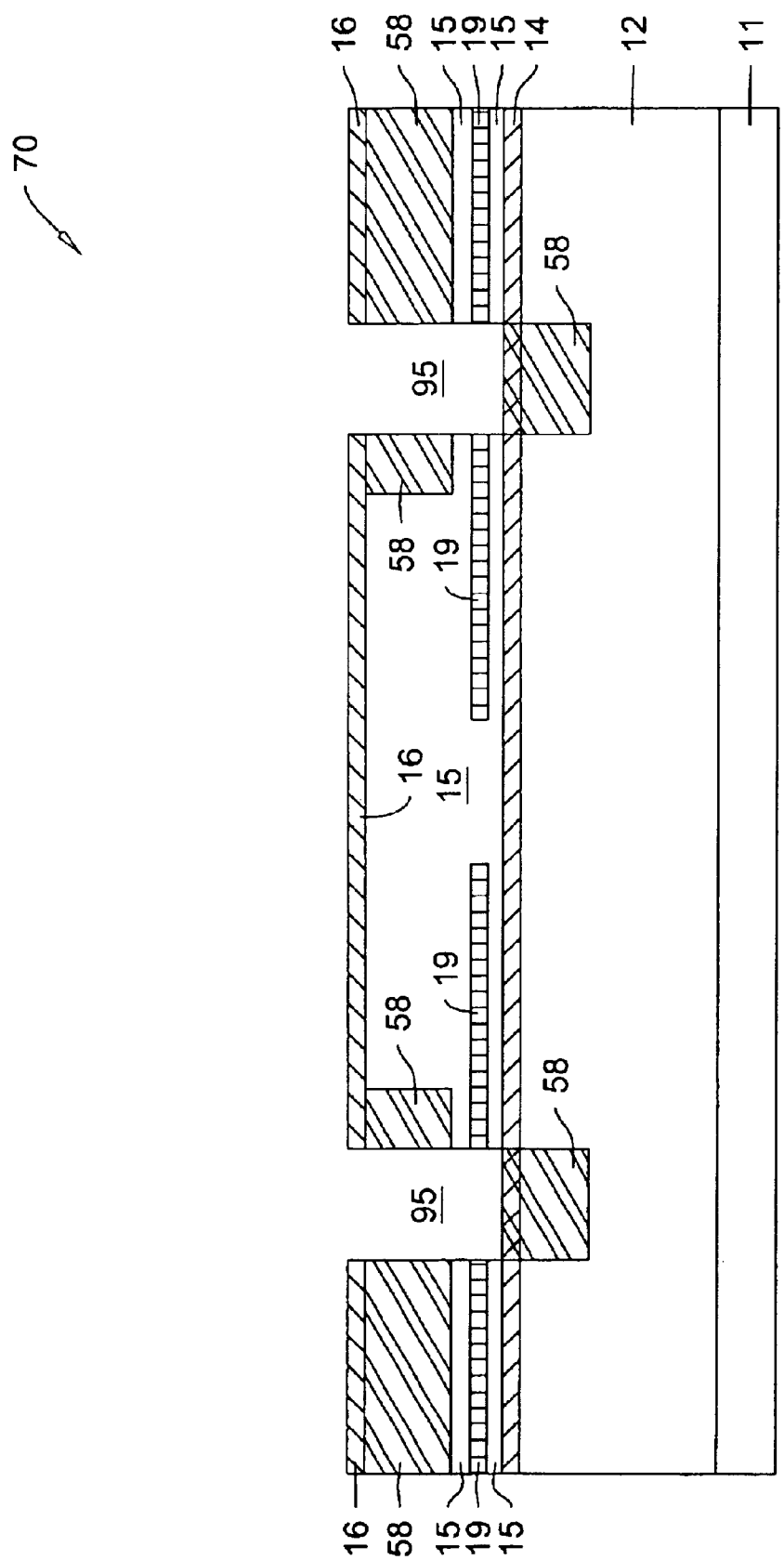

A mask or photo resist layer 91 having a pattern for a wide trench spoke and torus pattern for oxide and isolation trench etching, with open area 92, may be formed on oxide layer 16, in FIG. 109. An etchant may be applied to the top of structure 70 to remove a portion of oxide layer 16 in area 92, as shown in FIG. 110. Mirror 15 is ICP etched to just above or into active region 14 through area 92 of mask 91. In FIG. 111, the etching of mirror 15 may be just up to active region 14, resulting in a wide trench 95. In FIG. 112, photo resist 91 may be stripped. Structure 70 may be put into a wet oxidation environment where at least one oxidizable layer 19 in mirror 15 may be oxidized resulting in an aperture for current and/or optical confinement during operation of structure 70. The oxidized layers are shown in FIG. 113. A circular mask 93 for preventing ions implanting into the center aperture portion of structure 70 may be placed on layer 16, as in FIG. 114. An ion implant 58, at multiple levels with 7e14 and higher doses, may be implemented in structure 70, as revealed in FIG. 115. FIG. 116 shows photo resist 93 stripped from the top of structure 70.

Figure 117:
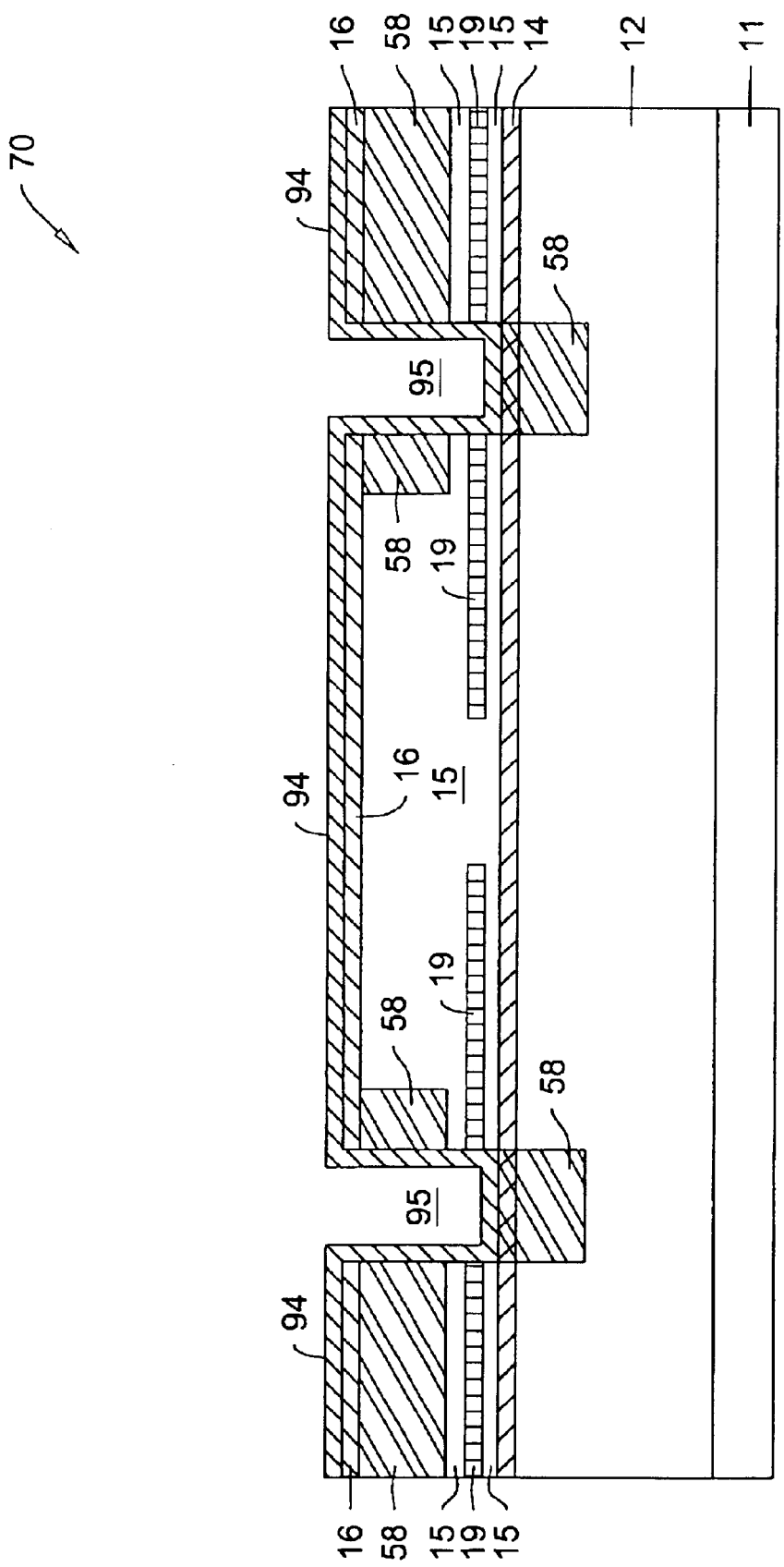
Figure 118:
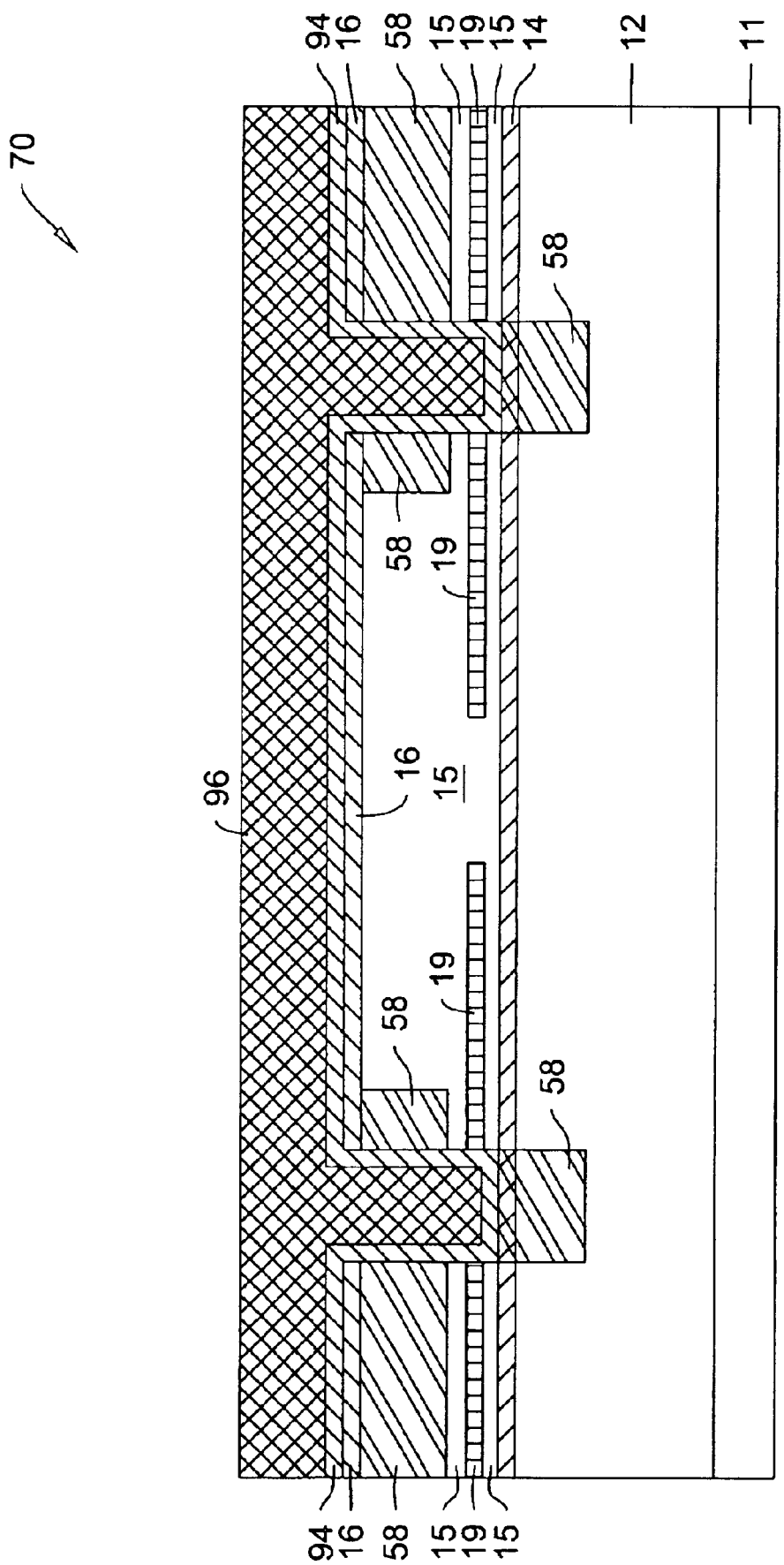
Figure 119:
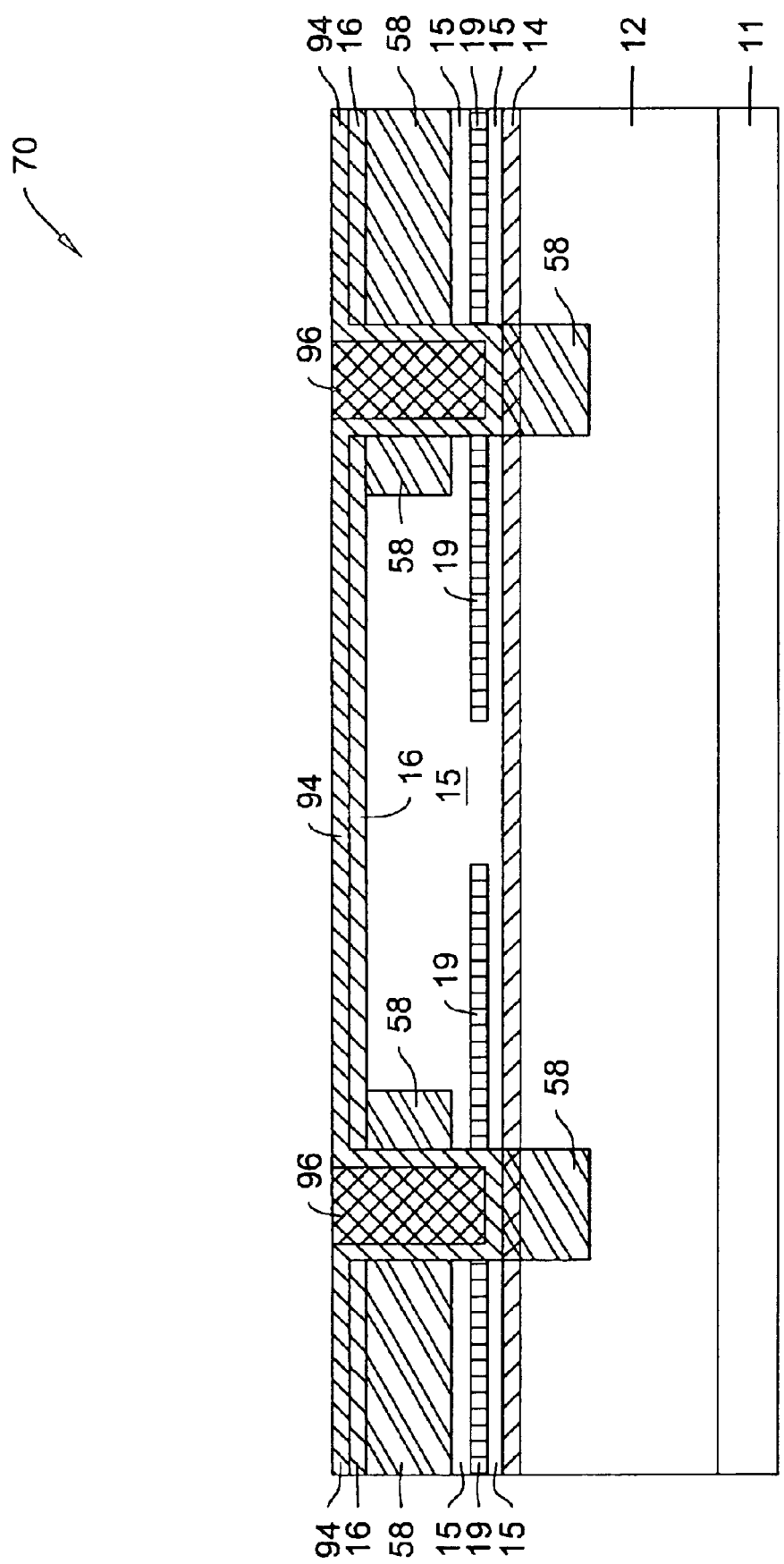

In FIG. 117, another about one-fourth wave length thick oxide layer 94 may be deposited on oxide layer 16. BCB or SOG material 96 may be spun on layer 94 of structure 70 where trenches 95 may be filled as in FIG. 118. Then material 96 may be planarized down to the top surface of oxide layer 94 with trench 95 filled to the top level of oxide layer 94, as revealed in FIG. 119. Material 96 may be baked and hardened.

Figure 120:
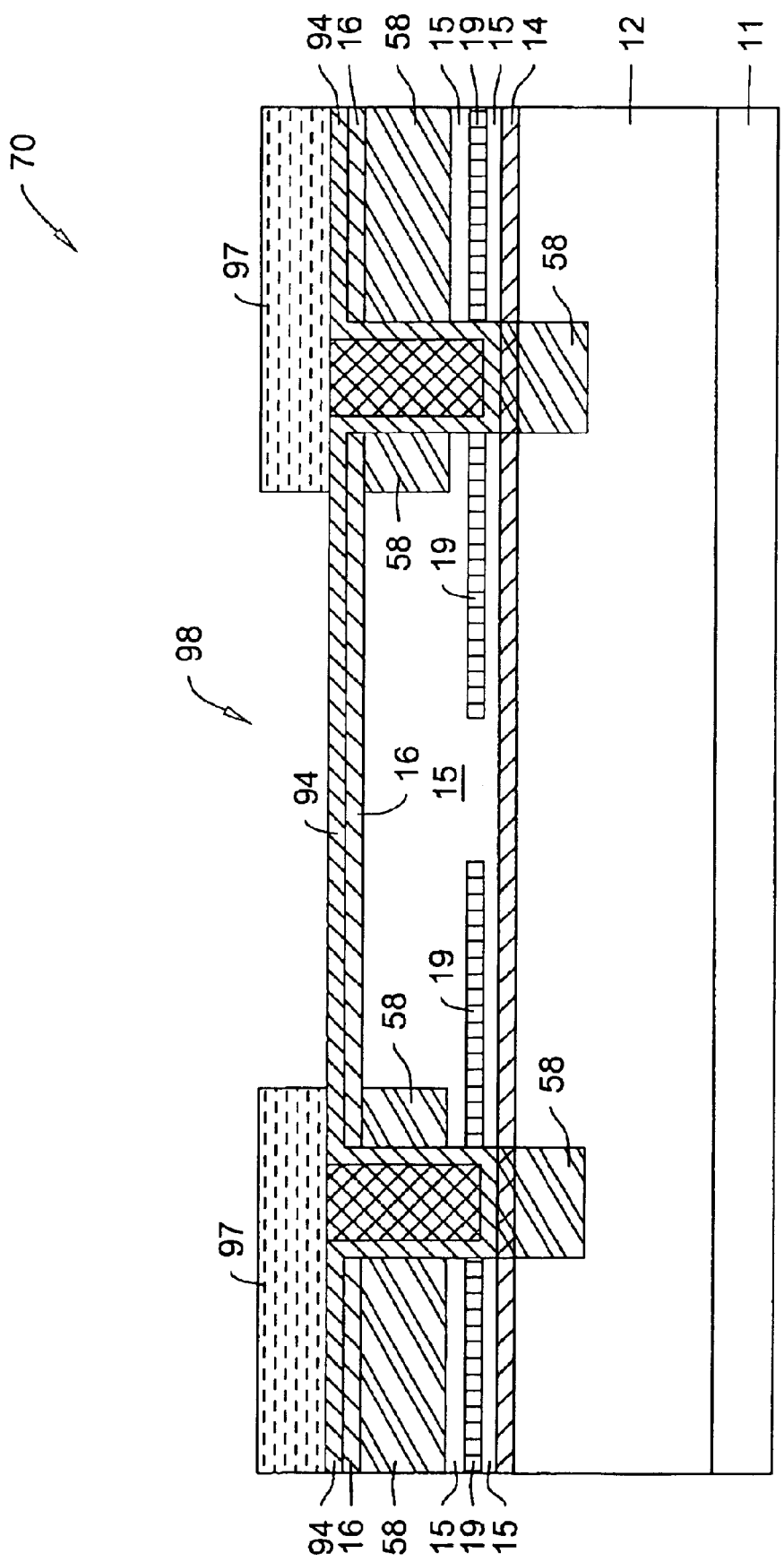
Figure 121:
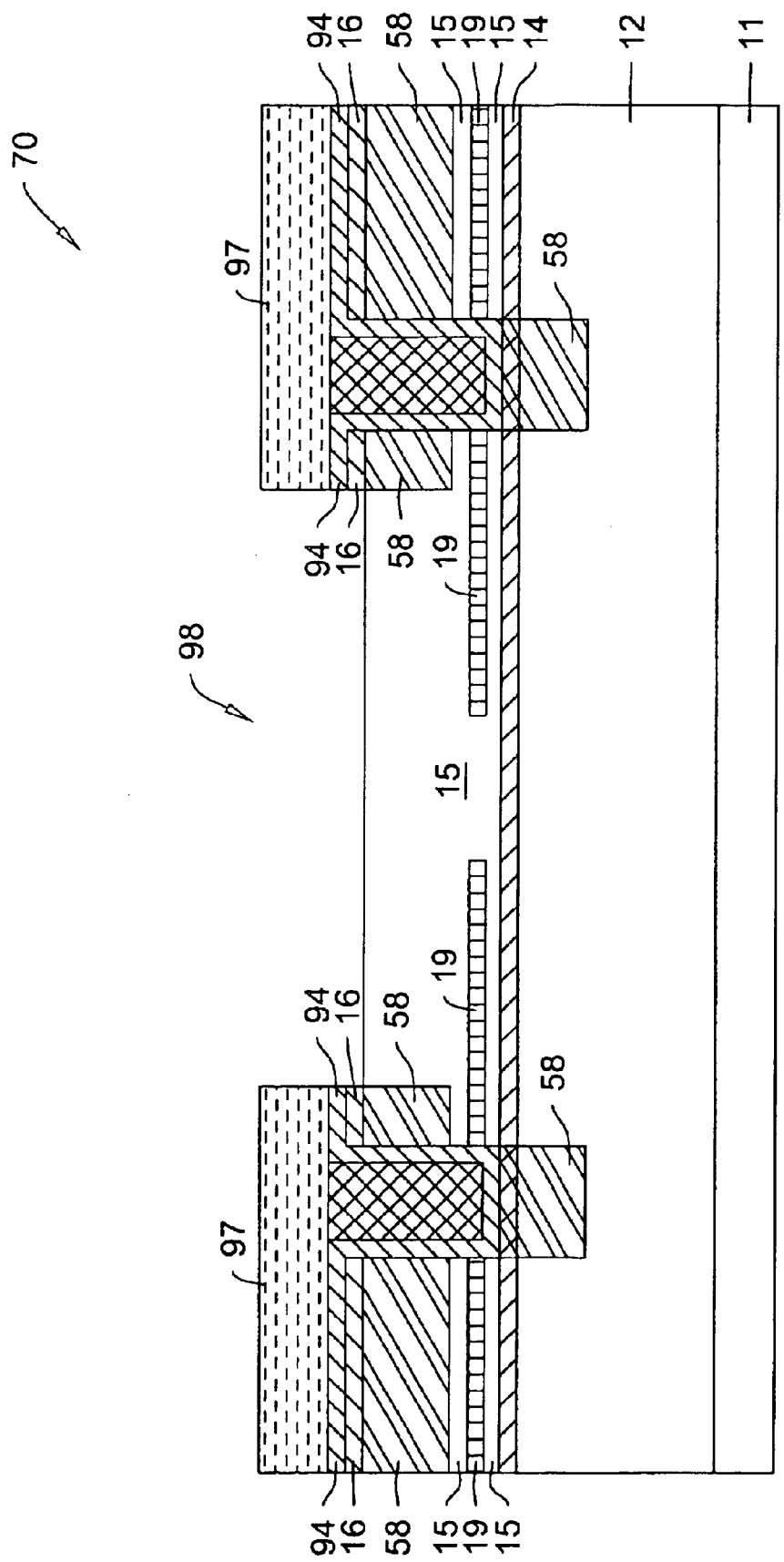
Figure 122:
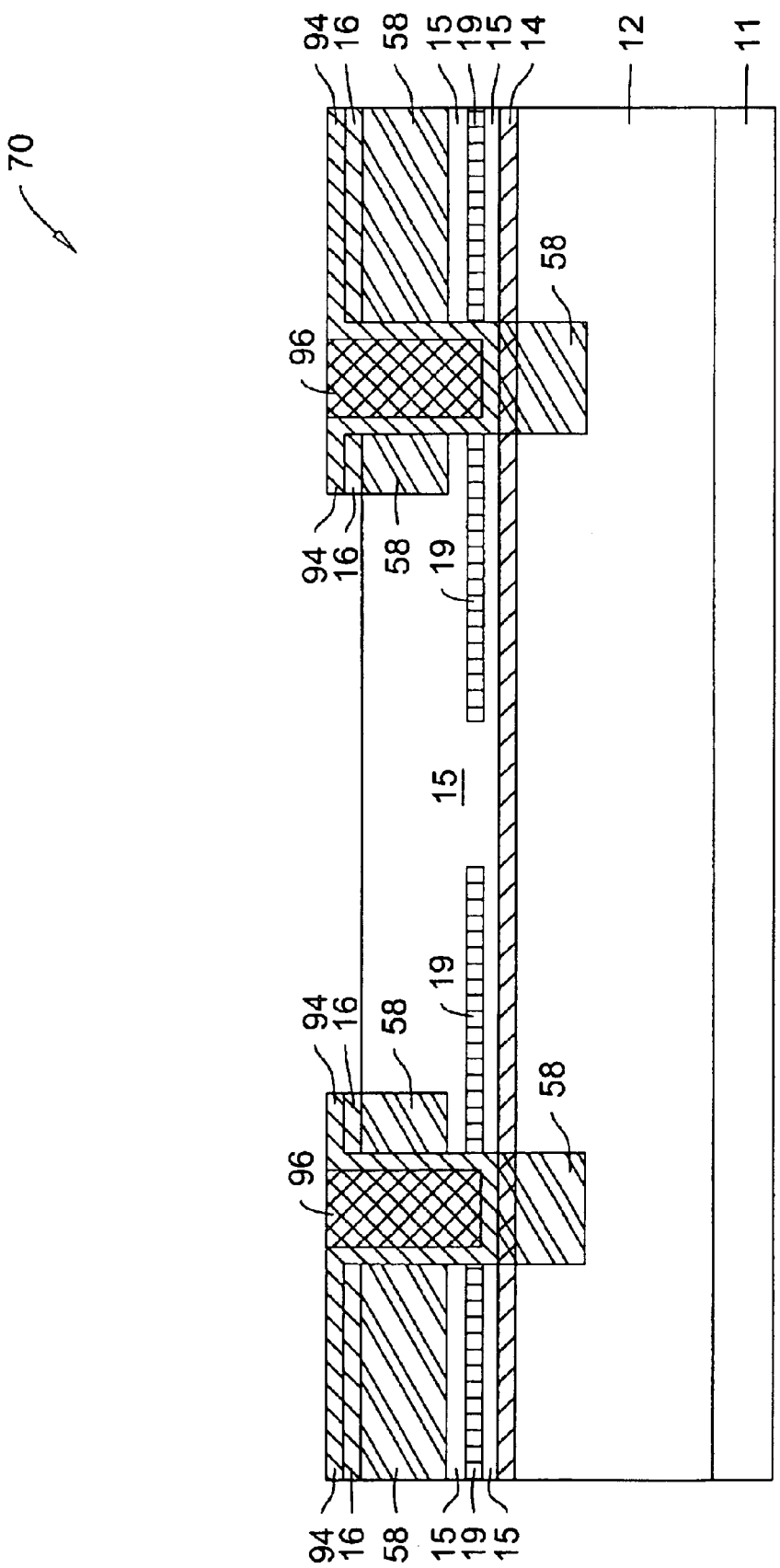

As FIG. 120, a photo resist 97 having a mask pattern having an inside diameter about that of implant 58, to open an area 98 for metal contact may be applied on layer 94 and planarized material 96. An etch may be applied to remove about one-half wavelength of oxide, i.e., layers 16 and 94, down to the top of mirror 15 in area 98, as shown in FIG. 121. Then photo resist 97 may be removed as in FIG. 122.

Figure 123:
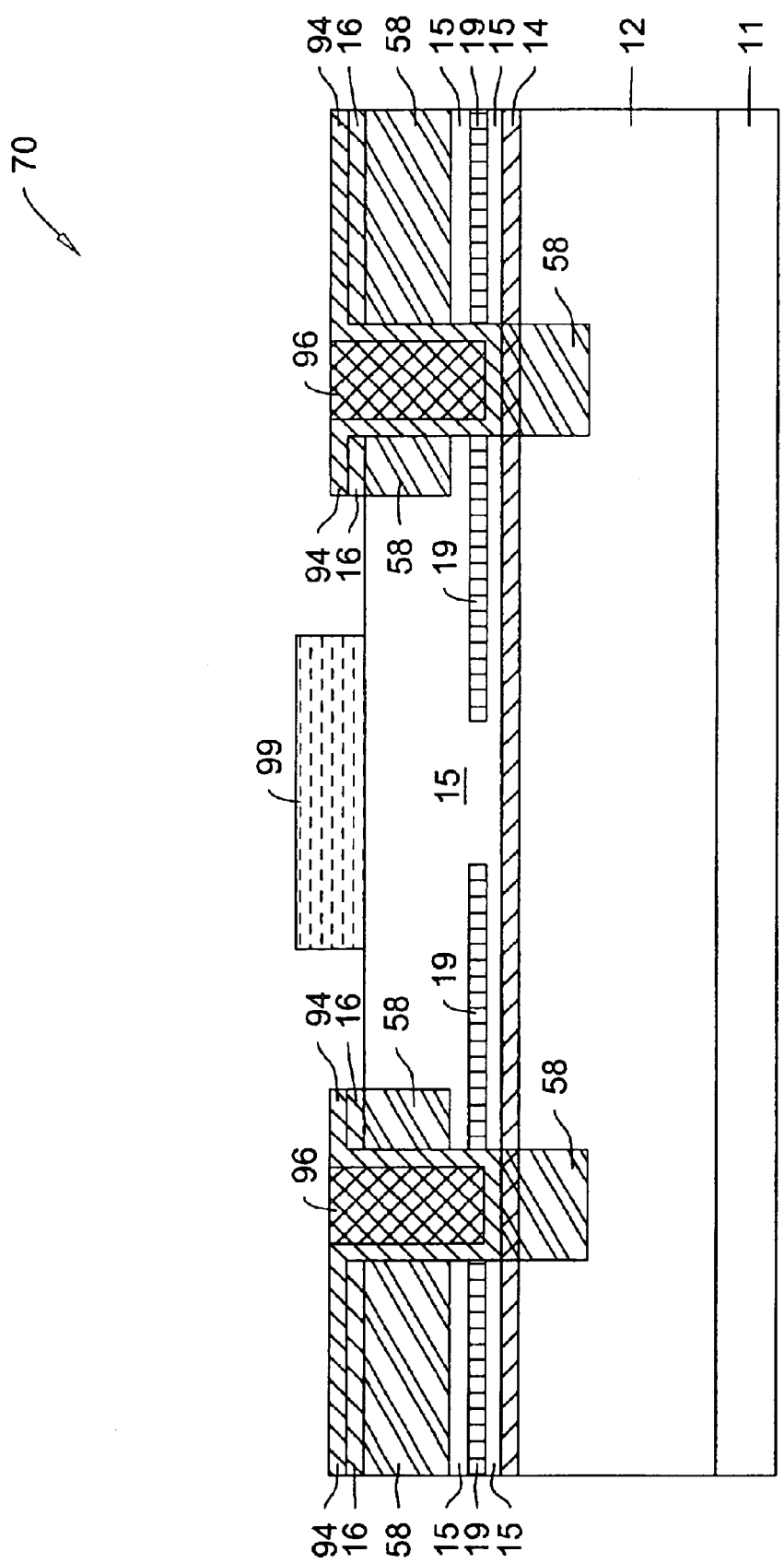
Figure 124:
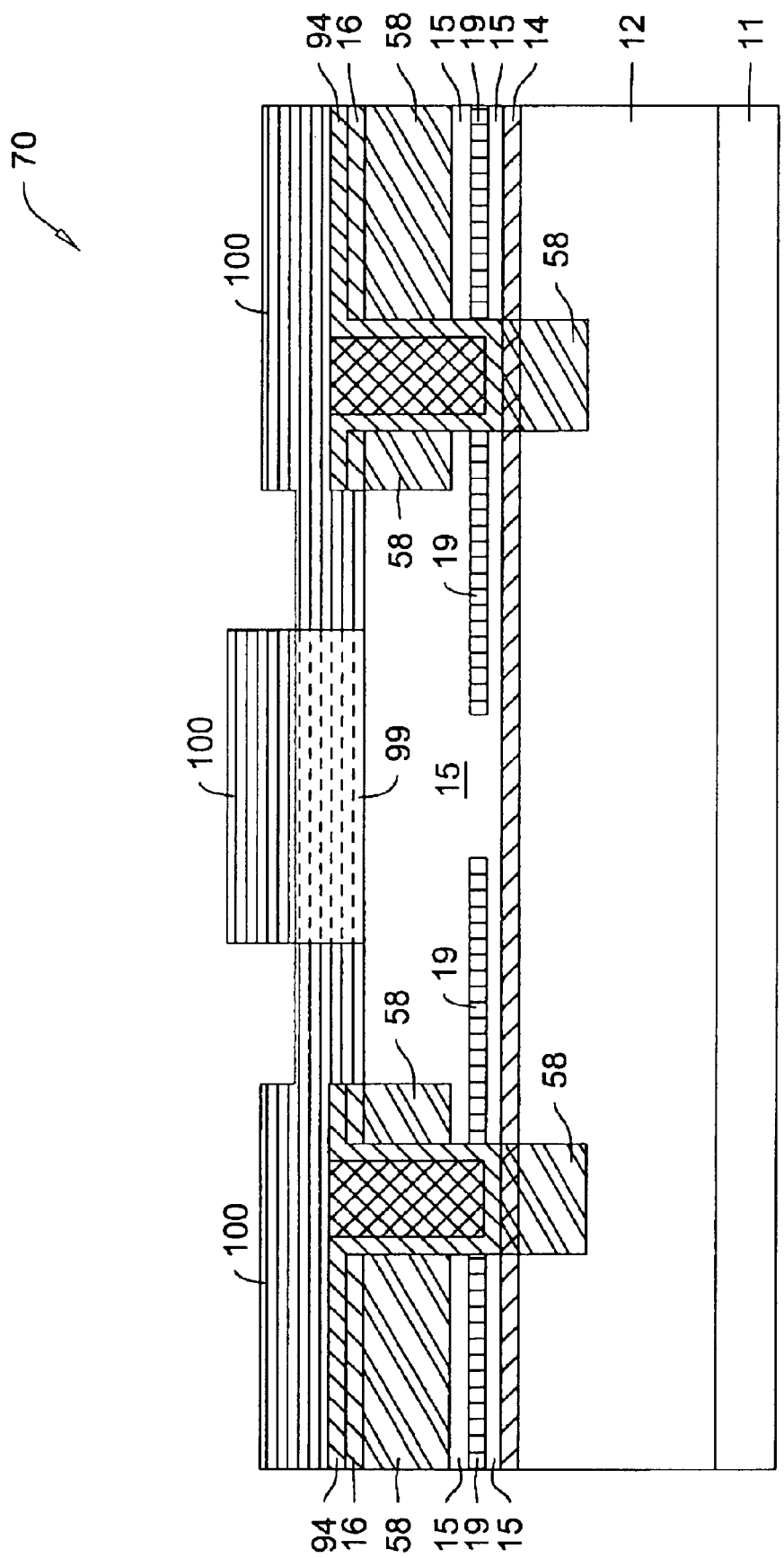
Figure 125:
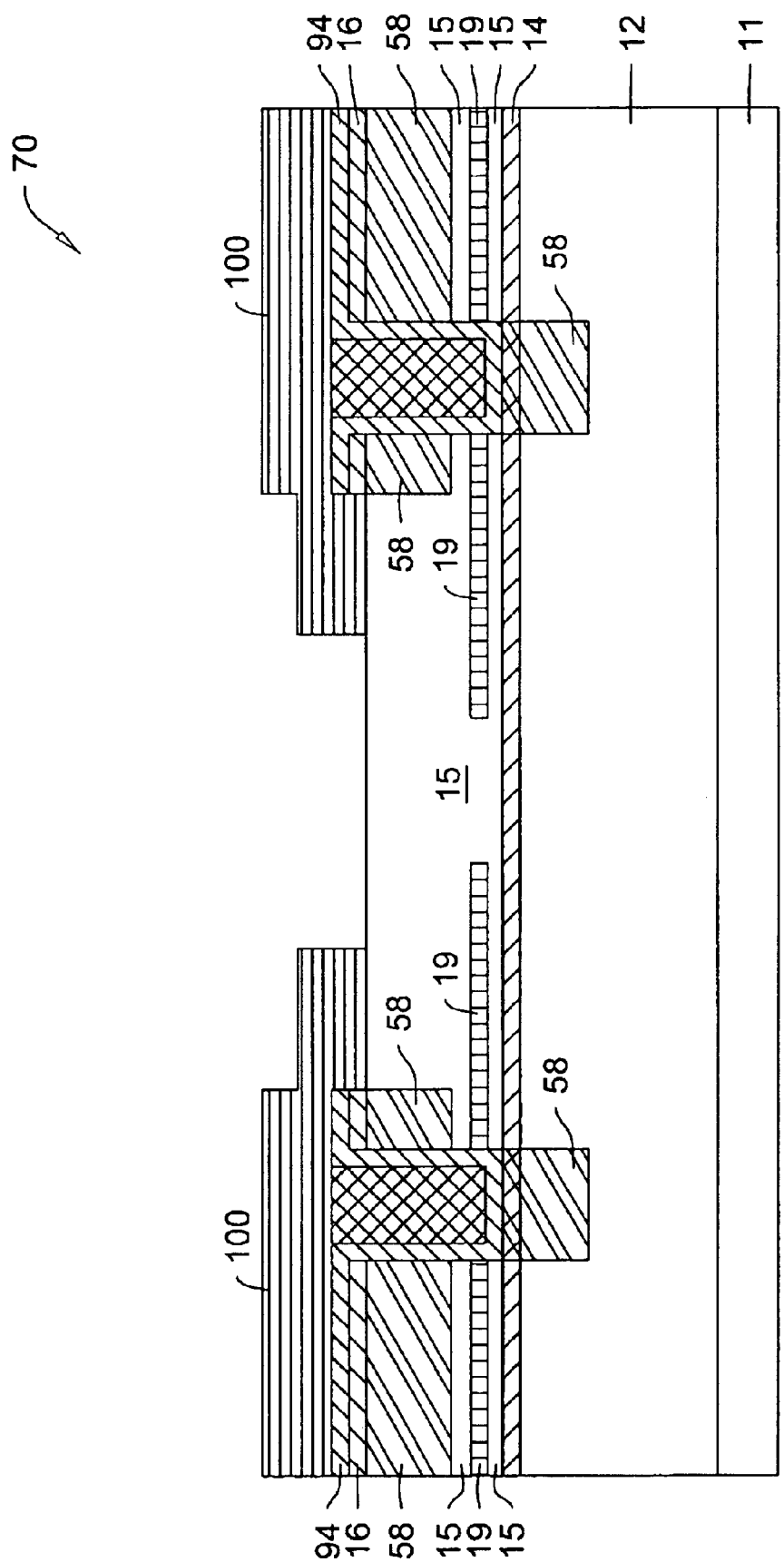
Figure 126:
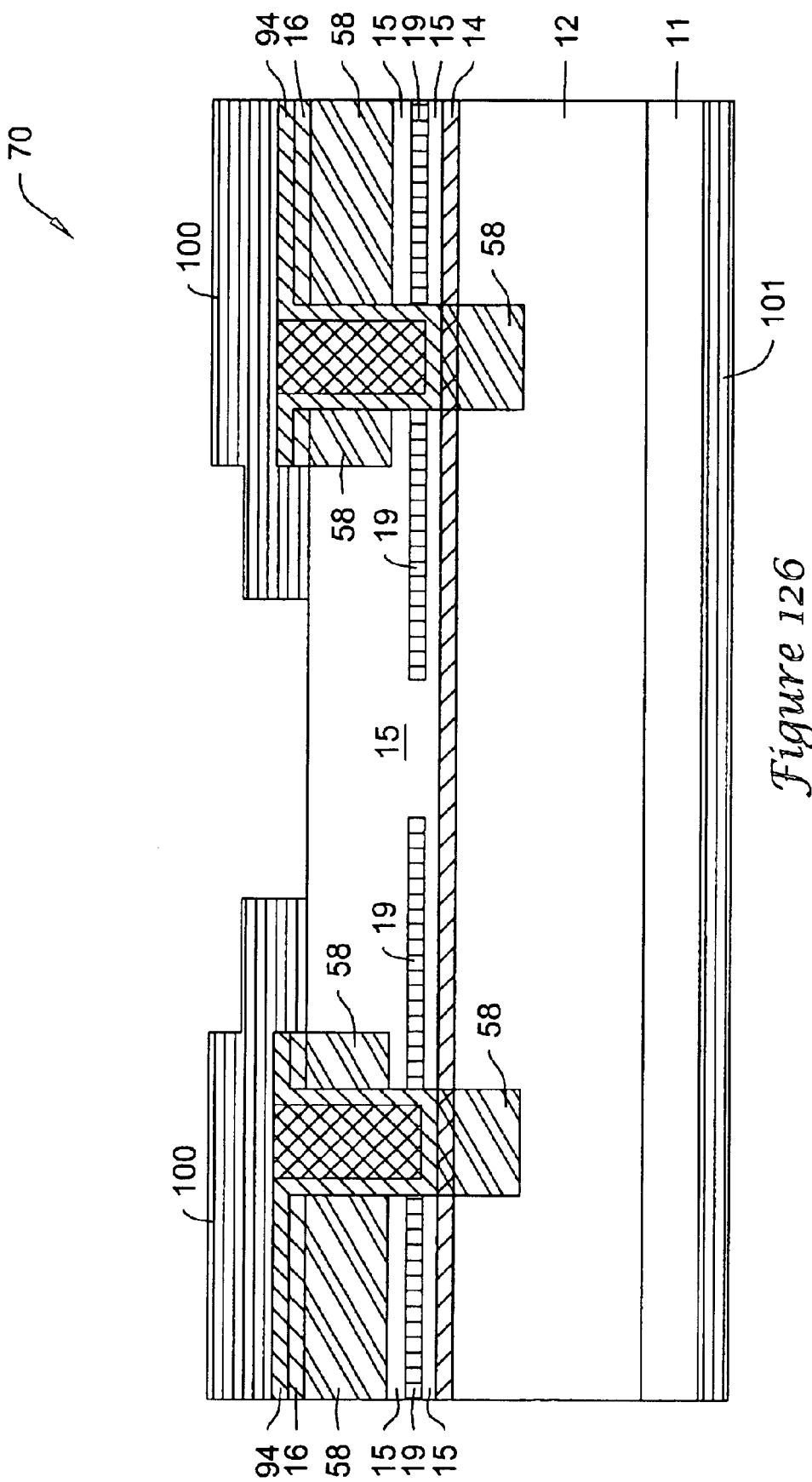

A photo resist mask 99 for a design of a metal bridge, a full aperture and bond pad pattern (LOR+PR) may be formed on the top of mirror 15 as shown in FIG. 123. A thick n-ohmic contact layer 100 of an Au/Ge alloy may be ebeam deposited on layer 94, material 96, top of mirror 15 and mask 99 as in FIG. 124. FIG. 125 shows the liftoff of metal 100 on photo resist 99 and the strip of photo resist 99. On the backside of substrate 11 of structure 70, an n-ohmic contact 101 may be ebeam deposited as in FIG. 126.

Figure 127:
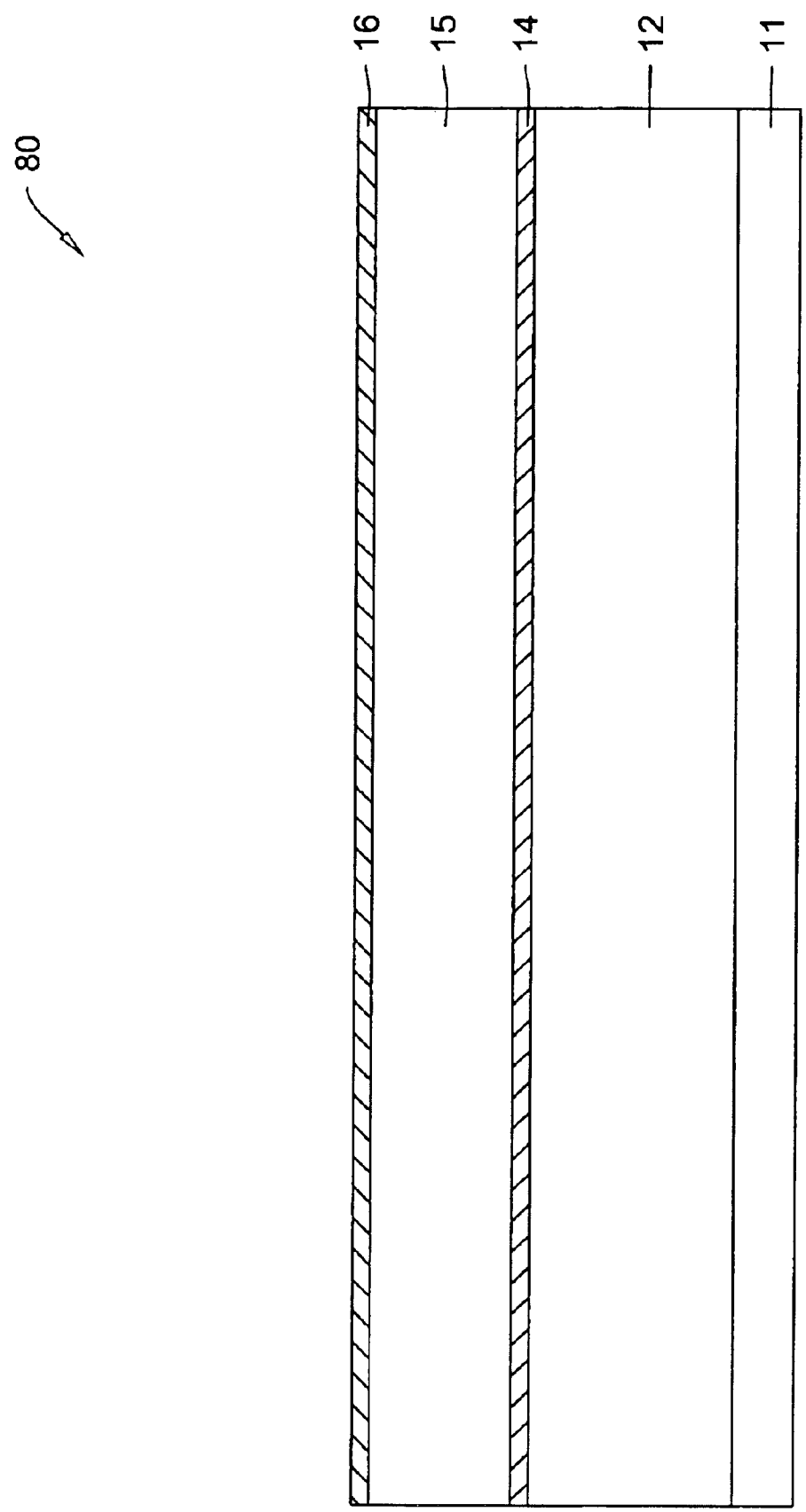
FIGS. 127–145 illustrate a process for making a laser structure having a contact air bridge over a trench and a backside contact.
Figure 128:
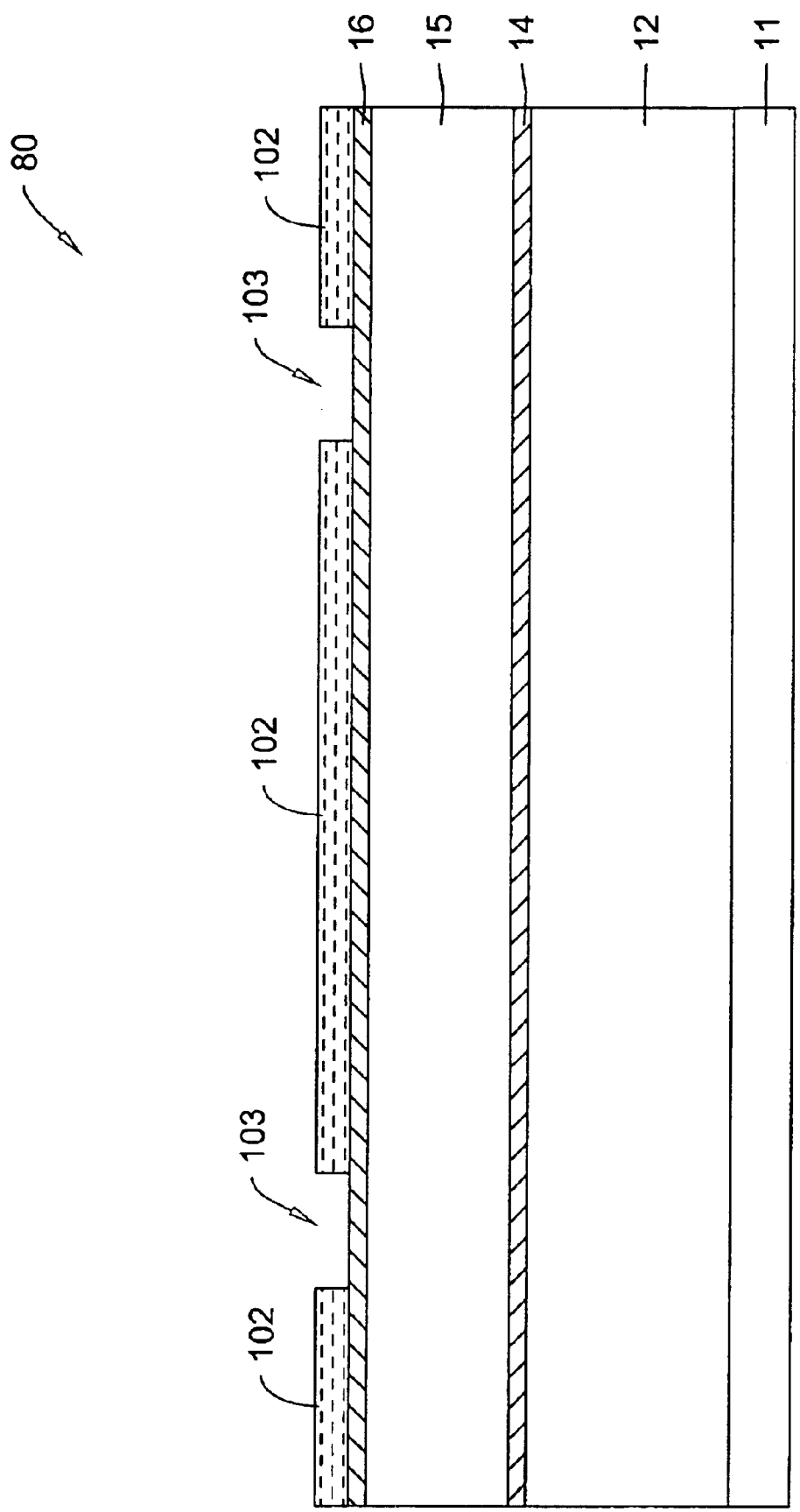
Figure 129:
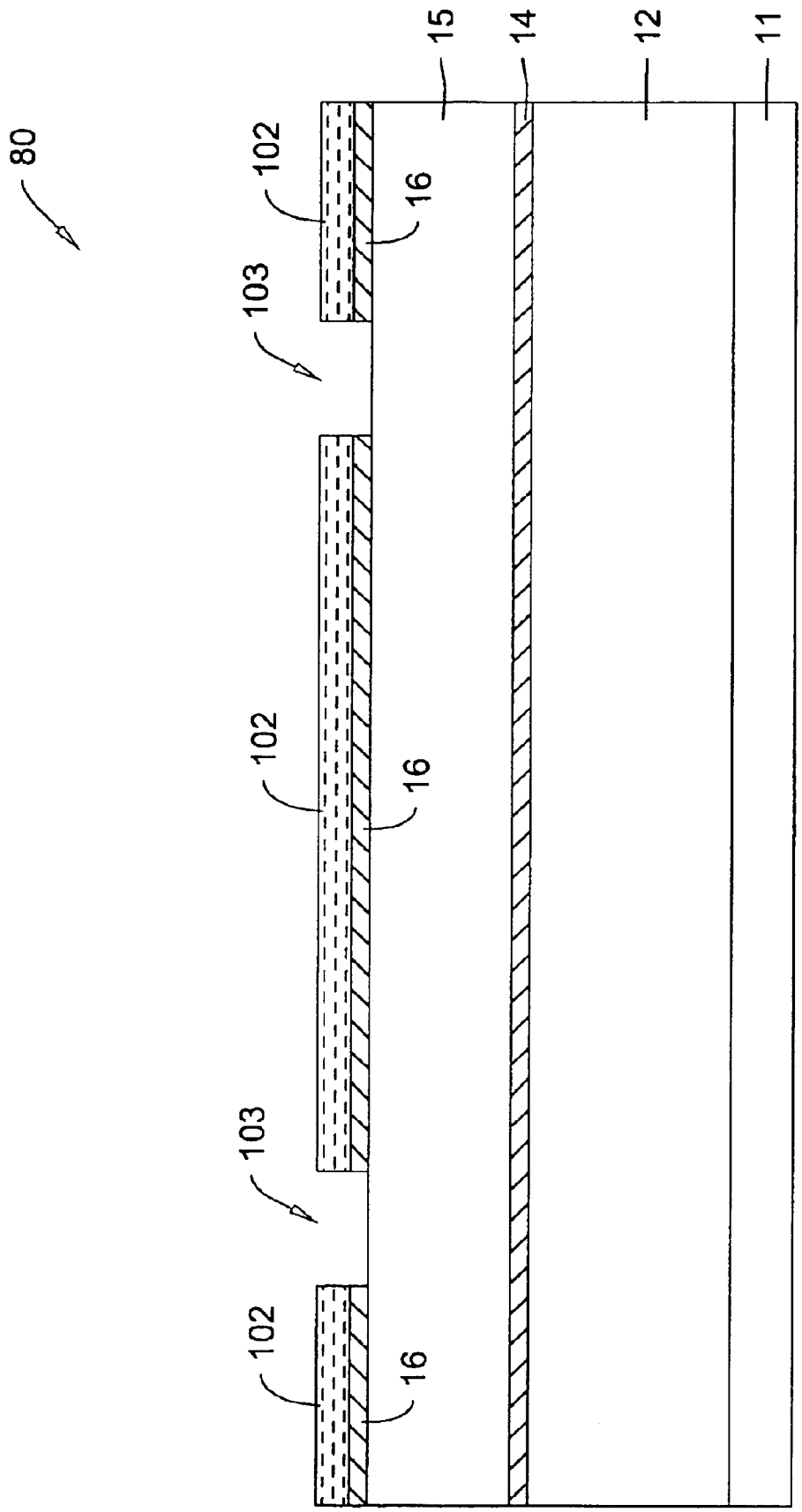
Figure 130:
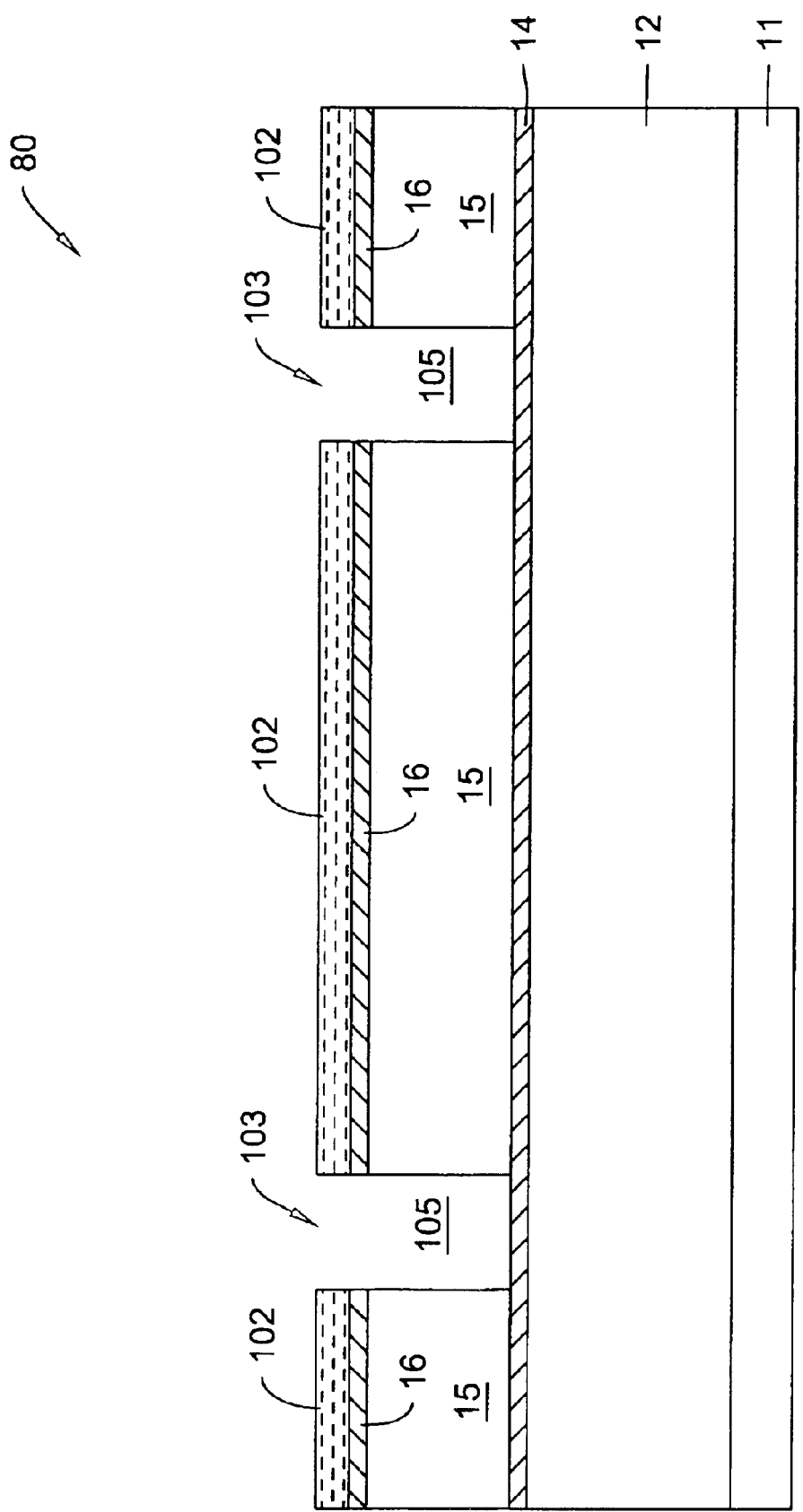
Figure 131:
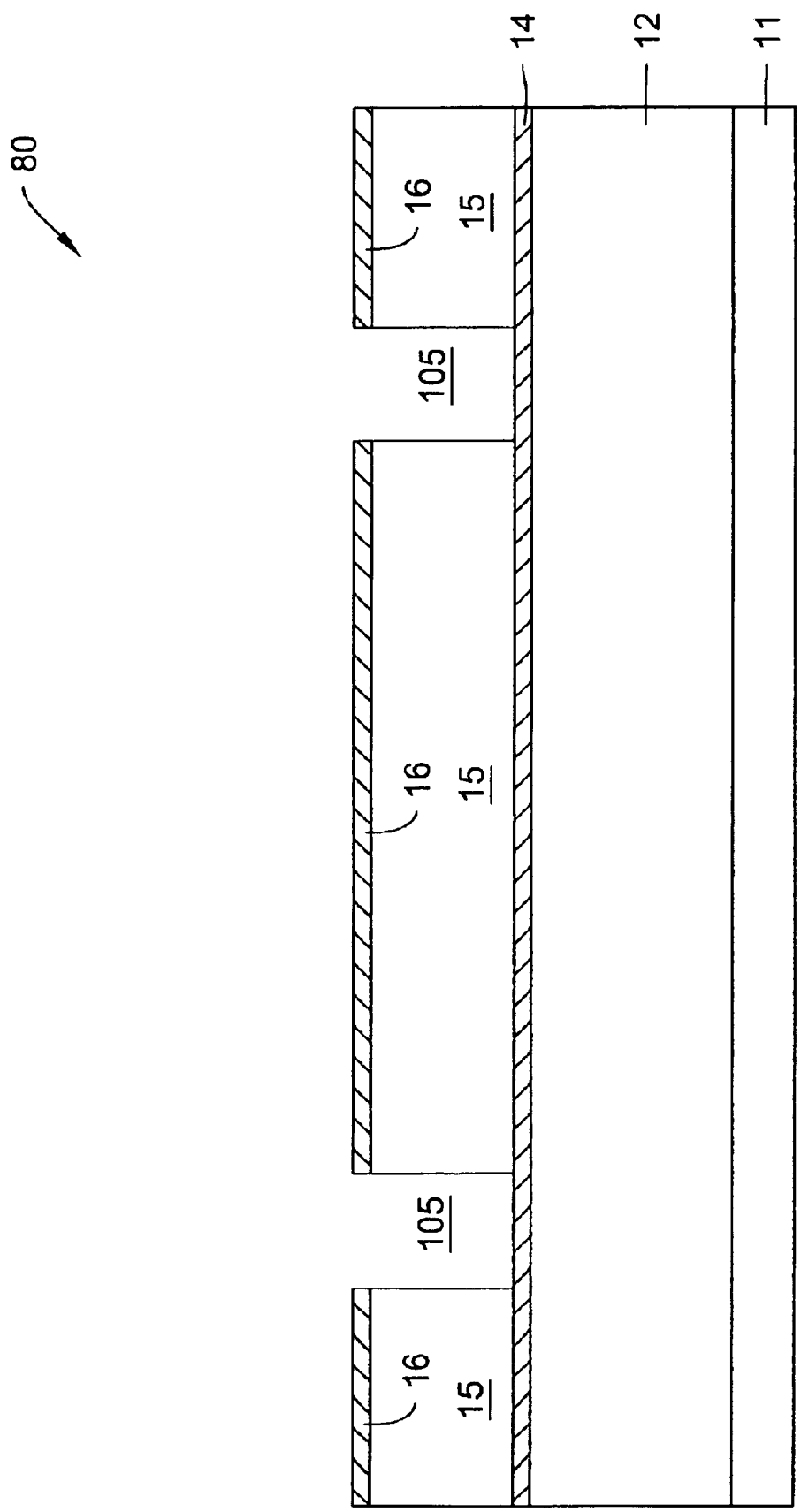

Another process may involve an air bridge, a thin pad dielectric, a wide trench and no Fetch. FIG. 127 shows the basic structure 80 of a laser device, having a substrate 11, bottom mirror 12, active region or layer 14 and top mirror 15, which may have an about one-fourth wavelength thick oxide layer 16 formed on the top of mirror 15. A mask 102, having a pattern for wide trench spoke and torus pattern for the oxide and trench etching, may be placed on layer 16 in FIG. 128. Oxide layer 16 may be etched off the top of mirror 15 in open area 103 of mask 102. In FIG. 130, mirror 15 may be ICP etched in area 103 down to active region 14. Alternatively, the etch may stop before layer 14 or go beyond layer 14 in mirror 12. The result may be a trench 105. Photo resist 102 may be stripped as in FIG. 131.

Figure 132:
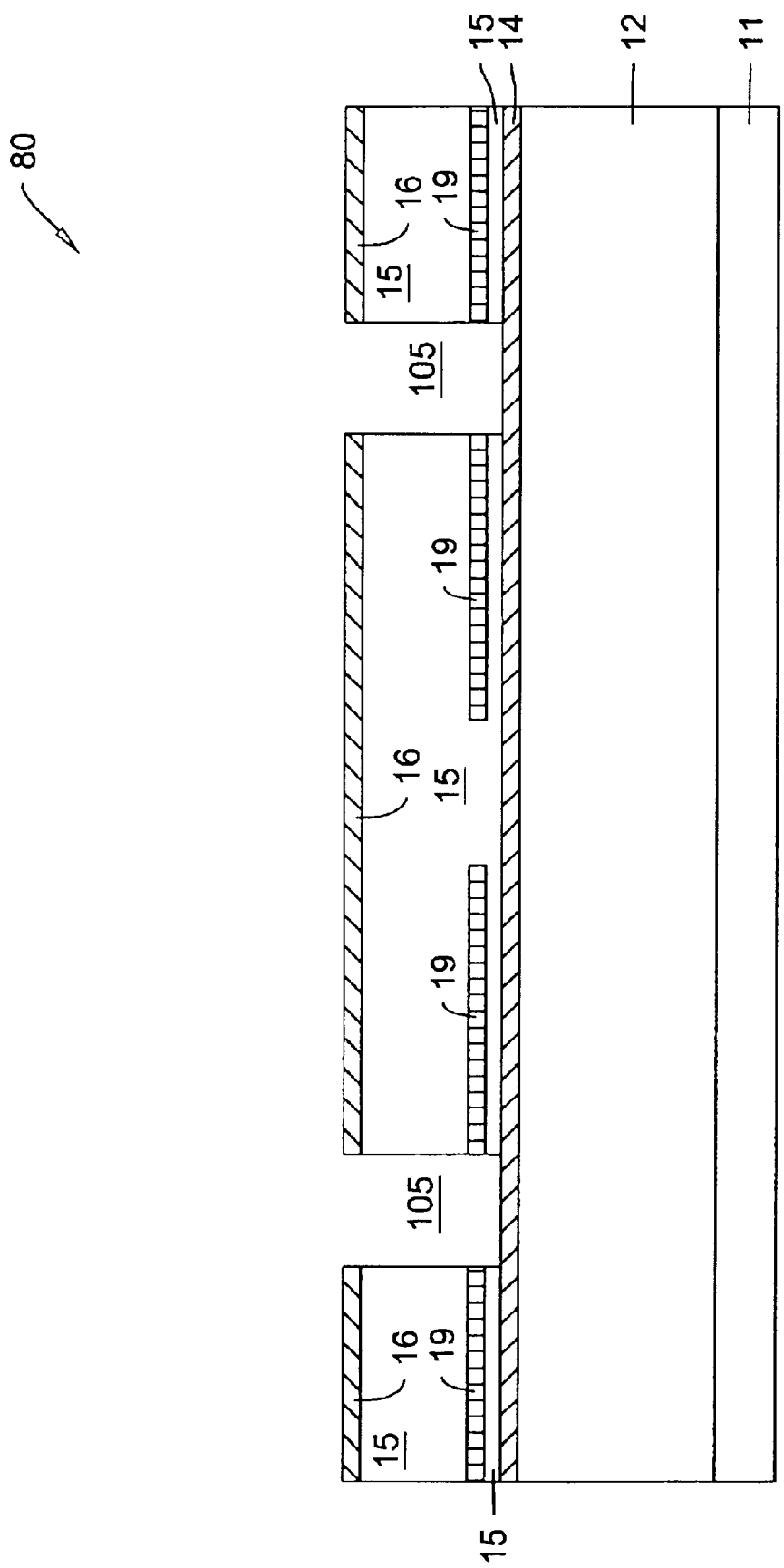
Figure 133:
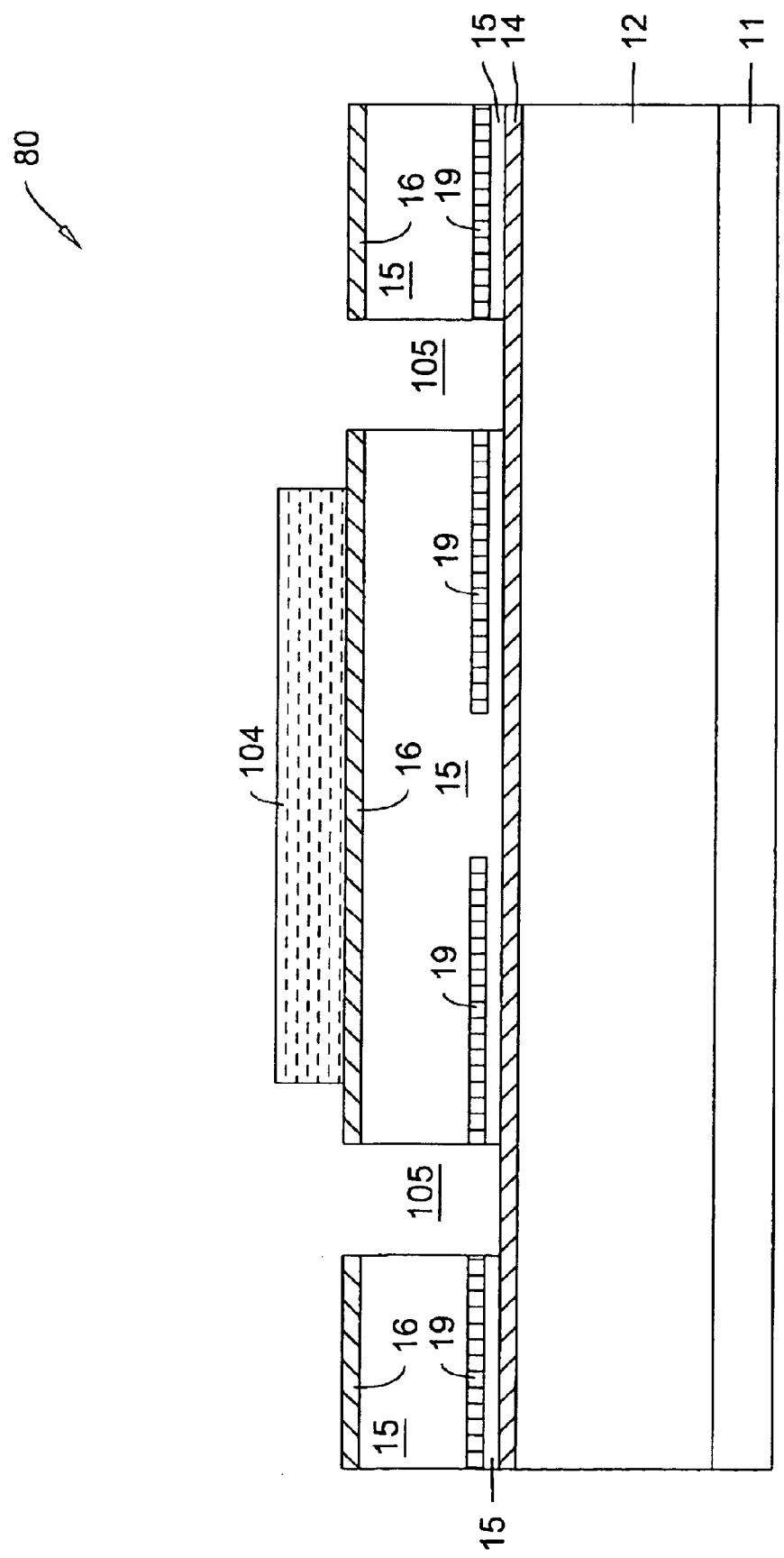
Figure 134:
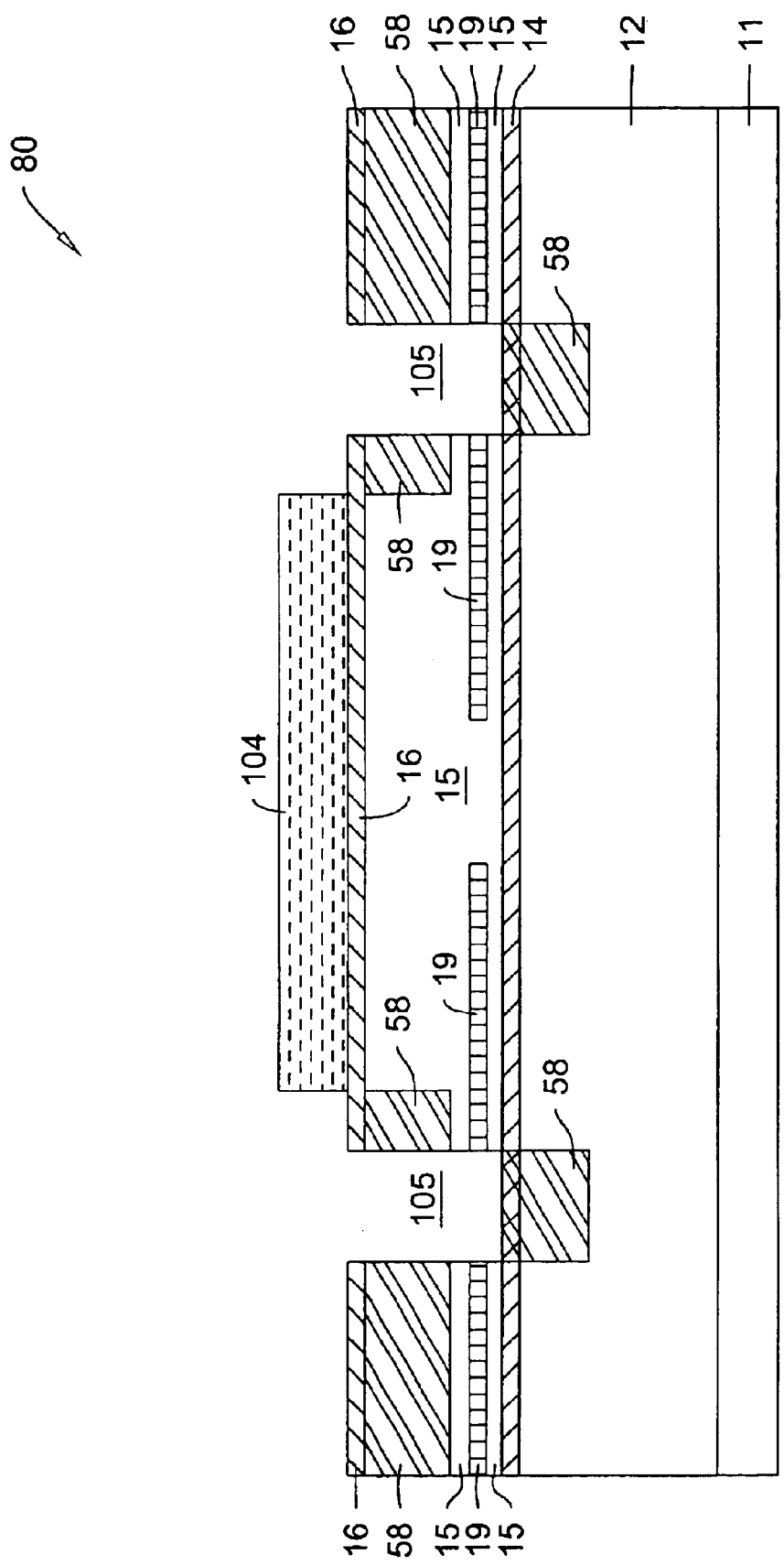
Figure 135:
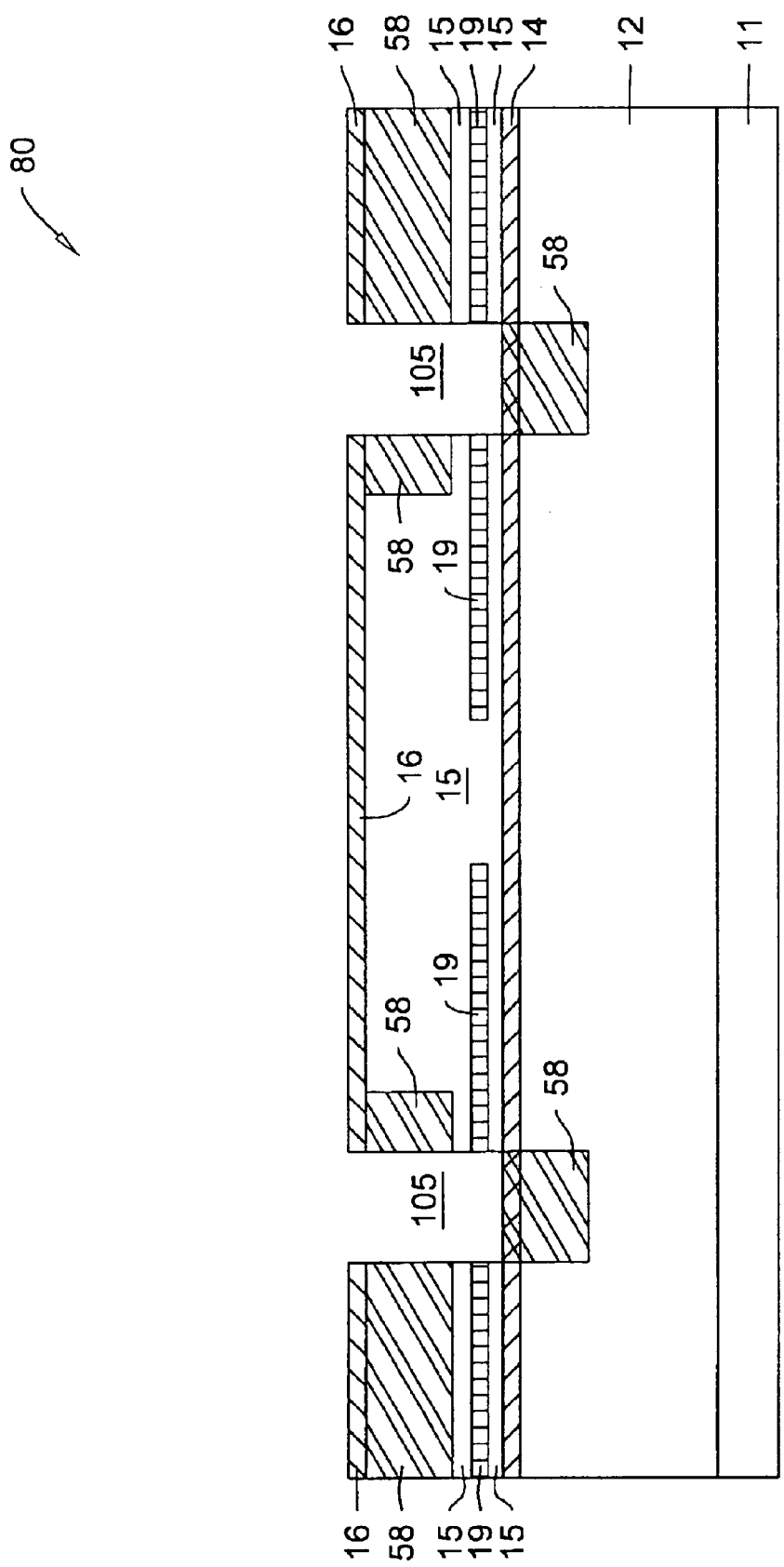

Structure 80 may be placed in an environment for a specific period of time to oxidize one or more oxidizable layers 19 in mirror 15 to form an aperture for current confinement when structure 80 is operating. Oxidized layer 19 is shown in FIG. 132. A mask or photo resist 104 having a circular pattern may be situated over the aperture area of mirror 15 for an isolation implant, as indicated in FIG. 133. An ion implant may be effected into structure 80 from the top resulting in an isolation implant 58, as shown in FIG. 134. After the ion implant, photo resist 104 may be stripped as in FIG. 135.

Figure 136:
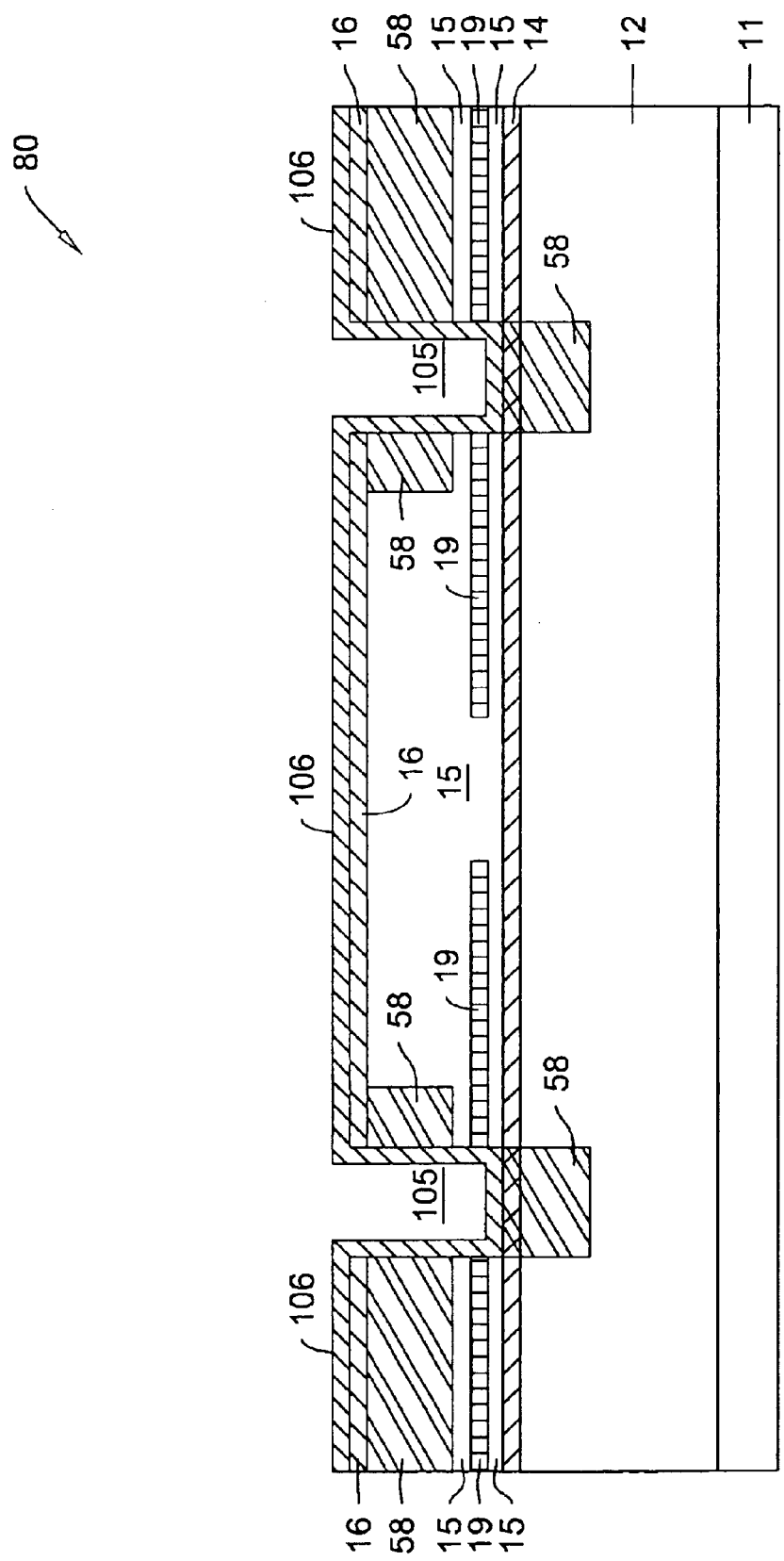
Figure 137:
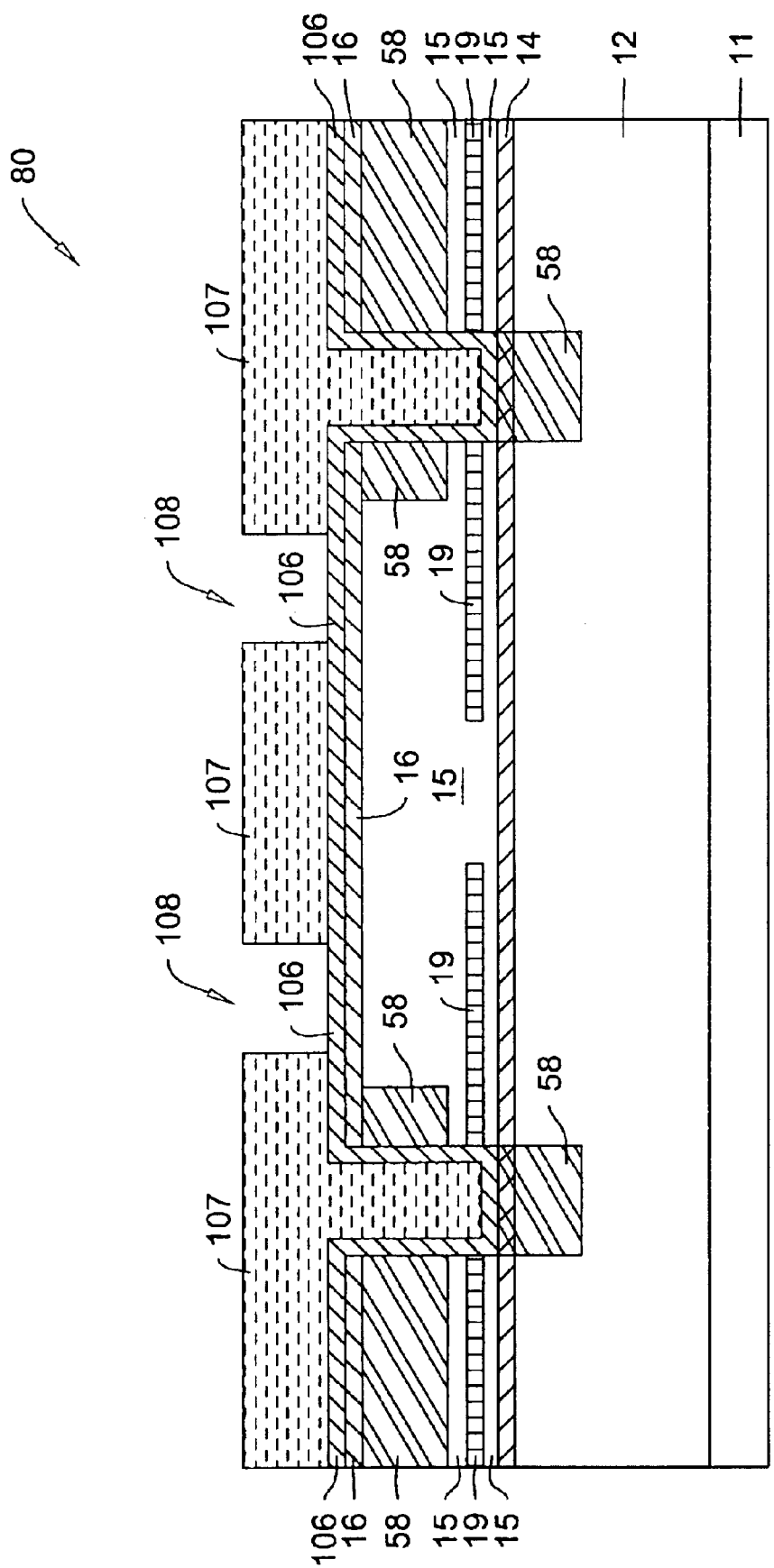
Figure 138:
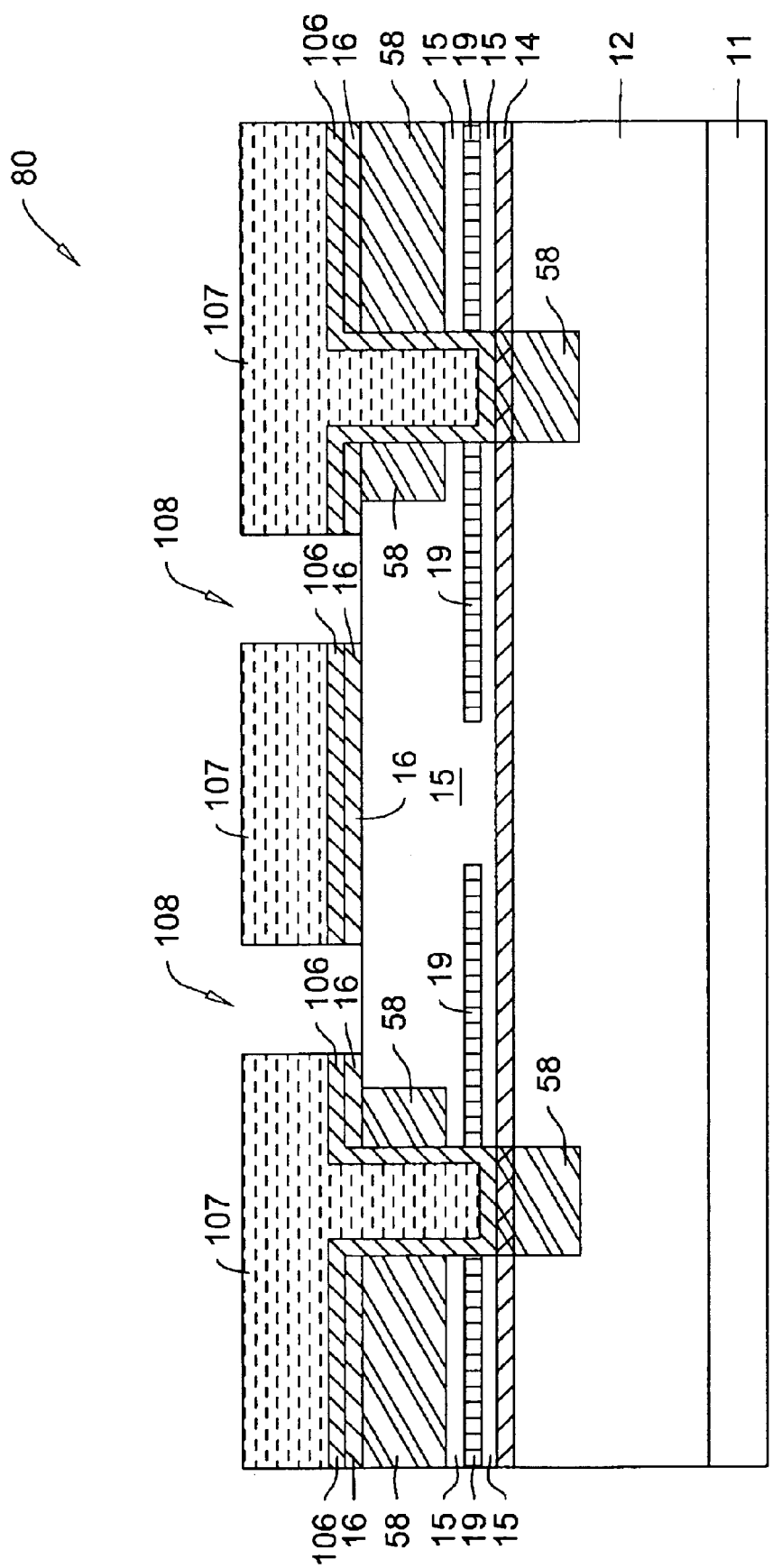
Figure 139:
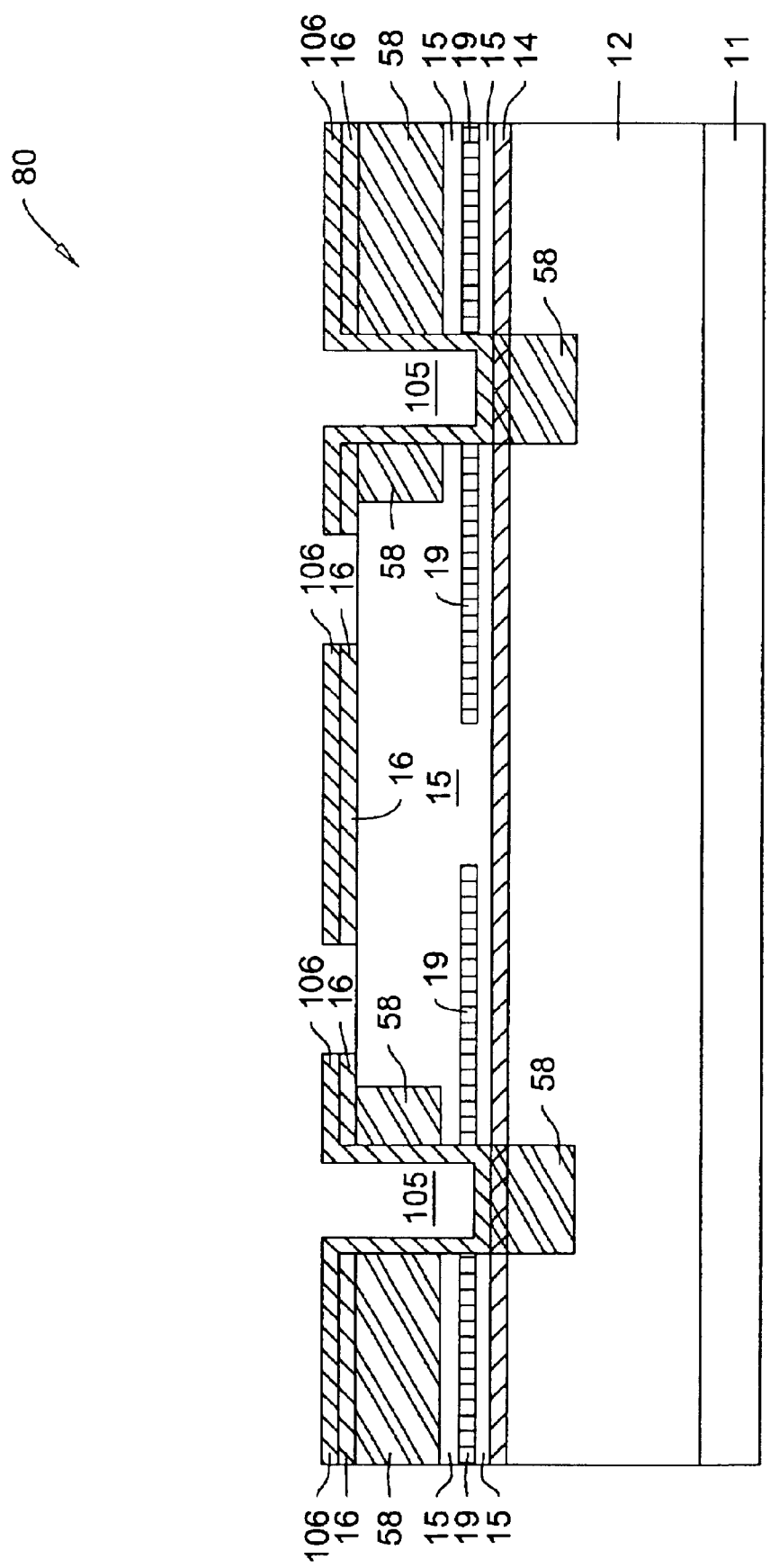

An oxide layer 106 of about one-fourth thickness may be formed on oxide layer 16 as indicated in FIG. 136. Oxide layer 106 may also be formed on the surfaces of trench 105. A mask 107 having an open area 108 with a torus pattern for a contact may be applied on top of oxide layer 106 as in FIG. 137. An etchant may be applied through open area 108 to etch out layers 16 and 106 down to the top surface of mirror 15, as shown in FIG. 138. The total thickness of oxide etched may be about one-half of a wavelength. Then photo resist 107 may be stripped in FIG. 139.

Figure 140:
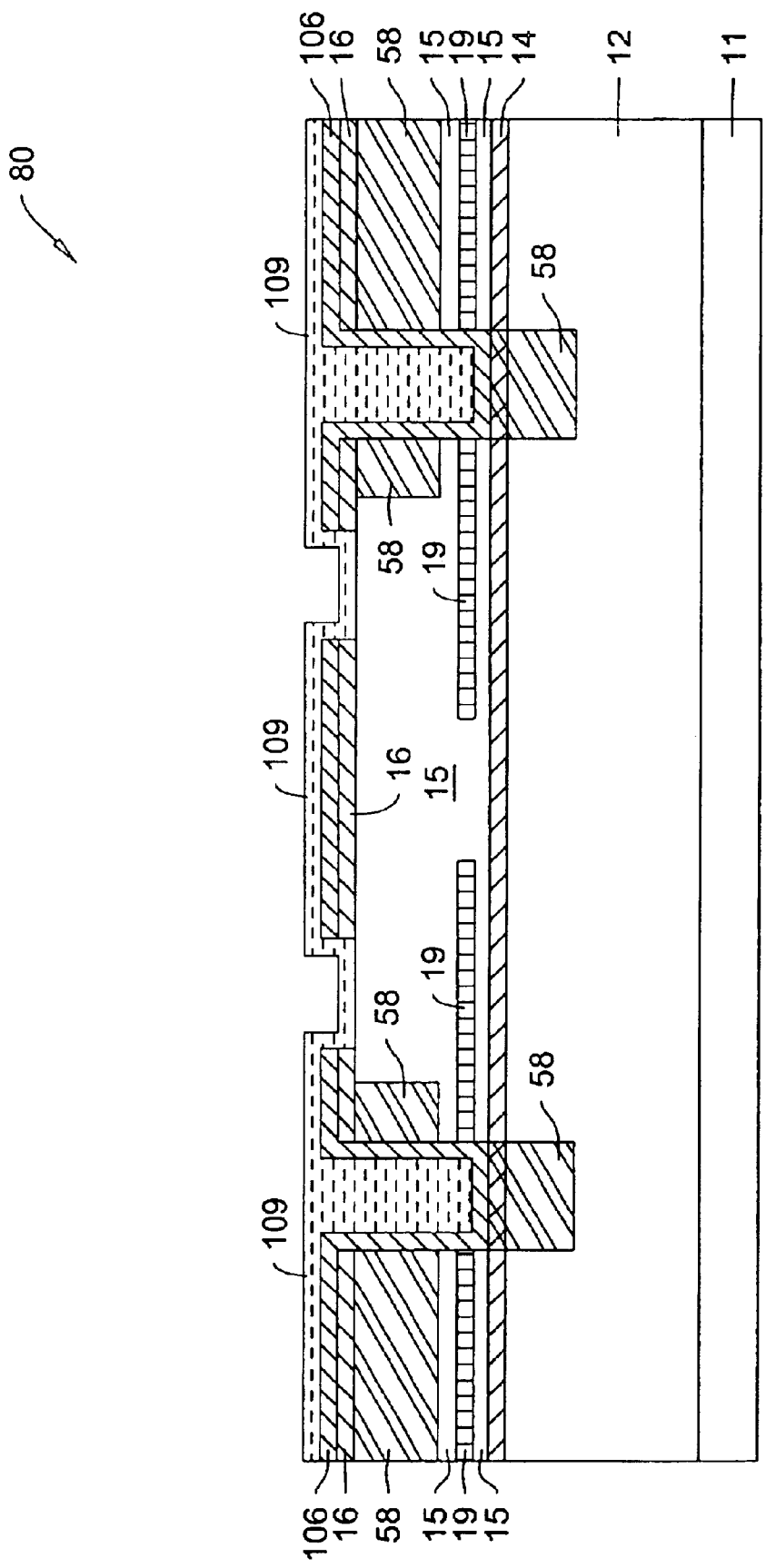
Figure 141:
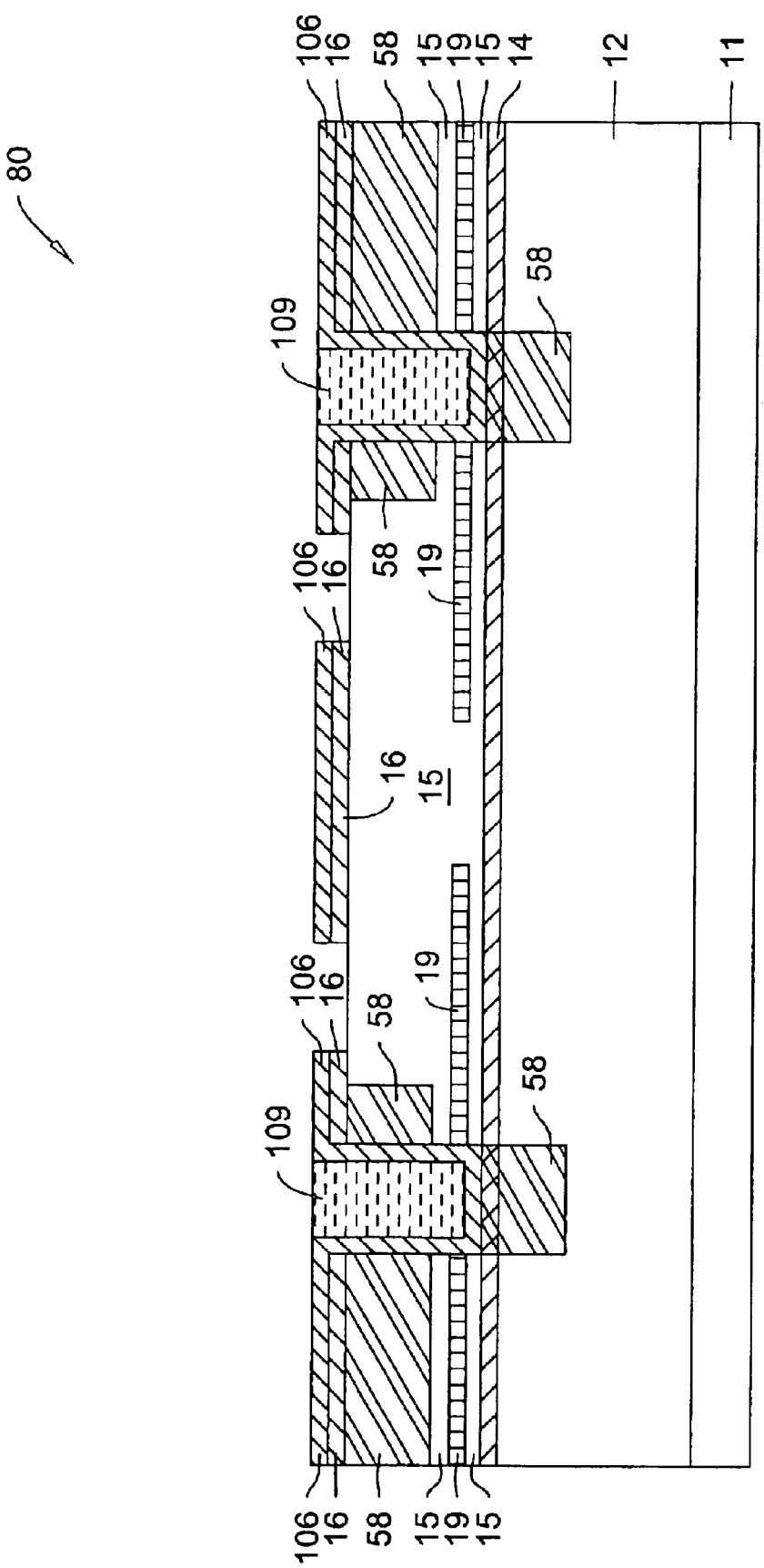
Figure 142:
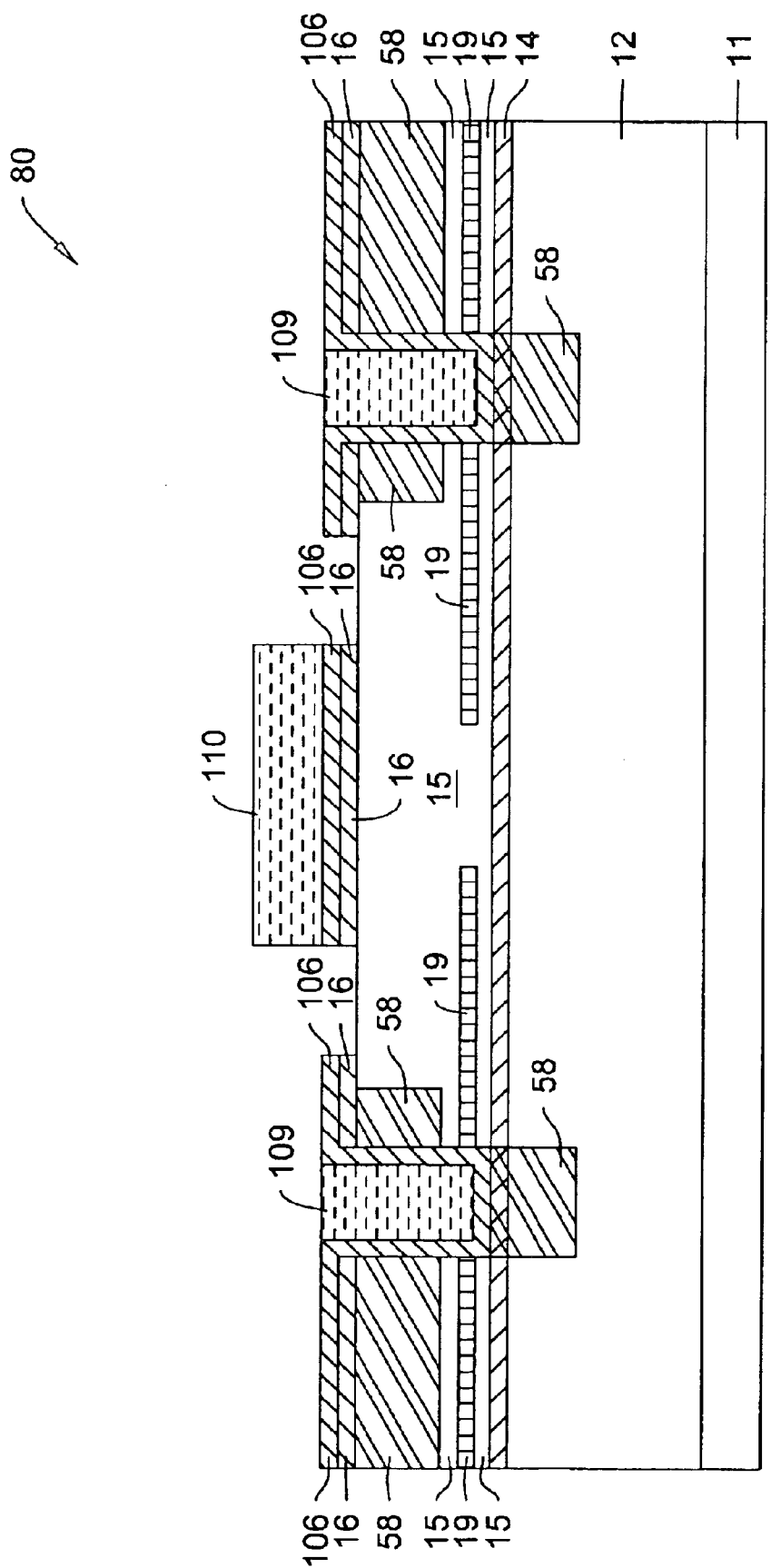
Figure 143:
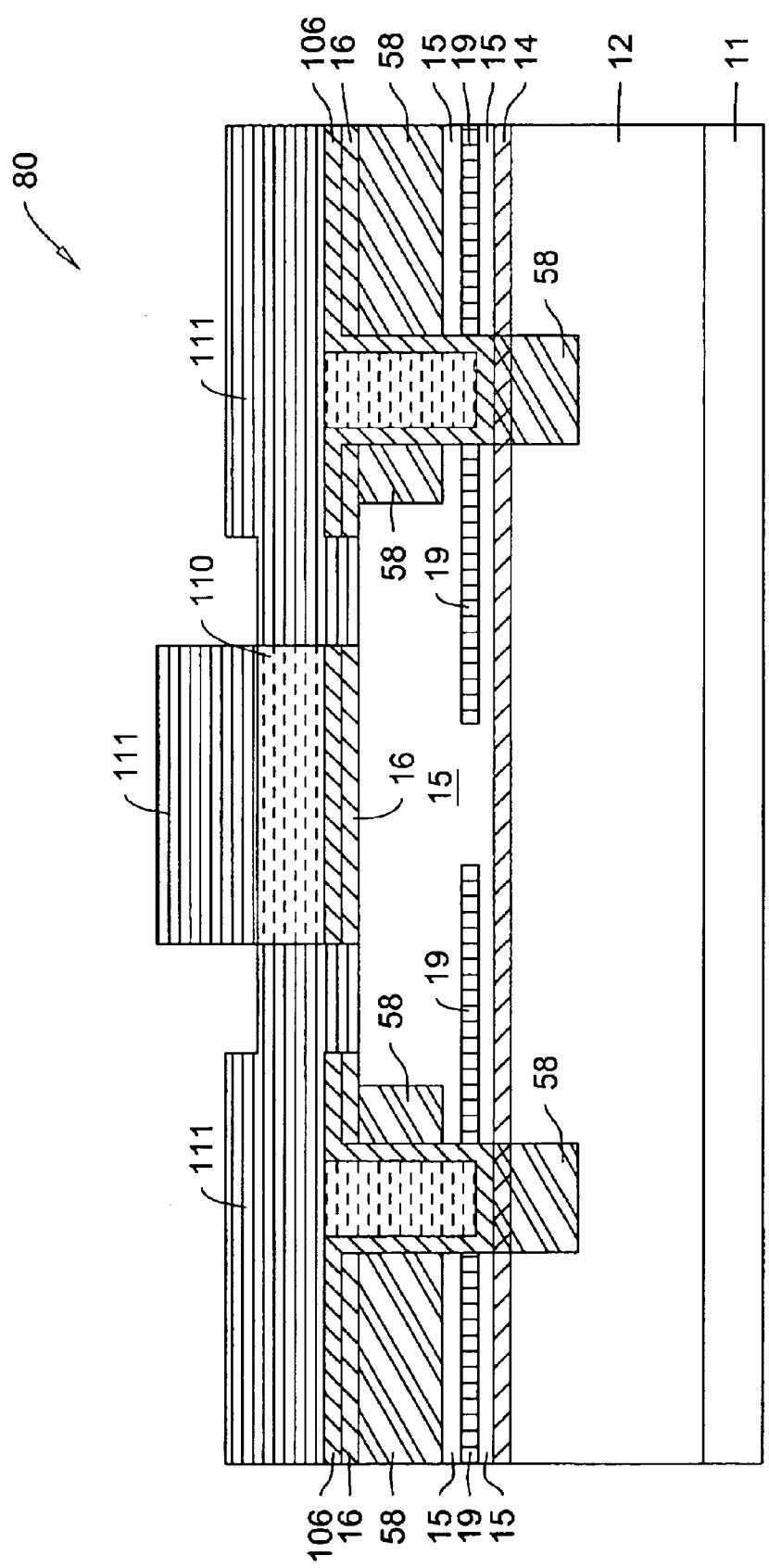
Figure 144:
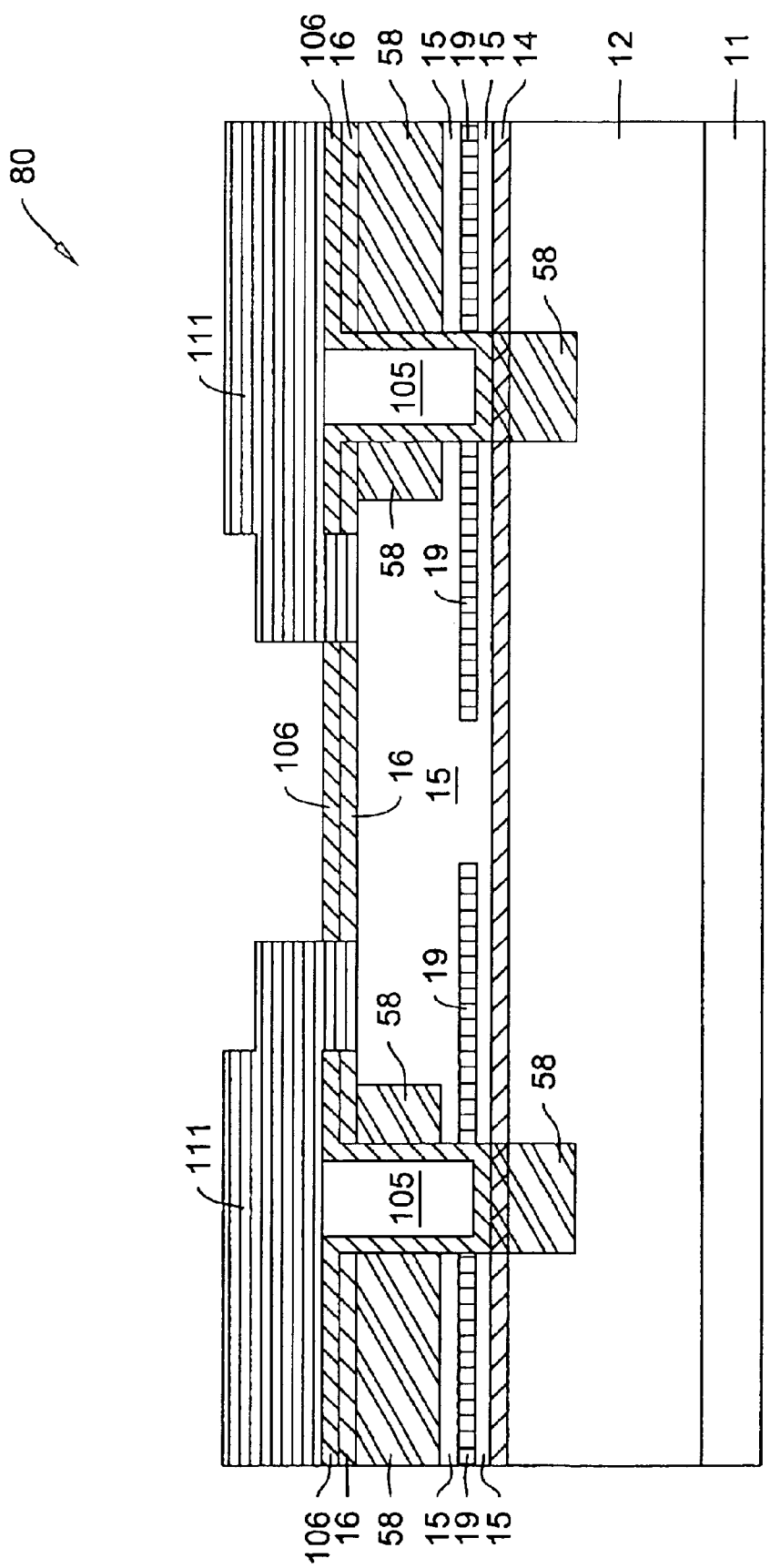
Figure 145:
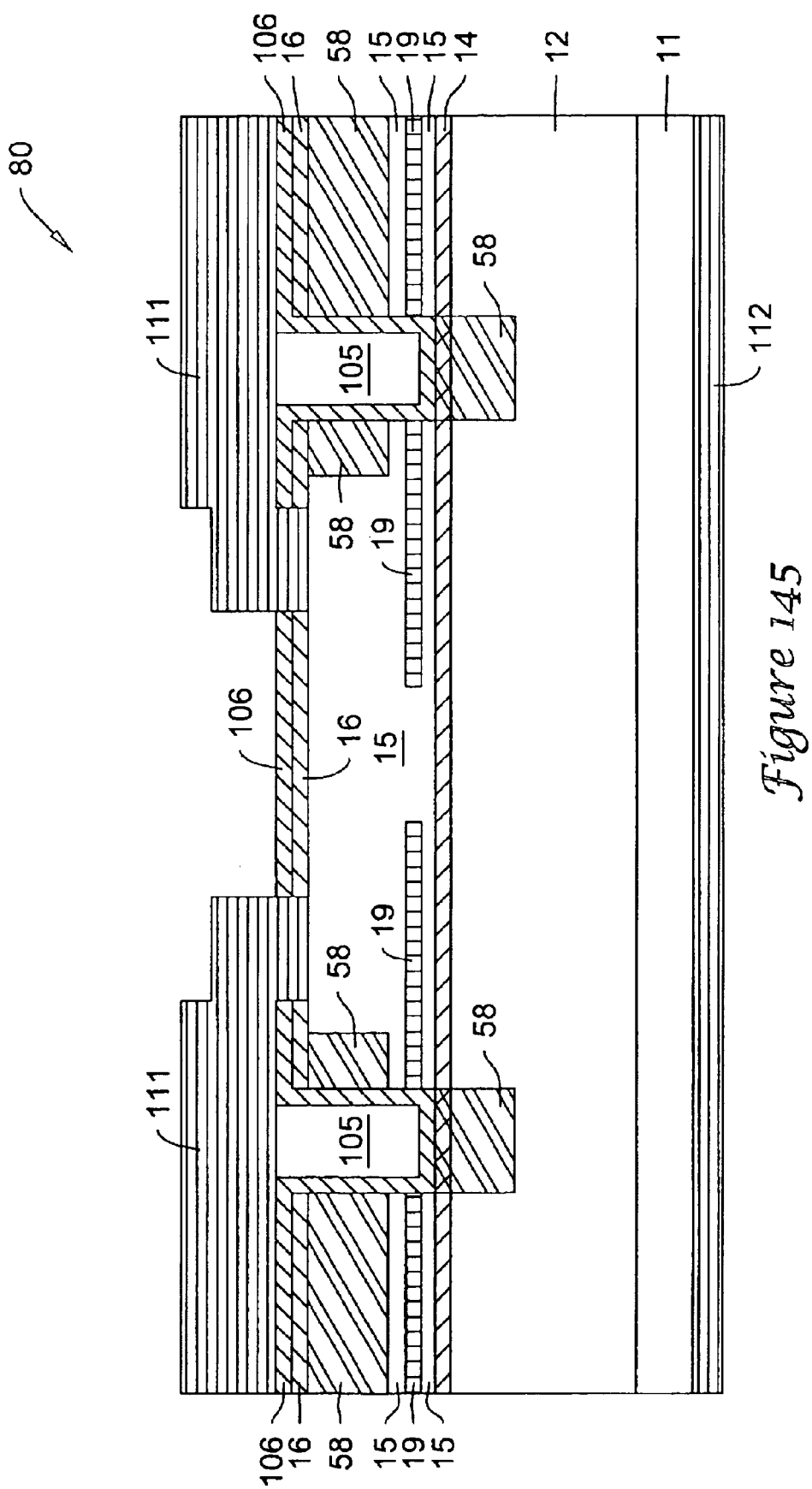

A photo resist 109 or an LOR+PR, or the like, may be spun on structure 80 as a thin layer on the surface of oxide layer 106 and the exposed top surface of mirror 15 but filling in trenches 105, as shown in FIG. 140. An air bridge pattern may be developed out of layer 109 leaving the fill of material 106 in trenches 105 as in FIG. 141. A LOR+PR material 110 may be applied for bridge metal, full aperture and bond pad pattern as in FIG. 142. A thick n-ohmic contact layer 111 of an Au/Ge alloy may be ebeam deposited on structure 80, as shown in FIG. 143. There may be a lift-off of metal 111 on photo resist 110 and a strip of photo resist 109 and 110 to result in a contact 111 on mirror 15 and an air bridge 111 formation over trench 105, as illustrated in FIG. 144. An n-ohmic contact 112 of an Au/Ge alloy may be ebeam deposited on the backside of substrate 11, as shown in FIG. 145.

Figure 146:
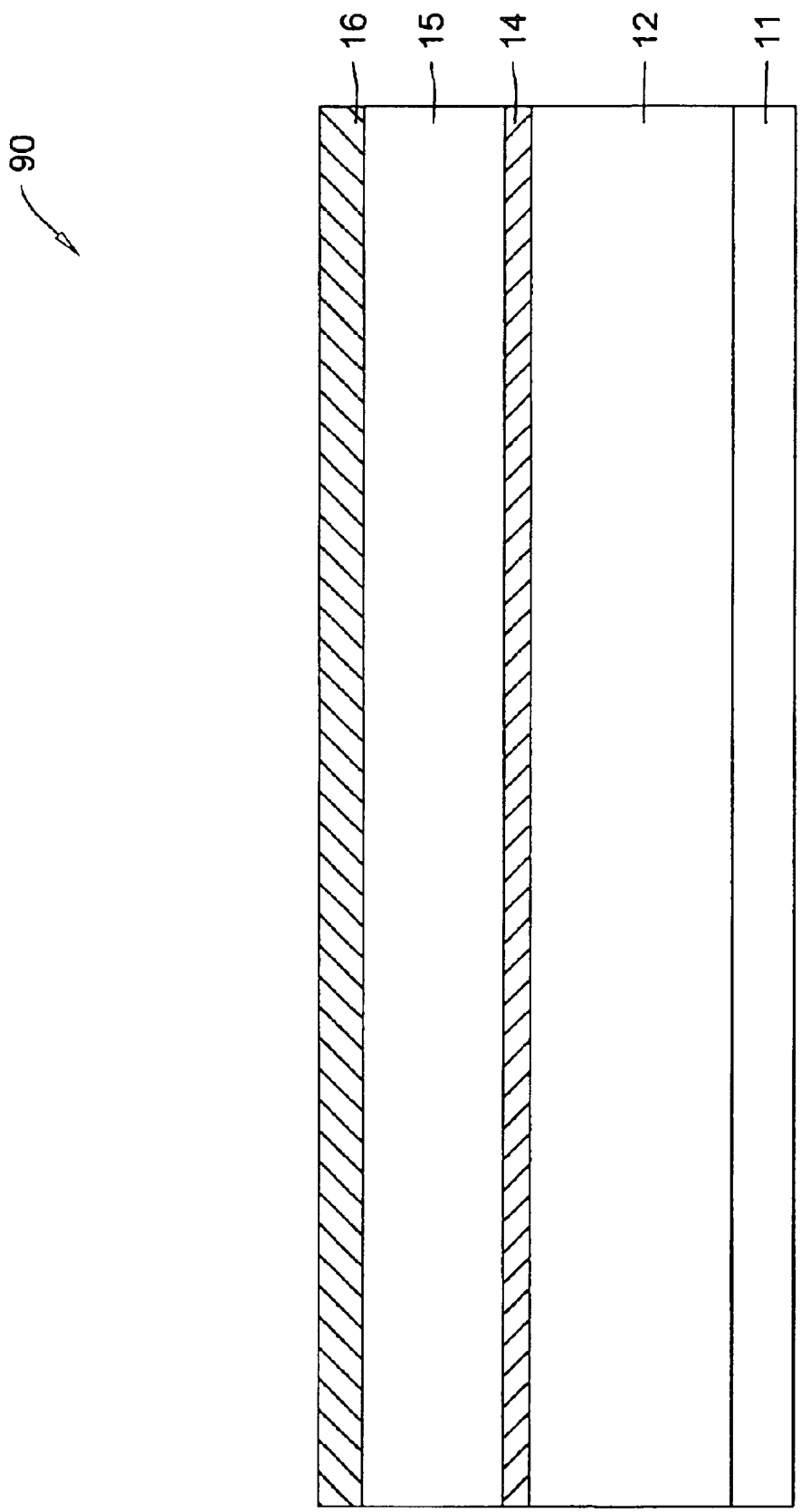
FIGS. 146–168 reveal a process for making a laser structure having a waffle pad of small oxidation trenches.
Figure 147:
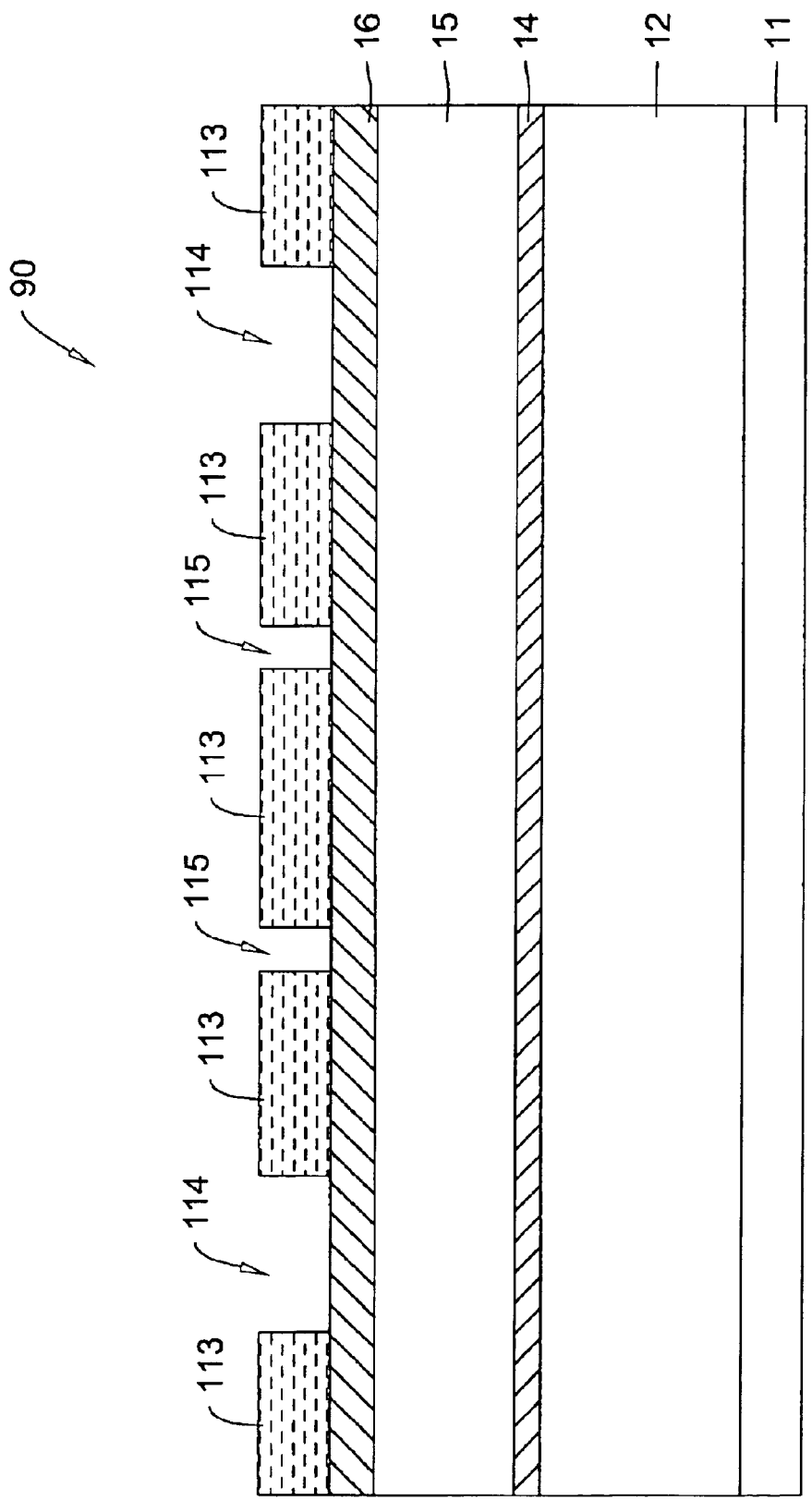
Figure 148:
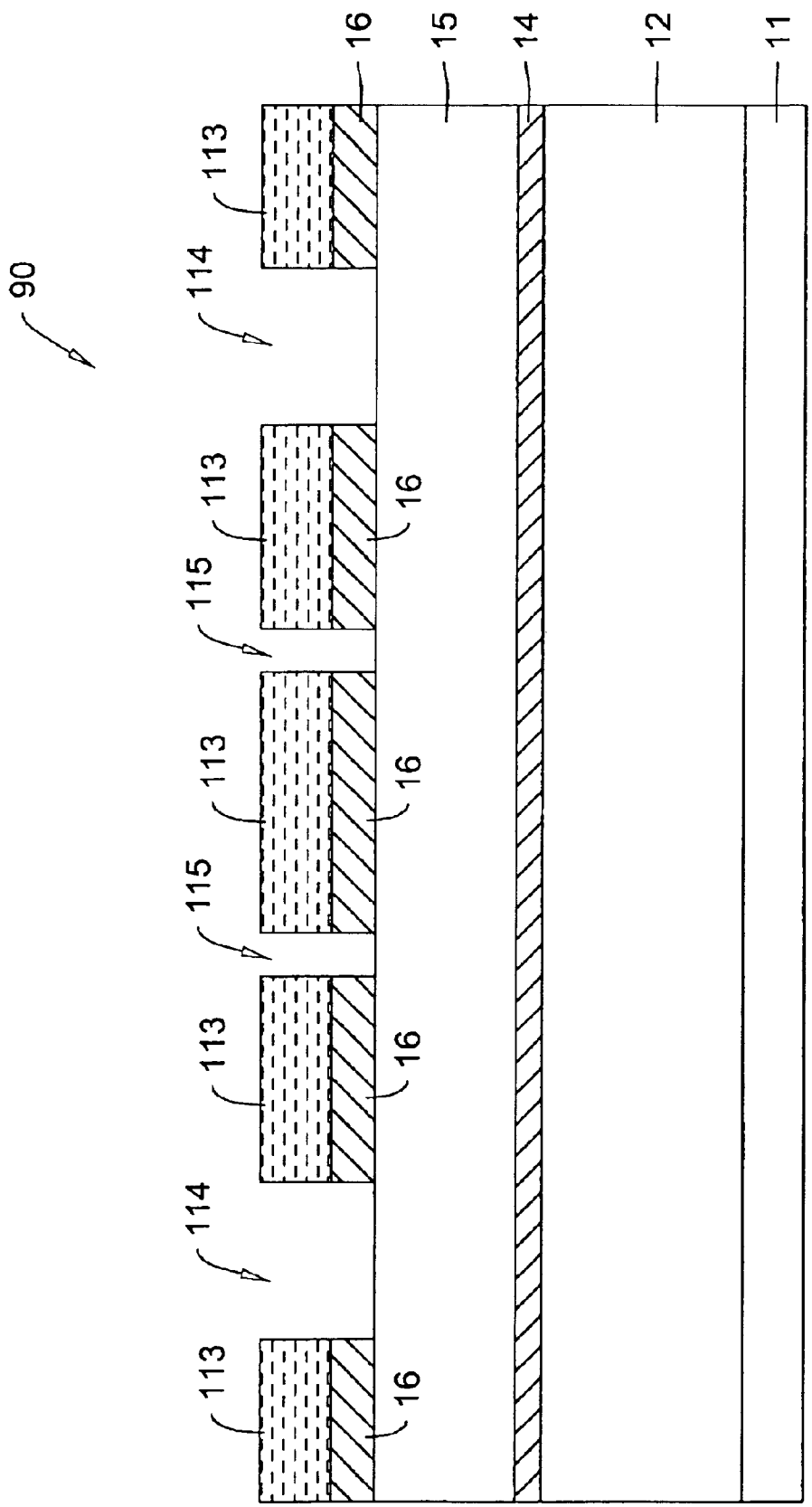
Figure 149:
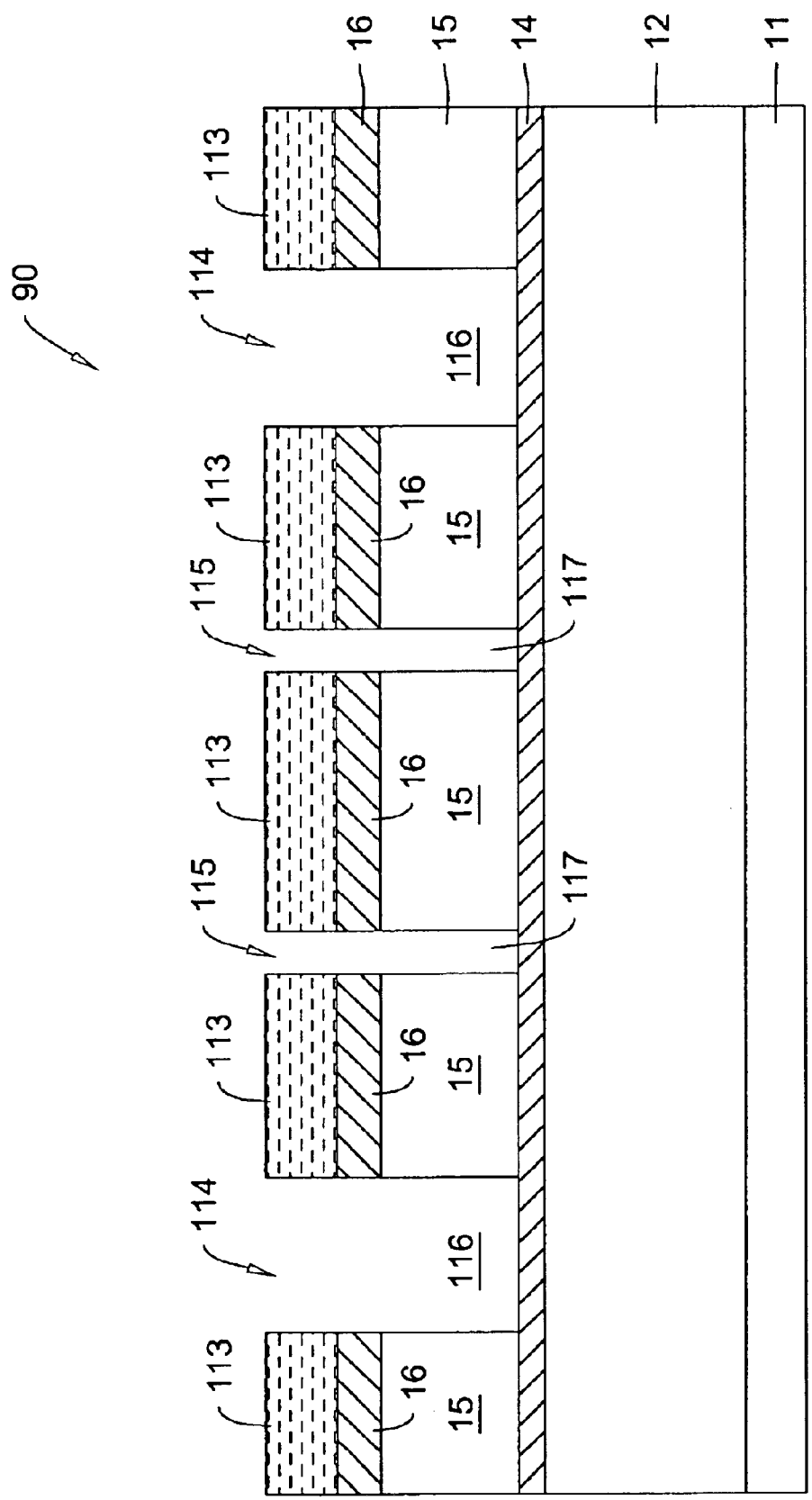
Figure 150:
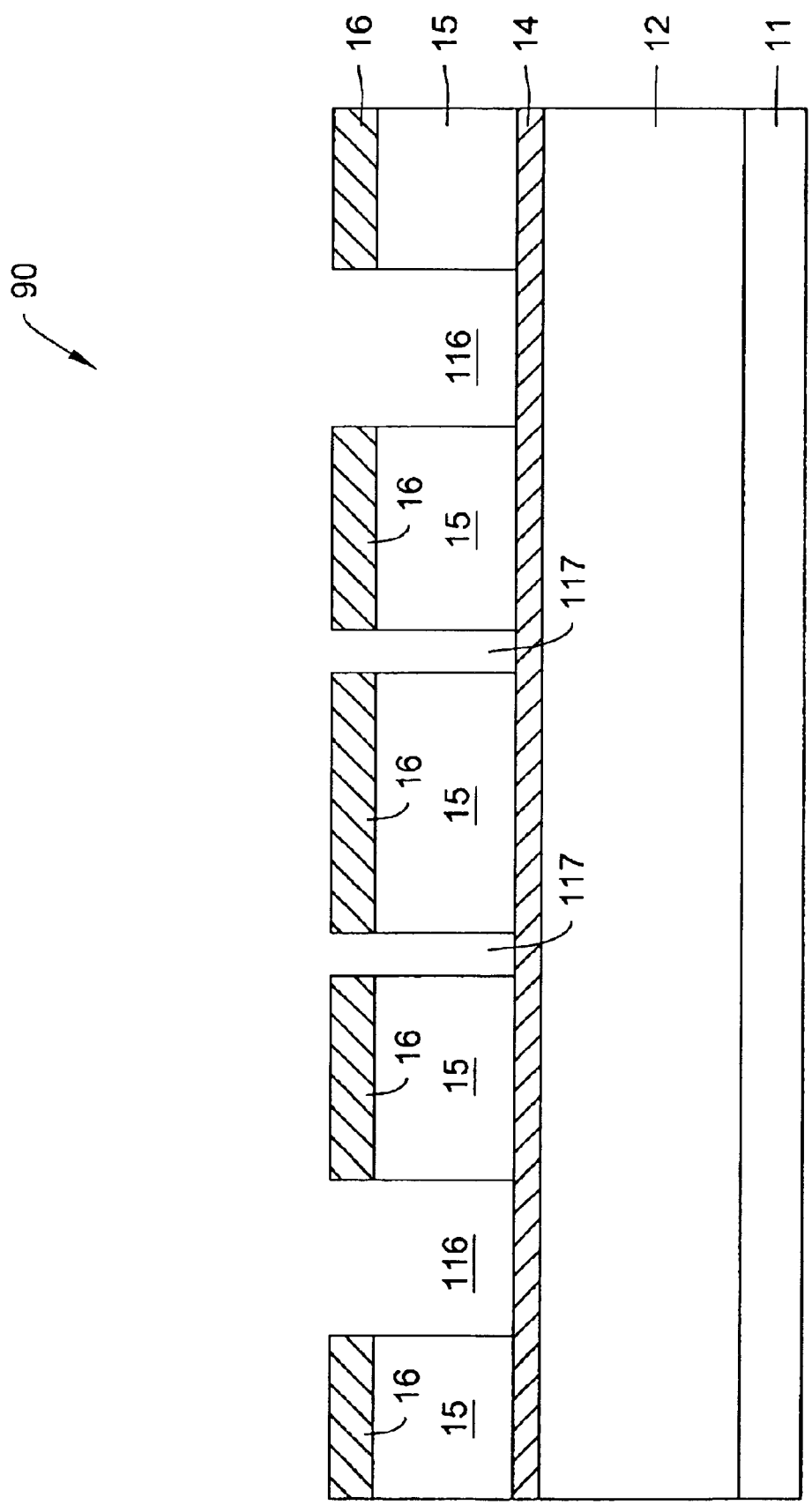

Another process may make a waffle pattern for oxide etching and thick dielectric. FIG. 146 shows a structure 90 that may have a bottom mirror 12 formed on a substrate 11, an active region or layer 14 formed on mirror 12, and a top mirror 15 formed on active layer 14. On the top surface of mirror 15, an oxide layer 16 of about one-half wavelength thickness may be PECVD deposited. On oxide layer 16, a mask 113 of photo resist material for etching a waffle trench spoke, with a torus and waffle patterns for oxide and isolation trench etching. Open area 114 may be for the isolation trench and areas 115 may be for vertical trenches for oxidation purposes, as shown in FIG. 147. FIG. 148 shows an etching of oxide layer 16 down to the top surface of mirror 15 in areas 114 and 115. An ICP etch of mirror 15 in areas 114 and 115 may result in trenches 116 and 117, as shown in FIG. 149. This illustration of structure 90 may involve either isolation trench 116 or oxidation trenches 117, or both trenches 116 and 117. For purposes of this illustrative example, both trenches 116 and 117 are discussed. Trenches 116 and 117 may be etched with the bottom above or into active region 14. Trench 116 may be ring-like around the device. Trenches 117 may be vertical-like, square or round holes down into mirror 15. In FIG. 150, photo resist material 113 may be stripped.

Figure 151:
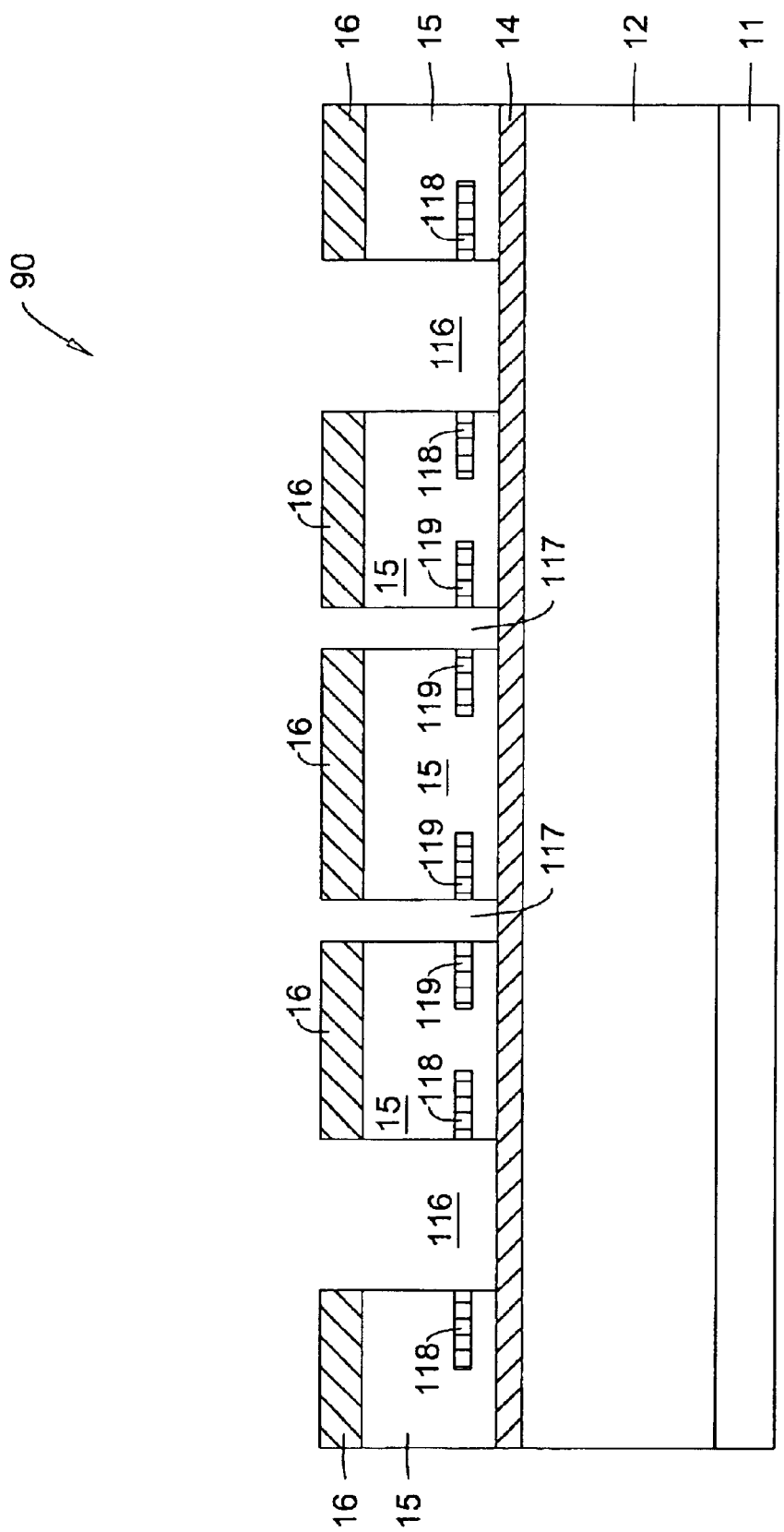
Figure 152:
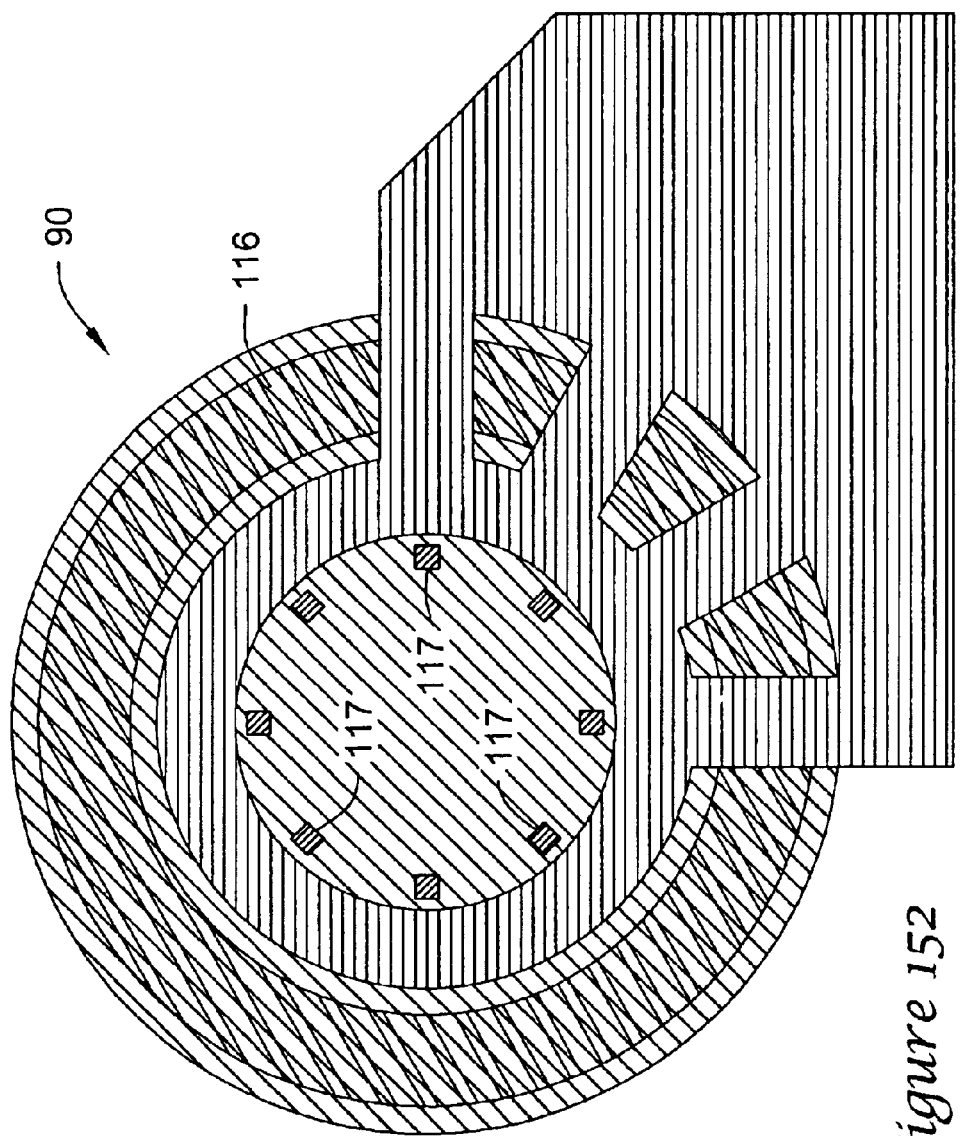

Structure 90 may be immersed in a very humid and hot environment sufficient to result in an appropriate amount of oxidation of at least one oxidizable layer in mirror 15. The wet oxidation through trench 116 may result in oxidized layers 118 and oxidation through trenches 117 may result in oxidized layers 119, as shown in FIG. 151. FIG. 152 is a top view of structure 90 at a more advanced stage of fabrication than that in FIG. 151. However, FIG. 152 shows a number of vertical trenches 117 that may go down from the top of structure 90 into mirror 15 to enable oxidization of layers 119 with wet oxidation via these trenches 119. The two middle oxidized layers 119 may form the aperture for current confinement in the laser device.

Figure 153:
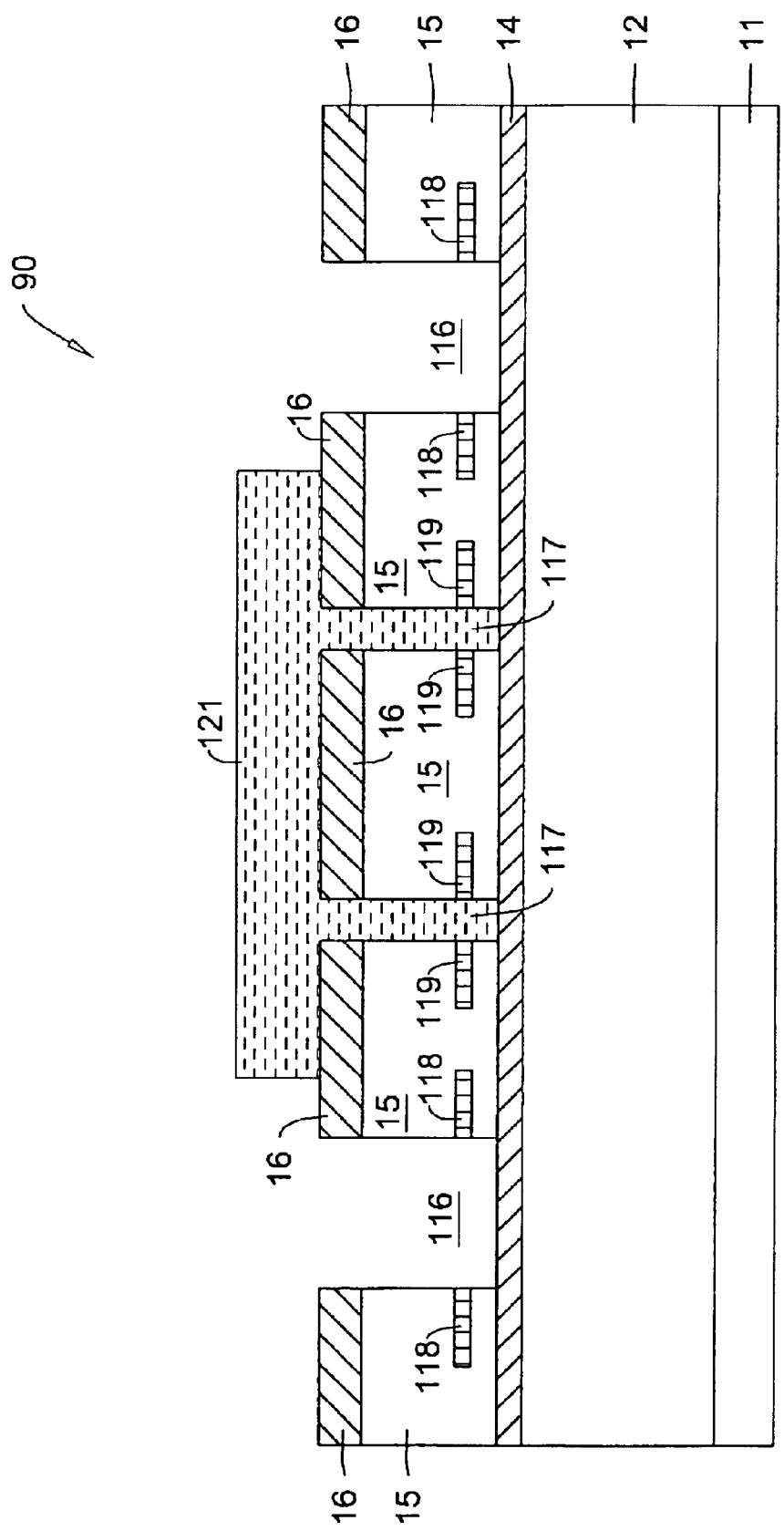
Figure 154:
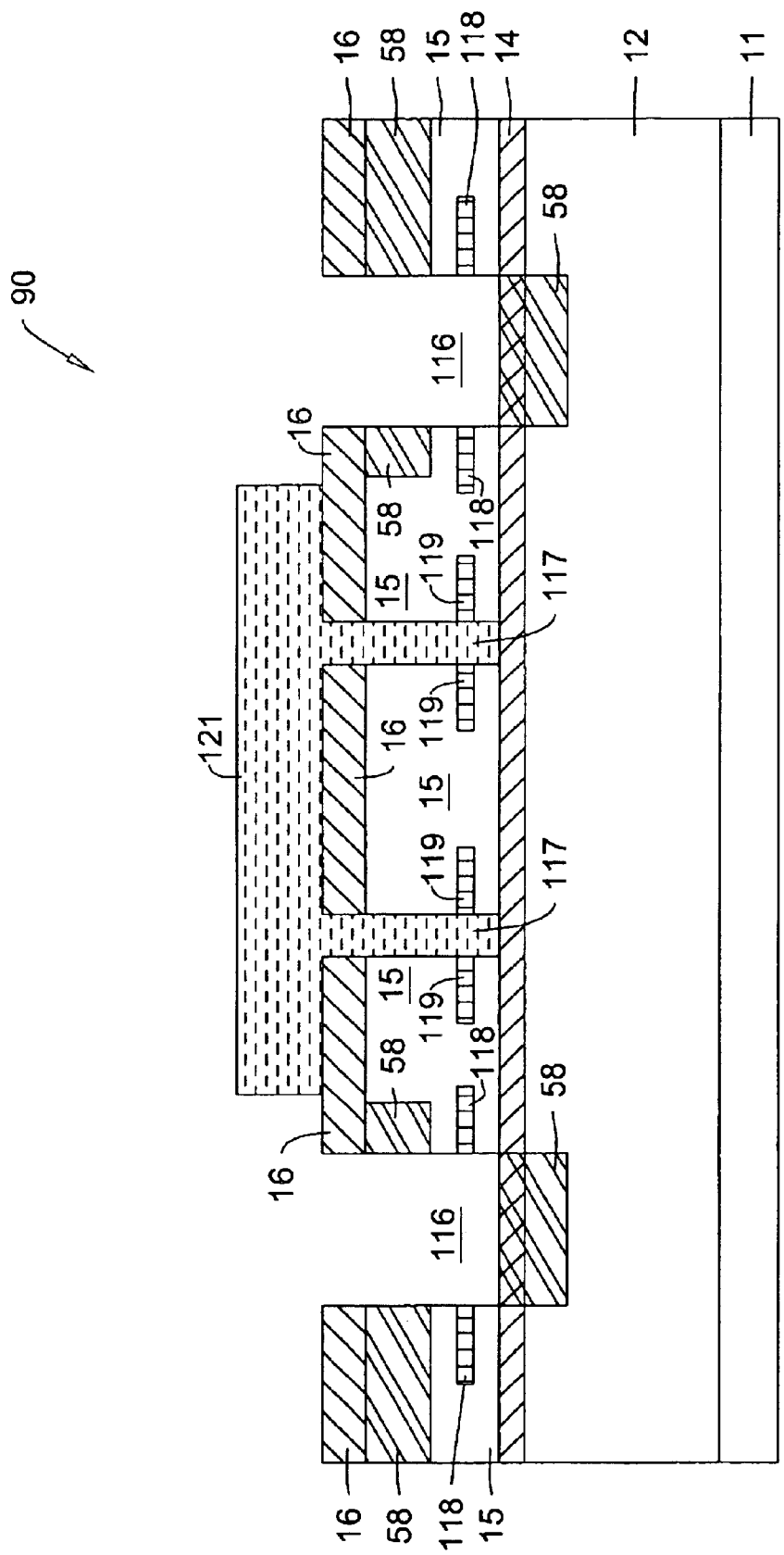
Figure 155:
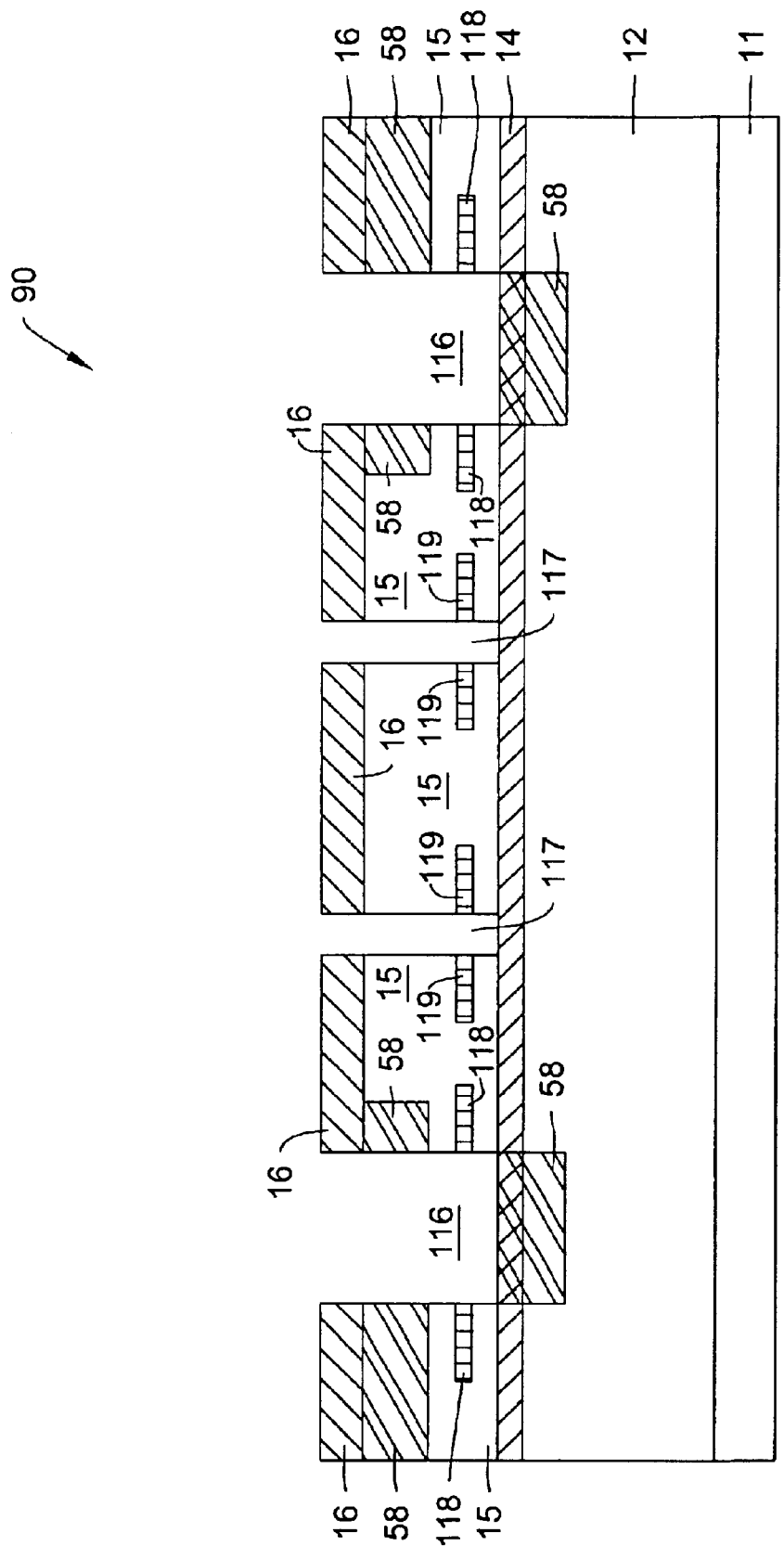

In FIG. 153, a mask 121 with a circular pattern may be formed on structure 90 over trenches 117 and portions of layer 16. Mask 121 may be made to reduce or prevent ion implantation going through it. An ion implant may be effected into structure 90 from the top resulting in implanted isolating regions 58 in second mirror 15 and first mirror 12, as in FIG. 154. Photo resist material 121 may be removed as in FIG. 155.

Figure 156:
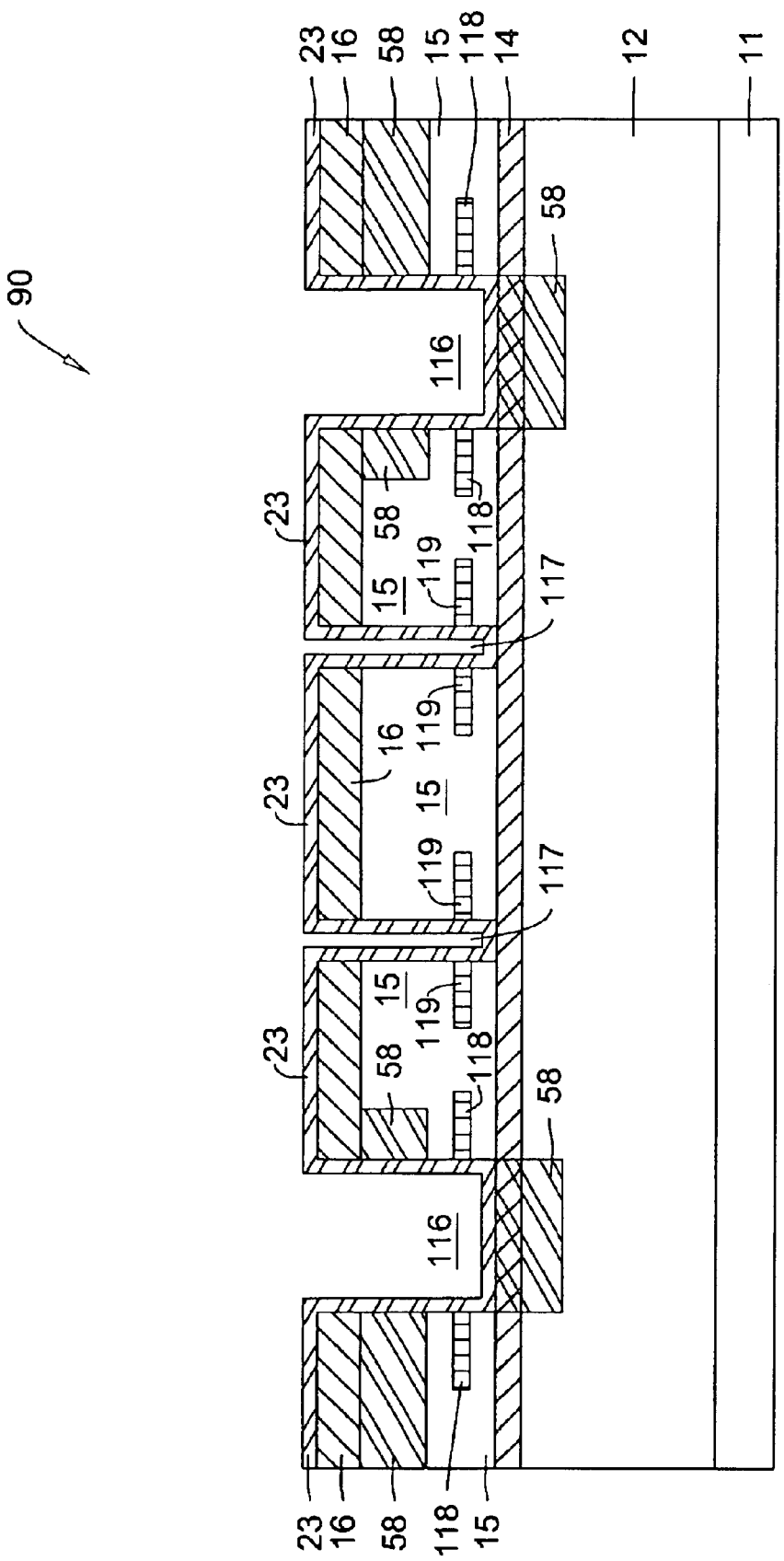
Figure 157:
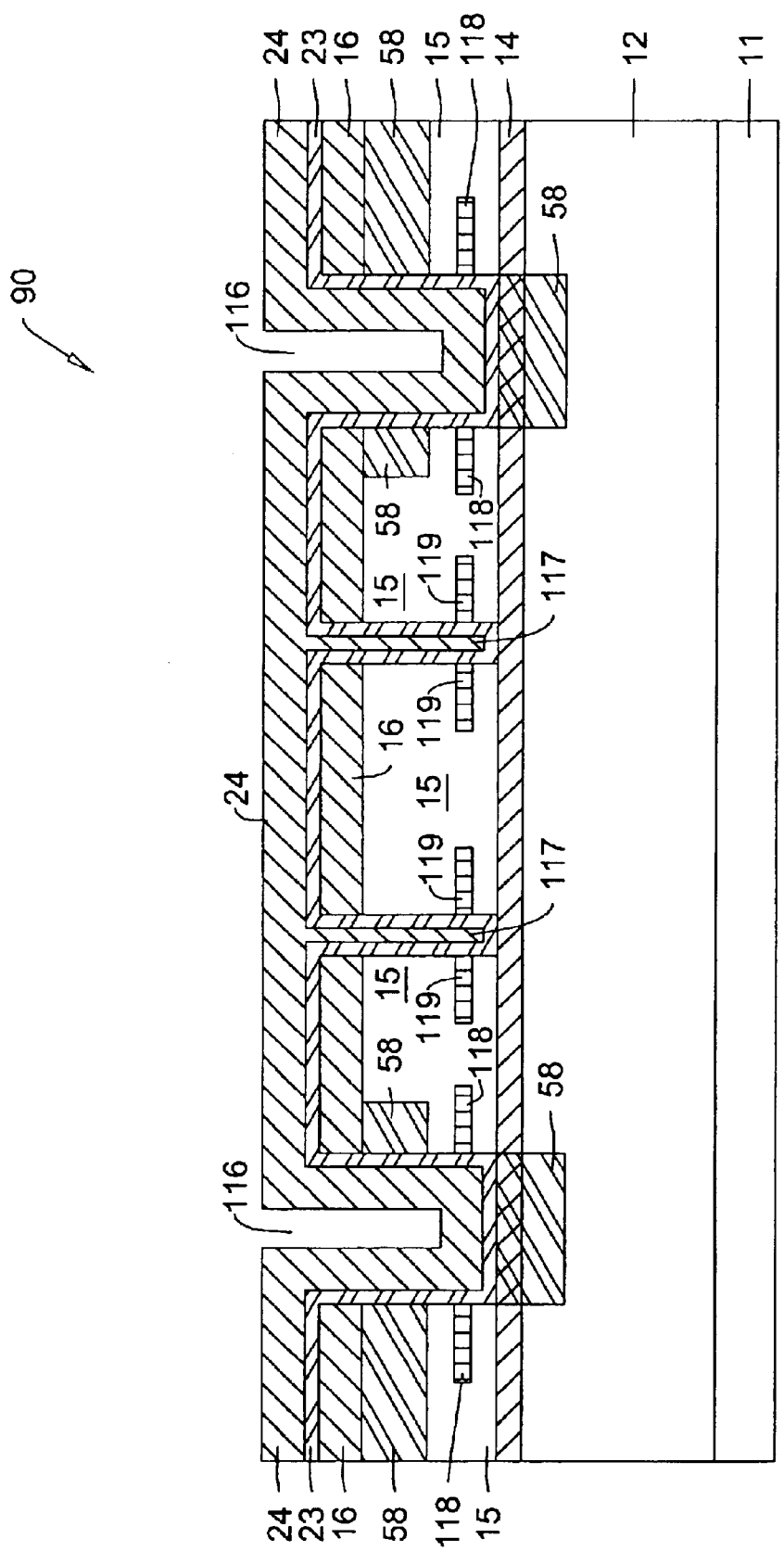

A layer 23 of nitride having a thickness of about 0.5 micron may be PECVD deposited on layer 16 and the surfaces of trenches 116 and 117, as illustrated in FIG. 156. On layer 23, an oxide layer 24 of about 1.0+ microns (i.e., thick dielectric) may be PECVD deposited on nitride layer 23, as in FIG. 157.

Figure 158:
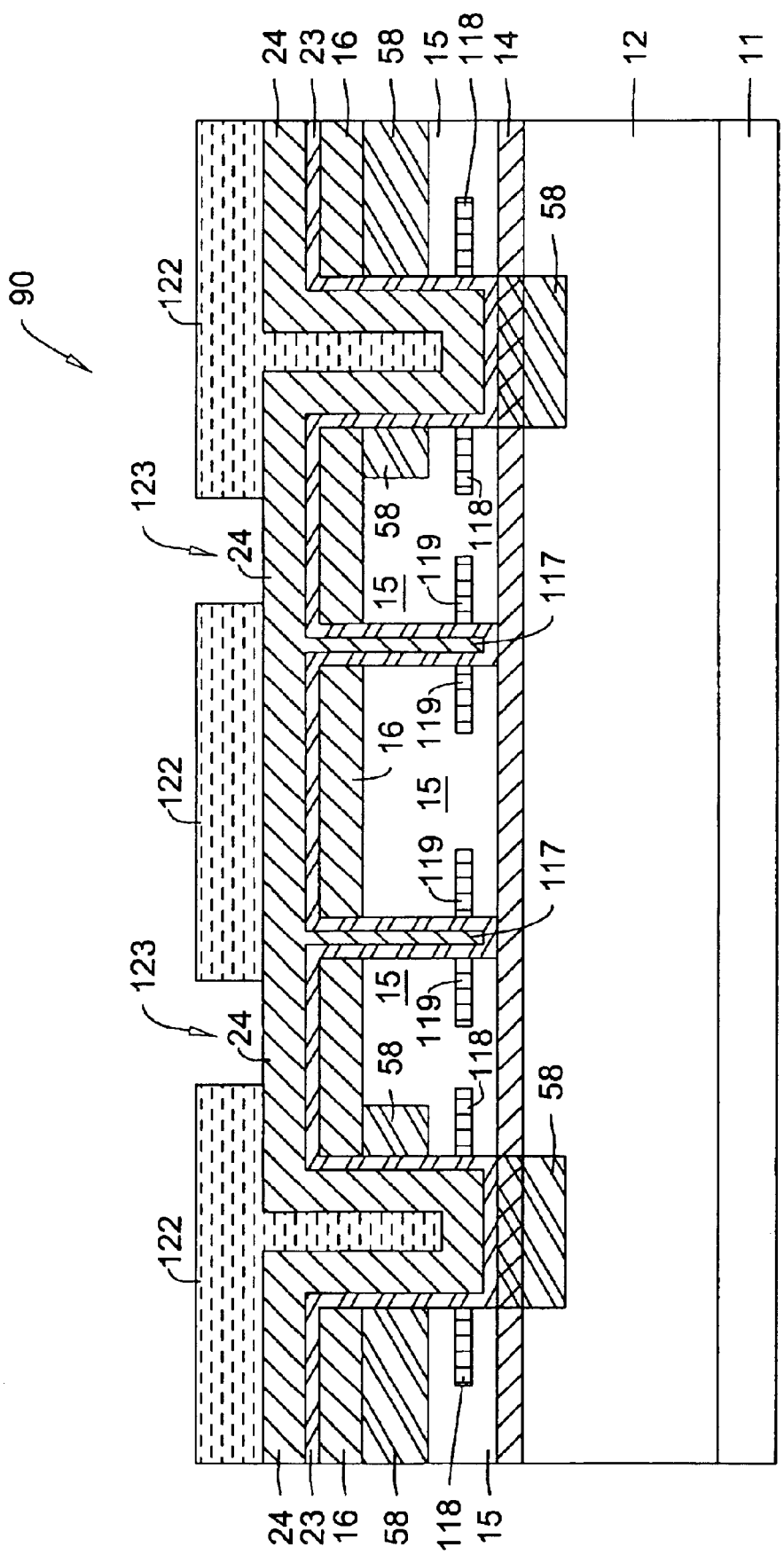
Figure 159:
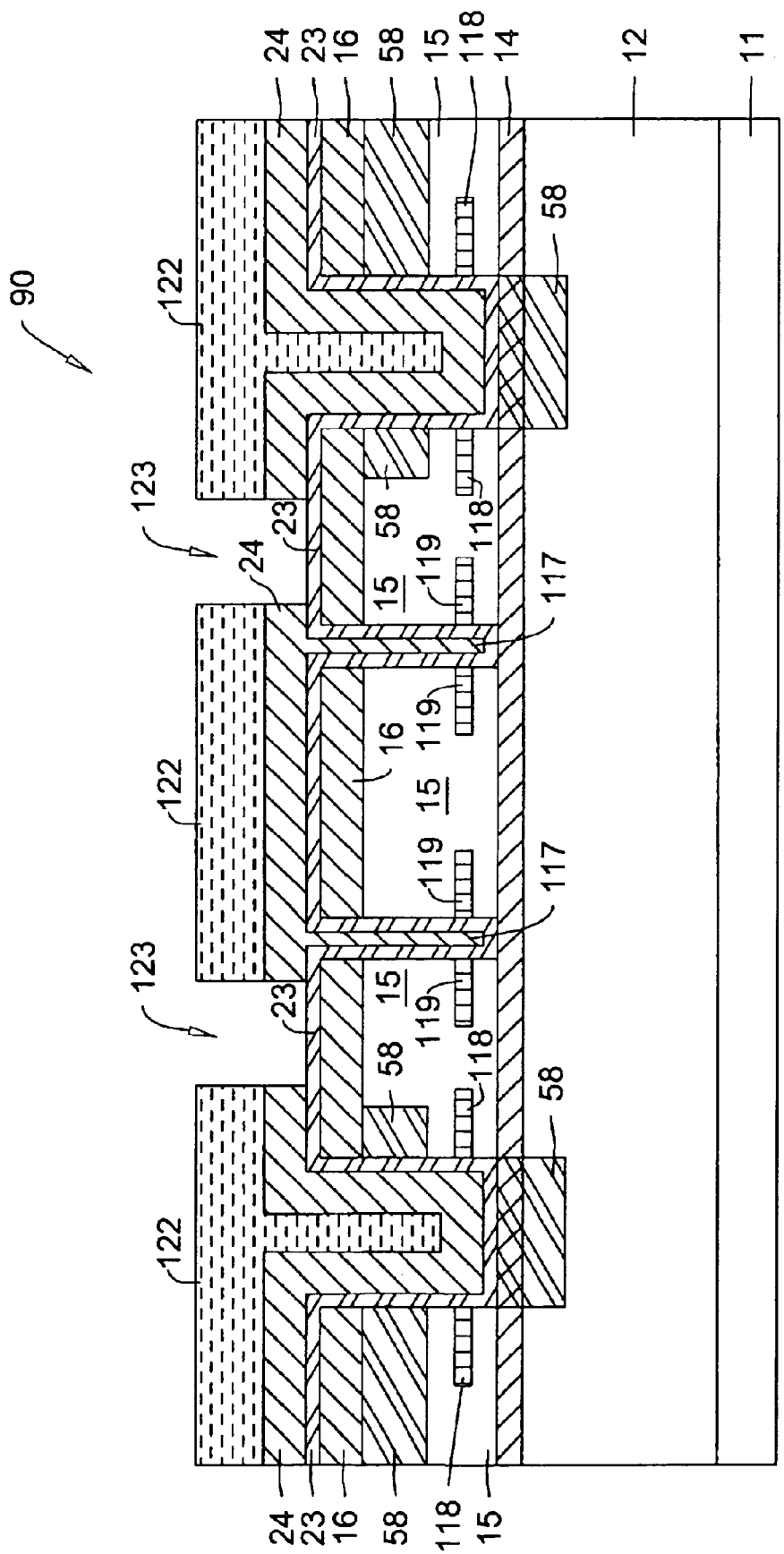
Figure 160:
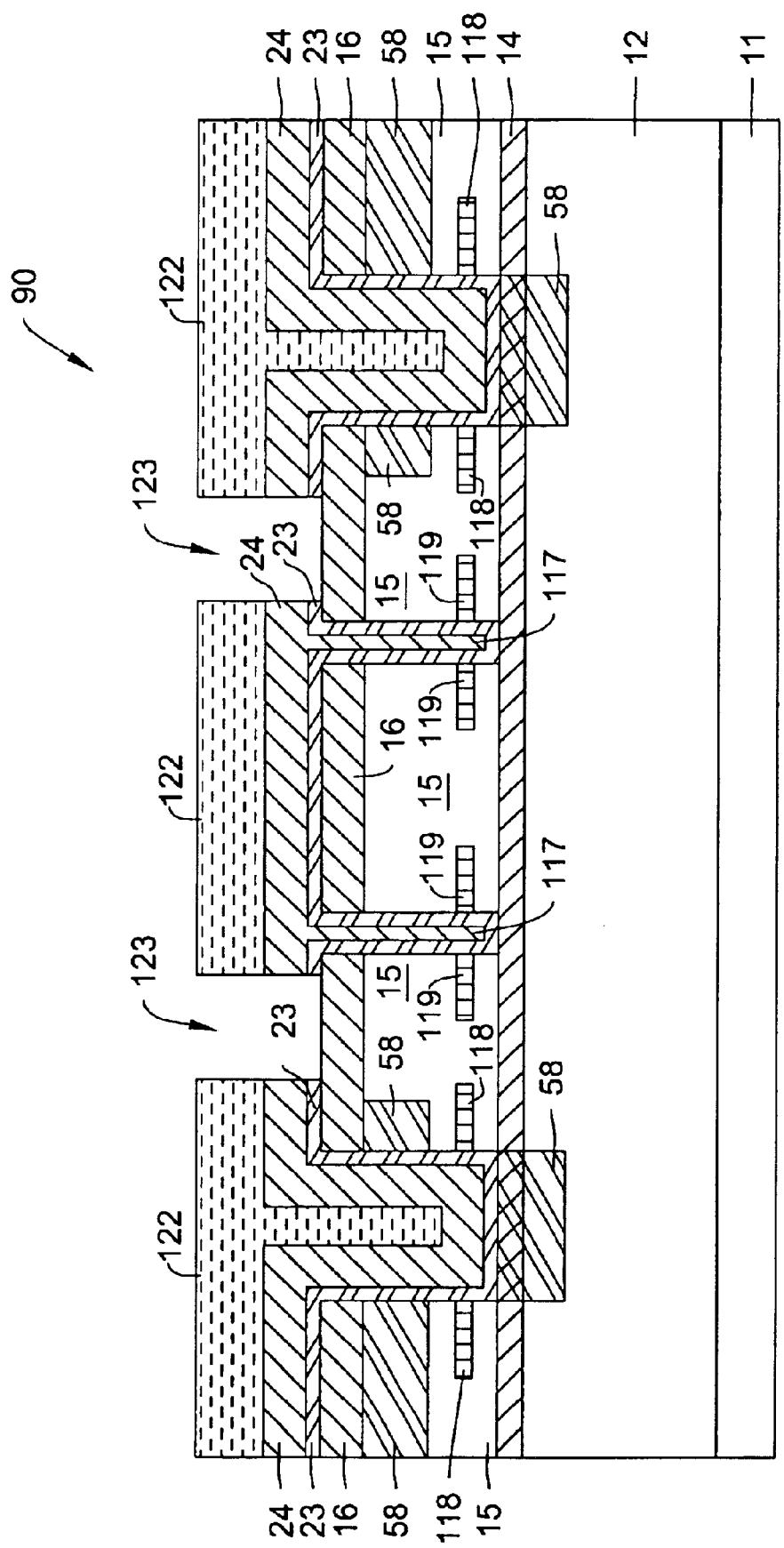
Figure 161:
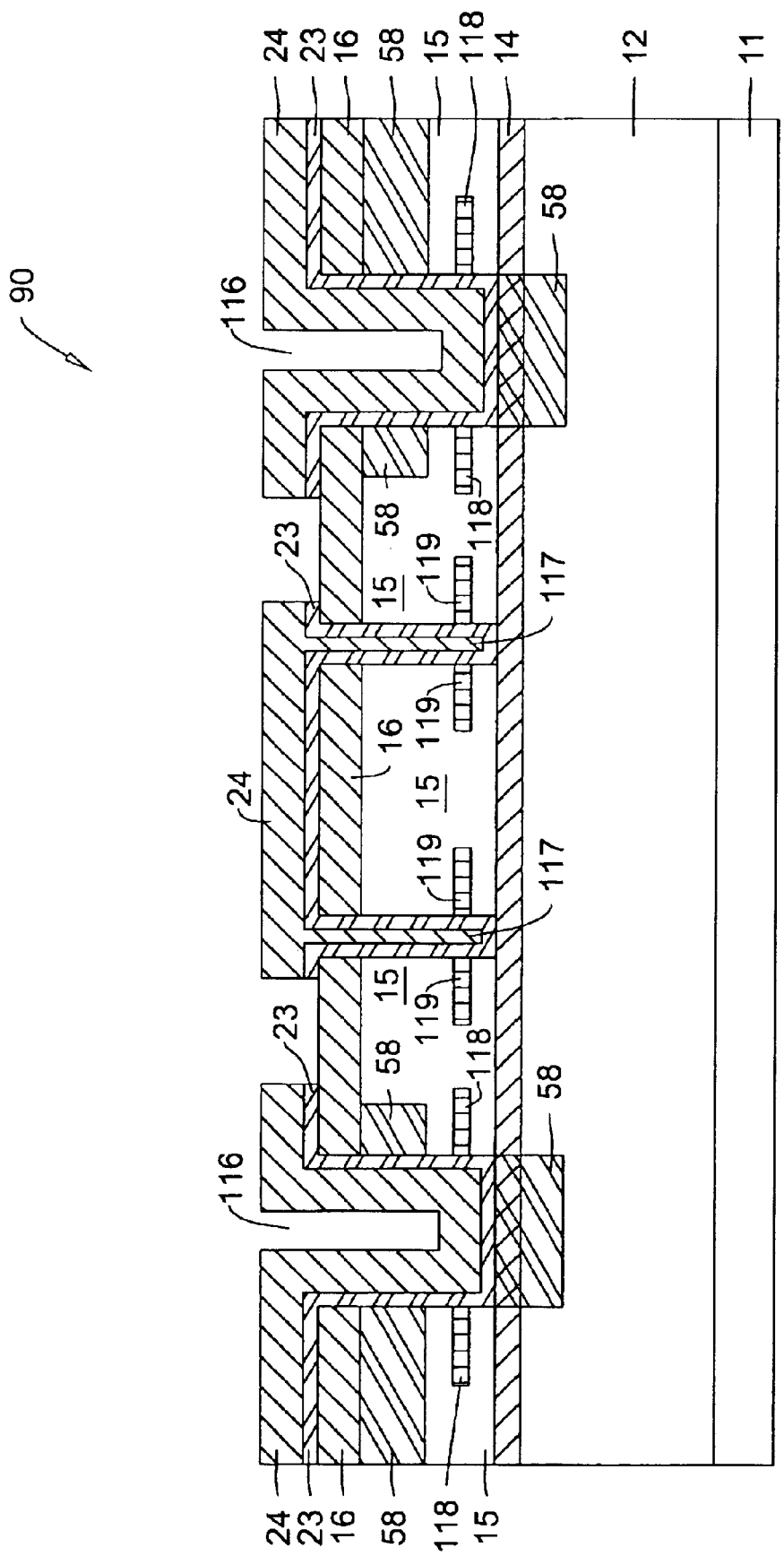
Figure 162:
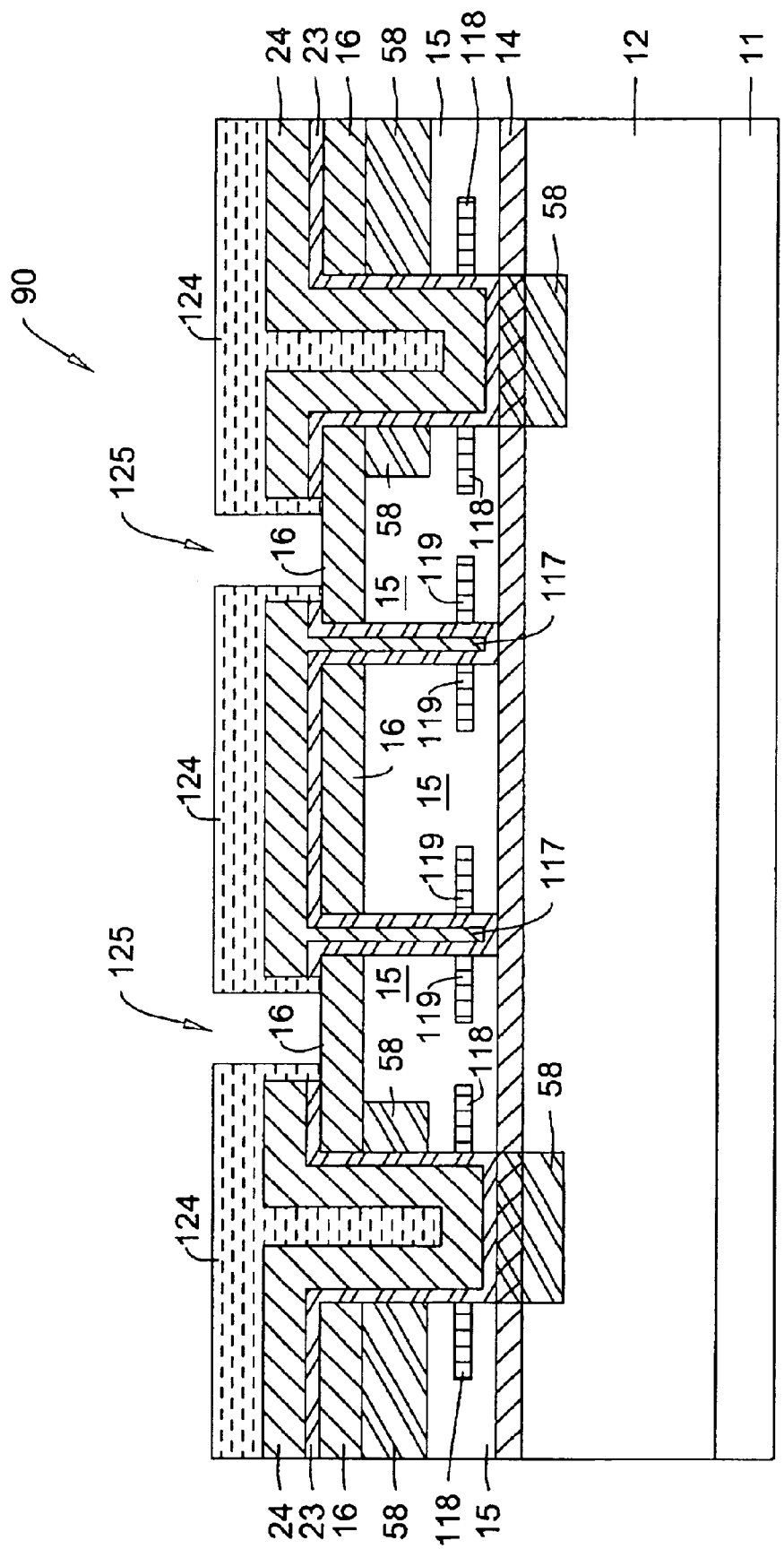
Figure 163:
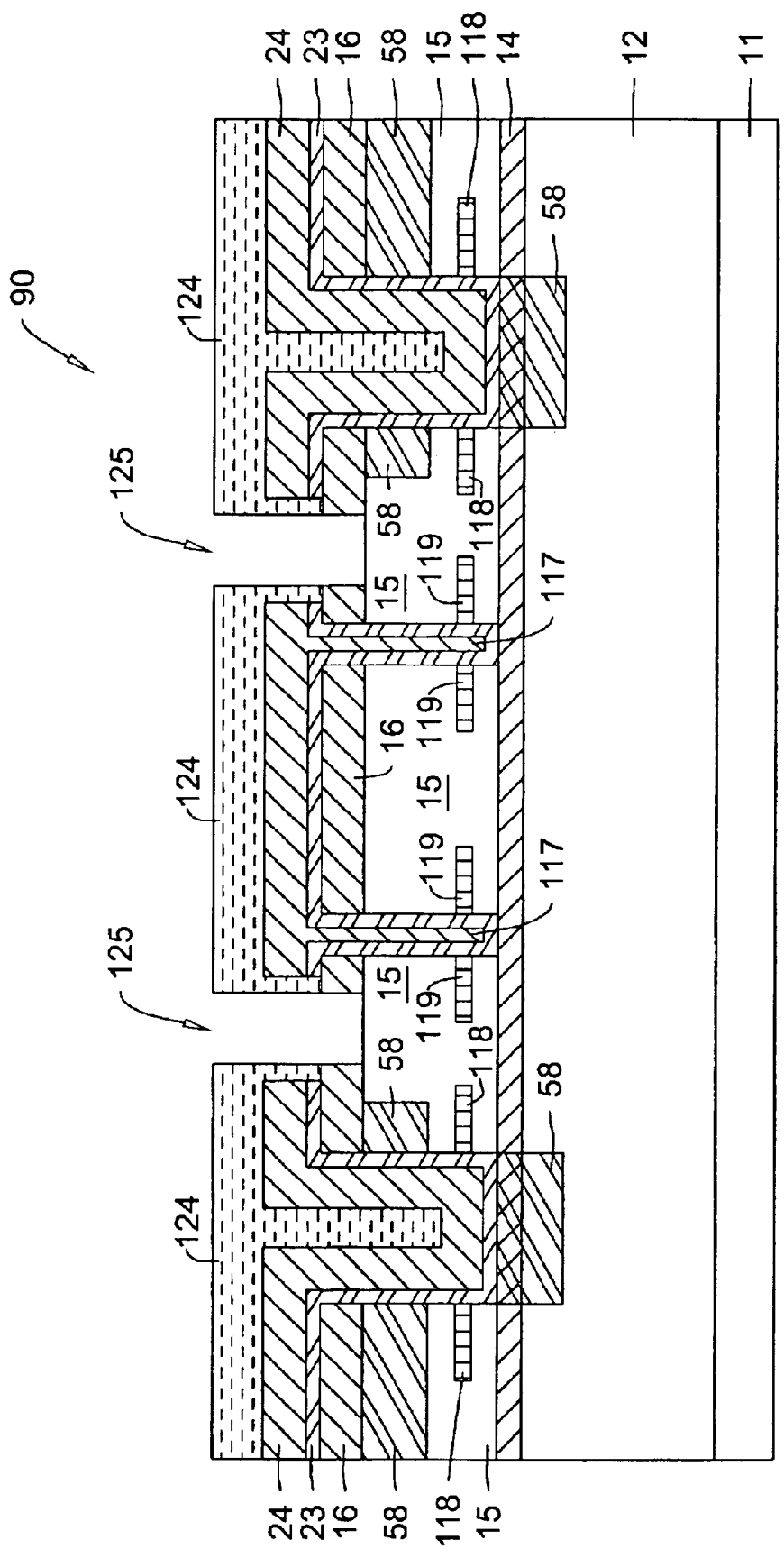
Figure 164:
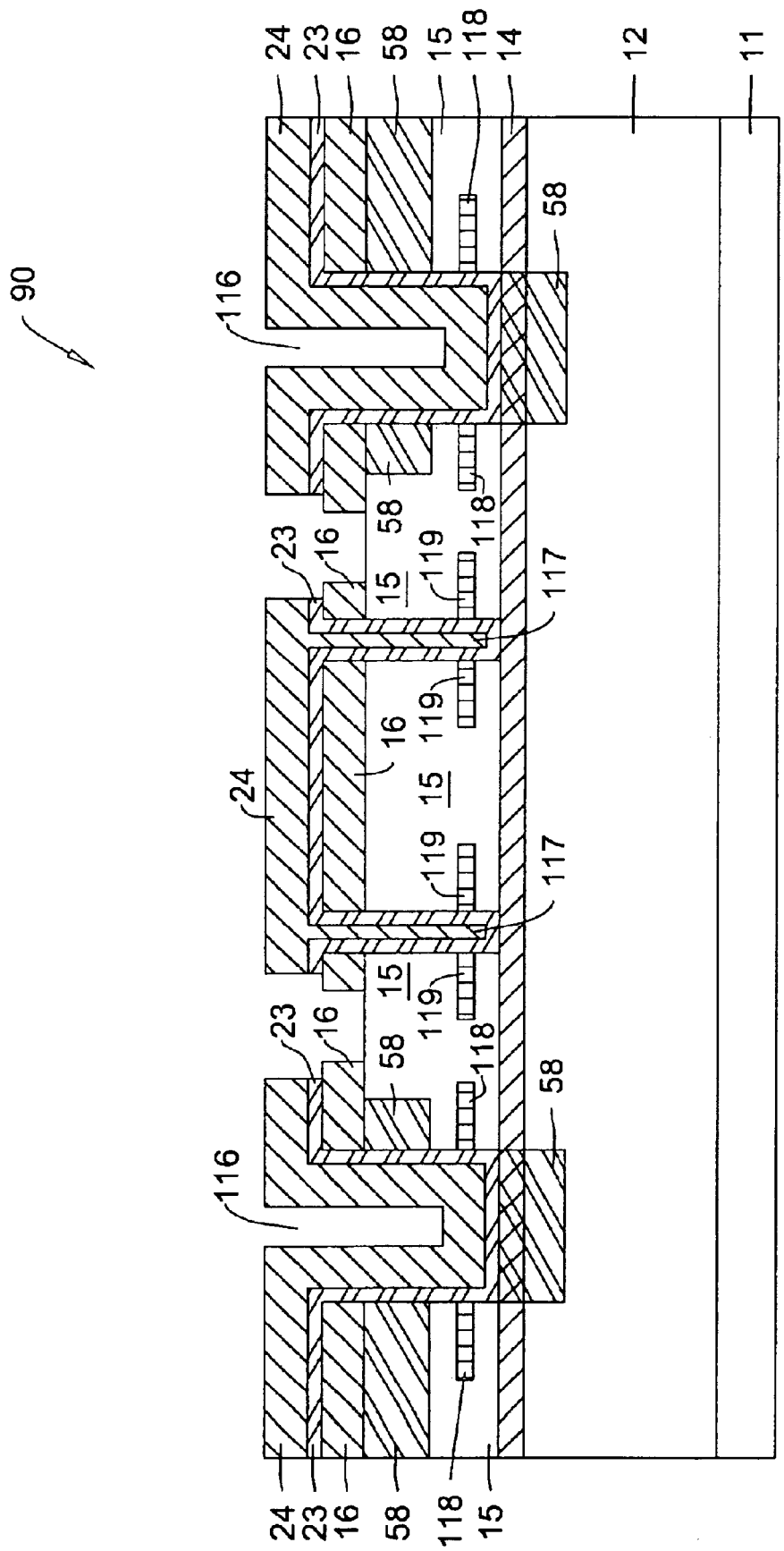

A photo resist 122 may be applied with a torus pattern similar to the isolation 58 diameter, smaller than the trench 116 diameter, and the inside pattern covering the aperture and trench 117 areas, with open area 123, as in FIG. 158. In FIG. 159, oxide layer 24 may be etched, and in FIG. 160, nitride layer 23 may be etched, through open area 123 of mask 122. Photo resist mask 122 may be stripped in FIG. 161. Another mask 124 to open an area 125 for a metal contact may be applied to structure 90, as in FIG. 162. In FIG. 163, oxide layer 16 may be etched down to the top surface of mirror 15 in open area 125 of mask 124. Photo resist layer 124 may be stripped as noted in FIG. 164.

Figure 165:
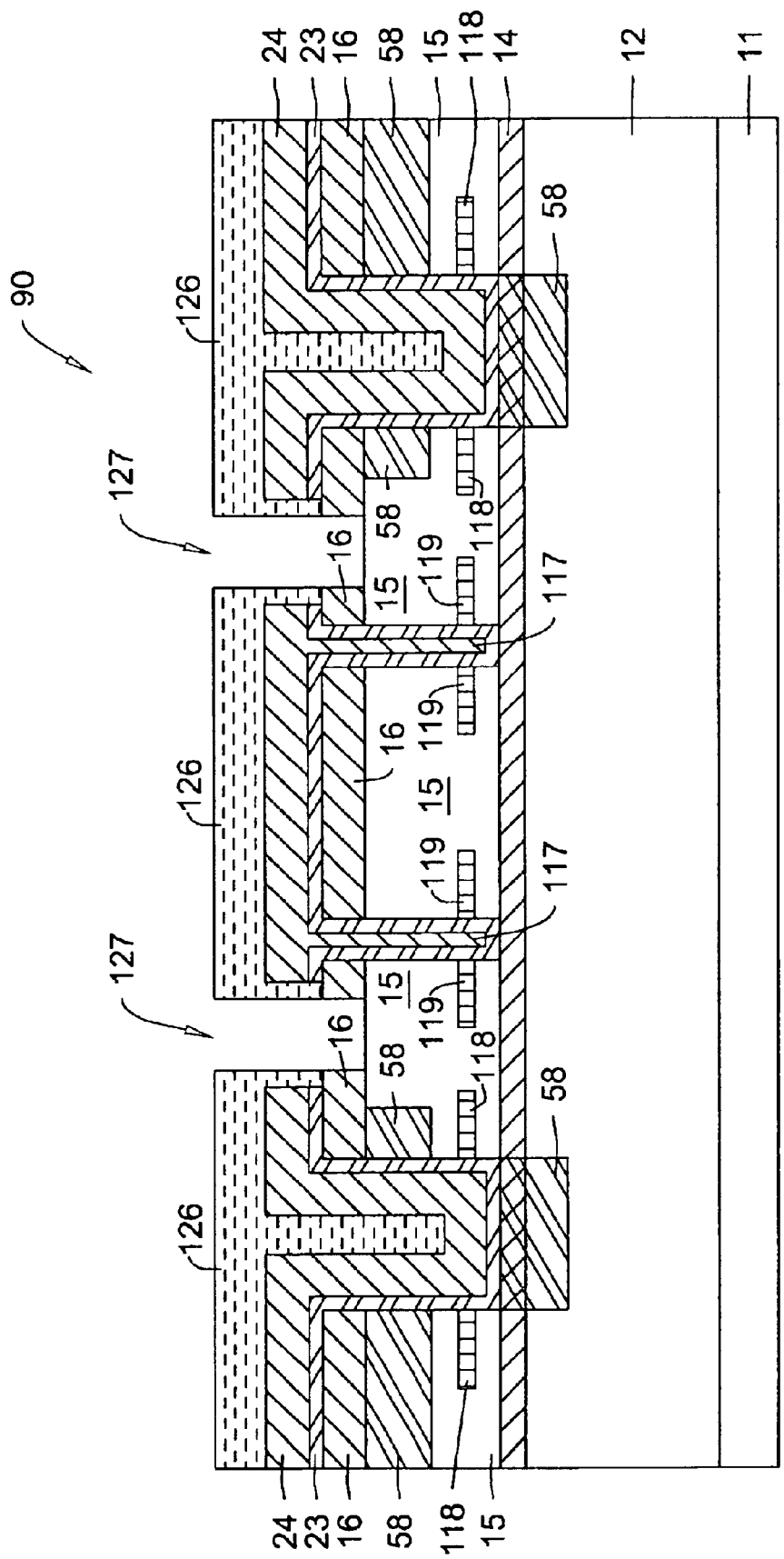
Figure 166:
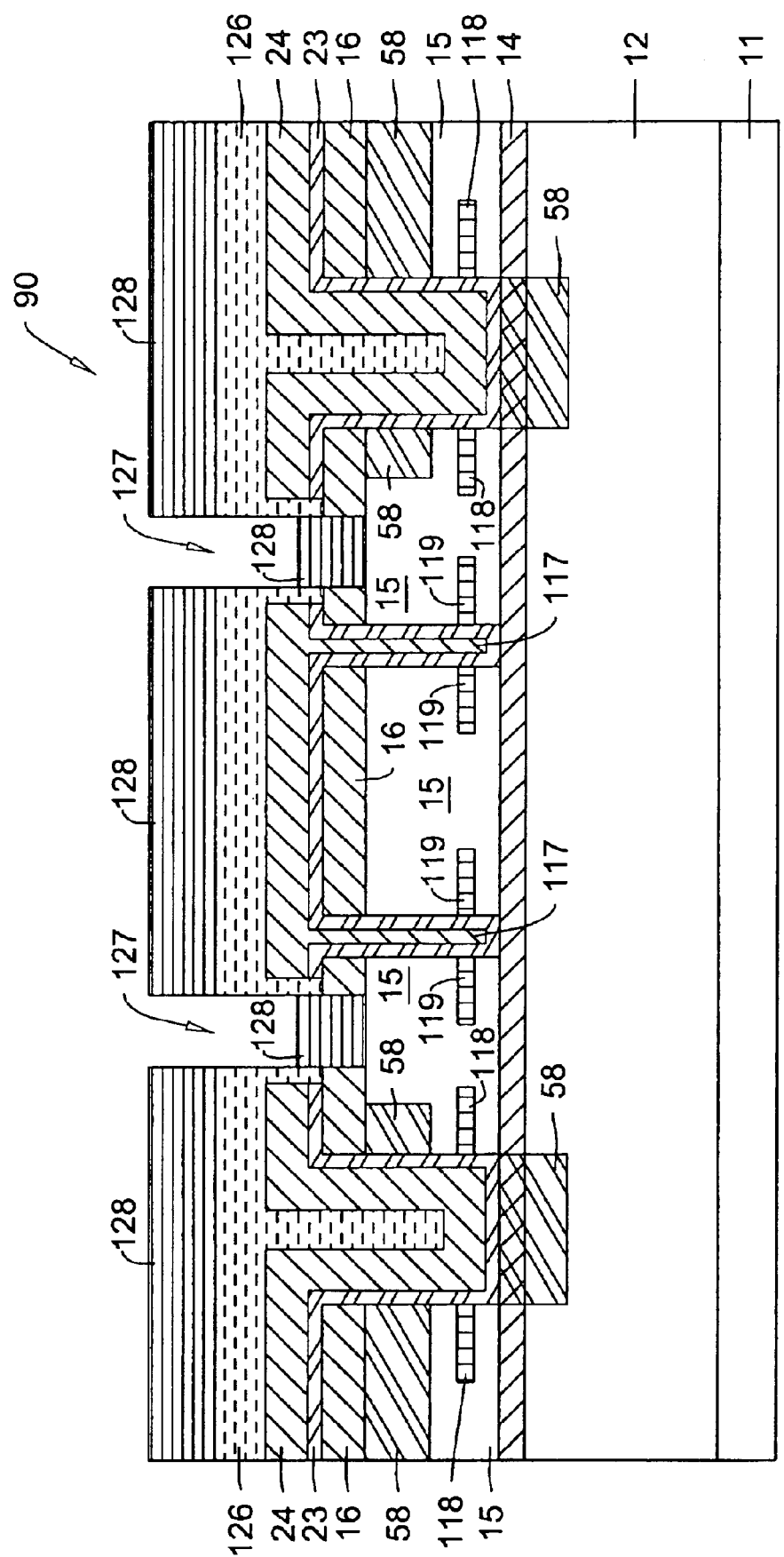
Figure 167:
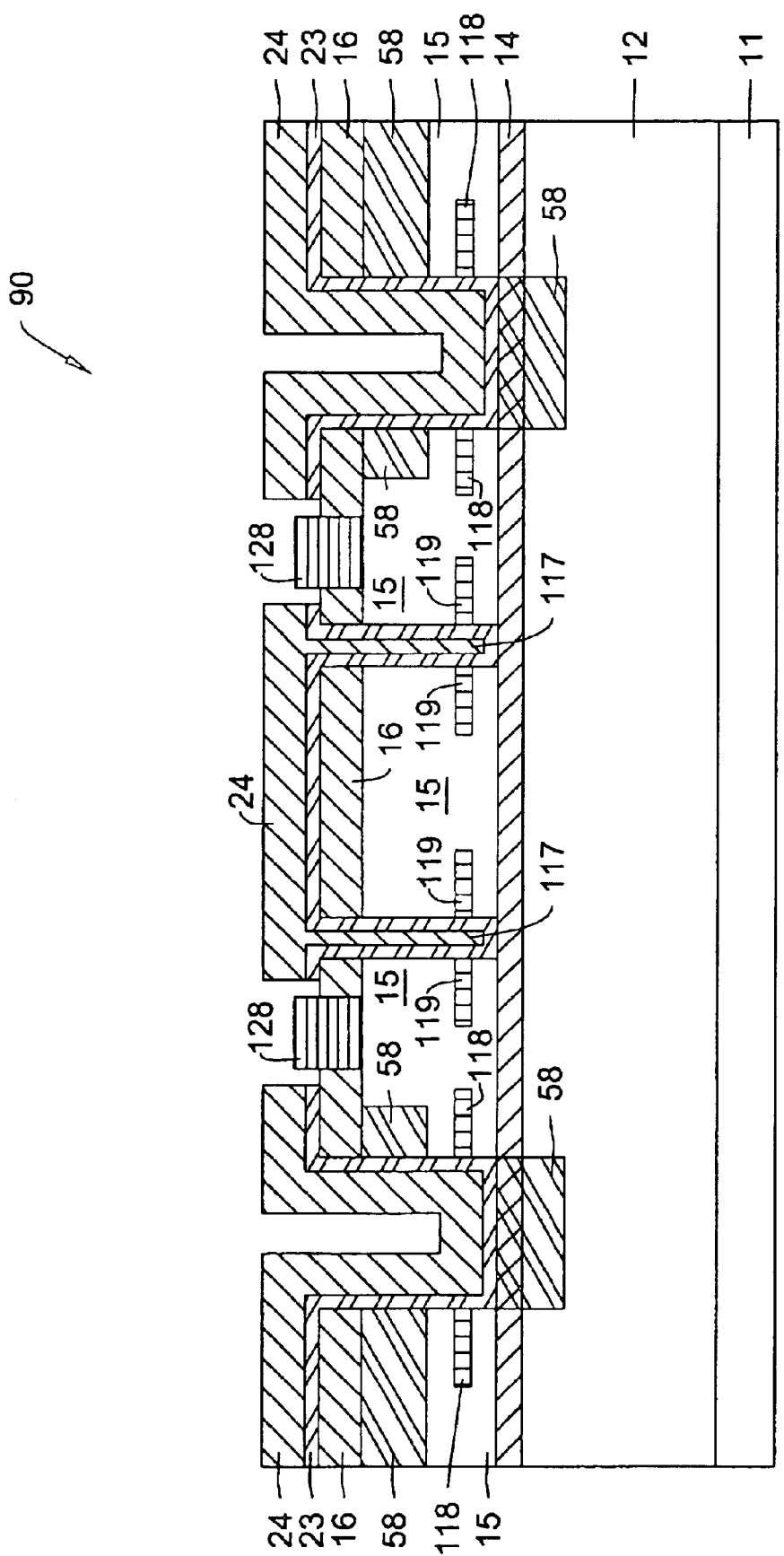
Figure 168:
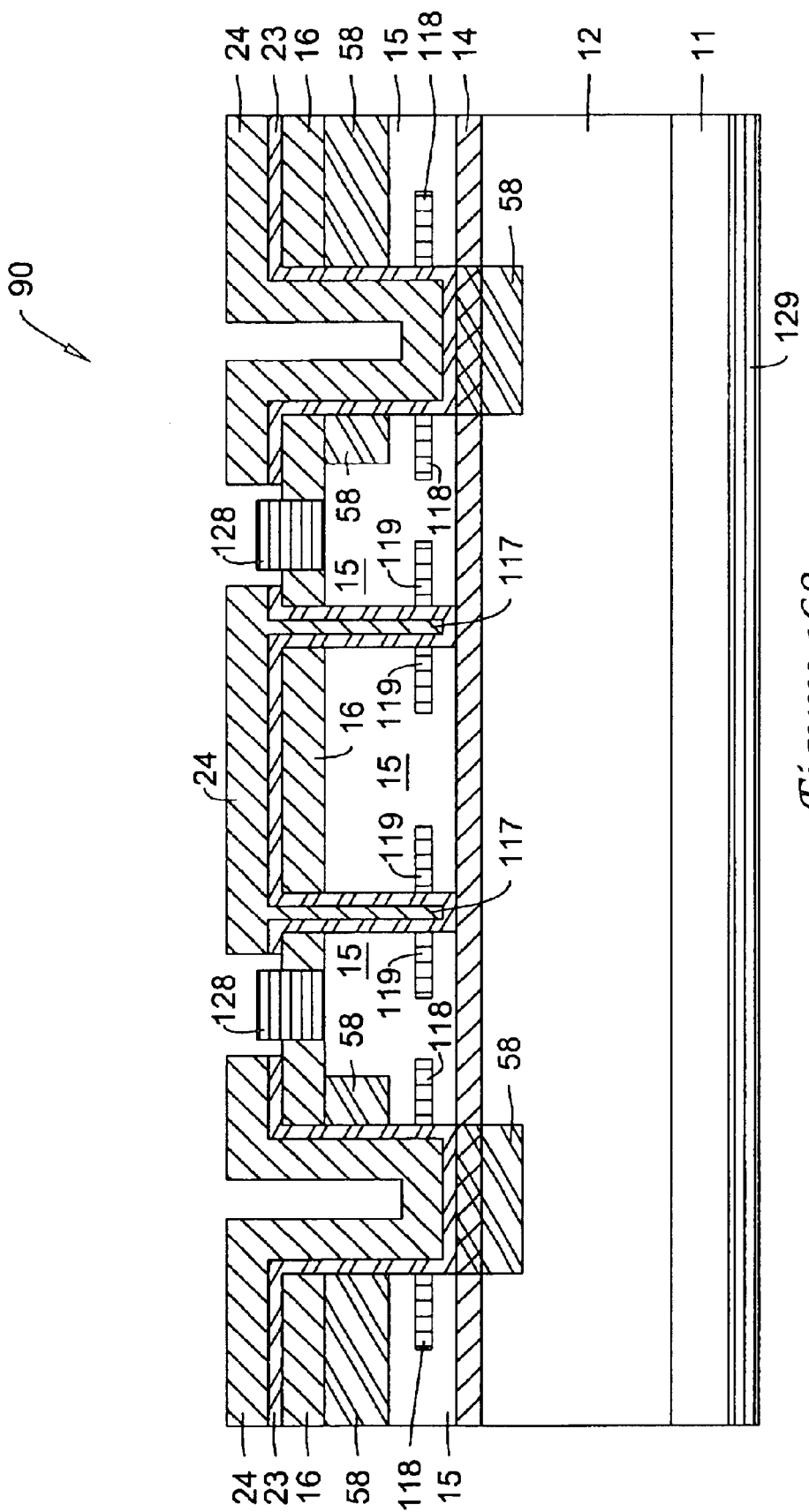

As shown in FIG. 165, a mask (LOR+PR) 126 with open area 127, for a full aperture and bond pad pattern, may be applied to structure 90. An Au/Ge alloy material 128 may be ebeam deposited to form an n-ohmic contact on the top surface of mirror 15, as illustrated in FIG. 166. Mask 127 may be stripped and a lift off of metal 128 on mask 127 may be effected with the result in FIG. 167. An n-ohmic contact 129 of an Au/Ge alloy may be ebeam deposited or sputtered on the backside of substrate 11, as illustrated in FIG. 168. The metal may be annealed (RTA). Further steps of fabrication may be similar to one or more steps of the processes disclosed in this description.

Figure 169:
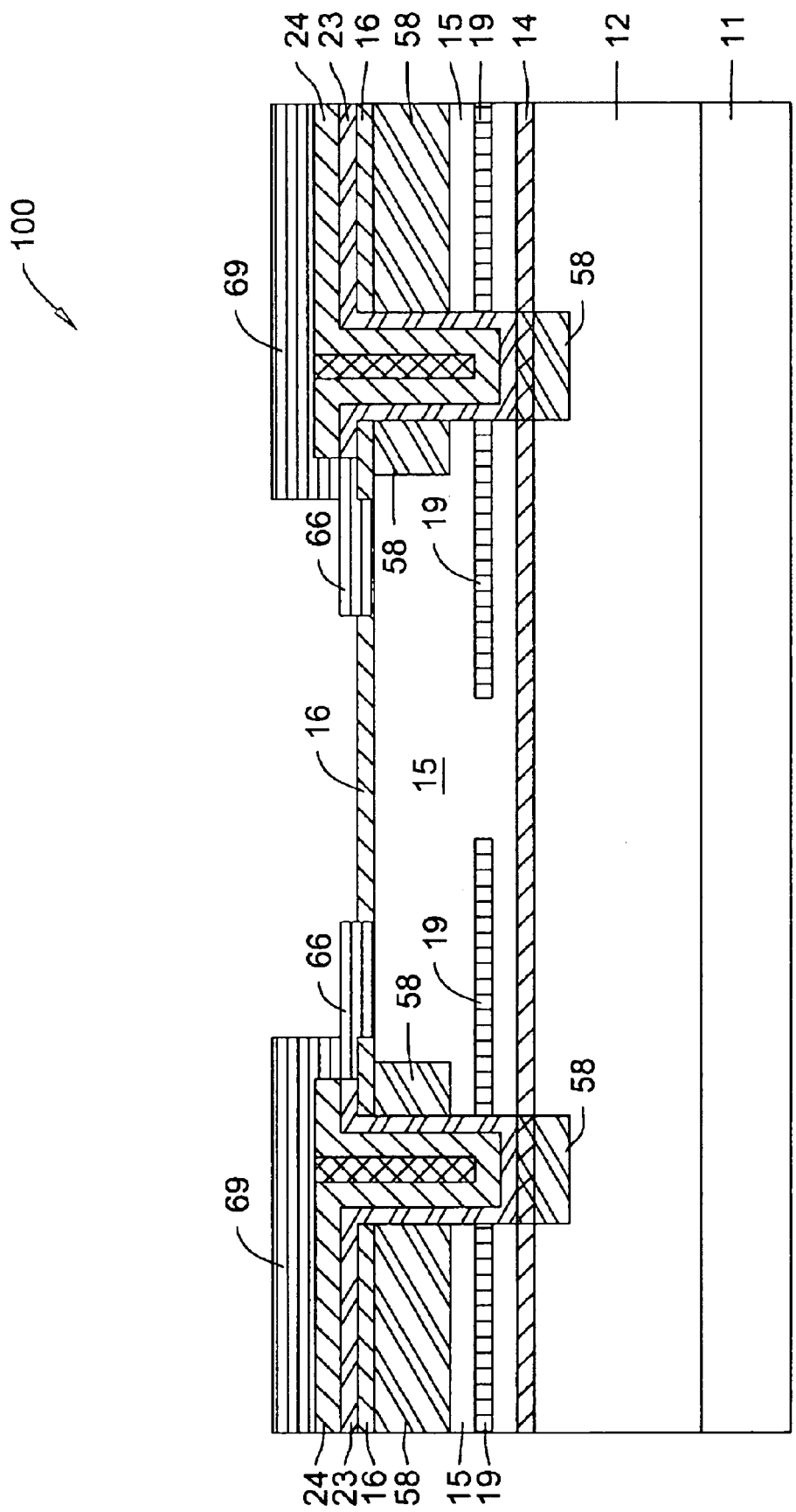
FIGS. 169–171 show a process for wafer thinning for a laser structure having a backside contact.
Figure 170:
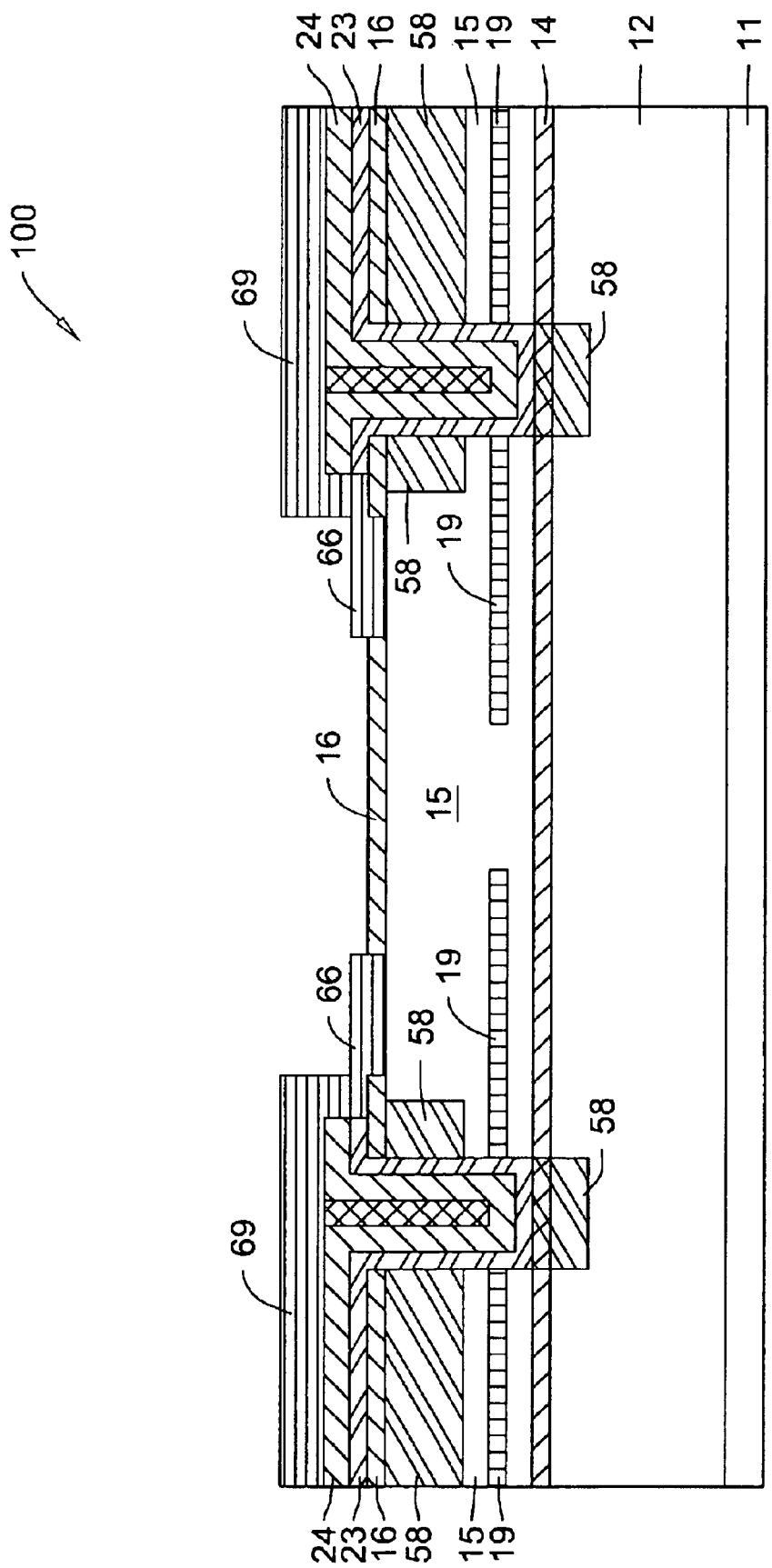
Figure 171:
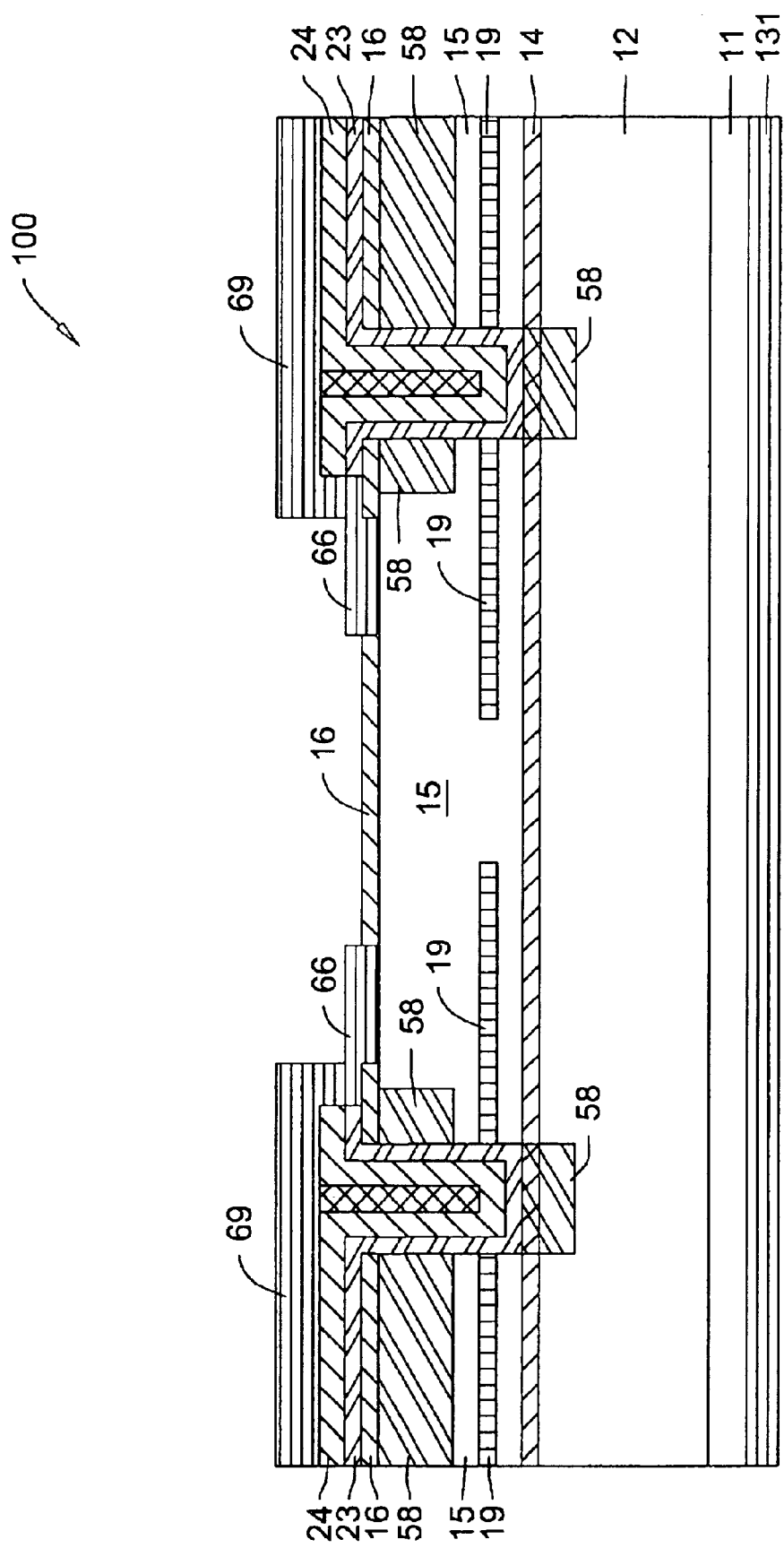
Figure 172:
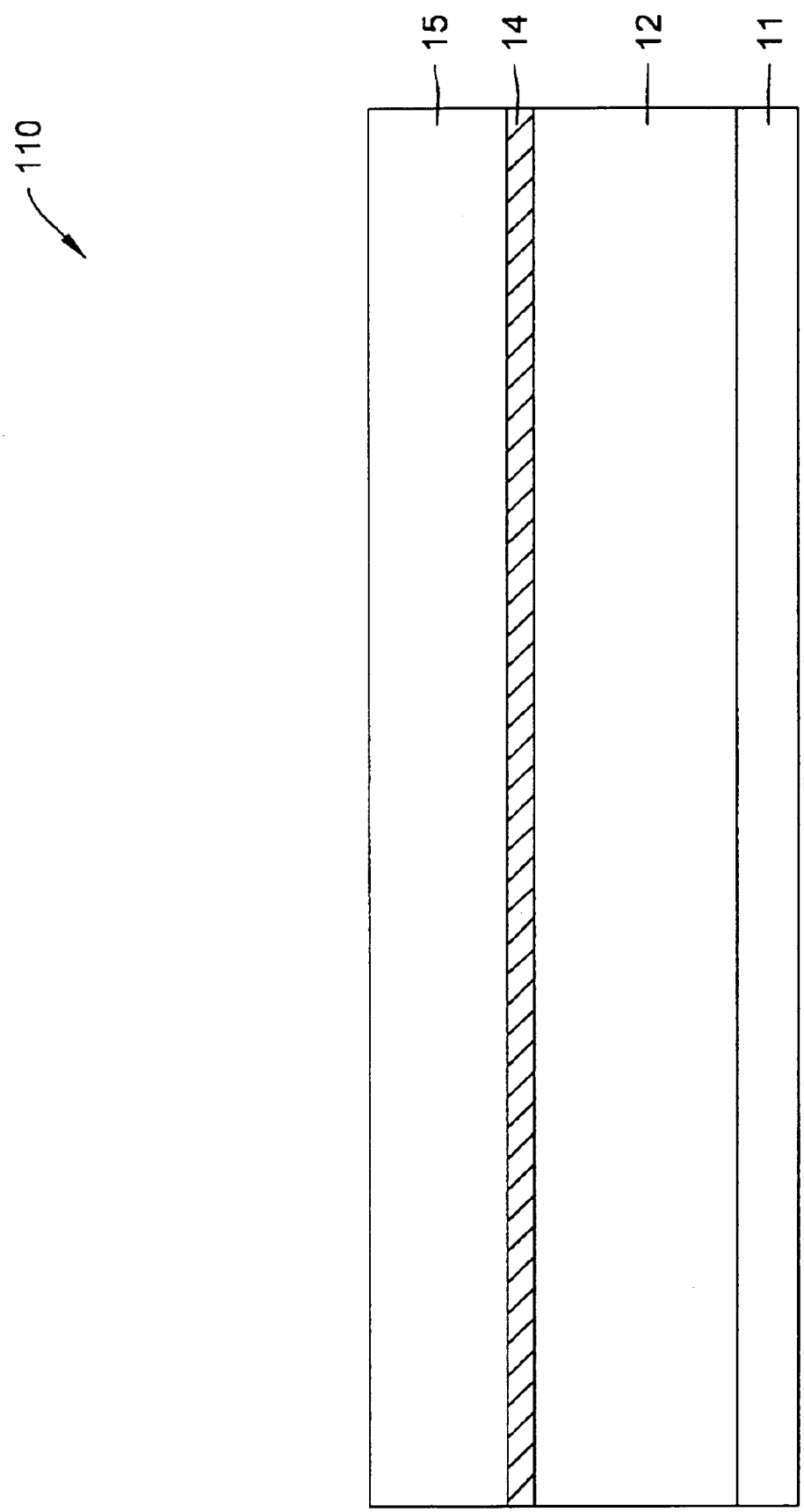

Another process that may be associated with one of the processes disclosed here, or another process, is wafer thinning. This process may be added to the end of the processing flows of this description with their backside n-ohmic and anneal steps removed. FIG. 169 shows a structure 100 that may be similar to structure 50 of FIG. 80, except that structure 100 may have a thicker substrate 11. Structure 100 may be mounted onto a lapping disk/carrier (not shown). In FIG. 170 structure 100 may be lapped ground/polished until the substrate 11 thickness is between 4 and 8 mils. Then an n-ohmic contact 131 may be formed on the backside of substrate 11 with an ebeam deposition of an Au/Ge alloy. Contact 131 may be (RTA) annealed.

Figure 173:
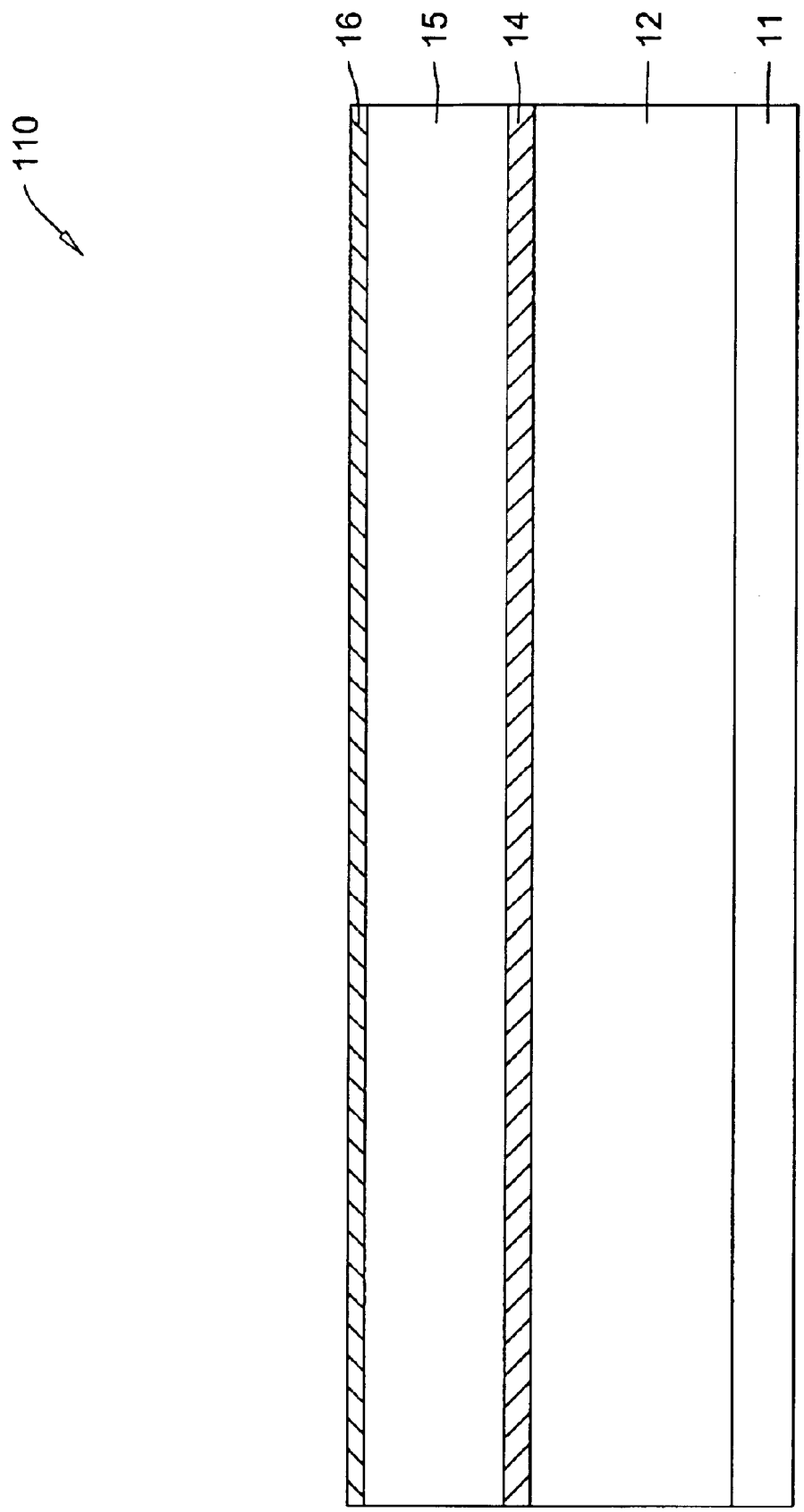
Figure 174:
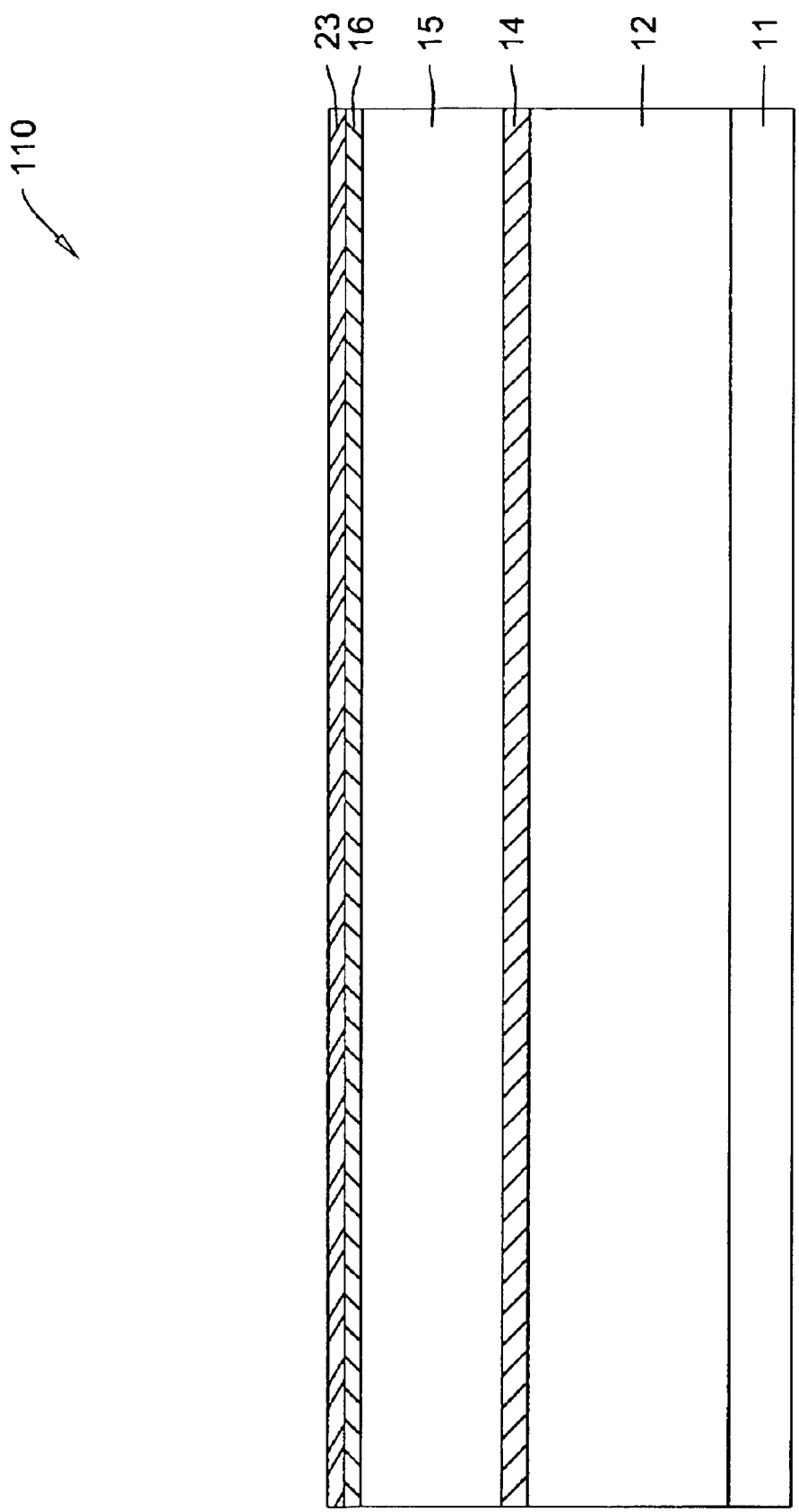
Figure 175:
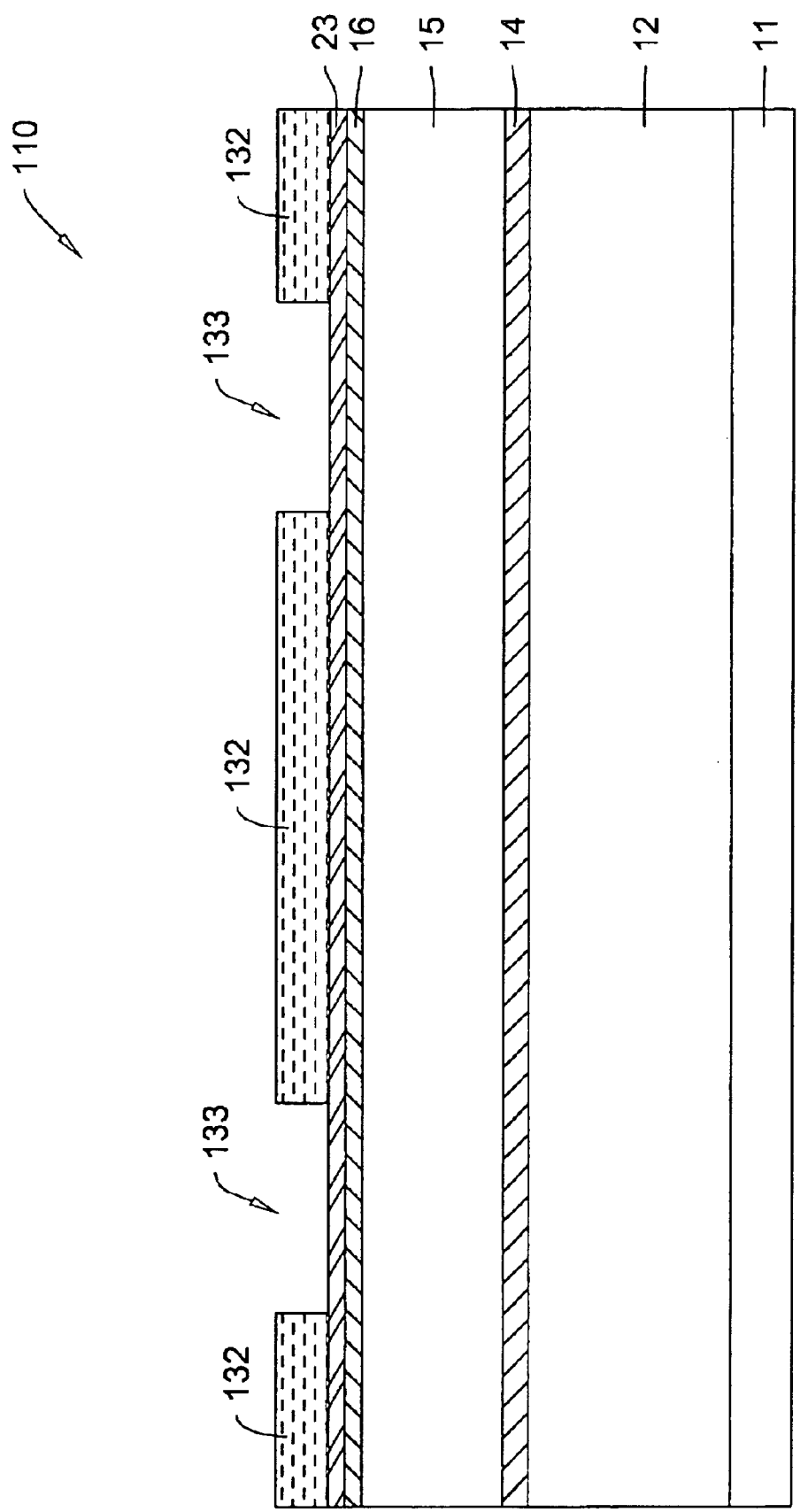
Figure 176:
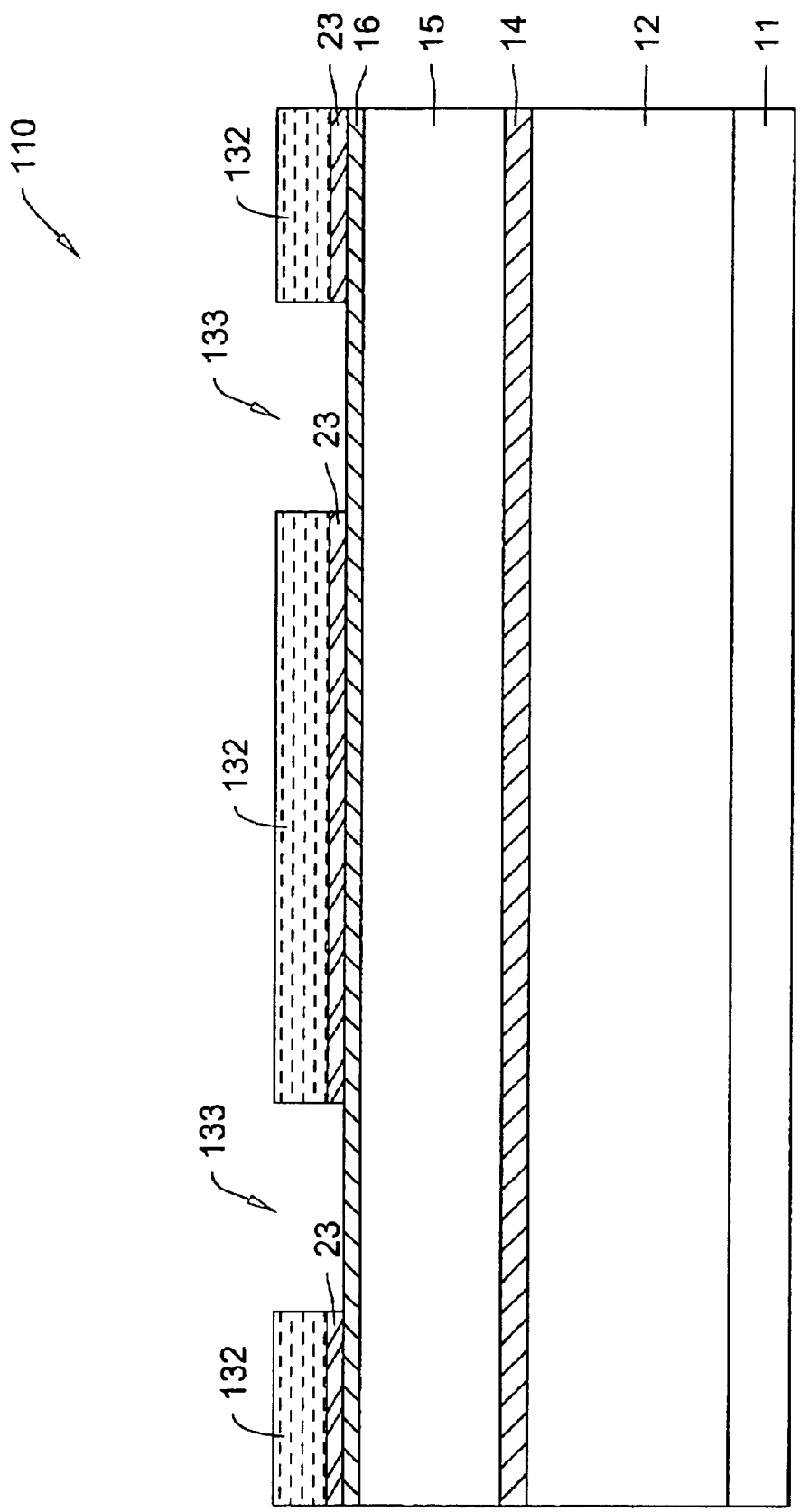
Figure 177:
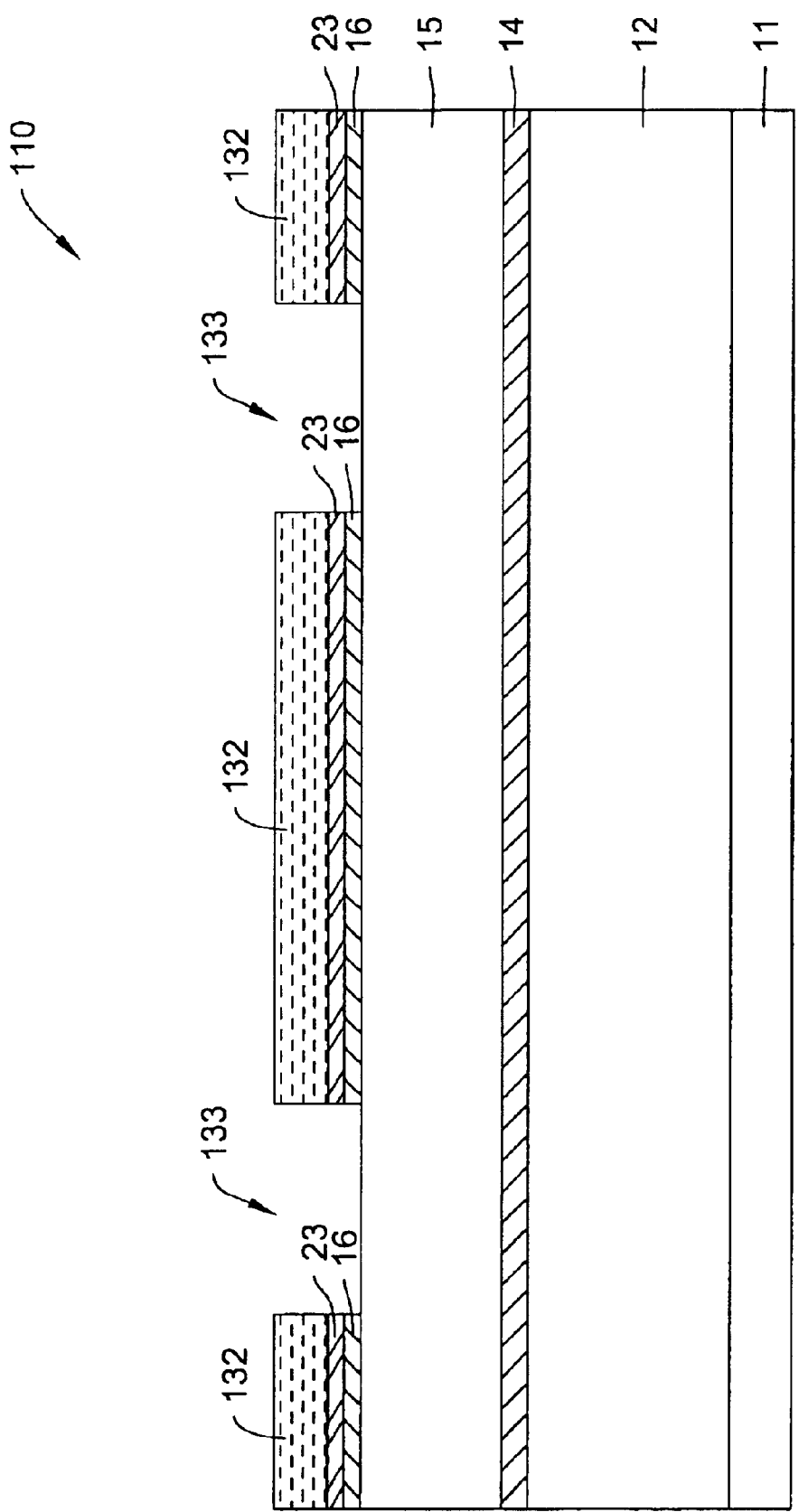
Figure 178:
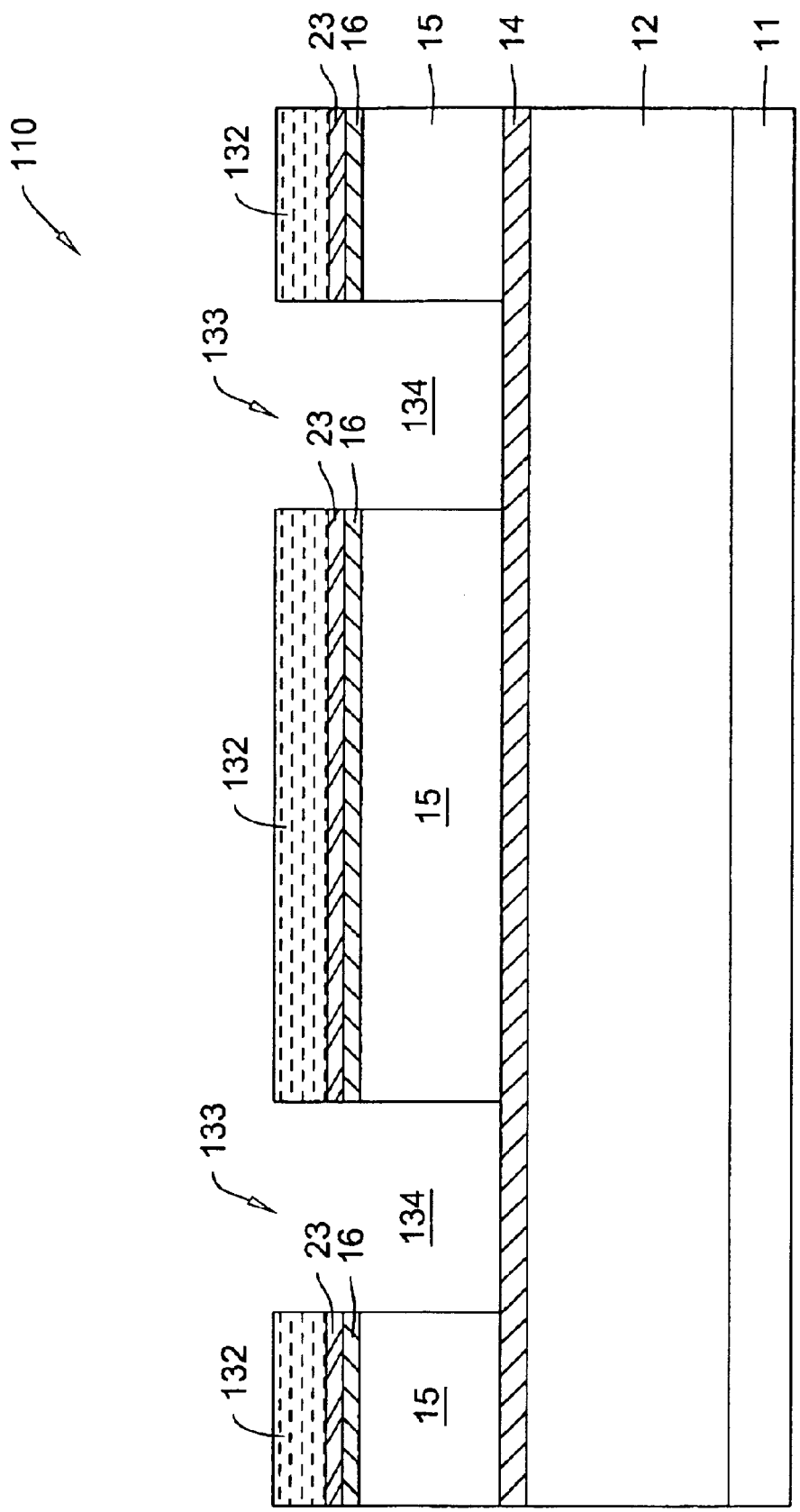
Figure 179:
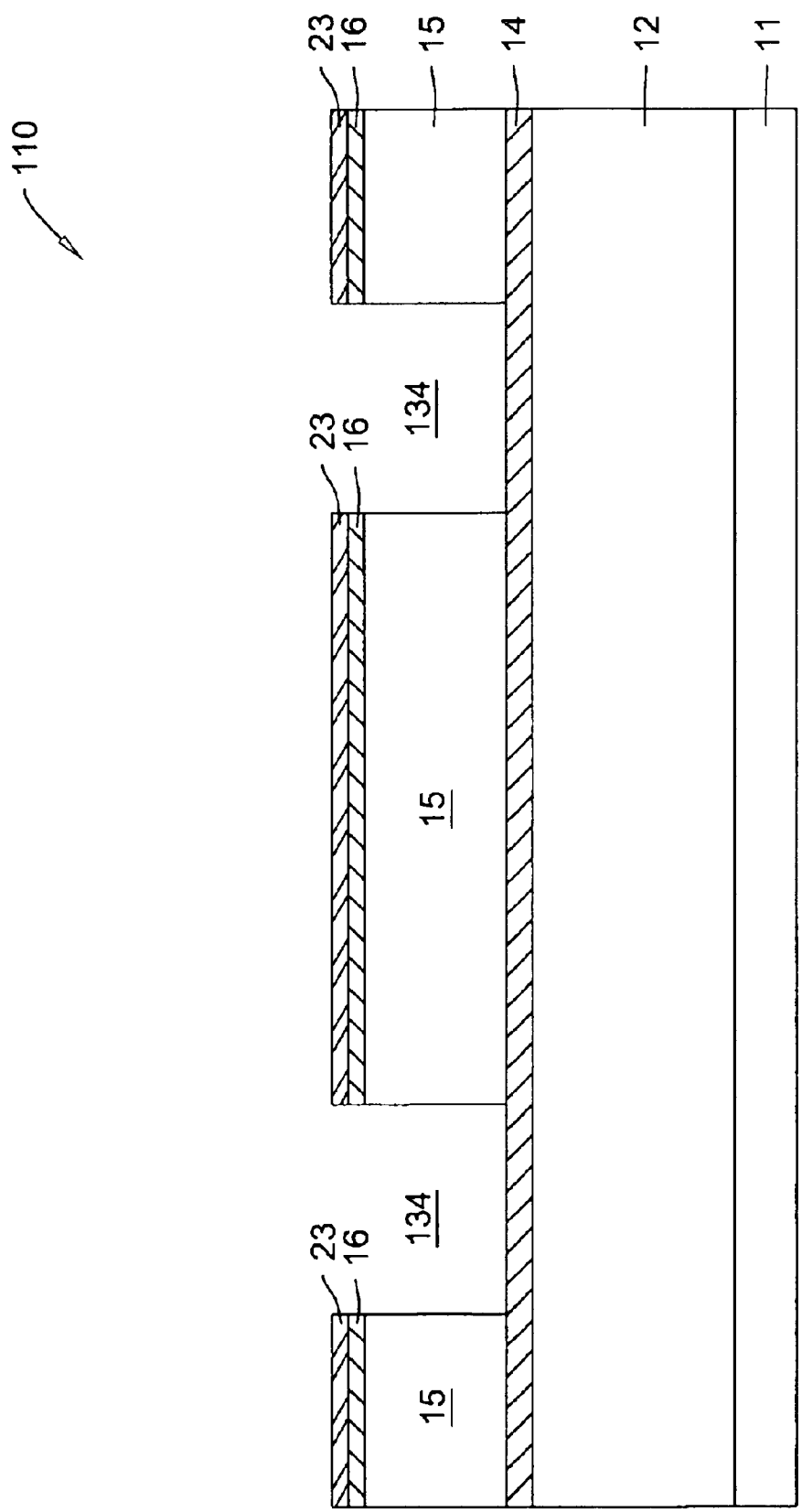
Figure 180:
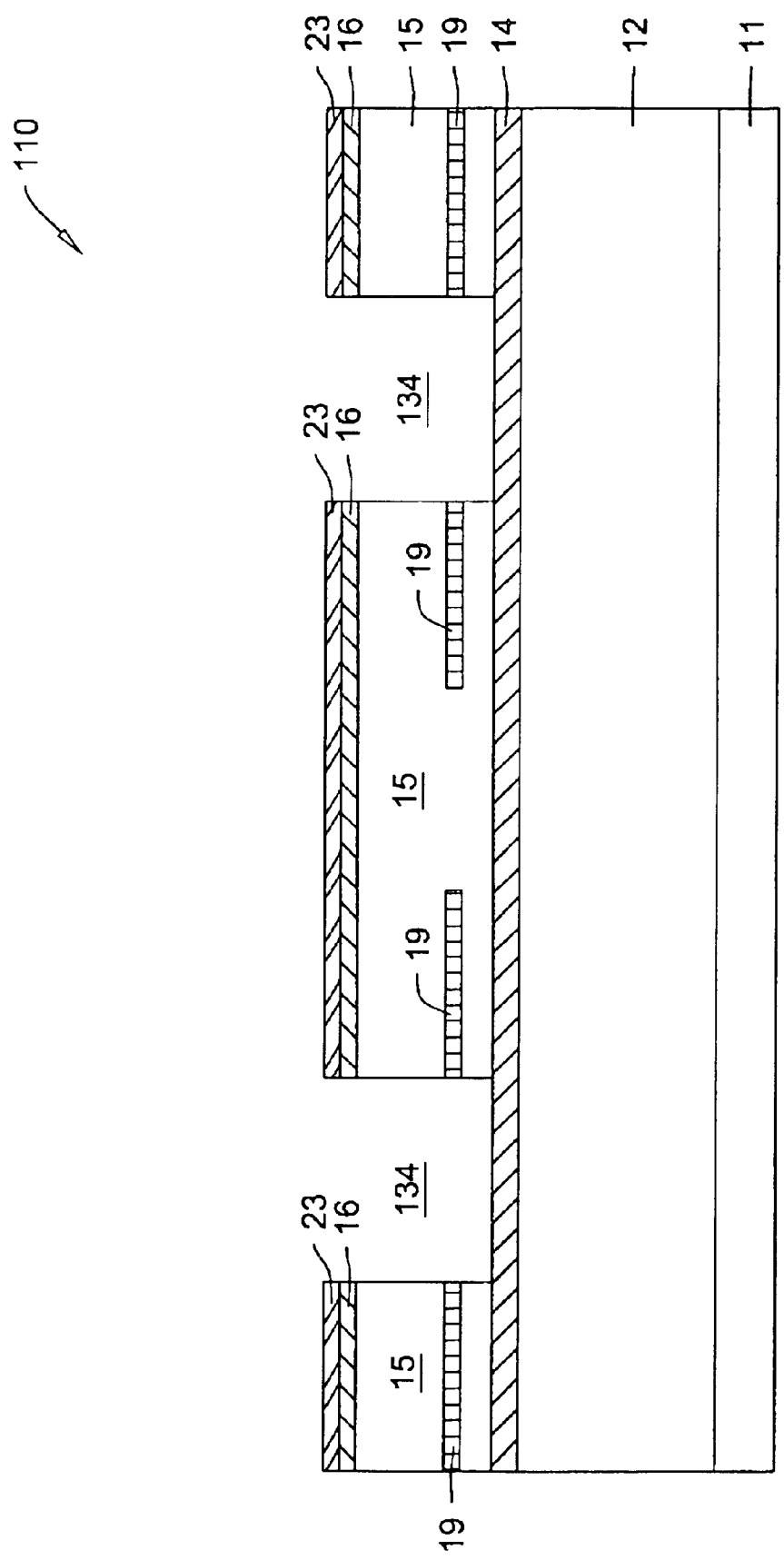
Figure 18I:
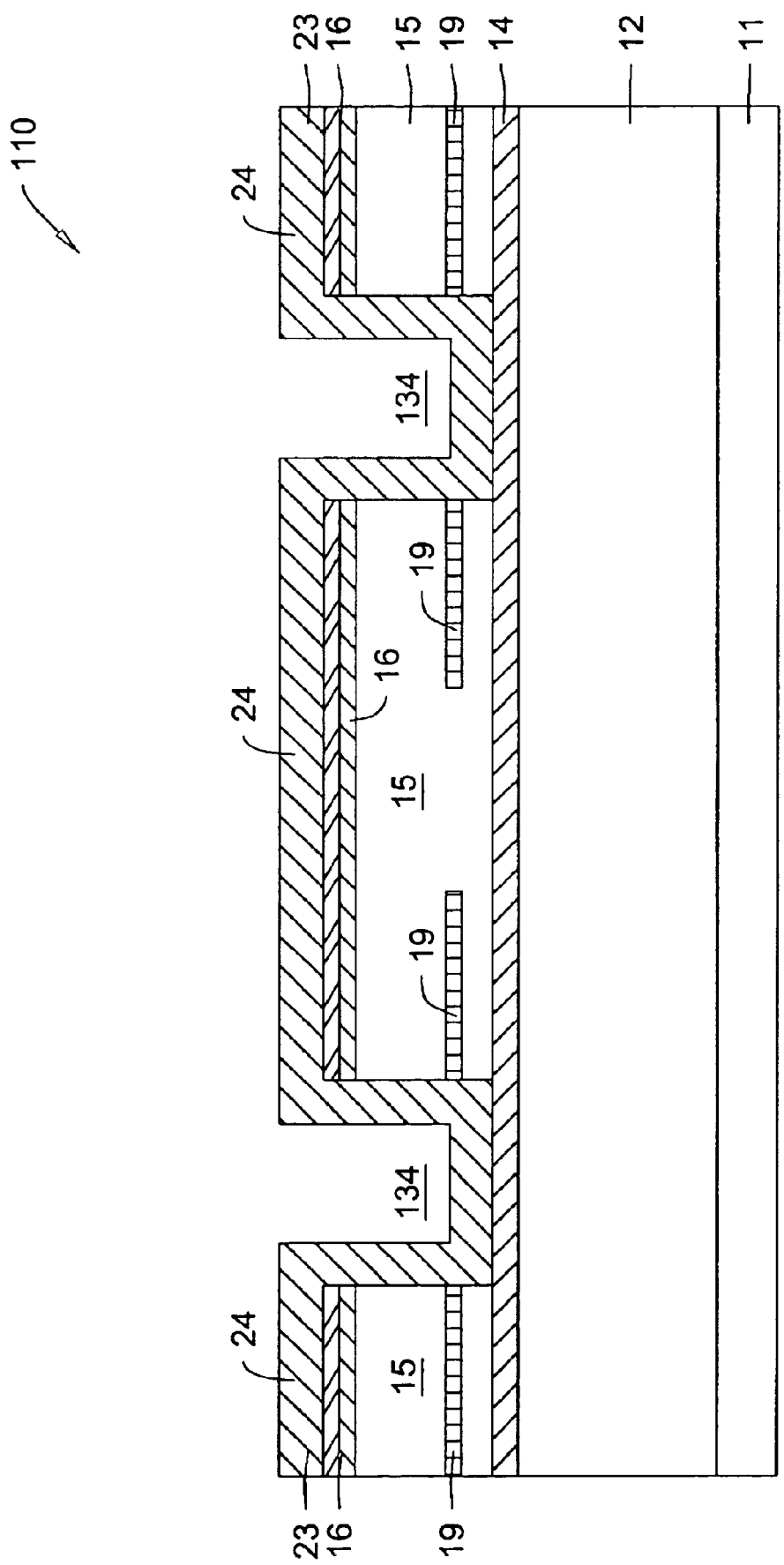
Figure 182:
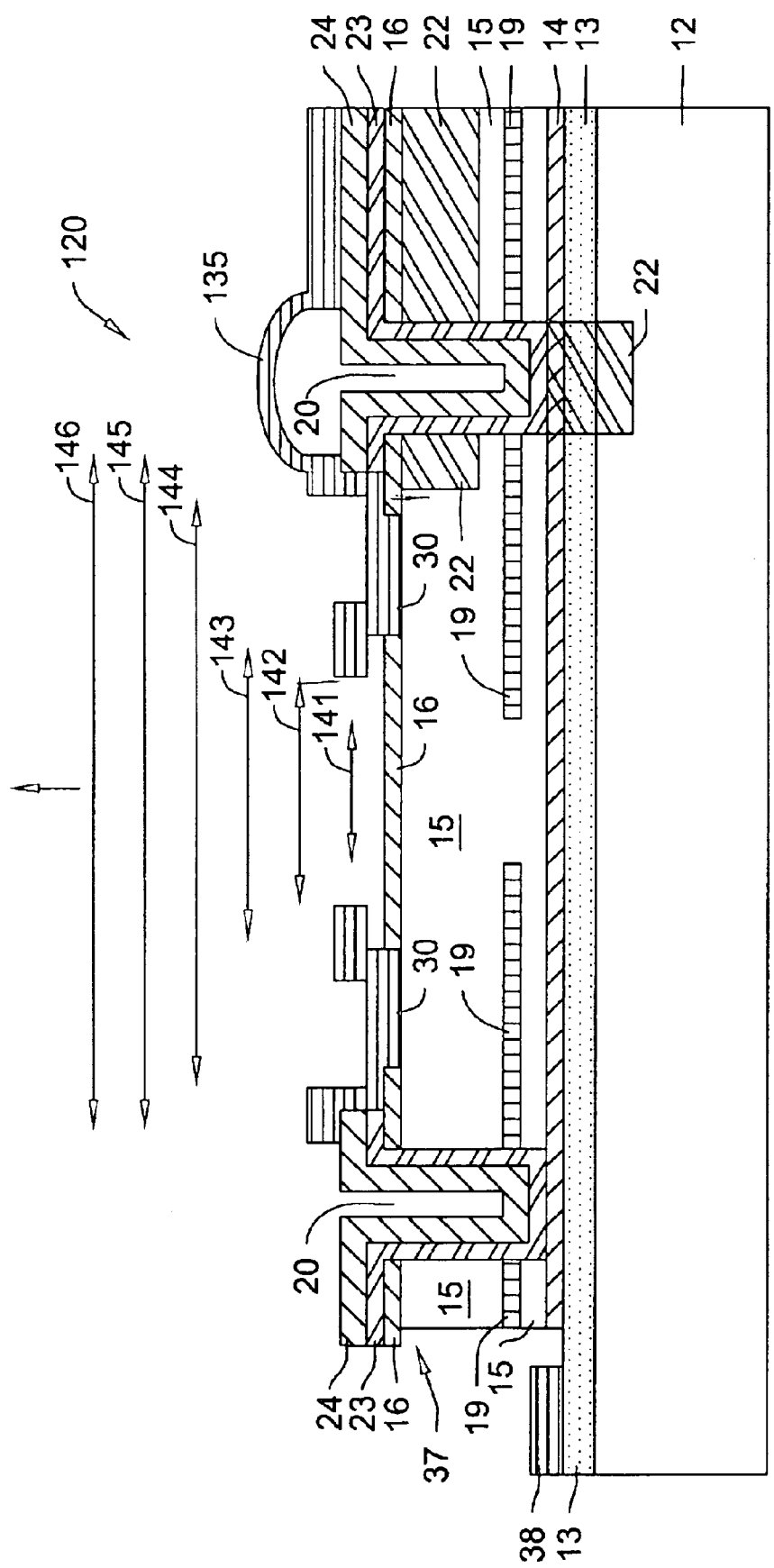
FIGS. 182–188 reveal variants of laser structures using the various processes described and/or portions thereof.
Figure 183:
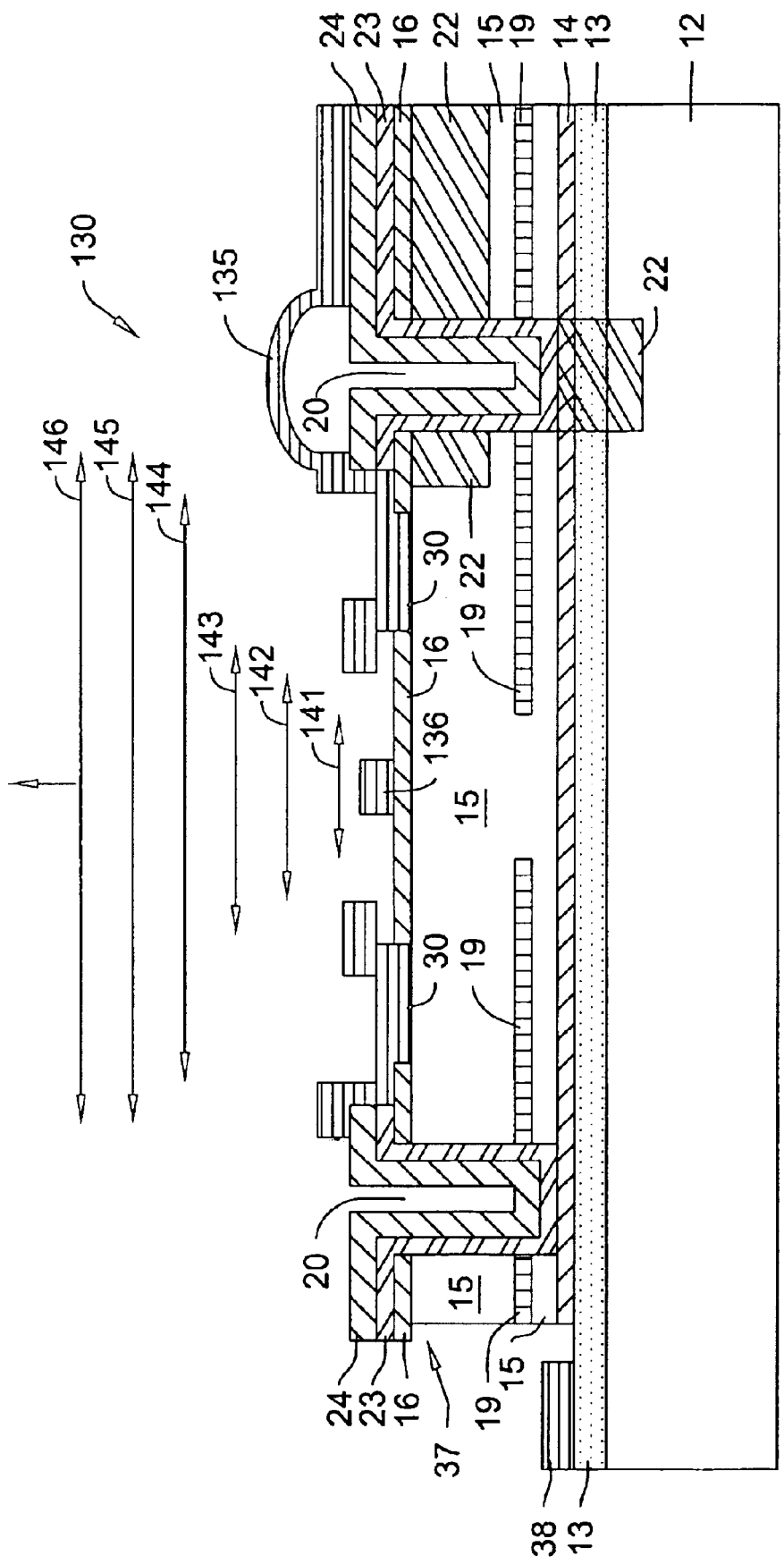
Figure 184:
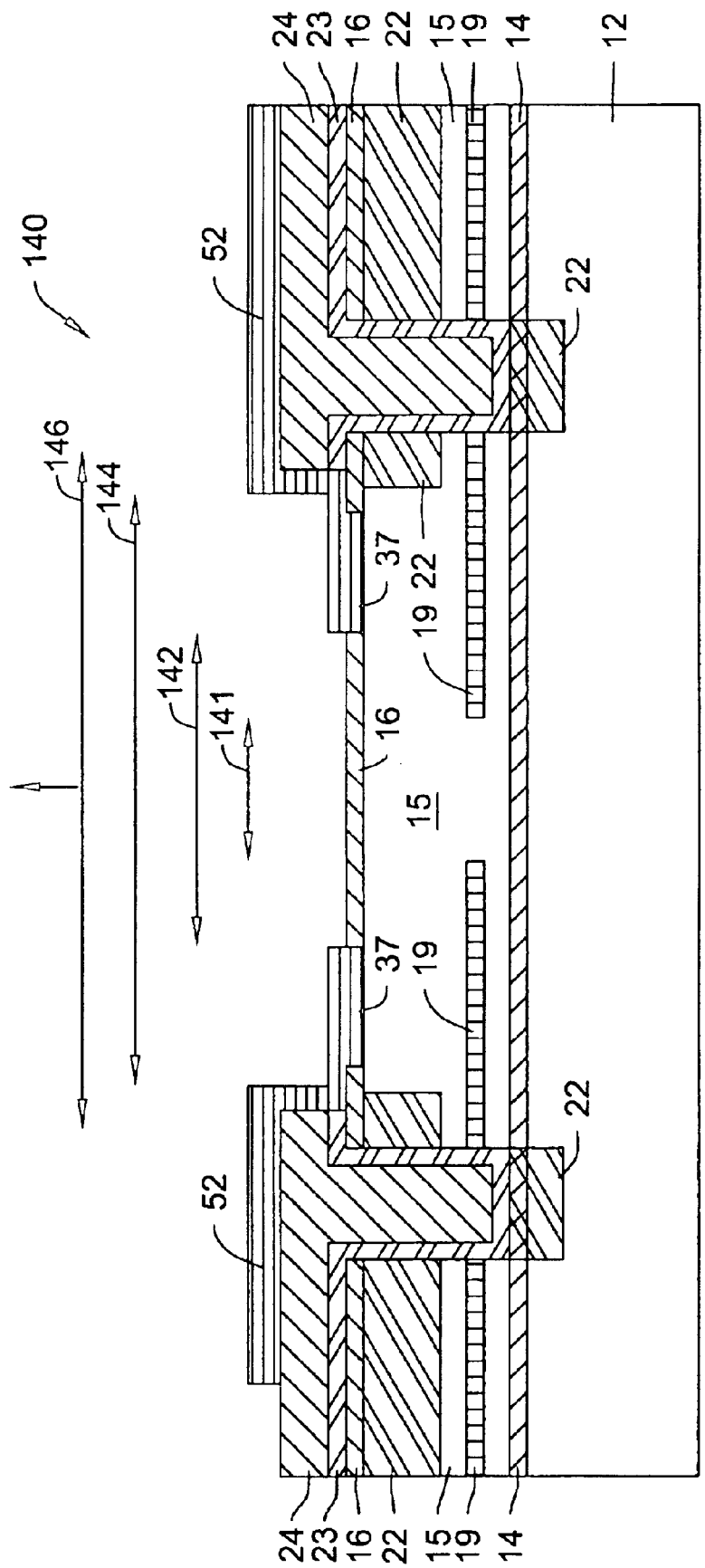
Figure 185:
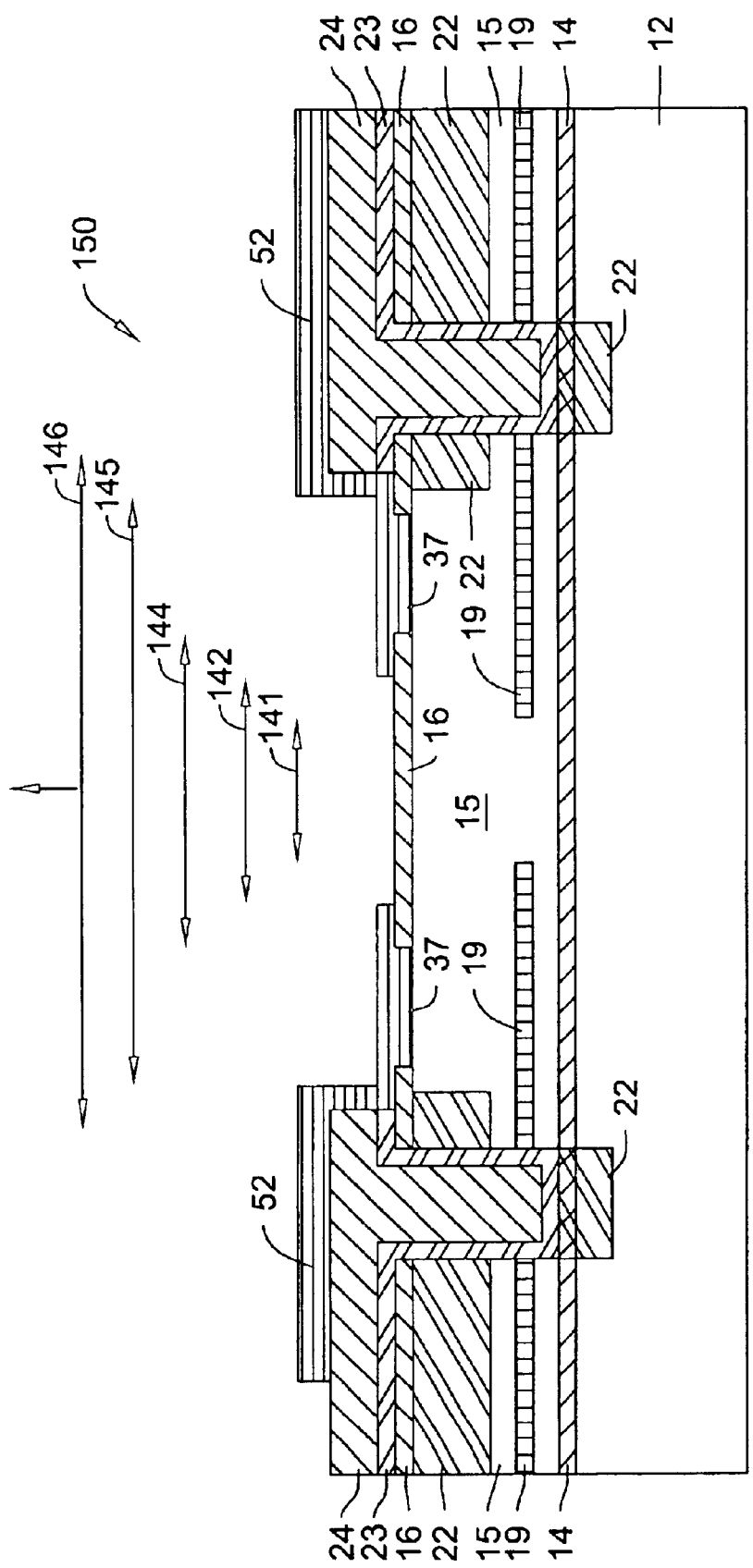

A process for a self-aligned (SA) Fetch may be utilized. It may be used in lieu of the about first six steps of the processes described here. The basis of structure 110 in FIG. 122 include a first DBR mirror 12 on a substrate 11, an active region or layer 14 on mirror 12, and a second DBR mirror 15 on active layer 14. A quarter-wavelength or so thick layer 16 of oxide may be PECVD deposited on mirror 15 as in FIG. 173. On layer 16, in FIG. 174, a nitride layer 23 of about a one-fourth wavelength thickness may be PECVD deposited. In FIG. 175, a mask 132, with an open area 133, having a pattern for an SA (self-aligned) trench oxidation spoke, an isolation trench and a Fetch aperture ring, may be deposited on nitride layer 23. A portion of nitride layer 23 in open area 133 may be etched away, as shown in FIG. 176. A mode port may cover the Fetch aperture and ring with a photo resist. Oxide layer 16 may be etched out down to the top surface of mirror 15 in area 133 as revealed in FIG. 177. In FIG. 178, an ICP etch of mirror 15 down to just above or up to or into active region 14 in open area 133, may be effected resulting in a channel 134. Mask 132 of photo resist may be stripped as in FIG. 179. Structure 110 may be inserted into an environment that results in the wet oxidation of oxidizable layer or layers 19 in mirror 15, as illustrated in FIG. 180. For thick dielectric processes only, an oxide layer 24 of about one-half wavelength thickness may be formed on nitride layer 23 and the surfaces of trench 134, as indicated in FIG. 181. This process may be continued at the appropriate step of one of the other more complete processes in the present description.

FIGS. 182–188 reveal several configurations that may be made in accordance with one or more processes disclosed in the present description. As to configuration 120, it may have an air bridge 135 and a coplanar contact 38 arrangement with some similarity to air bridge 34 and coplanar contact 38 of configuration 10 in FIG. 32. Configuration 130 of FIG. 183 may have similar features as those of FIG. 182 except there appears to be a metal area 136 at the center of the aperture of configuration 130. Configurations 140 and 150 of FIGS. 184 and 185 may have several similarities to configuration 40 in FIG. 53. Configuration 150 may have a narrower configuration trench and a lip-overhang of contact 37 in contract to configuration 140.

Figure 80:
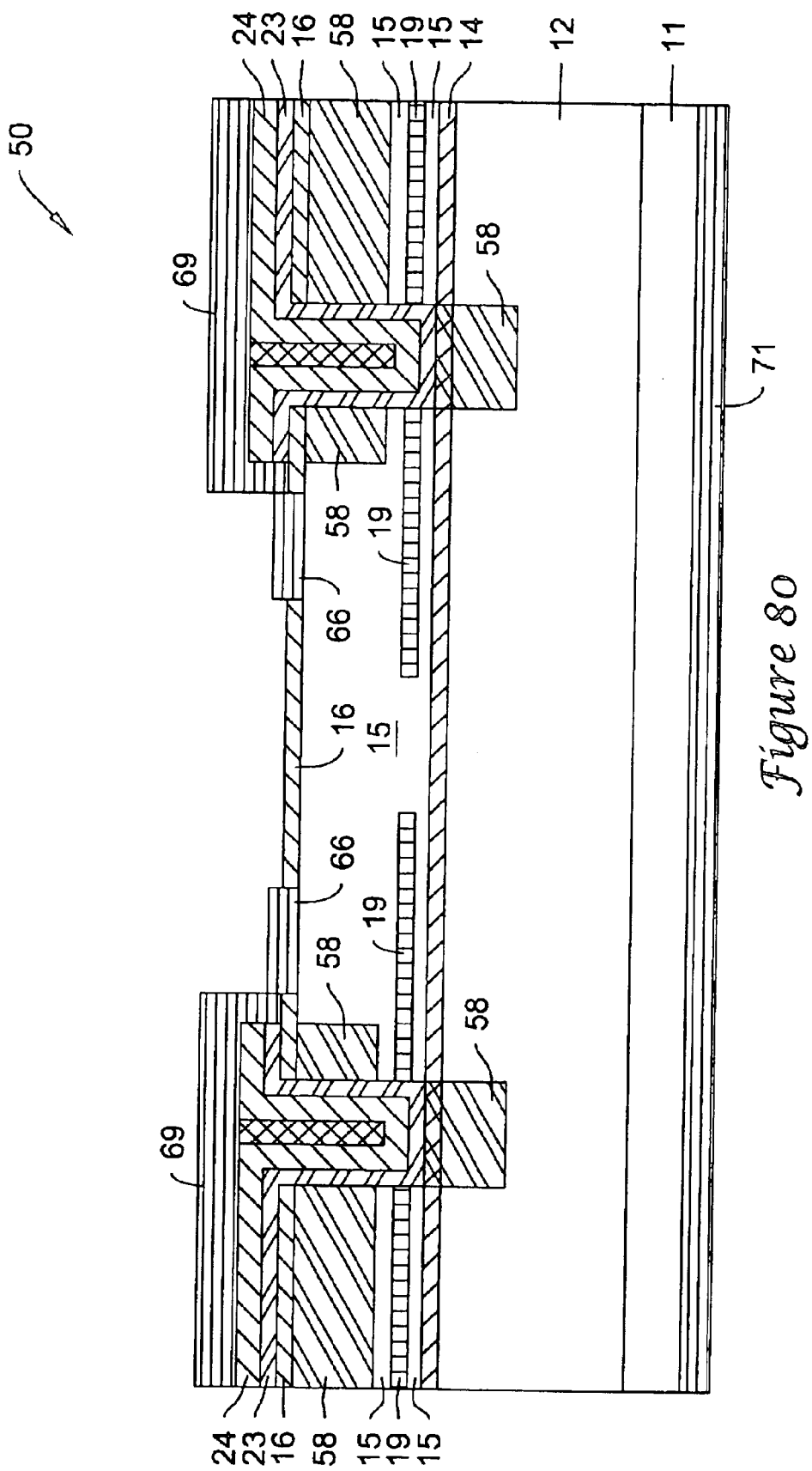
Figure 186:
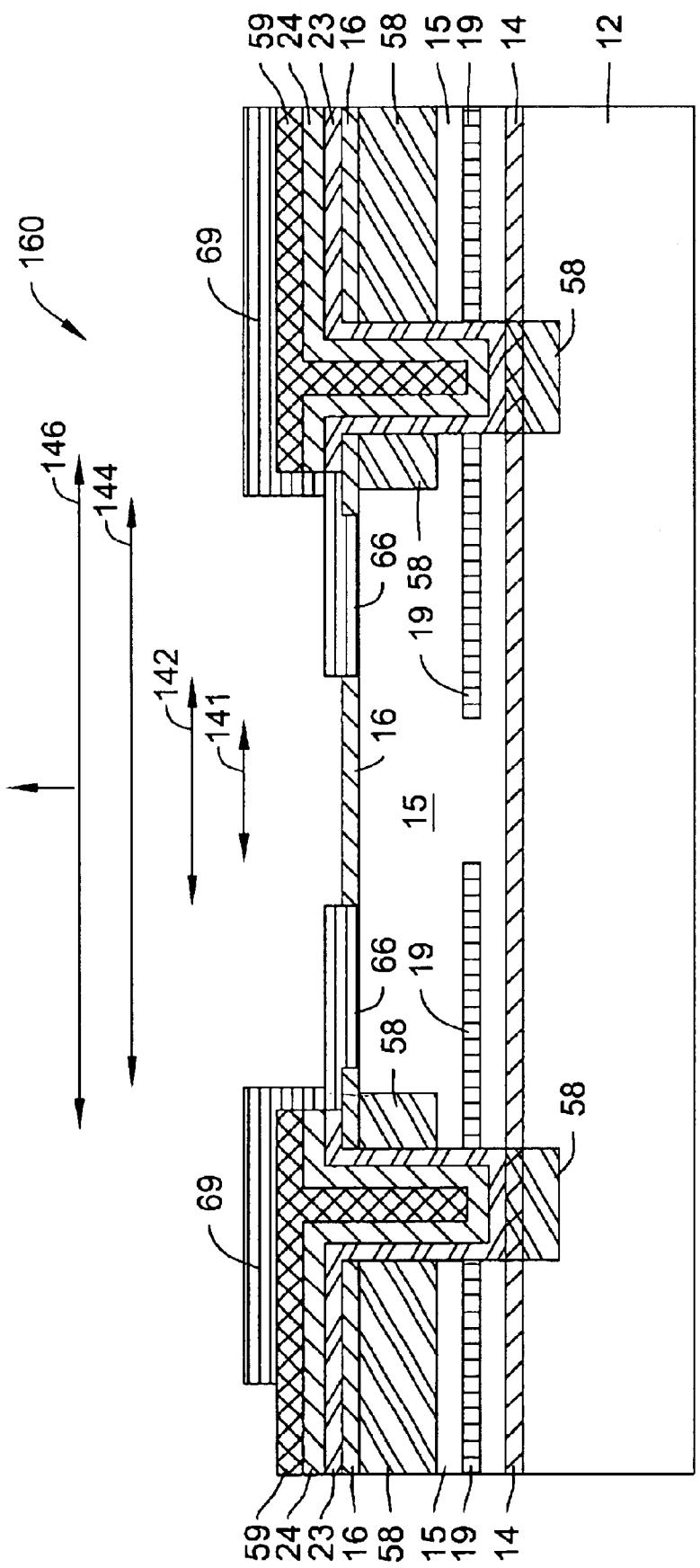
Figure 187:
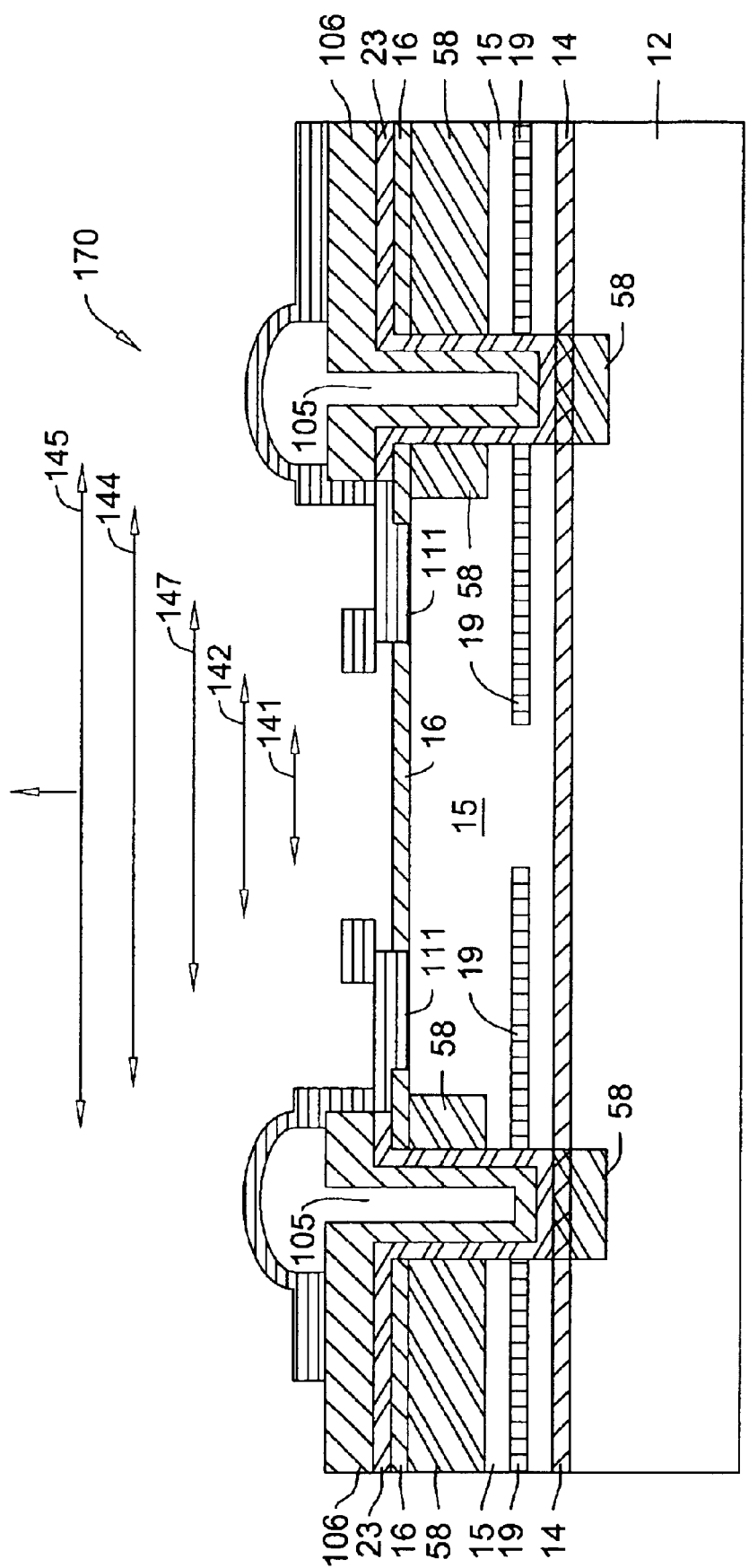
Figure 188:
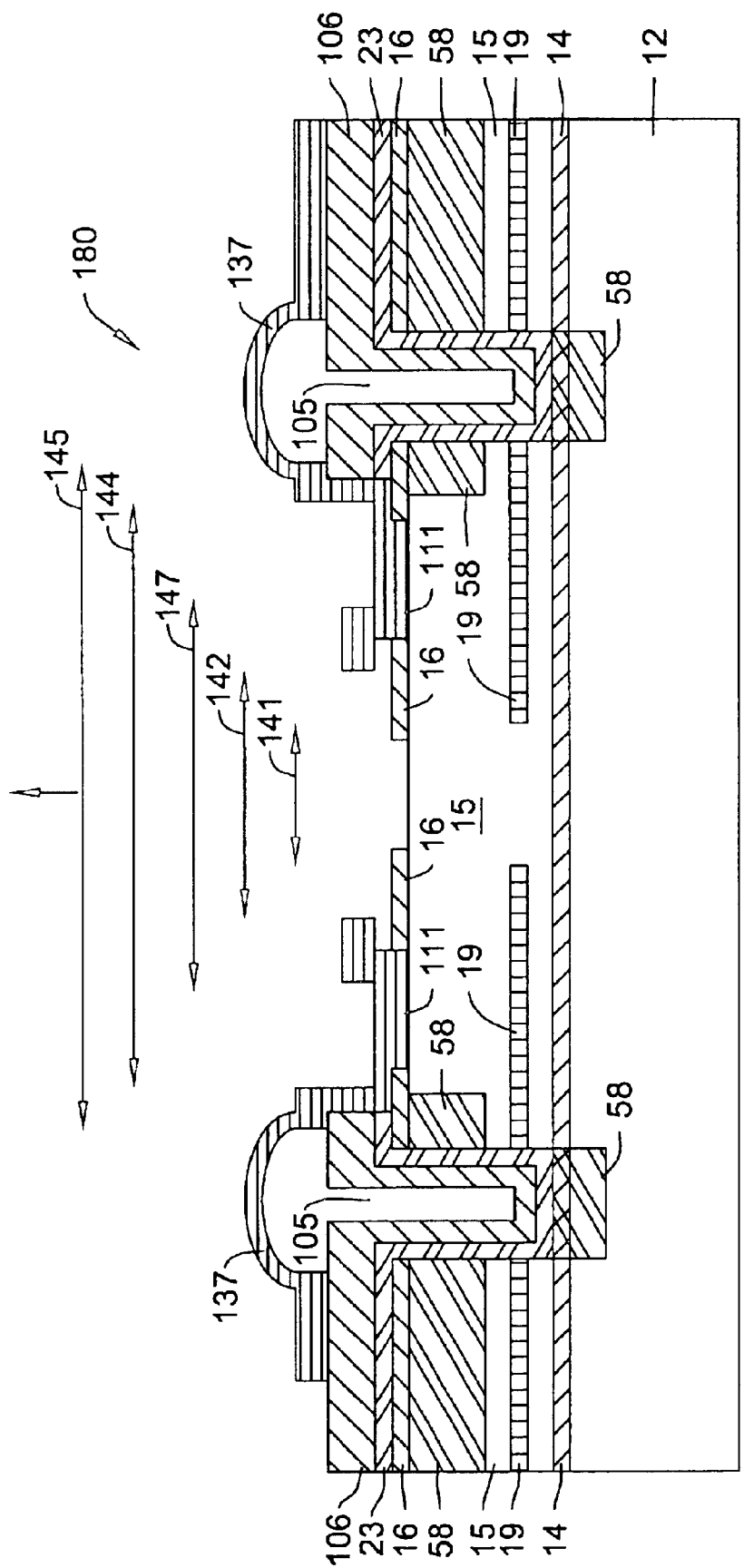

Configuration 160 of FIG. 186 may have a material BCB or SOG spun on for supporting a bridging conductor 69 over the trench, similar to configuration 50 of FIG. 80. Configuration 170 of FIG. 187 and configuration 180 of FIG. 188 may have an air bridge with some similarity to the air bridge in configuration 80 of FIG. 145. A difference between configurations 170 and 180 is the removal of oxide at the center of the aperture in configuration 180.

Figure 189:
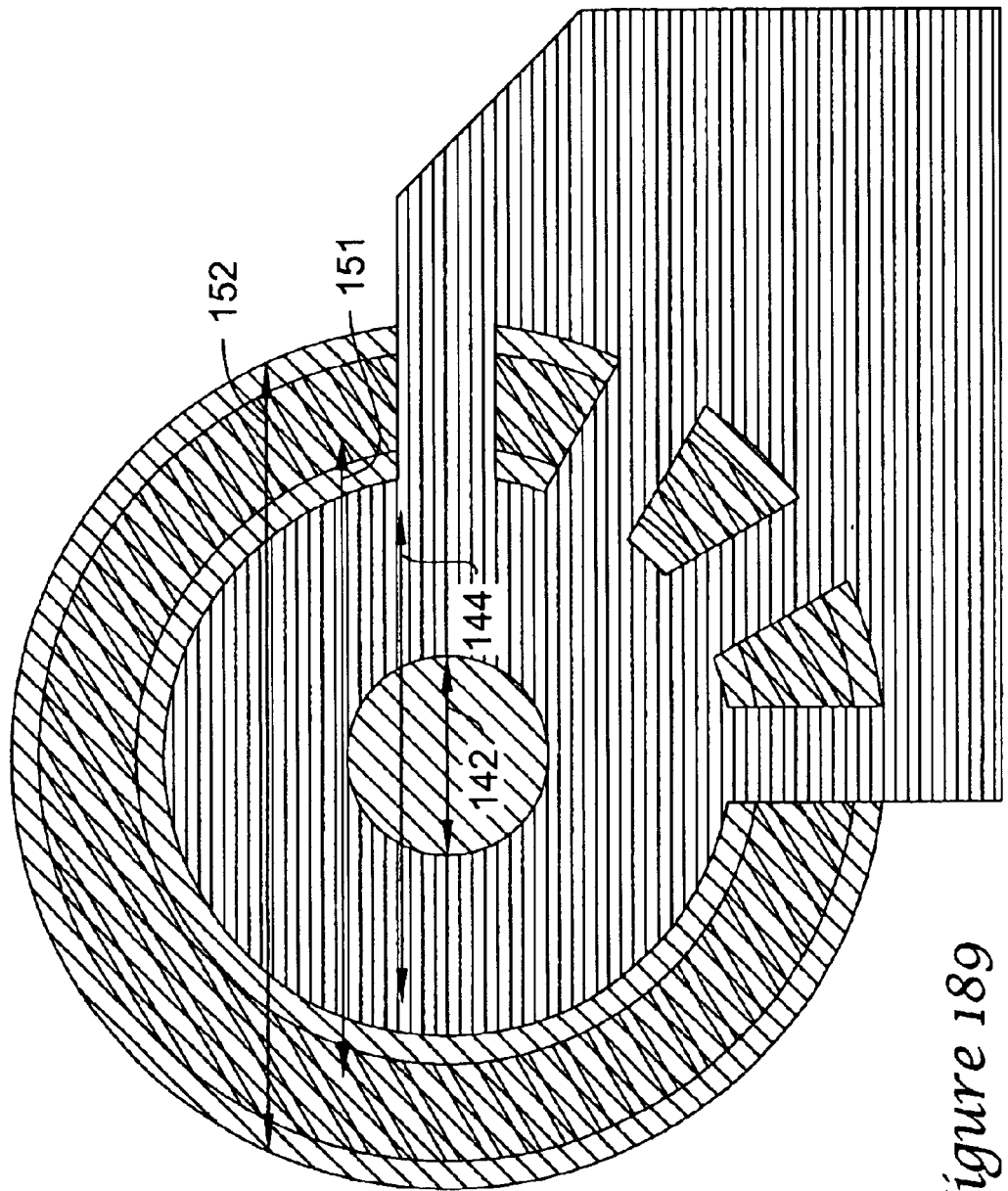
Figure 50:
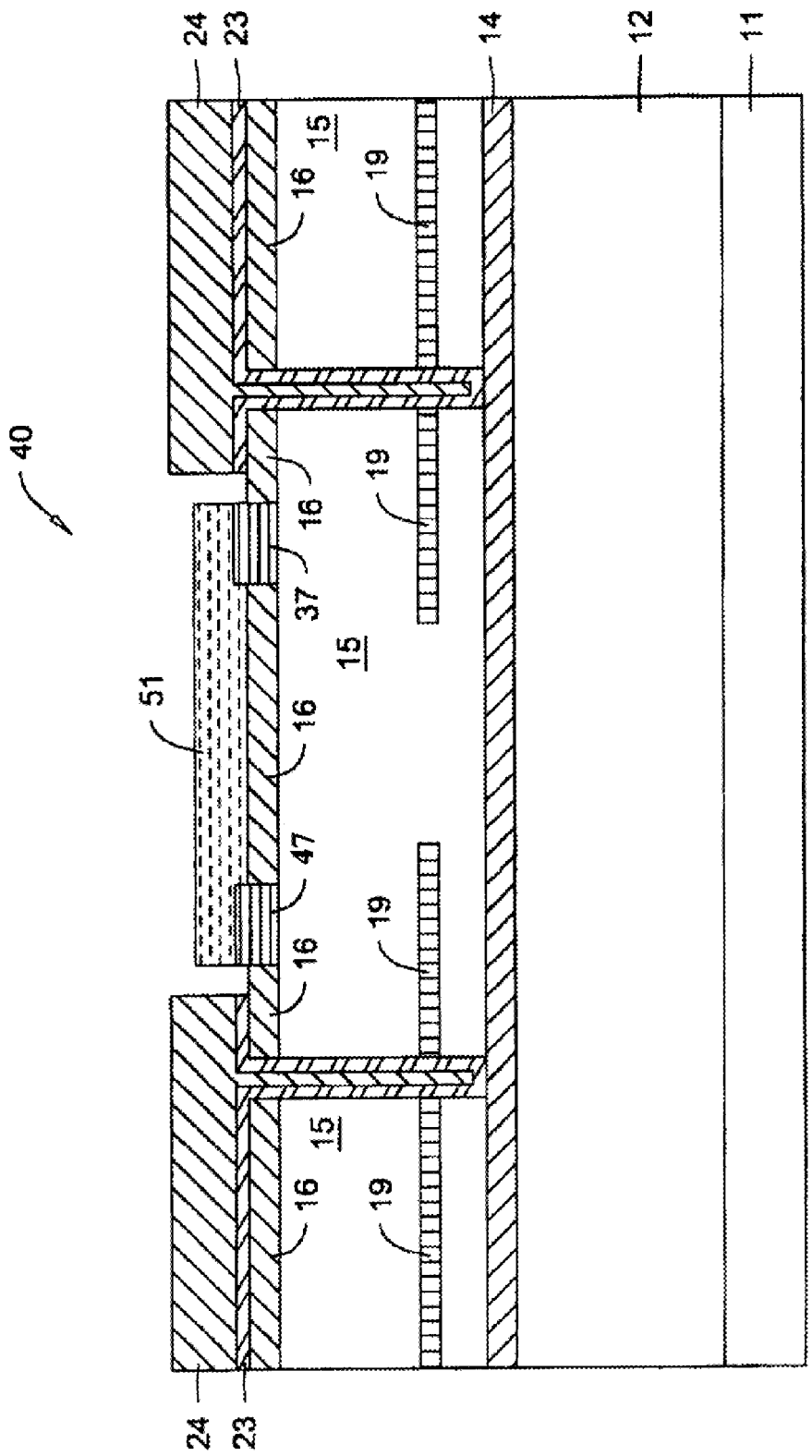
Figure 51:
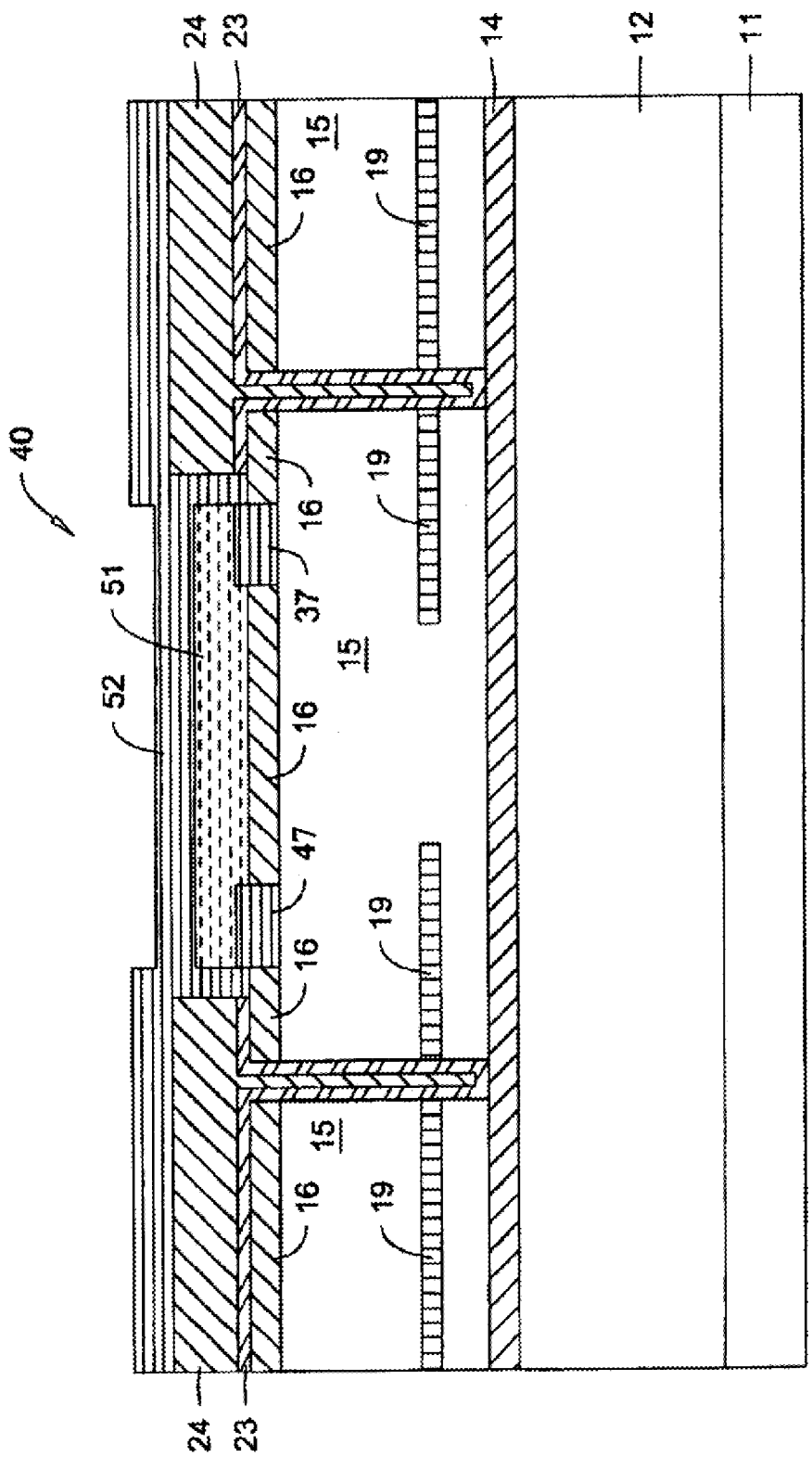
Figure 52:
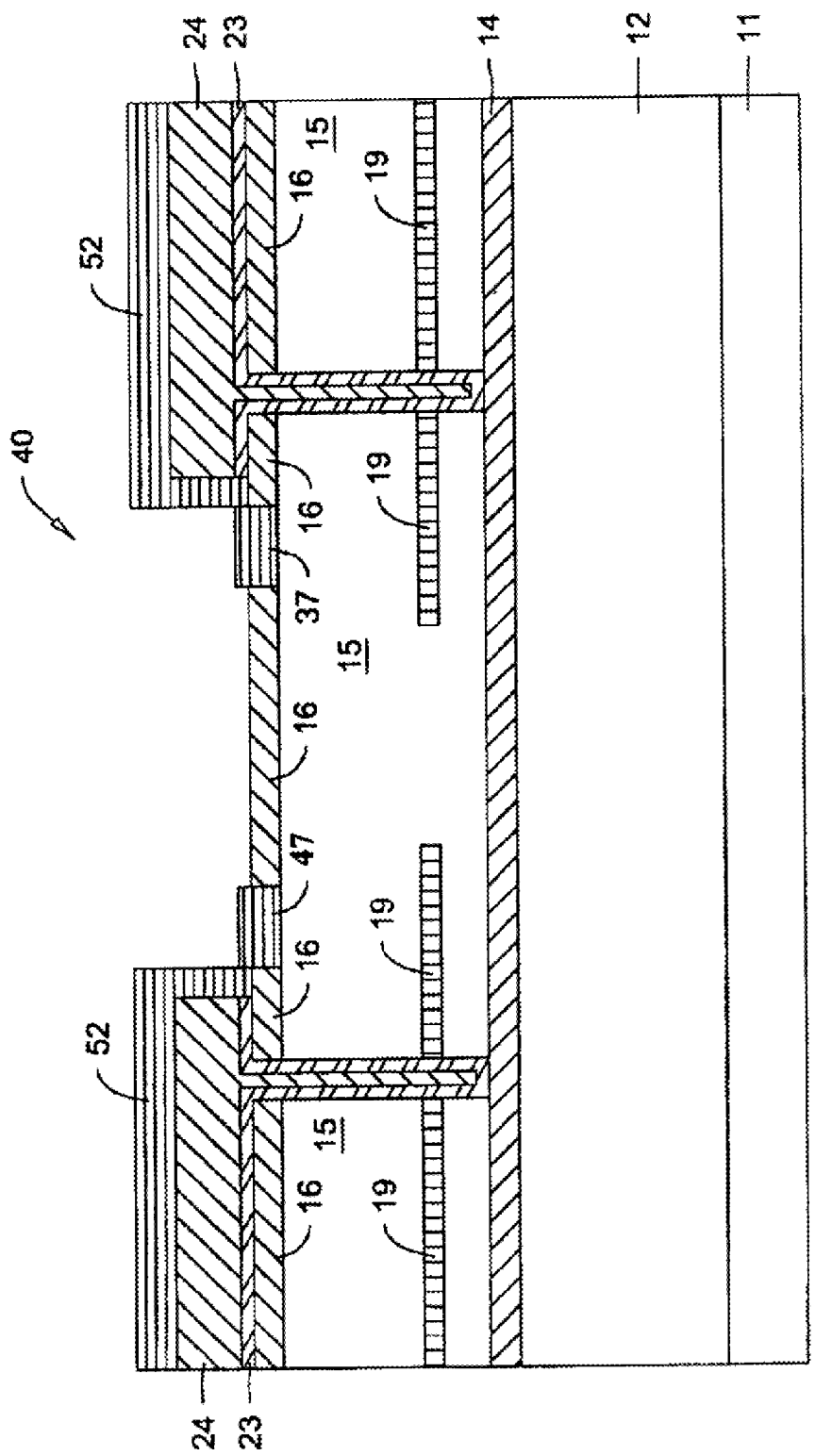
Figure 53:
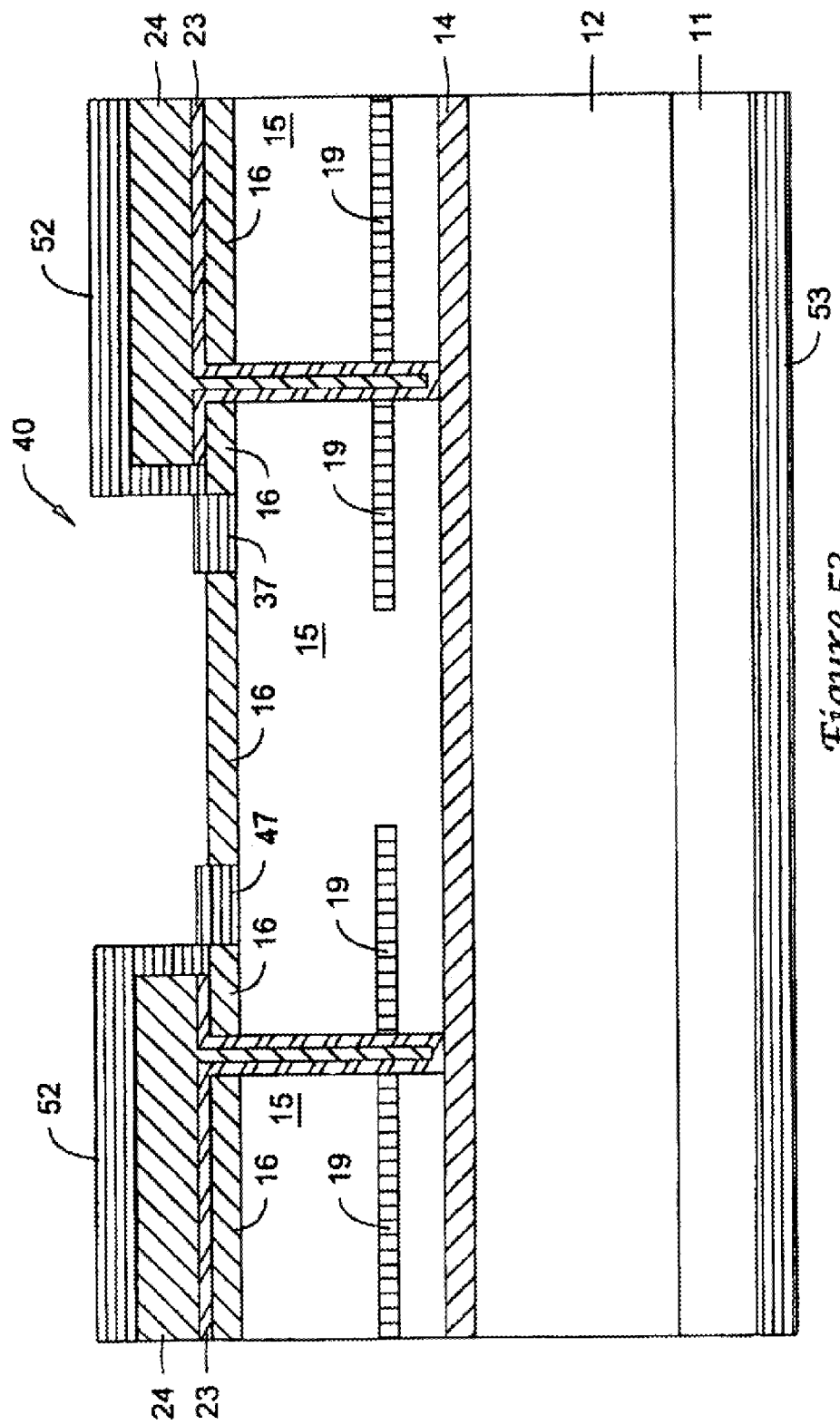

The configurations described here may have various sets of dimensions. An illustrative set of dimensions can be shown as an example. A table of standard layout geometry provides several dimensions. The dimensions may be stated in microns. FIG. 189 provides a top-down view of several dimensions. Dimensions may be stated as diameters but may be some other type of dimension since not all dimensioned items are necessarily circular. Some of the dimensions are air oxide aperture diameter 141, an inner metal ring inside diameter (deposited) 142, a contact via inside diameter (etched) 143, an aperture via diameter (etched) 144, an air bridge release 145, and an inner metal ring outside diameter (deposited) 145, which may be indicated in one of the FIGS. 182–188. Several other dimensions may include a trench inside diameter 151 and a trench outside diameter 152, as in FIG. 189. Other dimensional features may be identified from various illustrative examples of configurations described in this description.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A method for making a laser device, comprising:
   forming a first mirror on a front-side of a substrate;
   forming an active region on the first mirror;
   forming a second mirror on the active region;
   forming a first dielectric layer on the second mirror;
   forming a trench along a perimeter of a first area defining the laser device;
   oxidizing a layer in the second mirror to form an aperture for the laser device;

forming a second dielectric on the first dielectric and in the trench;

etching the first and second dielectric layers from a second area on the second mirror;

forming a first layer of electrical contact material on the second area on the second mirror; and forming a second layer of electrical contact material bridging the trench and having electrical contact with the first layer of electrical contact material.

2. The method of claim 1, further comprising forming a third layer of electrical contact material on a back-side of the substrate.

3. The method of claim 2, further comprising:

after the forming the trench, forming a mask on a third area situated within the first area;

implanting with ions a portion of the second mirror, active region and first mirror not covered by the mask; and removing the mask.

4. The method of claim 3, wherein the aperture is a current confining aperture.

5. The method of claim 1, further comprising:

thinning the substrate by removing material form a back-side of the substrate; and forming a third layer of electrical contact material on a back-side of the substrate.

6. A method for making a laser device, comprising:

forming a first mirror on a front-side of a substrate;

forming an active region on the first mirror;

forming a second mirror on the active region;

forming a first dielectric layer on the second mirror;

forming a trench along a perimeter of a first area defining the laser device;

oxidizing a layer in the second mirror to form an aperture for the laser device;

forming a second dielectric on the first dielectric and in the trench;

etching the first and second dielectric layers from a second area on the second mirror;

forming a first layer of electrical contact material on the second area on the second mirror; and filling the trench with a material;

planarizng the material in the trench to a level matching the level of the second dielectric layer outside the trench; and forming a second layer of electrical contact material on the planarized material and the second dielectric layer, having electrical contact with the first layer of electrical contact material to provide an electrical connection from the first layer of electrical contact material to a location beyond the outside perimeter of the trench.

7. The method of claim 6, further comprising forming a third layer of electrical contact material on a back-side of the substrate.

8. The method of claim 7, further comprising:

after the forming the trench, forming a mask on a third area situated within the first area;

implanting with ions a portion of the second mirror, active region and first mirror not covered by the mask; and removing the mask.

9. The method of claim 8, wherein the aperture is a current confining aperture.

10. The method of claim 6, further comprising:

thinning the substrate by removing material form a back-side of the substrate; and forming a third layer of electrical contact material on a back-side of the substrate.

11. A method for making a laser device, comprising:

forming a first mirror on a front-side of a substrate;

forming an intra cavity contact layer on the first mirror;

forming an active region on the intra cavity contact layer mirror;

forming a second mirror on the active region;

forming a first dielectric layer on the second mirror;

forming a trench along a perimeter of a first area defining the laser device;

oxidizing a layer in the second mirror to form an aperture for the laser device;

forming a second dielectric on the first dielectric and in the trench;

etching the first and second dielectric layers from a second area on the second mirror;

forming a first layer of electrical contact material on the second area on the second mirror;

forming a second layer of electrical contact material bridging the trench and having electrical contact with the first layer of electrical contact material;

etching a portion of the first and second dielectric layers, the second mirror and active region to expose a third area on the intra-cavity contact layer; and forming a third layer of contact material on the third area of the intra-cavity contact layer.

12. The method of claim 11, further comprising:

after the forming the trench, forming a mask on a third area situated within the first area;

implanting with ions a portion of the second mirror, active region and first mirror not covered by the mask; and removing the mask.

13. The method of claim 12, wherein the aperture is a current confining aperture.

14. A method for making a laser device, comprising:

forming a first mirror on a front-side of a substrate;

forming an active region on the first mirror;

forming a second mirror on the active region;

forming a first dielectric layer on the second mirror;

forming a trench along a perimeter of a first area defining the laser device;

oxidizing a layer in the second mirror to form an aperture for the laser device;

forming a second dielectric on the first dielectric and in the trench;

etching the first and second dielectric layers from a second area on the second mirror;

forming a first layer of electrical contact material on the second area on the second mirror; and filling the trench with a material;

planarizng the material in the trench to a level matching the level of the second dielectric layer outside the trench;

forming a second layer of electrical contact material on the planarized material and the second dielectric layer, having electrical contact with the first layer of electrical contact material to provide an electrical connection from the first layer of electrical contact material to a location beyond the outside perimeter of the trench;

etching a portion of the first and second dielectric layers, the second mirror and active region to expose a third area on the intra-cavity contact layer; and forming a third layer of contact material on the third area of the intra-cavity contact layer.

15. The method of claim 14, further comprising:
after the forming the trench, forming a mask on a third area situated within the first area;
implanting with ions a portion of the second mirror, active region and first mirror not covered by the mask; and
removing the mask.

16. The method of claim 15, wherein the aperture is a current confining aperture.

17. A method for making a laser device, comprising:
forming a first mirror on a front-side of a substrate;
forming an active region on the first mirror;
forming a second mirror on the active region;
forming a first dielectric layer on the second mirror;
forming a trench along a perimeter of a first area defining the laser device;
forming an aperture within the perimeter of the first area, with an ion implantation in a portion of the second mirror;
forming a second dielectric on the first dielectric and in the trench;
etching the first and second dielectric layers from a second area on the second mirror;
forming a first layer of electrical contact material on the second area on the second mirror; and
forming a second layer of electrical contact material bridging the trench and having electrical contact with the first layer of electrical contact material.

18. The method of claim 17, further comprising forming a third layer of electrical contact material on a back-side of the substrate.

19. The method of claim 18, wherein the aperture is a current confining aperture.

20. The method of claim 17, further comprising:
thinning the substrate by removing material form a back-side of the substrate; and
forming a third layer of electrical contact material on a back-side of the substrate.

21. A method for making a laser device, comprising:
forming a first mirror on a front-side of a substrate;
forming an active region on the first mirror;
forming a second mirror on the active region;
forming a first dielectric layer on the second mirror;
forming a trench along a perimeter of a first area defining the laser device;
forming an aperture within the perimeter of the first area, with an ion implantation in a portion of the second mirror;
forming a second dielectric on the first dielectric and in the trench;
etching the first and second dielectric layers from a second area on the second mirror;
forming a first layer of electrical contact material on the second area on the second mirror; and
forming a second layer of electrical contact material bridging the trench and having electrical contact with the first layer of electrical contact material;
etching a portion of the first and second dielectric layers, the second mirror and active region to expose a third area on the intra-cavity contact layer; and
forming a third layer of contact material on the third area of the intra-cavity contact layer.

22. The method of claim 21, wherein the aperture is a current confining aperture.

23. A method for making a vertical cavity surface emitting laser comprising:
depositing an oxide layer on a structure comprising:
a first mirror;
an active region on the first mirror; and
a second mirror on the active region; and
wherein:
the oxide layer is on the second mirror; and
the second mirror has at least one oxidizable layer;
placing a first mask having a trench pattern on the oxide layer;
etching the oxide layer and the second mirror to form a trench;
removing the first mask;
partially oxidizing the at least one oxidizable layer to form a first aperture in the second mirror;
placing a second mask, having a pattern for implanting, on the oxide layer;
implanting a portion of the second mirror;
removing the second mask;
depositing a nitride layer on the oxide layer;
depositing a second oxide layer on the nitride layer;
placing a third mask having an aperture pattern on the second oxide layer;
etching the second oxide layer and the nitride layer in a form of the aperture;
removing the third mask;
placing a fourth mask having a contact pattern on the second oxide layer and the first oxide layer;
etching an area of the first oxide layer for a contact;
depositing a metal layer on the fourth mask and the area etched for the area; and
removing the fourth mask with the metal on the fourth mask.

24. A process for making a light emitting device comprising:
forming a first mirror on a substrate;
forming a contact layer on the first mirror;
forming an active region on the contact layer;
forming a second mirror having at least one oxidizable layer on the active region;
forming a first oxide layer on the second mirror;
masking the first oxide layer;
etching a trench through the first oxide layer;
etching a trench into the second mirror;
removing the masking from the first oxide layer;
providing wet oxidation through the trench to oxidize a portion of the oxidation layer of the second mirror to form a first aperture;
masking a portion of the first oxide layer;
implanting ions into the second mirror and through at least a portion of the trench into the active region and the first mirror;
removing the masking from the portion of the oxide layer;
forming a passivation layer on the oxide layer, and surfaces of the trench;
forming a second oxide layer on the passivation layer;
masking the trench and a portion of the second oxide layer proximate to the trench;

etching the unmasked portion of the second oxide layer and passivation layer from the first oxide layer;

removing the masking from the trenches and the portion of the second oxide layer proximate to the trench;

masking the second oxide layer and a center portion of the exposed first oxide layer;

etching the unmasked portion of the exposed first oxide layer down to a top layer of the second mirror;

forming a first metal layer on the exposed portion of the top layer of the second mirror;

removing the masking from the second oxide layer and the center portion of the first oxide layer;

annealing the metal layer;

masking the trench and area within the metal layer;

forming a second metal layer on the masking and exposed portions of the second and first oxide layers;

masking portions of the second metal layer;

forming a third metal layer on exposed portions of the second metal layer;

removing the masking from portions of the second metal layer;

removing exposed portions of the second metal layer;

removing the masking from the trench and the area within the metal layer;

masking a whole area except a portion of the second oxide layer adjacent to a portion of the trench;

removing the unmasked portion of the second oxide layer and nitride layer, the first oxide layer, the second mirror and the active region under that unmasked portion;

undercutting below the first oxide layer a portion of the second mirror and active region;

forming a fourth metal layer on a portion of the contact layer;

removing the masking from the whole area; and annealing the fourth metal layer.

* * * * *

UNITED STATES PATENT AND TRADEMARK OFFICE
CERTIFICATE OF CORRECTION

PATENT NO.        : 7,031,363 B2
APPLICATION NO. : 10/697660
DATED             : April 18, 2006
INVENTOR(S)       : Biard et al.

It is certified that error appears in the above-identified patent and that said Letters Patent is hereby corrected as shown below:

Title Page
Item 56, References Cited, OTHER PUBLICATIONS, "Choe, et al…", change "AIAs" to --AlAs--
Item 56, References Cited, U.S. PATENT DOCUMENTS, Page 2, change "4,790,733 A  12/1988  Vaccaro" to --5,790,733 A  8/1998  Smith--
Item 56, References Cited, U.S. PATENT DOCUMENTS, Page 2, remove "5,586,571 A  12/1996  Guillermo"
Item 56, References Cited, U.S. PATENT DOCUMENTS, Page 2, change "6,086,263 A  6/2000  Smith" to --6,086,263 A  7/2000  Selli et al.--
Item 56, References Cited, U.S. PATENT DOCUMENTS, Page 3, change "6,496,621 B1  12/2002  Koehler et al." to --6,496,621 B1  12/2002  Kathman--
Item 56, References Cited, OTHER PUBLICATIONS, Page 3, "G.G. Ortiz…" change "GA0.8As" to --Ga0.8As--
Item 56, References Cited, OTHER PUBLICATIONS, Page 3, "Kash, et al…" change "AIAs" to --AlAs--
Item 56, References Cited, OTHER PUBLICATIONS, Page 3, "Koley B…" change "AIAs" to --AlAs--
Item 56, References Cited, OTHER PUBLICATIONS, Page 4, "Osinski…" change "AIAs" to --AlAs--
Item 56, References Cited, OTHER PUBLICATIONS, Page 4, "Ries,…" change "AIAs-AlGaAs/InGAP" to --AlAs-AlGaAs/InGaP--
Item 56, References Cited, OTHER PUBLICATIONS, Page 4, "Tao,…" change "AlGaAs" to --AlGaAs--

Figure 53:
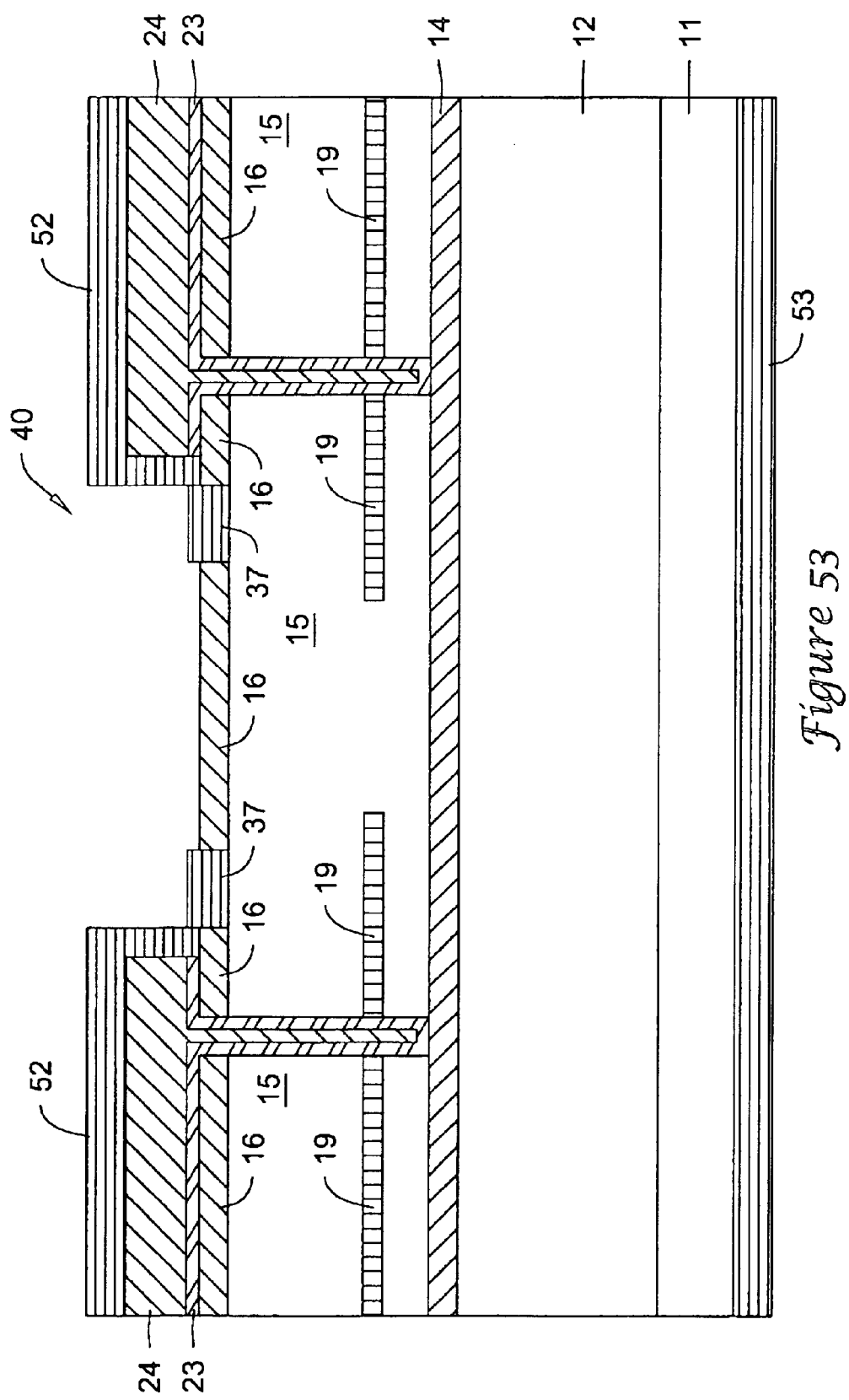

Drawings
Sheet 51, Figure 50, change both reference numerals "37" to --47--, as shown in attached
Sheet 52, Figure 51, change both reference numerals "37" to --47--, as shown in attached
Sheet 53, Figure 52, change both reference numerals "37" to --47--, as shown in attached
Sheet 54, Figure 53, change both reference numerals "37" to --47--, as shown in attached Column 2
Line 25, change "mirror 16" to --mirror 15--

UNITED STATES PATENT AND TRADEMARK OFFICE
CERTIFICATE OF CORRECTION

PATENT NO.         : 7,031,363 B2
APPLICATION NO. : 10/697660
DATED                 : April 18, 2006
INVENTOR(S)       : Biard et al.

It is certified that error appears in the above-identified patent and that said Letters Patent is hereby corrected as shown below:

Column 4
Line 17, change "On nitride layer 23, about" to --About--
Line 28, after "photo resist layer" insert --43--
Line 35, change "ebeam" to --e-beam--
Line 42, change "ebeam" to --e-beam--
Line 44, change "37" to --47--
Line 46, change "37" to --47--
Line 49, change "ebeam" to --e-beam--
Line 50, change "FIG. 52" to --FIG. 53--
Line 51, change "37" to --47--

Figure 64:
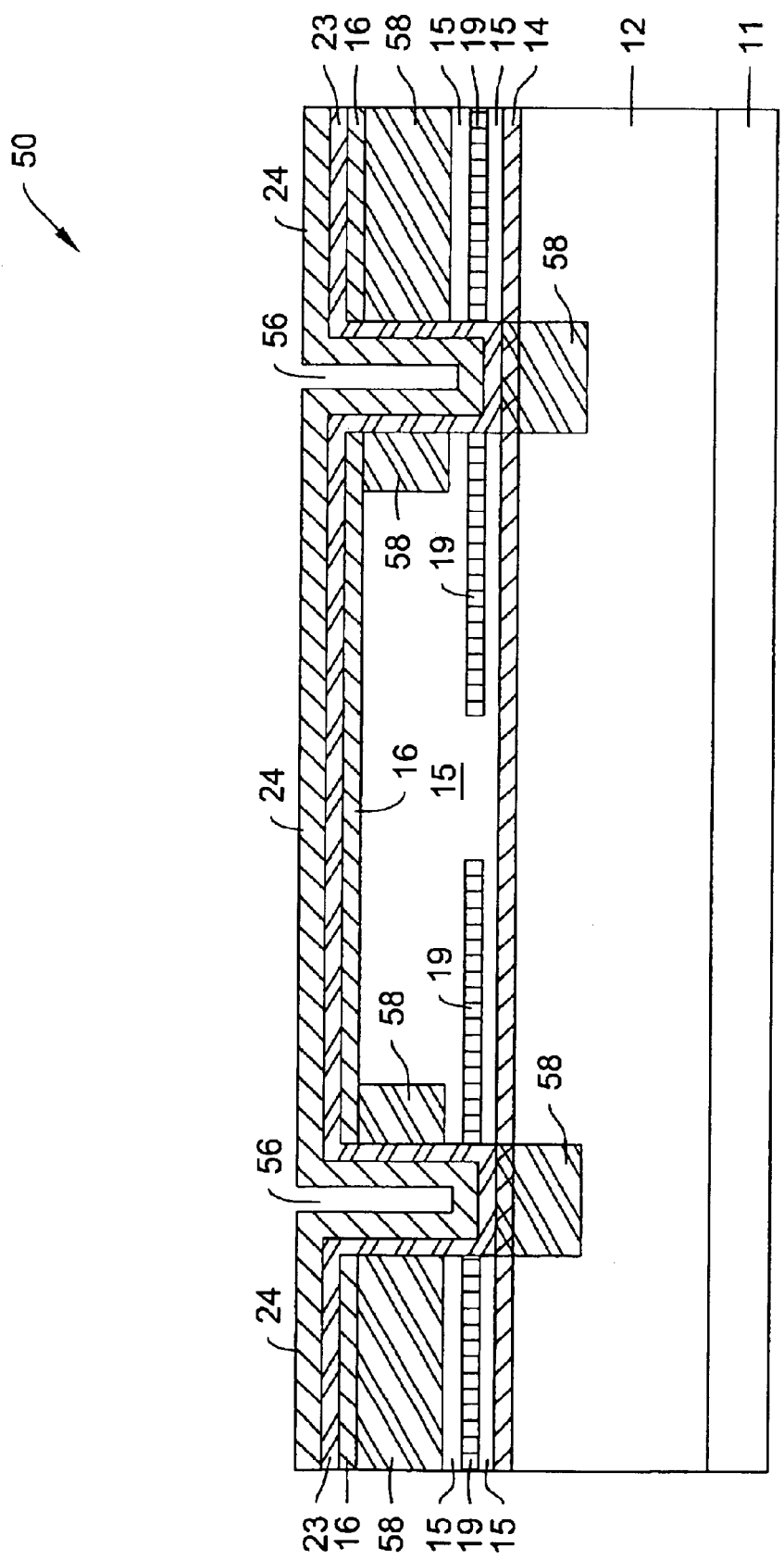

Column 5
Line 11, after "PECVD" insert --, as in FIG. 64--
Line 28, after "16 and 24" insert --,as in FIG. 71--
Line 46, change "ebeam" to --e-beam--
Line 48, after "RTA)" insert --, shown in FIG. 80--

Figure 88:
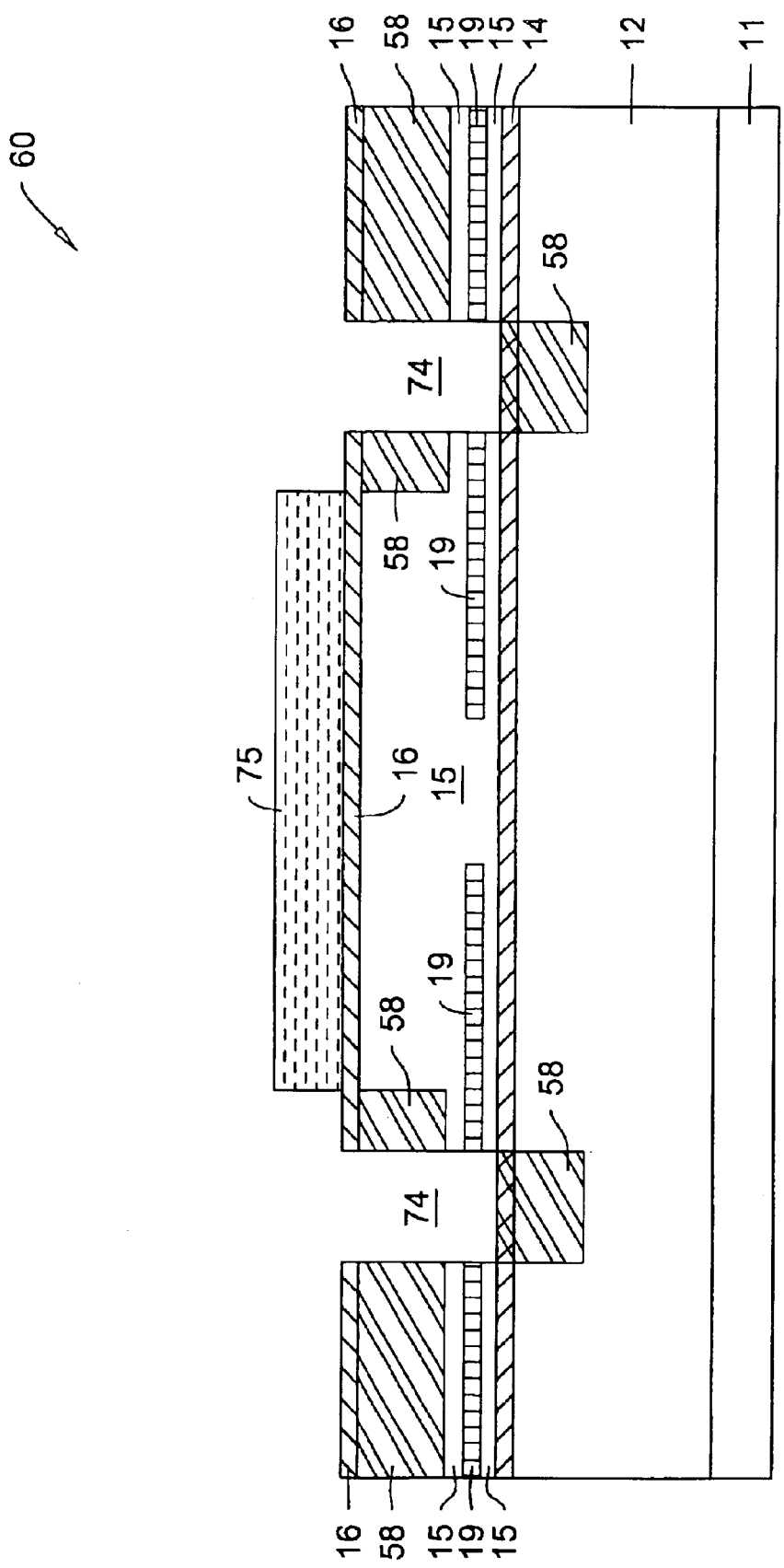

Column 6
Line 7, change "shown in FIG. 89" to --shown in FIG. 88--
Line 19, after "Nitride layer" insert --23--
Line 30, change "ebeam" to --e-beam--
Line 35, change "ebeam" to --e-beam--

Column 7
Line 26, after "As" insert --in--
Line 41, change "ebeam" to --e-beam--
Line 47, change "ebeam" to --e-beam--

Column 8
Line 19, change "ebeam" to --e-beam--
Line 24, change "ebeam" to --e-beam--
Line 35, change "spoke," to --spoke may be placed,--
Line 61, change "trenches 119" to --trenches 117--

UNITED STATES PATENT AND TRADEMARK OFFICE
CERTIFICATE OF CORRECTION

PATENT NO. : 7,031,363 B2
APPLICATION NO. : 10/697660
DATED : April 18, 2006
INVENTOR(S) : Biard et al.

It is certified that error appears in the above-identified patent and that said Letters Patent is hereby corrected as shown below:

Column 9
Line 26, change "ebeam" to --e-beam--
Line 27, change "Mask 127" to --Mask 126--
Line 28, change "mask 127" to --mask 126--
Line 30, change "ebeam" to --e-beam--
Line 47, change "ebeam" to --e-beam--
Line 52, change "122" to --172--

Column 10
Line 24, change "contract" to --contrast--

Signed and Sealed this

Twenty Second Day of April, 2008

JON W. DUDAS
*Director of the United States Patent and Trademark Office*